US005835693A

United States Patent [19]

Lynch et al.

[11] Patent Number: 5,835,693

[45] Date of Patent: Nov. 10, 1998

[54] INTERACTIVE SYSTEM FOR SIMULATION AND DISPLAY OF MULTI-BODY SYSTEMS IN THREE DIMENSIONS

[76] Inventors: James D. Lynch, 247 N. Sheldon #22; Martin J. Vanderploeg, 202 S. Dakota Ave., both of Ames, Iowa 50014

[21] Appl. No.: 279,595

[22] Filed: Jul. 22, 1994

[51] Int. Cl.$^6$ .................................................... G06T 17/00

[52] U.S. Cl. ............................... 395/173; 395/95; 395/98

[58] Field of Search ............................... 395/152, 80, 85, 395/90, 92, 173, 174, 175, 95, 96, 98, 99; 364/810

[56] References Cited

U.S. PATENT DOCUMENTS

| | | | |
|---|---|---|---|
| 5,043,929 | 8/1991 | Kramer et al. .......................... | 364/578 |
| 5,253,189 | 10/1993 | Kramer .................................. | 364/578 |
| 5,297,057 | 3/1994 | Kramer et al. .......................... | 364/512 |

OTHER PUBLICATIONS

Lynch, "VIMS Source Code", Iowa State University, 1992.

W.L. Buford et al., "A Modeling and Simulatin System for the Human Hand," *J. Clin. Eng.*, 15, 445–451 (1990).

Y.S. Chao et al., *Biomechanics of the Hand, A Basic Research Study*; World Scientific Publishing Co.: Singapore (1989) [Title page, copyright page and Table of Contents (p. xi)].

M.A. Chace et al., "DAMN—Digital Computer Program for the Dynamic Analysis of Generalized Mechanical Systems," *SAE Transactions*, Paper No. 710244 (Jan. 1971).

H.N. Christiansen et al., "Movie. BYU Training Text"; Community Press: Provo, UT; 1986 [Title page, Copyright page, and Table of Contents (pp. i–iv)].

S.L. Delp, "Surgery Simulation: A Computer Graphics System to Analyze and Design Musculoskeletal Reconstructions of the Lower Limb," Ph.D. dissertation, Stanford University (1990).

S.L. Delp et al., "An Interactive Graphics–Based Model of the Lower Extremity to Study Orthopaedic Surgical Procedures," *IEEE Transactions on Biomedical Engineering*, 37, 757–767 (Aug. 1990).

*Graphics Gems.*; A.S. Glassner, Ed,; Academic Press, Inc.: Boston; 1990 [Title page, Copyright page, and Table of Contents (pp. vii–xiv)].

*Graphics Library Programming Guide*; Silicon Graphics, Inc.: Mountain View, CA; 1991 [Title page, copyright page and Table of Contents (pp. iii–xvi)].

D.T. Greenwood, *Principles of Dynamics*; Prentice–Hall, Inc.: Englewood Cliffs, NJ (1965).

M.A. Hussain et al., "Application of Symbolic Computation to the Analysis of Mechanical Systems, Including Robot Arms," in *Computer Aided Analysis and Optimization of Mechanical Systems Dynamics* (*NATO ASI Series*)*, vol. F9*; Springer–Verlag: Berlin; pp. 284–306 (1984).

W.W. Hooker et al., "The Dynamical Attitude Equations for an n–Body Satellite",*J. Astronaut. Sci.*, 12, 123–128 (1965).

(List continued on next page.)

*Primary Examiner*—Heather R. Herndon
*Assistant Examiner*—Stephen Hong
*Attorney, Agent, or Firm*—Schwegman, Lundberg, Woessner & Kluth, P.A.

[57] ABSTRACT

Method and apparatus for simulating a multibody system on a computer. The invention provides for inputting into the computer a mathematical description of each body in the multibody system, specifying into the computer a force to act on one of the bodies, formulating a Jacobian matrix, solving kinematics constraints in the computer, graphically displaying a result of the solution of the kinematic constraints from the computer onto an electronic display, whereupon the user can interactively input a change to the multibody system into the computer and graphically display a result of the change to the multibody system from the computer.

22 Claims, 92 Drawing Sheets

OTHER PUBLICATIONS

*IMSL Math/Library User's Manual Version 1.1*, IMSL, Inc.: Houston, TX; Dec. 1989 [Title page and Table of Contents (2 pp.)].

S.S. Kim et al., "A State Space Formulation for Multibody Dynamic Systems Subject to Control", Technical Report No. 84–20, Center for Computer Aided Design, University of Iowa, Iowa City, Iowa (1984).

S.S. Kim et al., "A General and Efficient Method for Dynamic Analysis of Mechnical Systems Using Velocity Transformations, " *J. Mechanisms, Transmissions, and Automation in Design*, 108, 176–182 (Jun. 1986).

A.G. Lynch, "A Symbolic Formulation for Equations of Motion of Multibody Systems", Ph.D. dissertation, Iowa State University (1988).

J.D. Lynch et al., "An Interactive Environment for Multibody Simulation", *Advances in Design Automation*, 2 (DE–vol. 65–2), 569–581 (1993).

M.E. Mortenson, *Computer Graphics: An Introduction to the Mathematics and Geometry*; Industrial Press Inc.: New York (1989) [Title page, copyright page, and Table of Contents (pp. vii–x)].

P.E. Nikravesh et al., "Application of Euler Parameters of the Dynamic Analysis of Three–Dimensional Constrained Mechanical Systems," *J. Mech. Design*, 104, 785–791 (Oct. 1982).

P.E. Nikravesh, *Computer–Aided Analysis of Mechanical Systems*; Prentice–Hall: Englewood Cliffs, NJ (1988) [Title page, copyright page and Table of Contents (pp. iii–vii)].

N. Orlandea et al., "A Sparsity–Oriented Approach to the Dynamic Analysis and Design of Mechanical Systems—Part I", *J. Engr. Indust.*, 99, 773–784 (Aug. 1977).

C.K. Pokorny et al., *Computer Graphics: The Principles Behing the Art and Science*; Franklin, Beedle & Assoc.: Irvine, CA; 1989 [Title page, copyright page and Table of Contents (pp. iii–x)].

R.E. Roberson et al., "A Dynamical Formalism for an Arbitrary Number of Interconnected Rigid Bodies, with Reference to the Problem of Satellite Attitude Control" In *Third Congress of the International Federation of Automatic Control*; vol. 1, Book 3; pp. 46D.1–46D.9 (Jun., 1966).

A. Seireg et al., "A Mathematical Model for Evaluation of Forces in Lower Extremeties of the Musculo–Skeletal System," *J. Biomechanics*, 6, 313–326 (May 1973).

A. Seireg et al., "The Prediction of Muscular Load Sharing and Joint Forces in the Lower Extremities During Walking," *J. Biomechanics*, 8, 89–102 (Mar. 1975).

A. Seireg et al., *Biomechanical Analysis of Musculoskeletal Structure for Medicine and Sports*; Hemisphere Publishing Co.: New York; 1989 [Title page, copyright page and Table of Contents (pp. vii–x)].

P.N. Sheth et al., "IMP (Integrated Mechanisms Program), A Computer–Aided Design Analysis System for Mechanisms and Linkage", *J. Engr. Indust.*, 94, 454–464 (May 1972).

R.A. Wehage et al., "Generalized Coordinate Partitioning for Dimension Reduction in Analysis of Constrained Dynamic Systems", *J. Mech. Design*, 104, 247–255 (Jan. 1982).

J. Wittenburg et al., "Mesa Verde: A Symbolic Program for Nonlinear Articulated–Rigid–Body Dynamics", ASME Paper No. 85–DET–151; pp. 1–8; presented at the ASME Design Engineering Division Conference and Exhibit on Mechanical Vibration and Noise, Cincinnati, OH (Sep. 10–13, 1985).

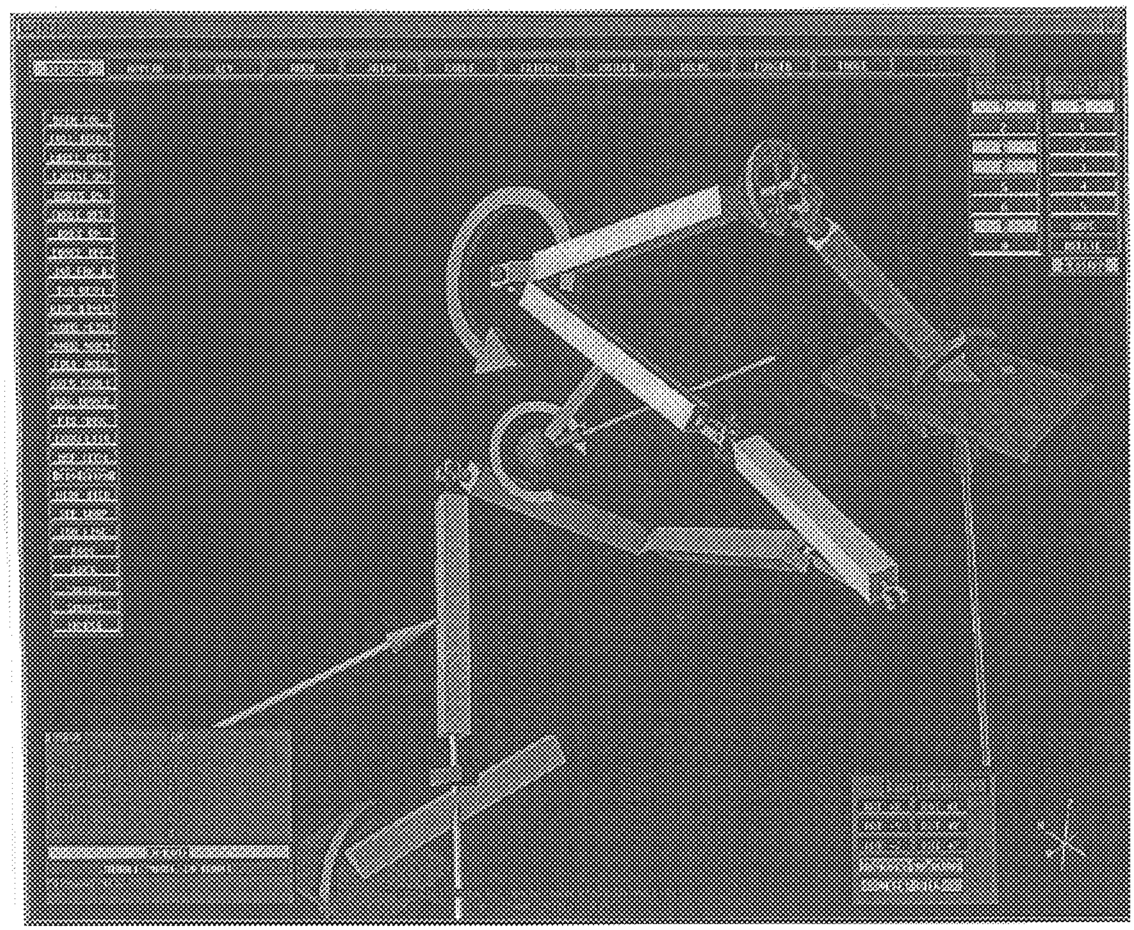
FIG. 3.1

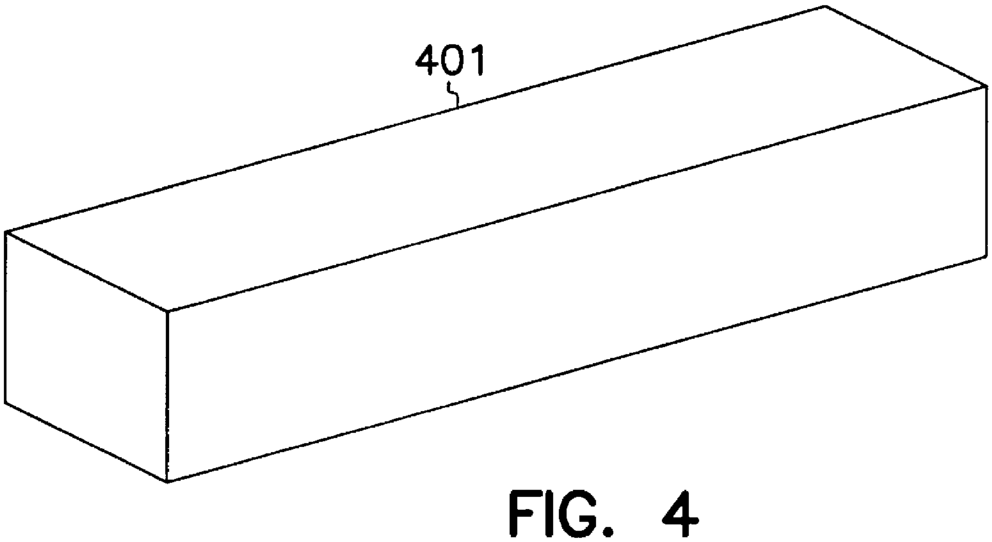
FIG. 4
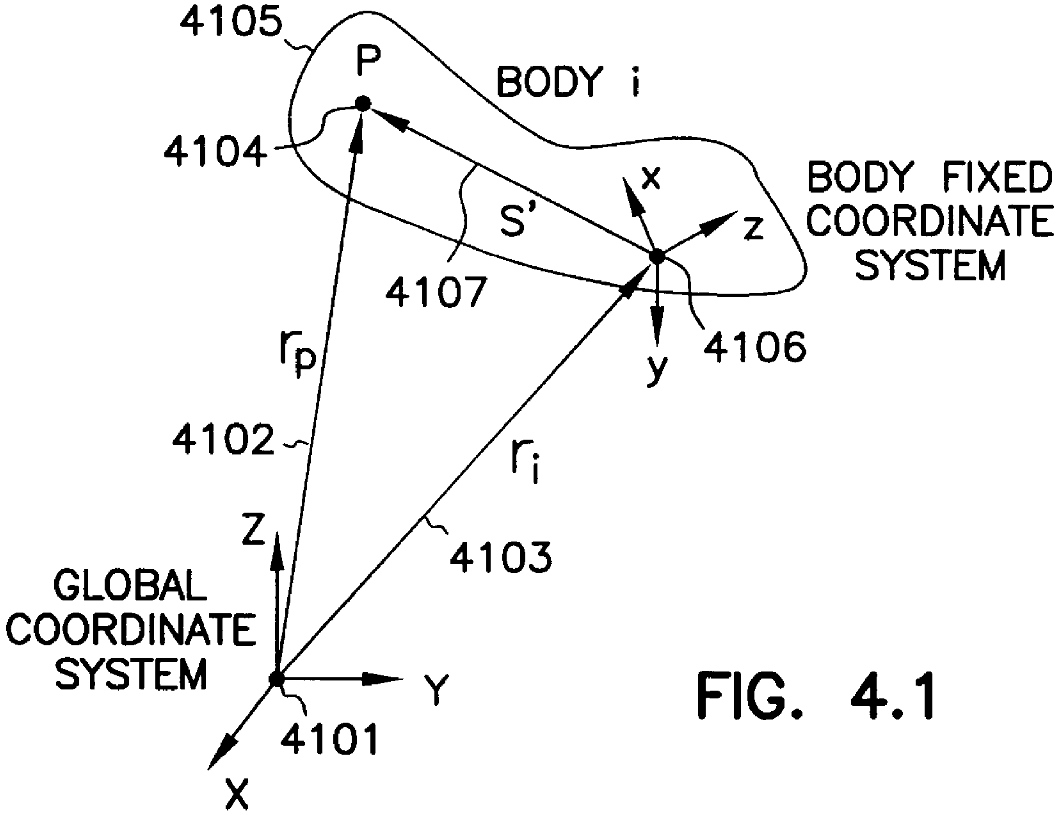
FIG. 4.1

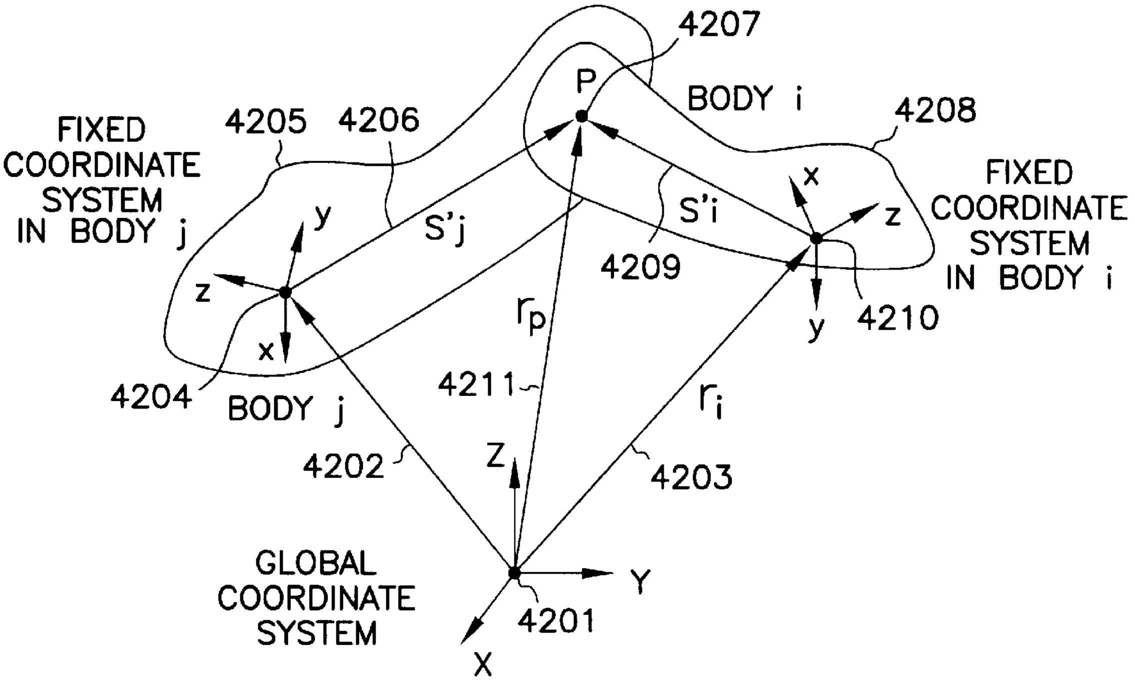
FIG. 4.2

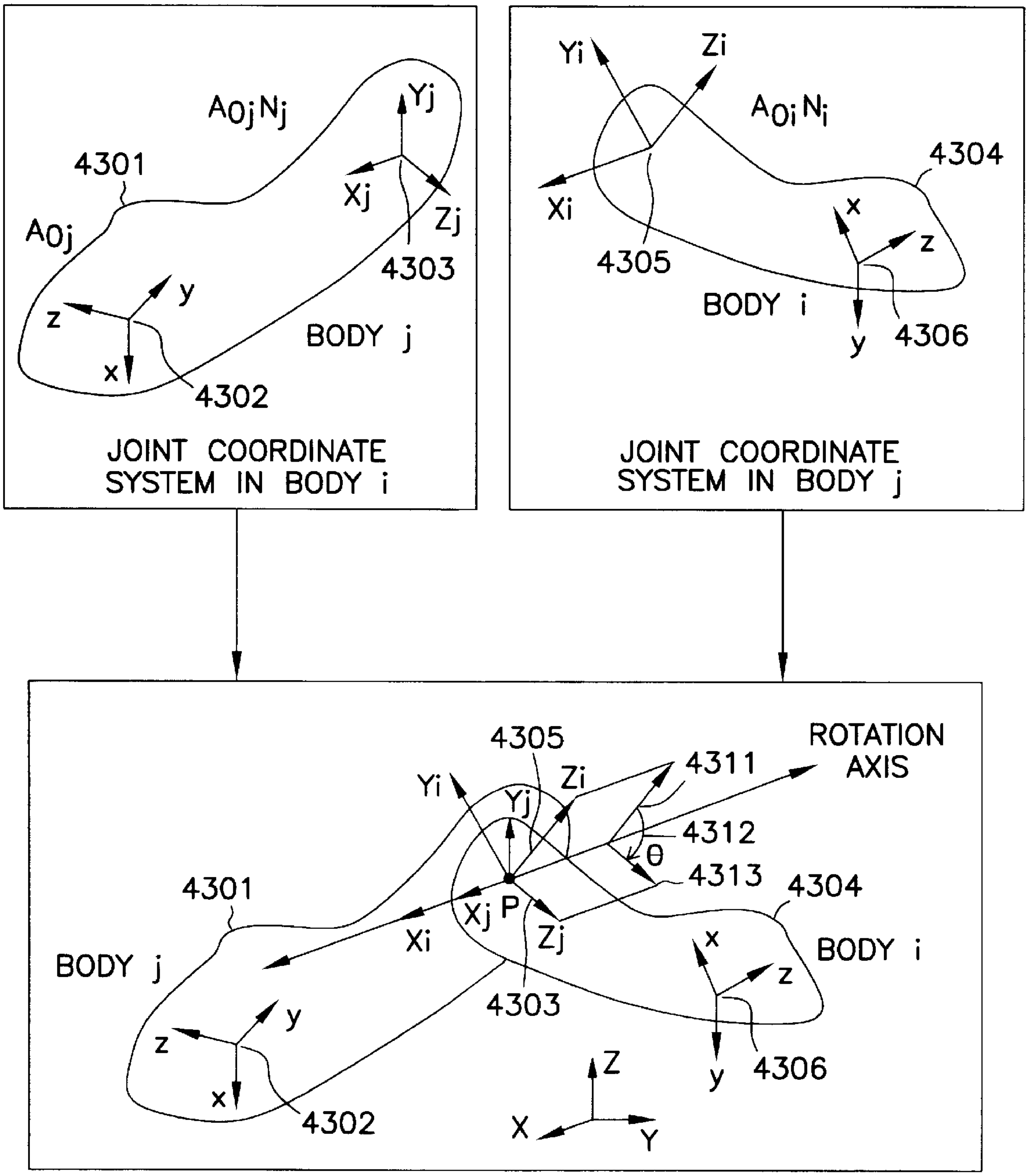
FIG. 4.3

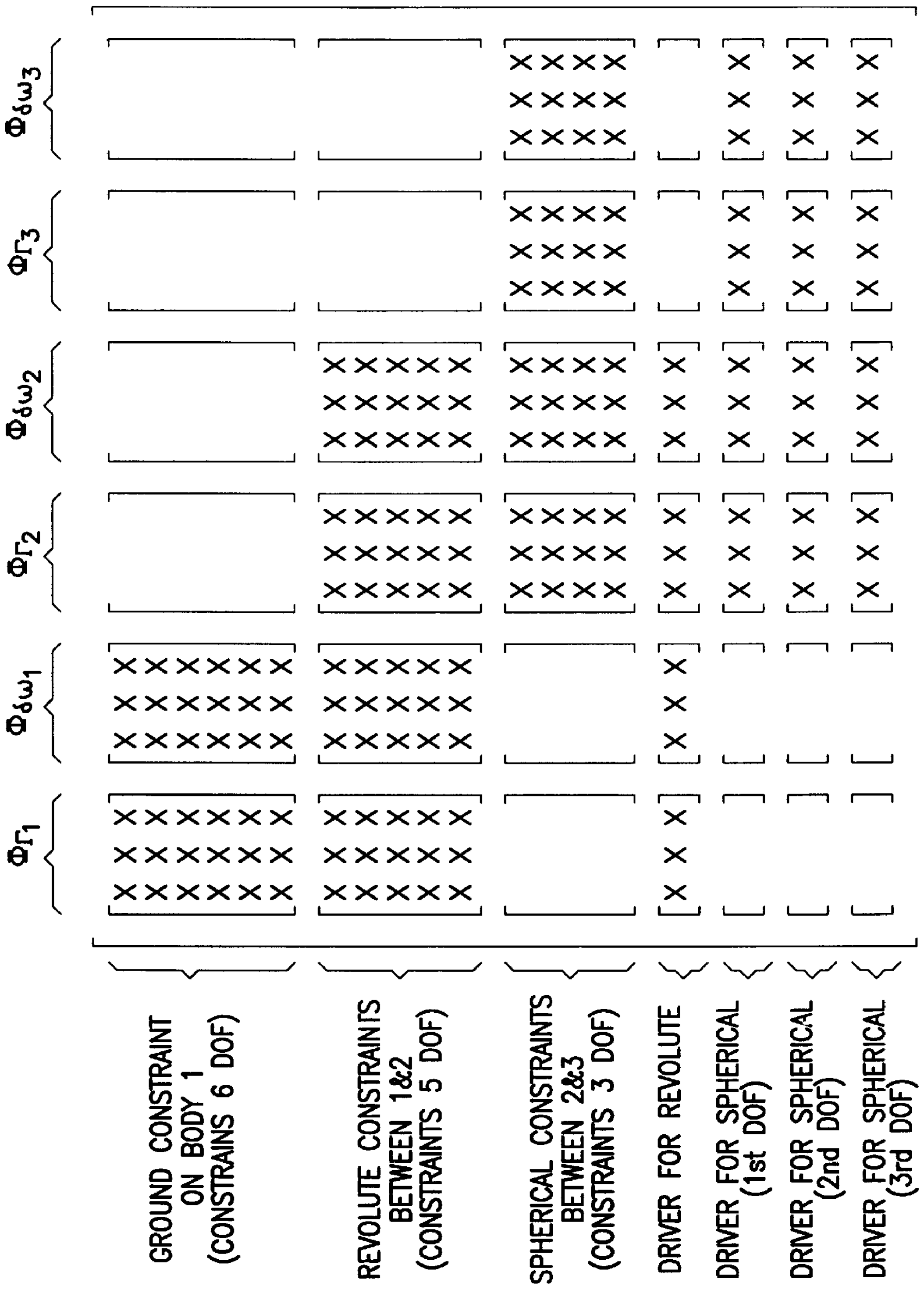
FIG. 4.4

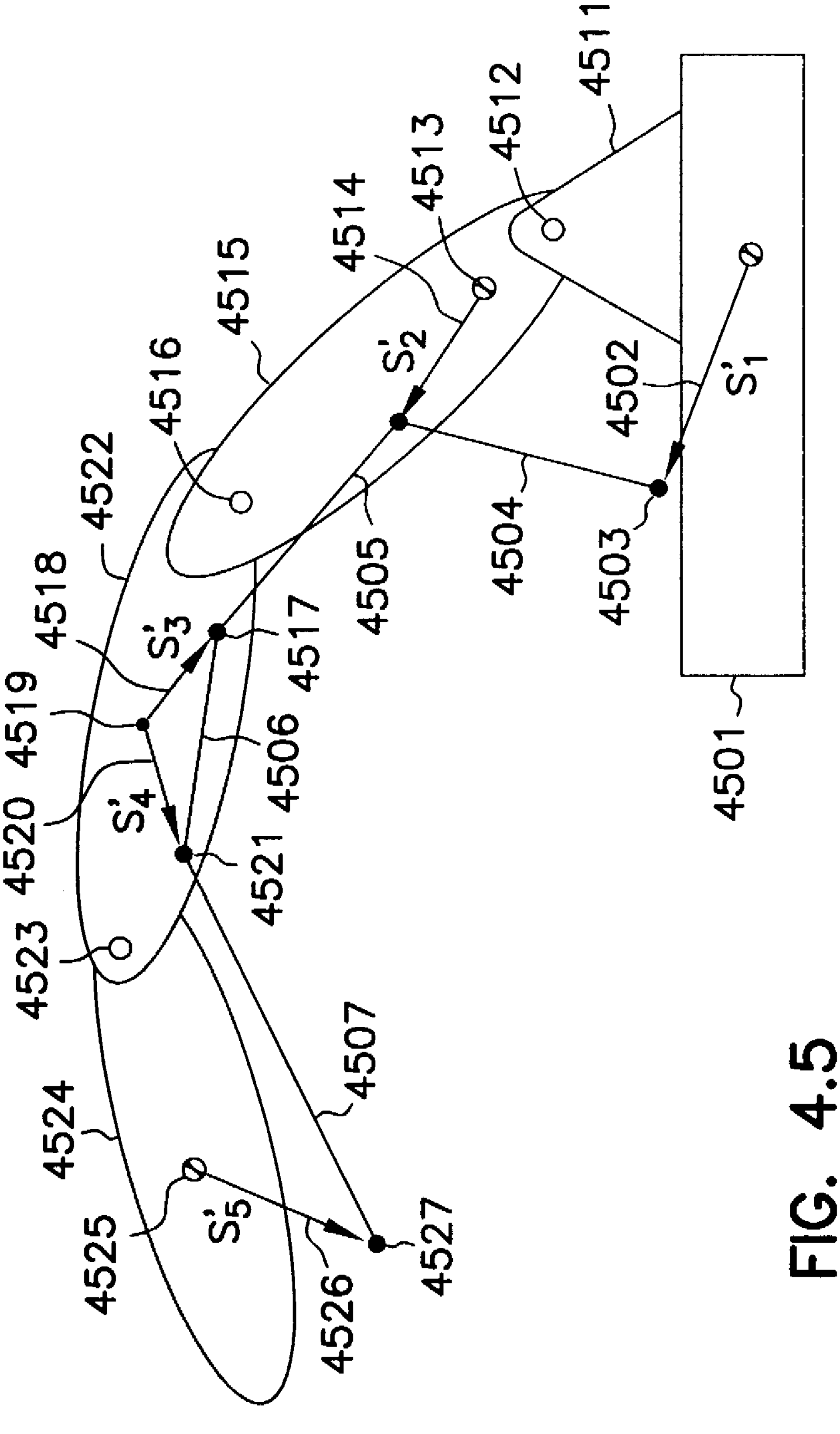
FIG. 4.5

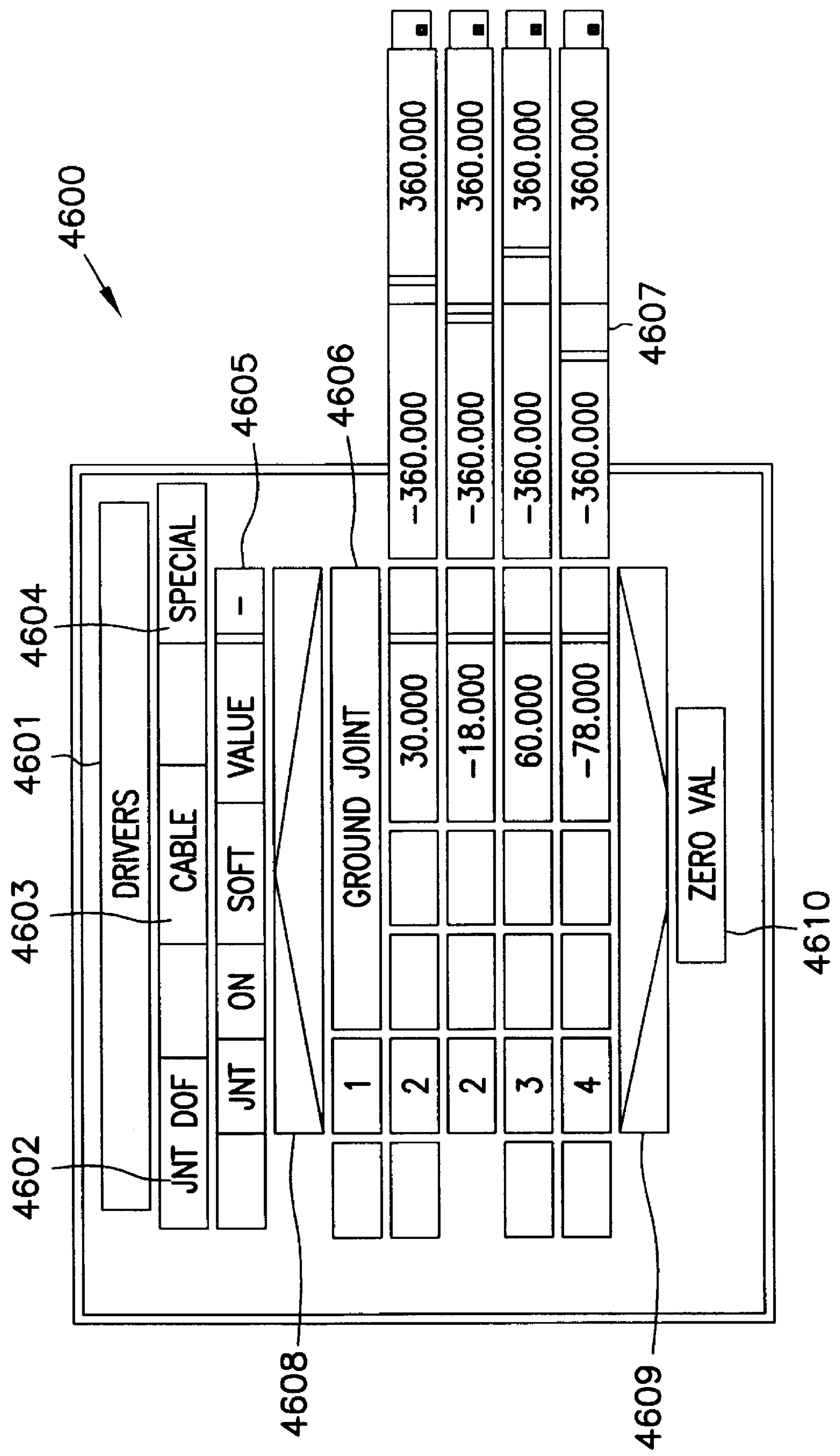
FIG. 4.6

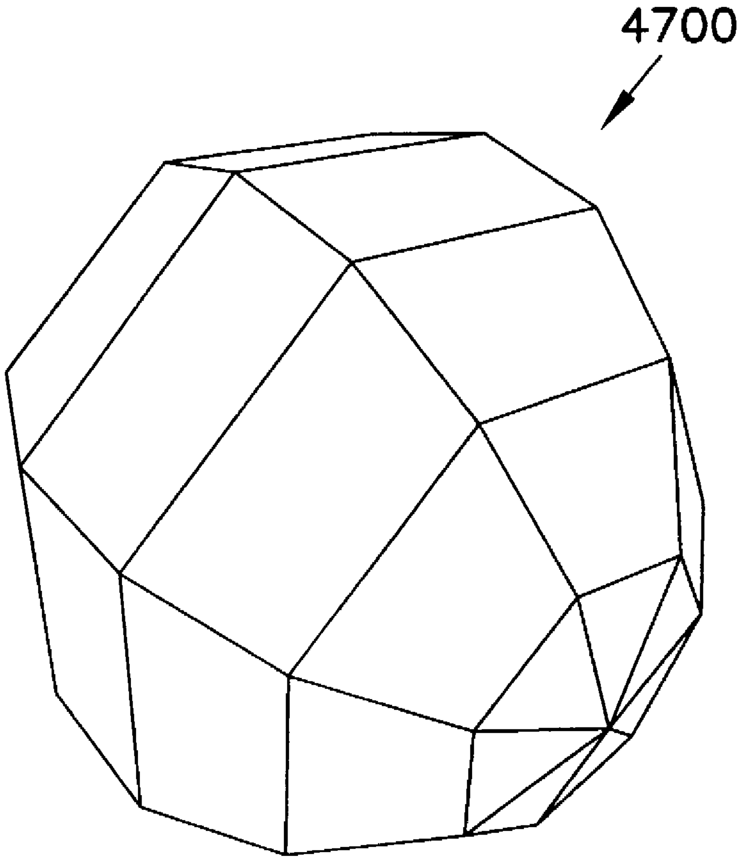
FIG. 4.7

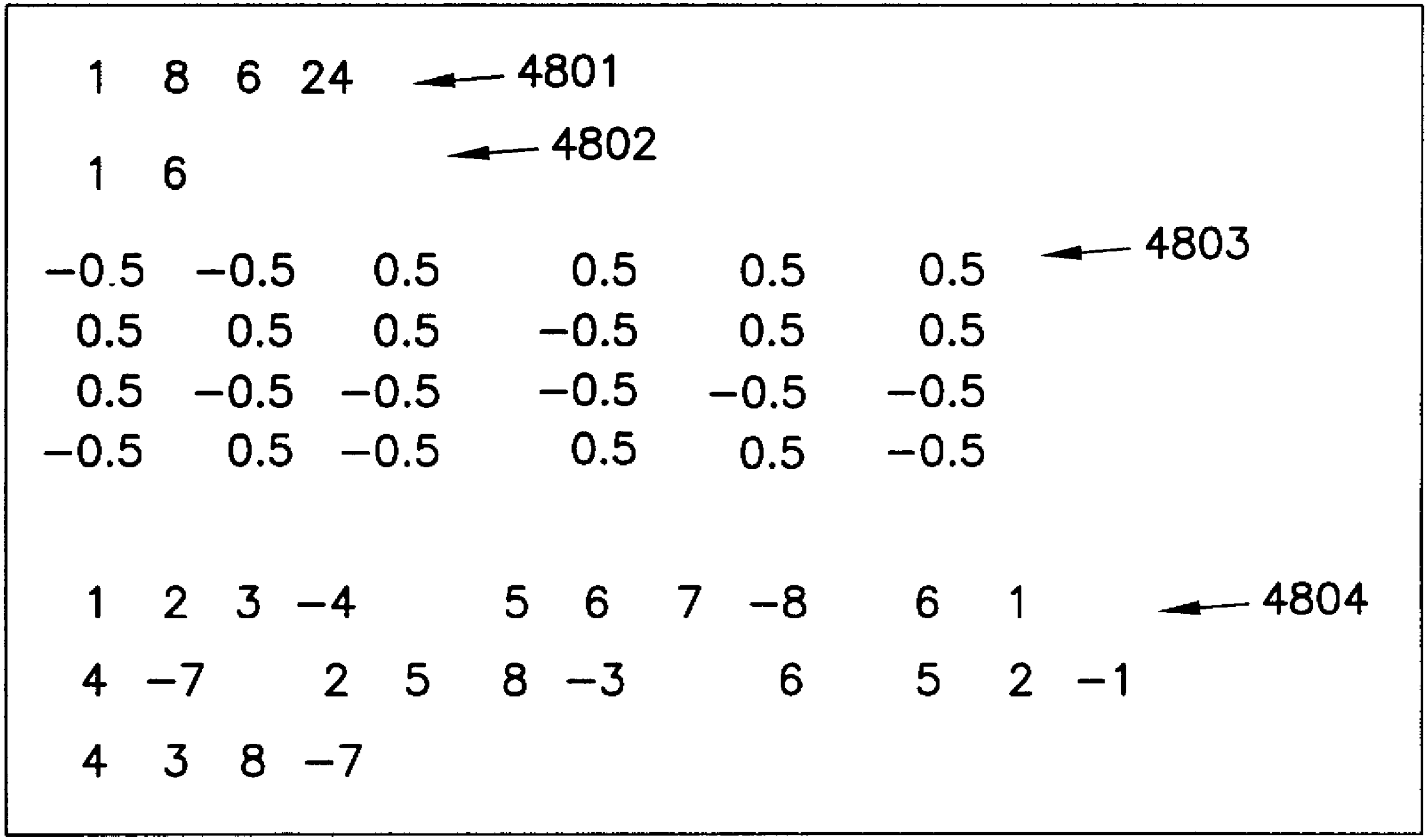
FIG. 4.8

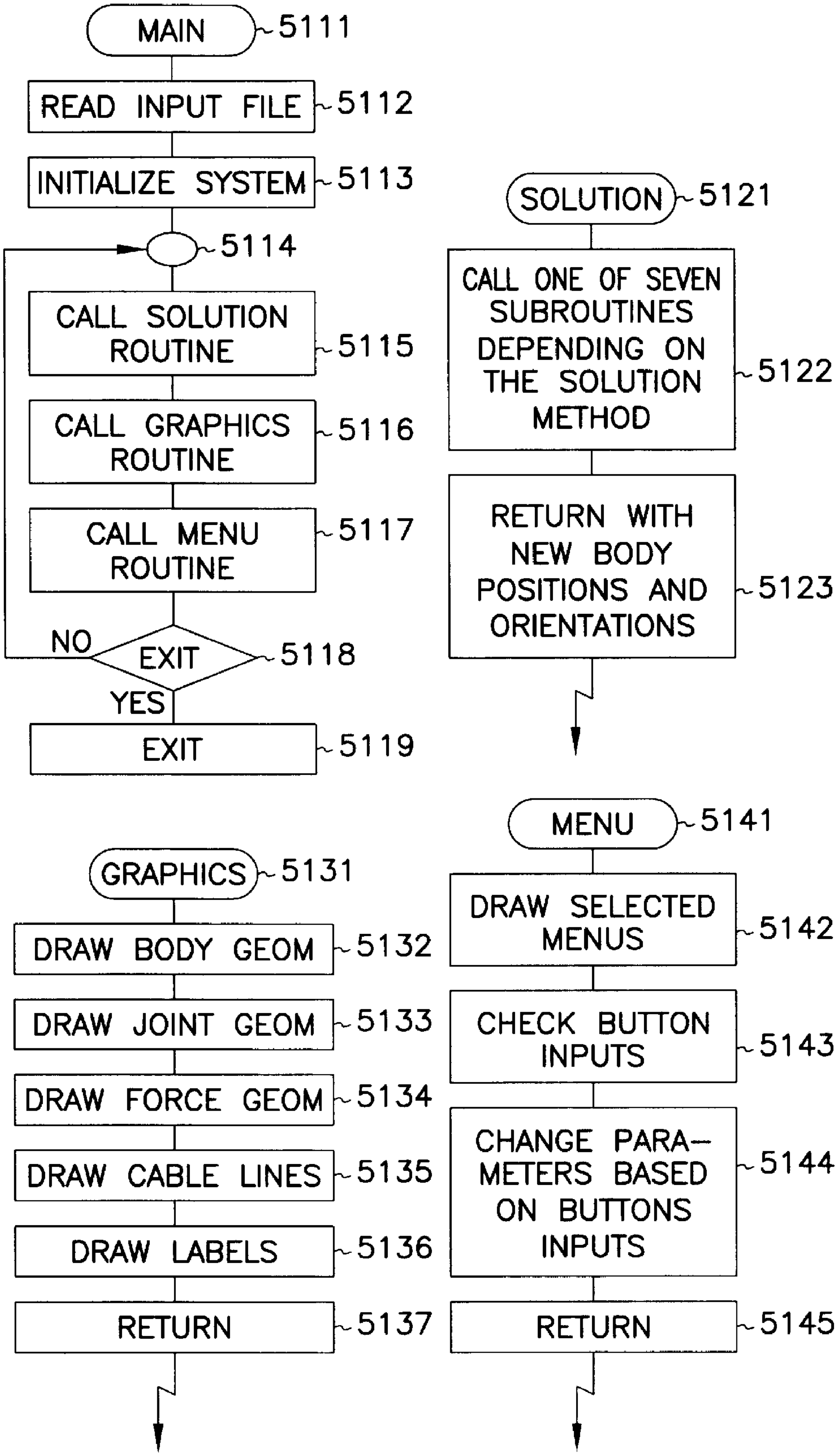
FIG. 5.1

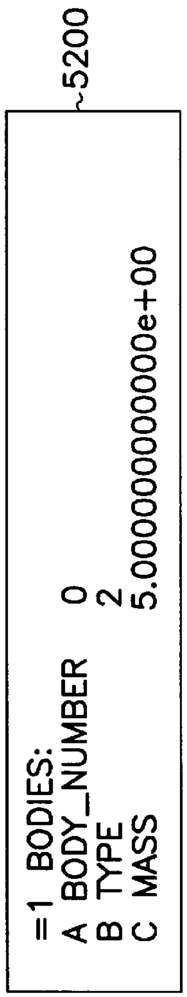
FIG. 5.2
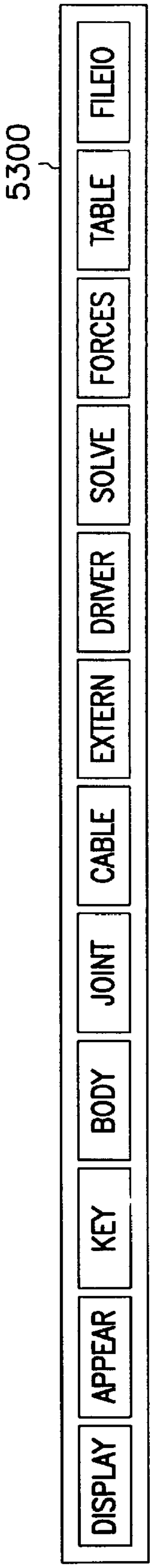
FIG. 5.3
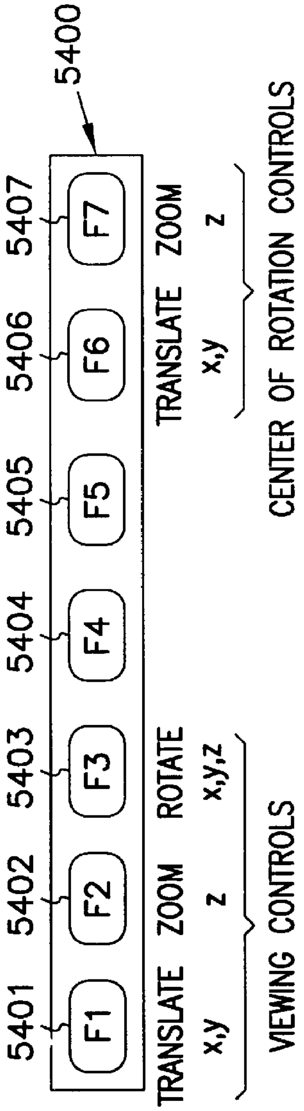
FIG. 5.4

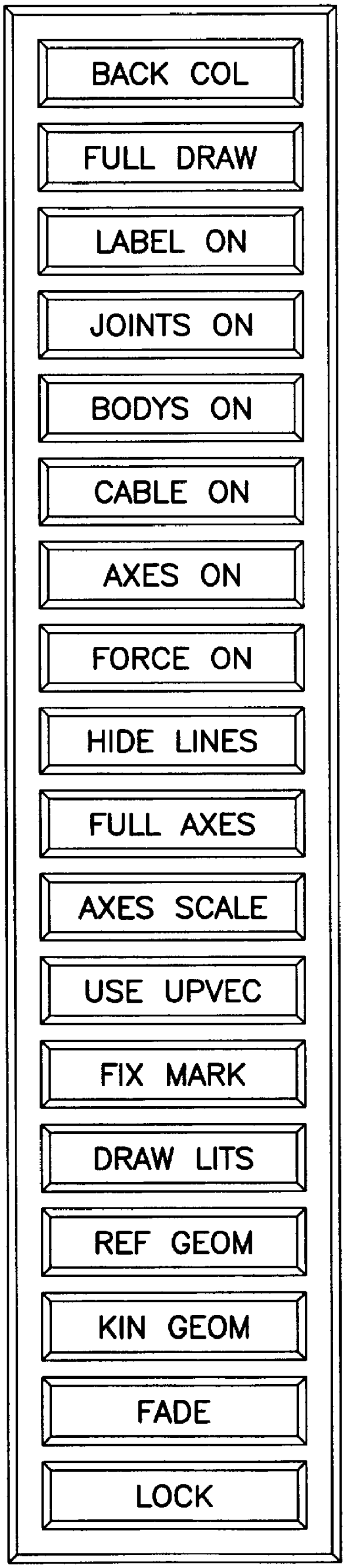
FIG. 5.3.1

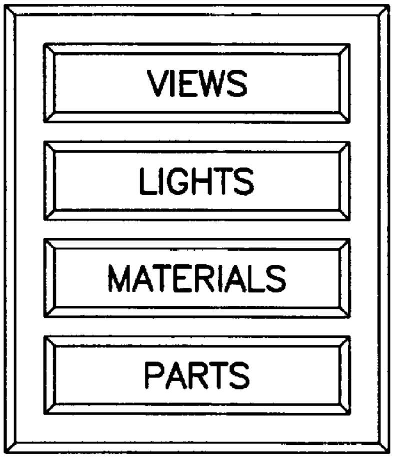
FIG. 5.3.2
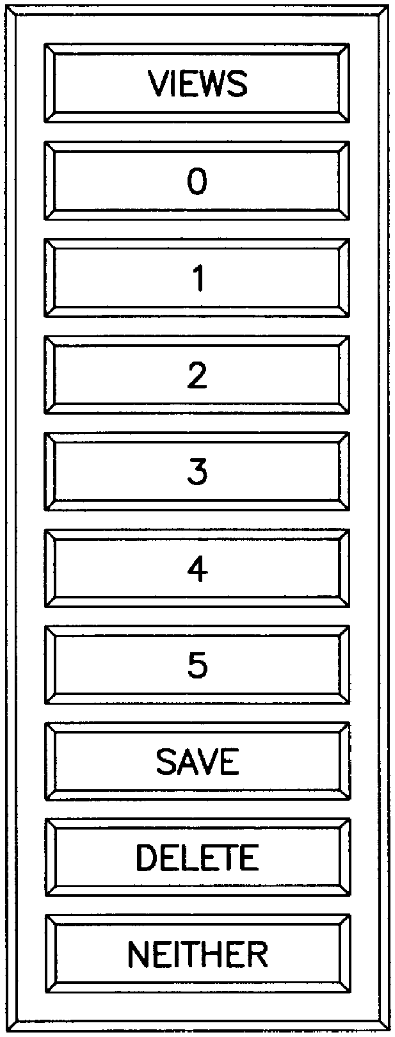
FIG. 5.3.3
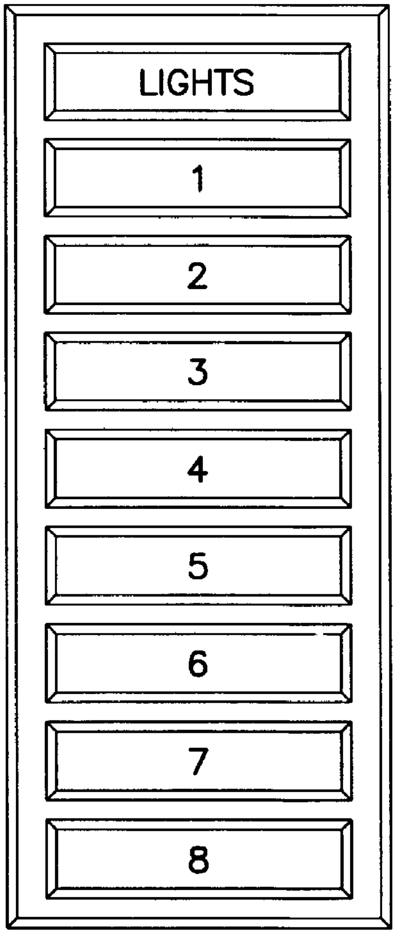
FIG. 5.3.4

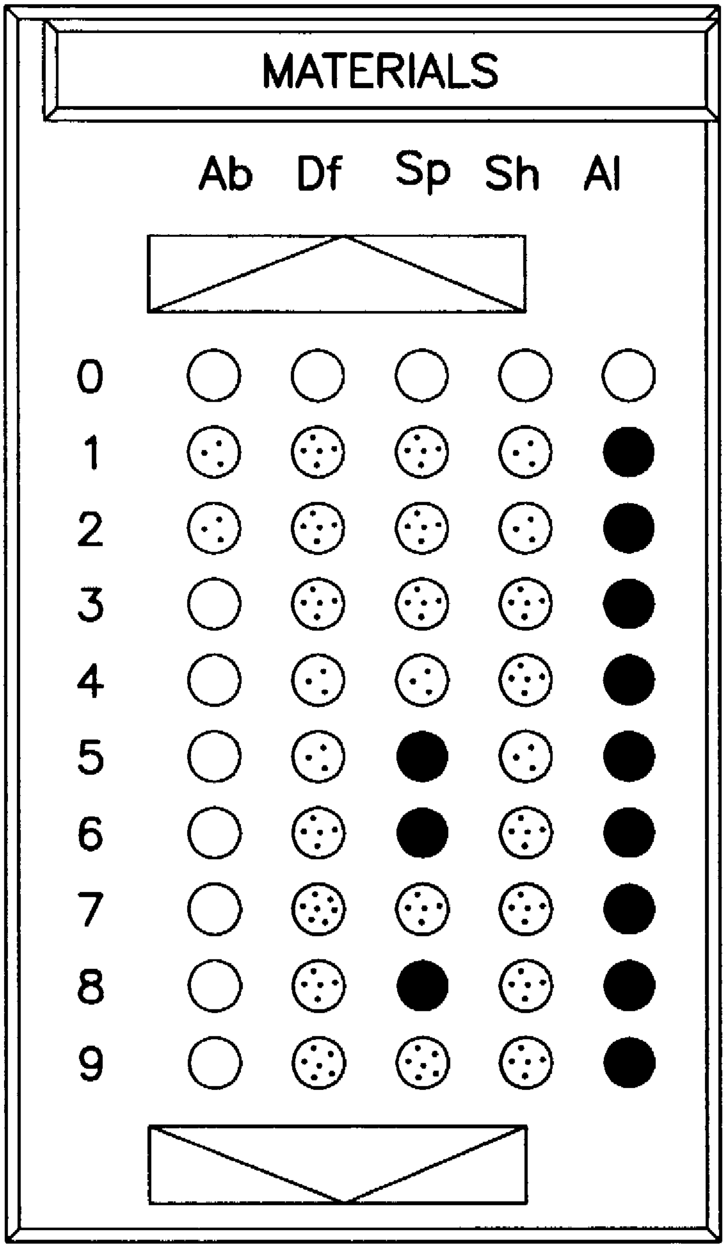
FIG. 5.3.5

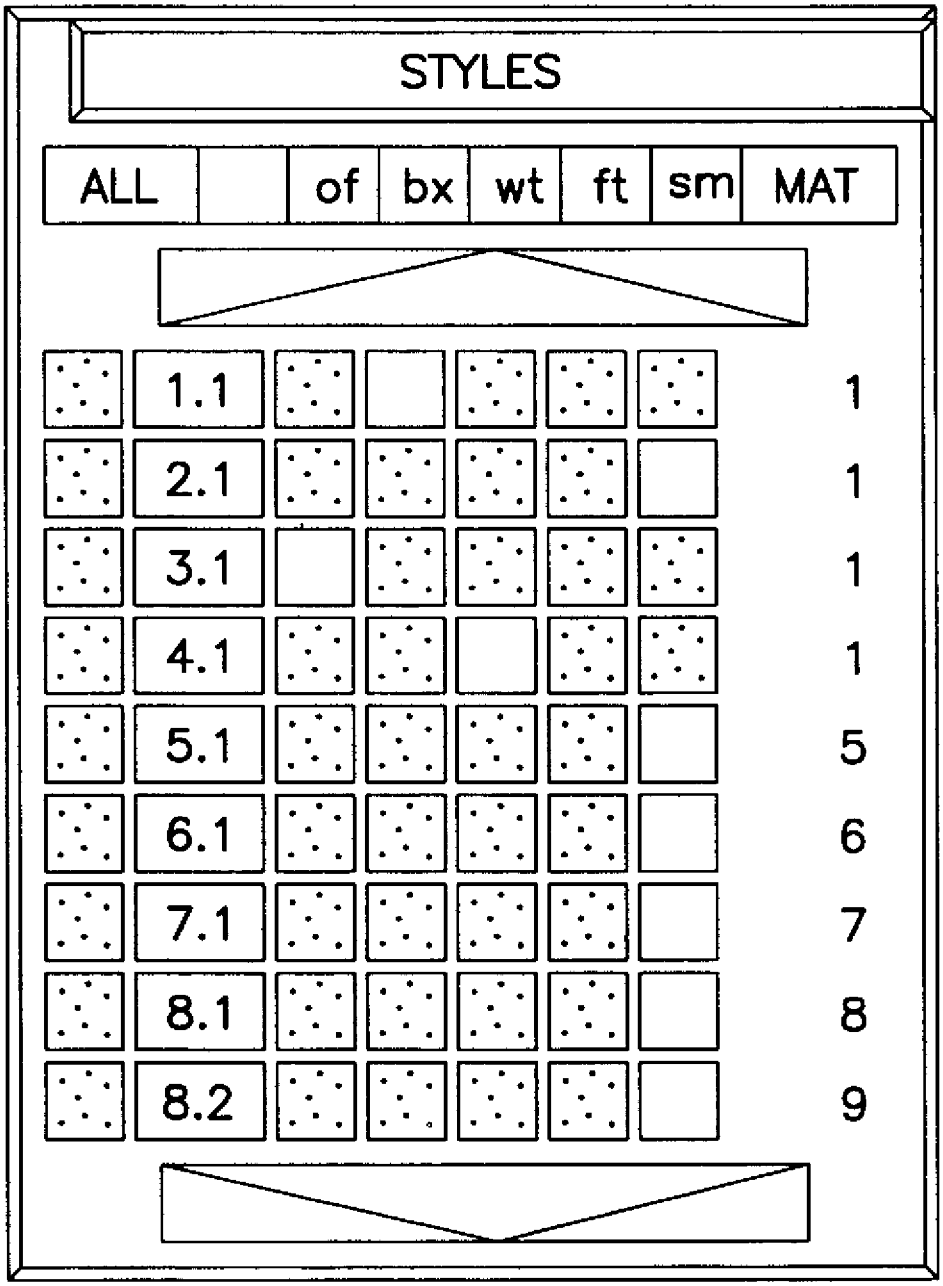
FIG. 5.3.6

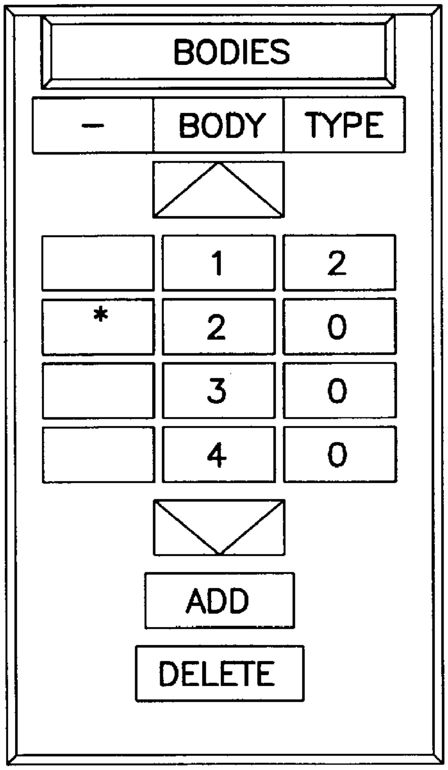
FIG. 5.4.1
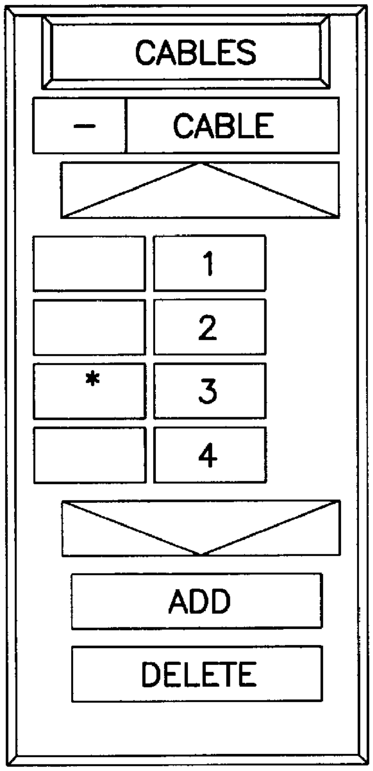
FIG. 5.4.3
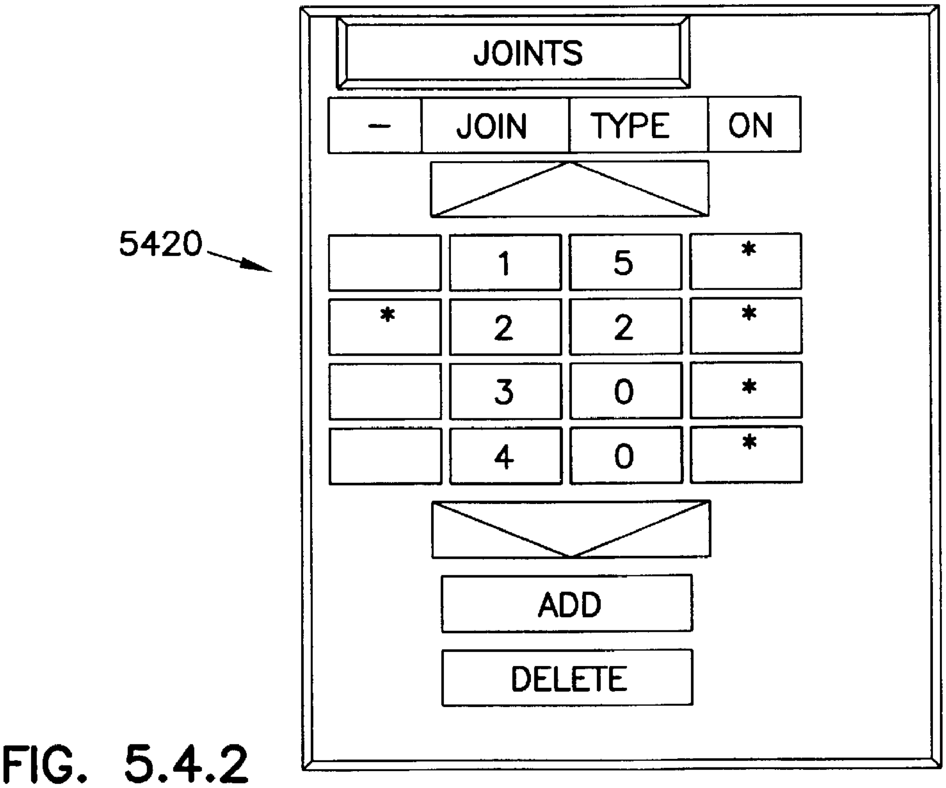
FIG. 5.4.2

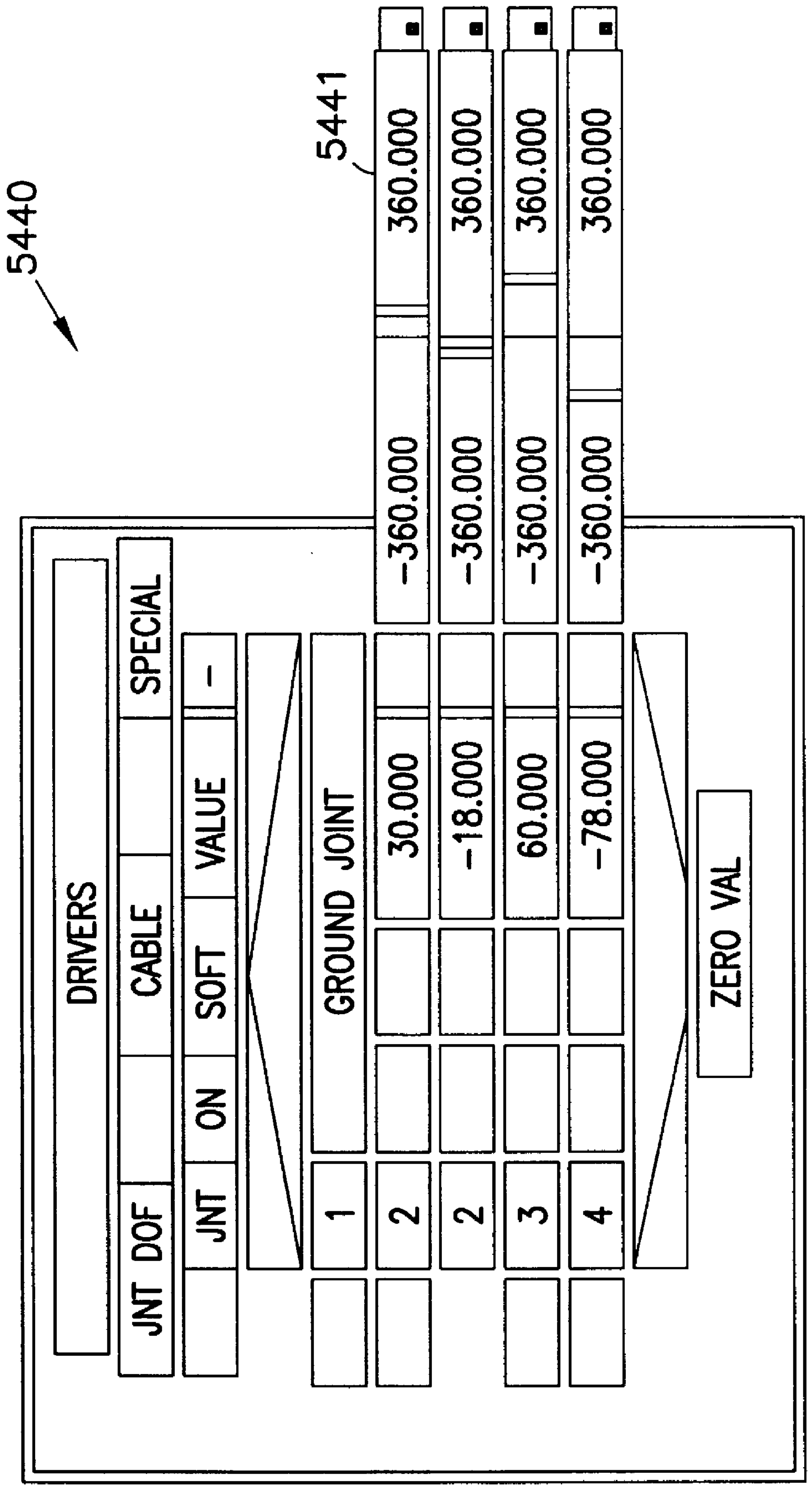
FIG. 5.4.4

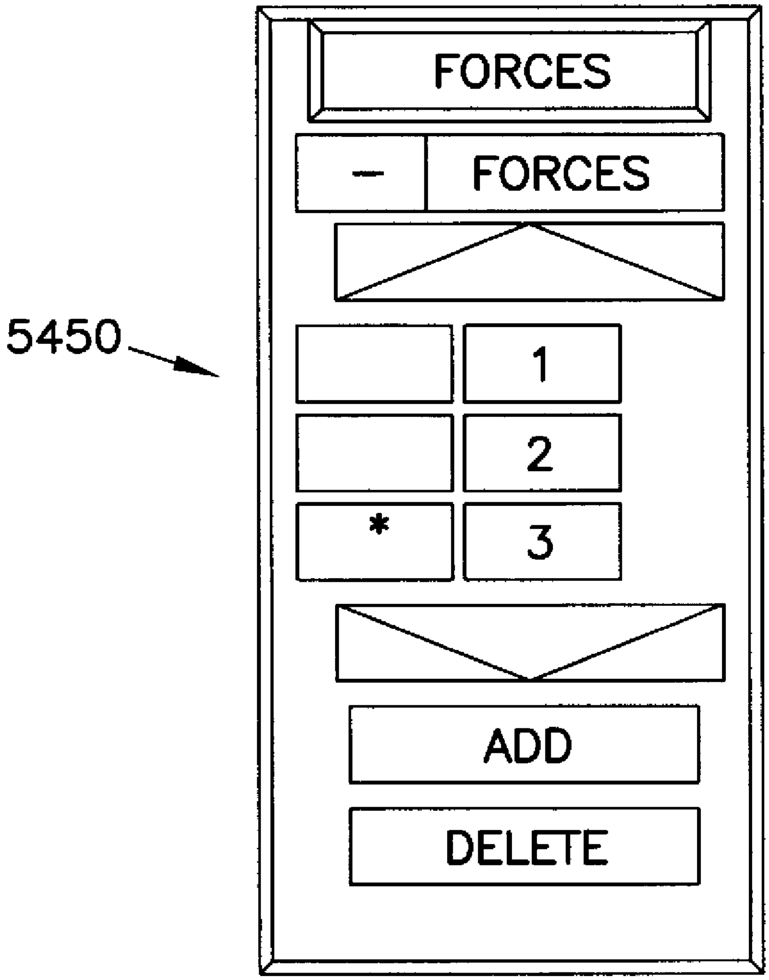
FIG. 5.4.5

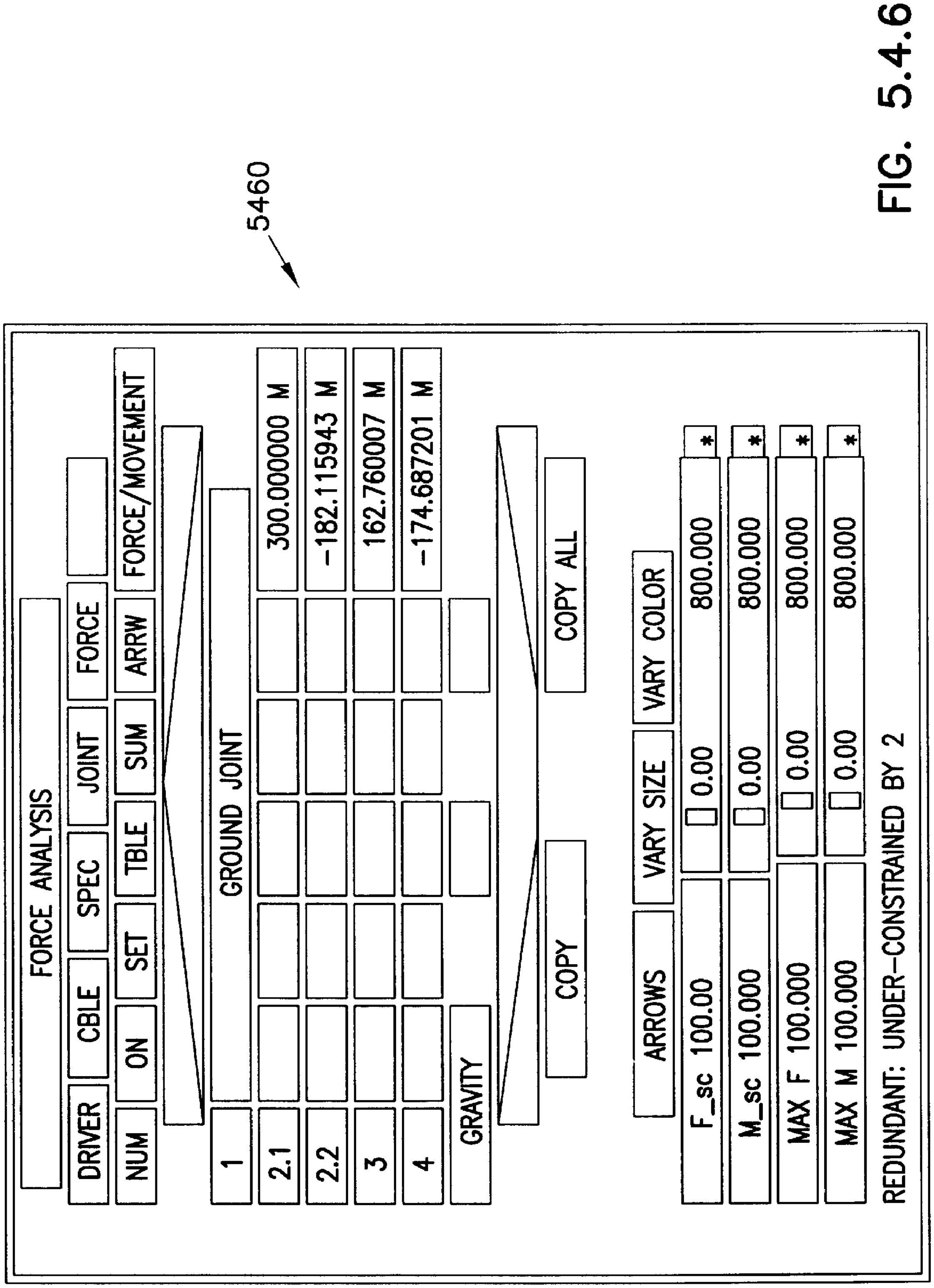
FIG. 5.4.6

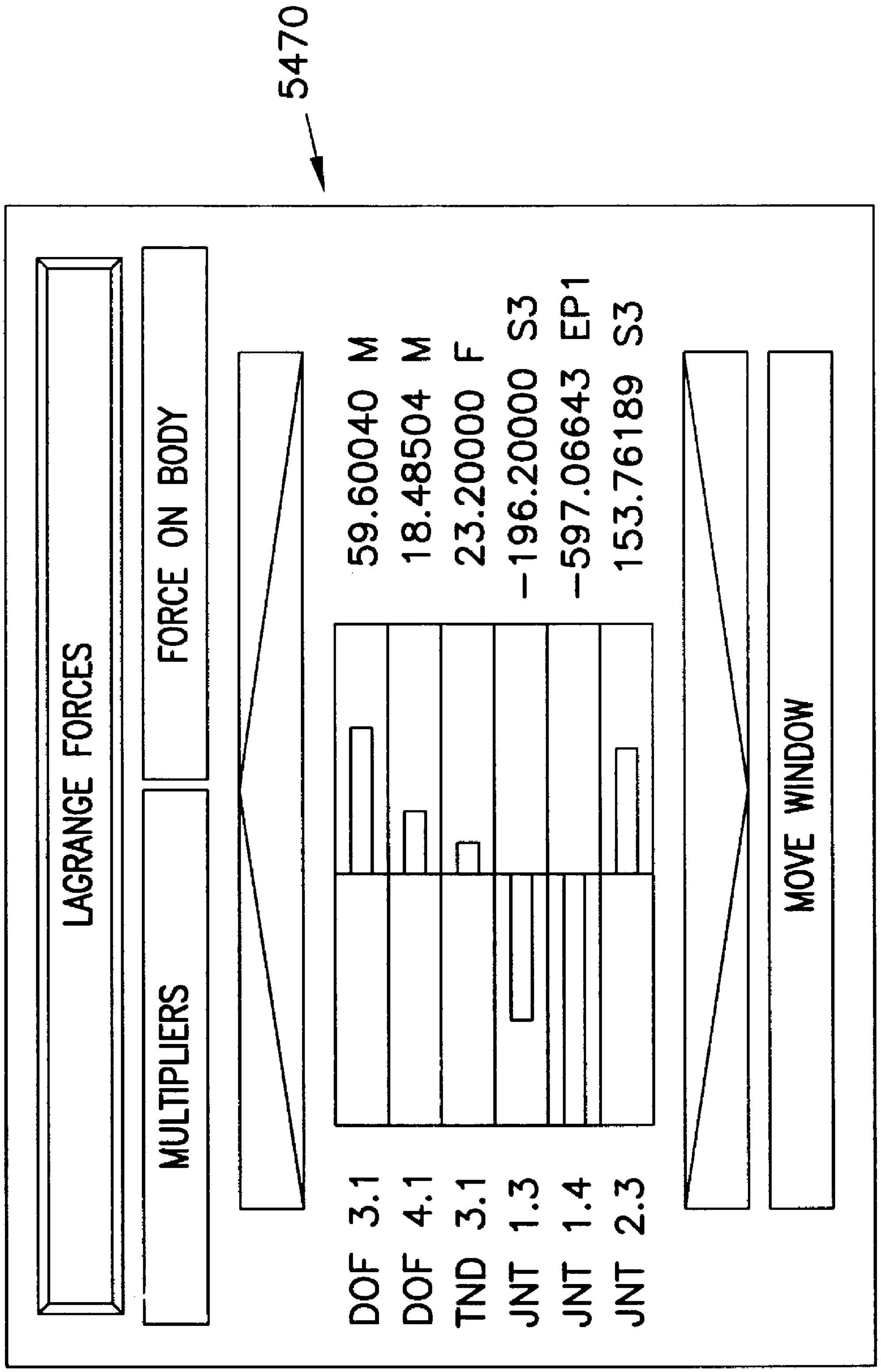
FIG. 5.4.7

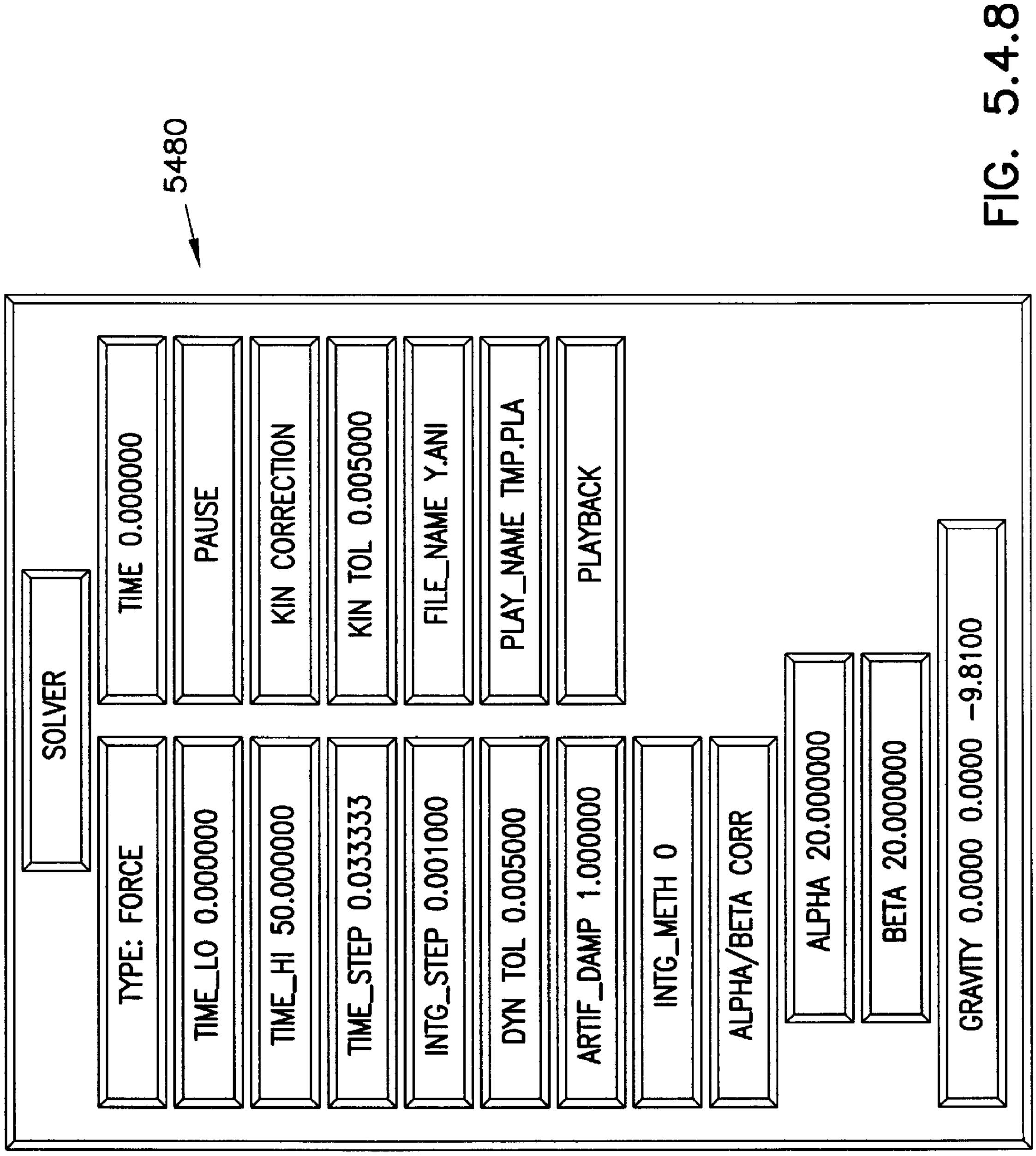
FIG. 5.4.8

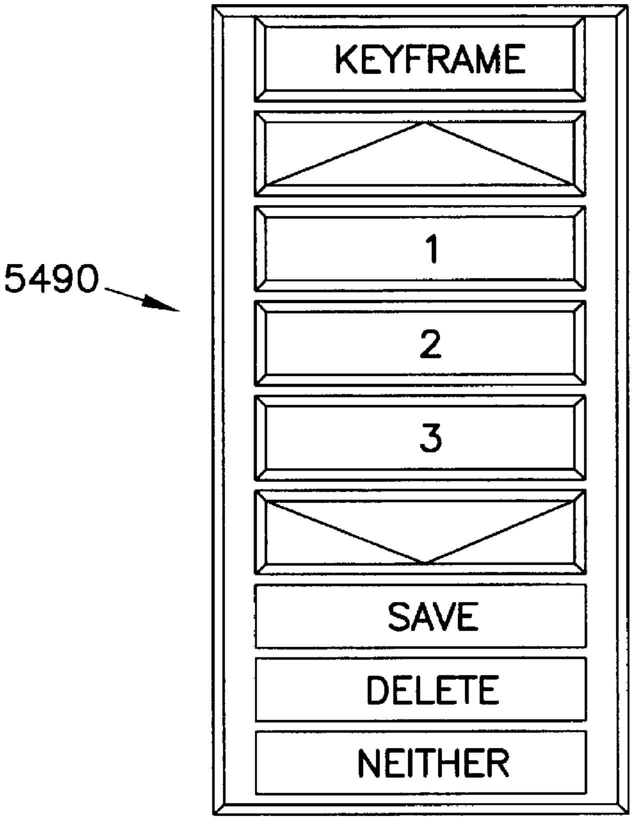
FIG. 5.4.9
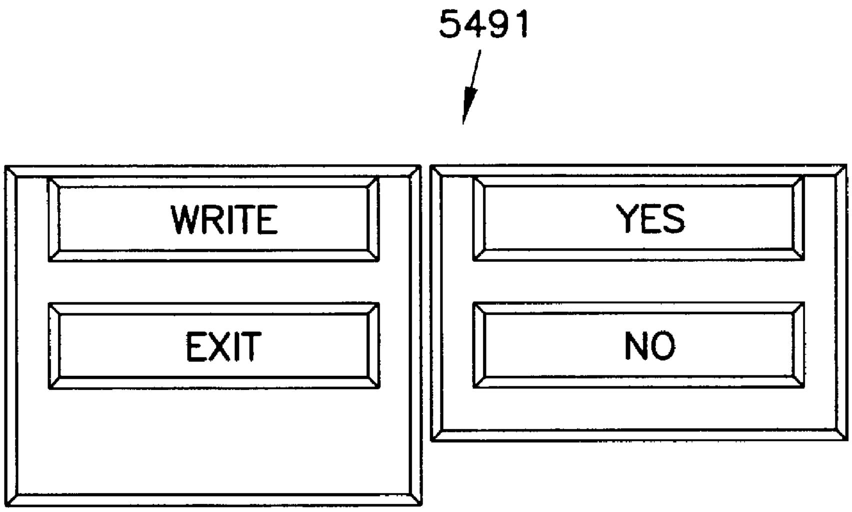
FIG. 5.4.10

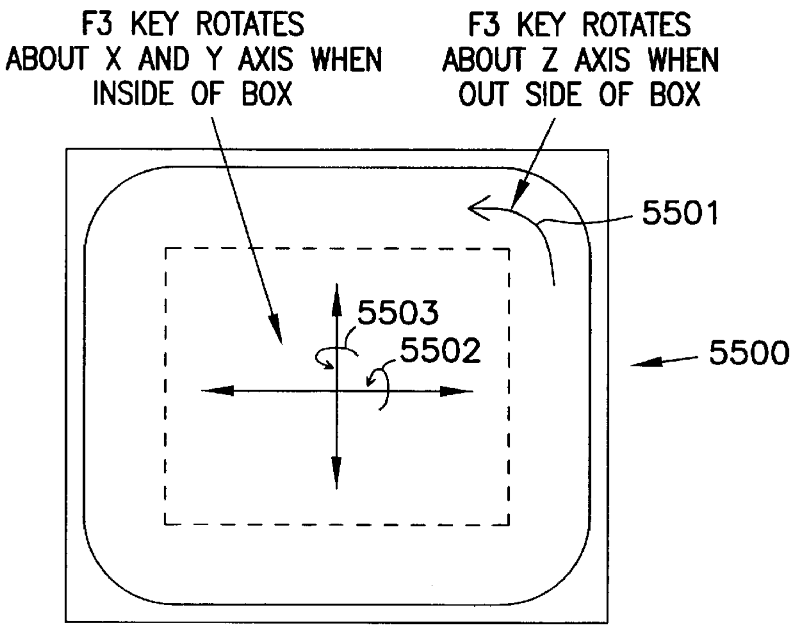
FIG. 5.5
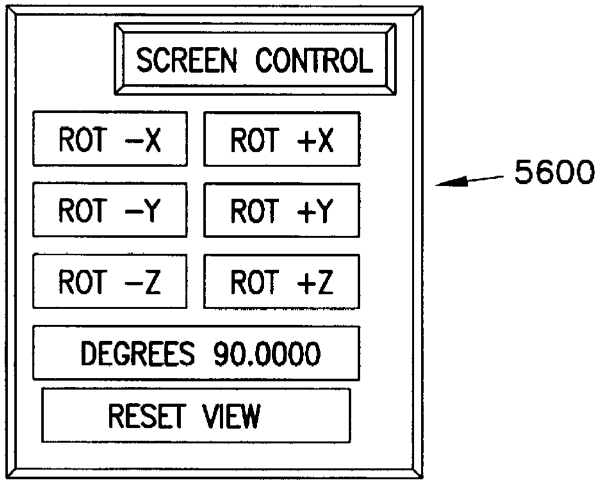
FIG. 5.6
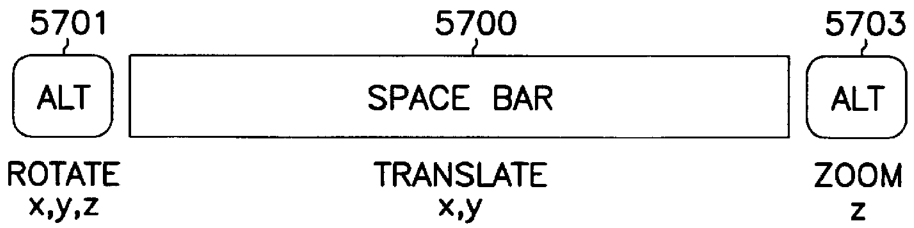
FIG. 5.7

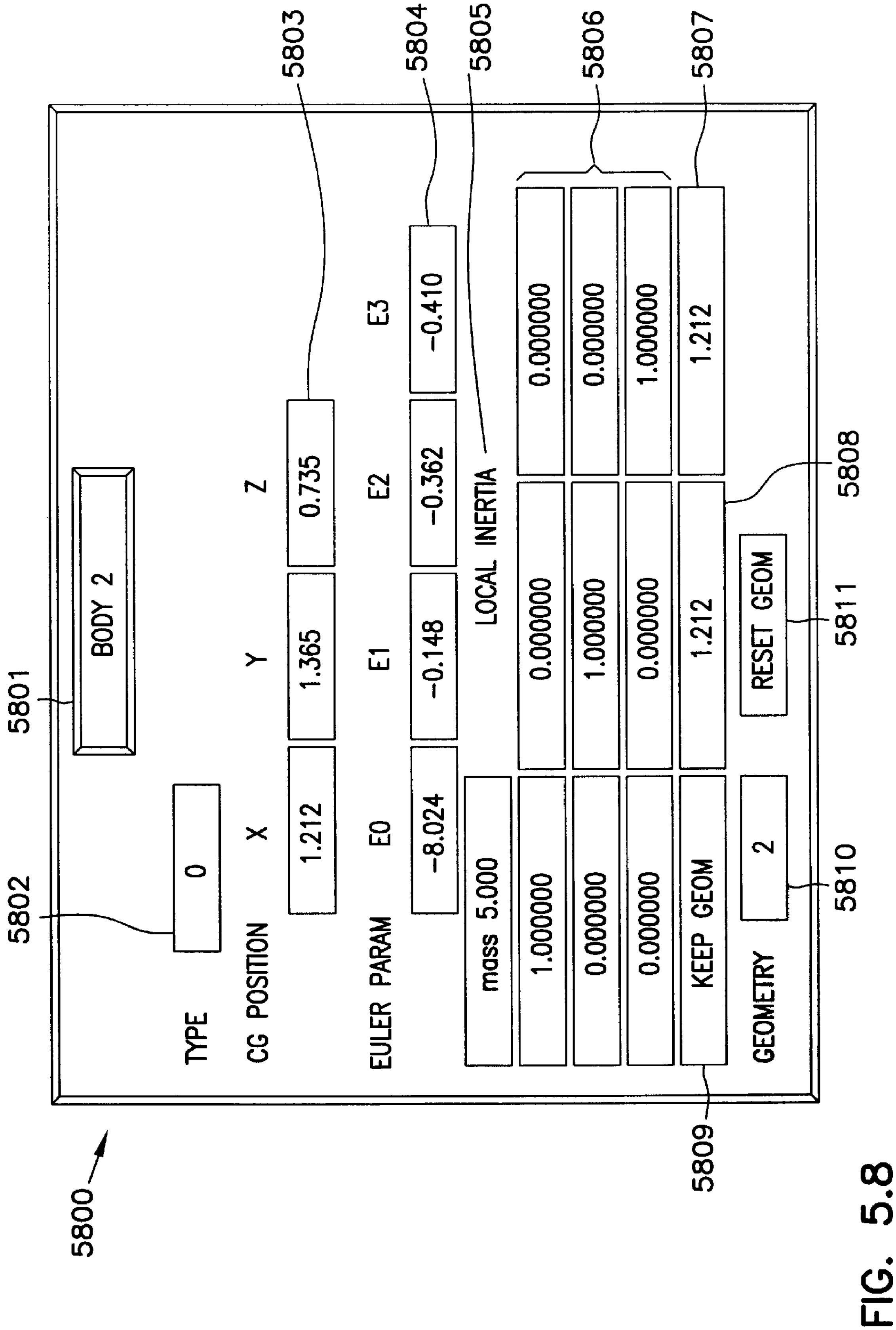
FIG. 5.8

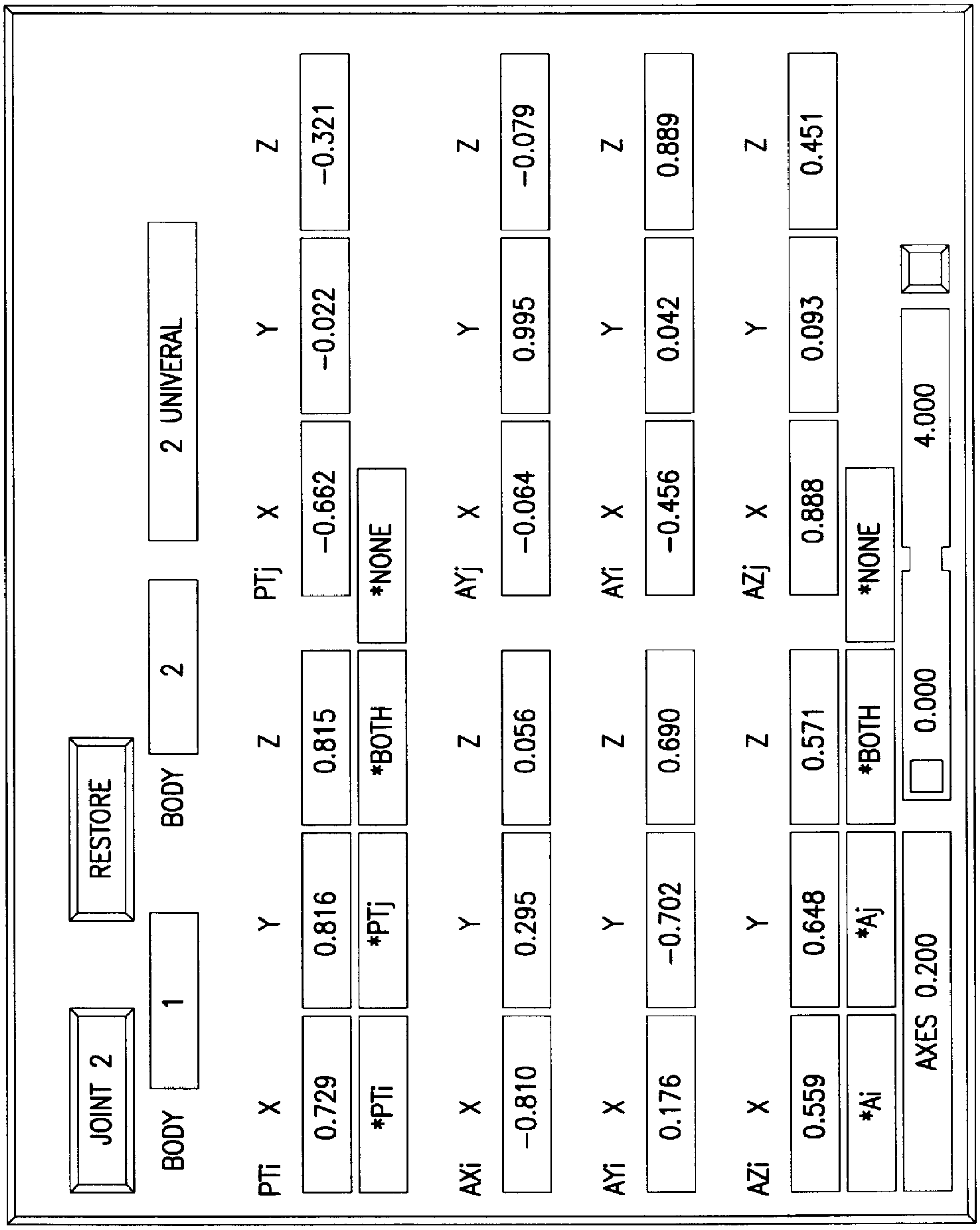
5900
FIG. 5.9
FIG. 5.9
| JOINT 2 | | | RESTORE | | | | | |
|---|---|---|---|---|---|---|---|---|
| BODY | 1 | | BODY | 2 | | 2 UNIVERAL | | |
| PTi | X | Y | Z | | PTj | X | Y | Z |
| | 0.729 | 0.816 | 0.815 | | | -0.662 | -0.022 | -0.321 |
| | *PTi | *PTj | *BOTH | | | *NONE | | |
| AXi | X | Y | Z | | AYj | X | Y | Z |
| | -0.810 | 0.295 | 0.056 | | | -0.064 | 0.995 | -0.079 |
| AYi | X | Y | Z | | AYi | X | Y | Z |
| | 0.176 | -0.702 | 0.690 | | | -0.456 | 0.042 | 0.889 |
| AZi | X | Y | Z | | AZj | X | Y | Z |
| | 0.559 | 0.648 | 0.571 | | | 0.888 | 0.093 | 0.451 |
| | *Ai | *Aj | *BOTH | | | *NONE | | |
| AXES 0.200 | | | 0.000 | | | 4.000 | | |

5910

| JOINT TYPE |
|---|
| 1 REVOLUTE<br>2 UNIVERSAL<br>3 SPHERICAL<br>4 TRANSLATIONAL<br>5 CYLINDRICAL<br>6 GROUND<br>7 SCREW |

FIG. 5.10

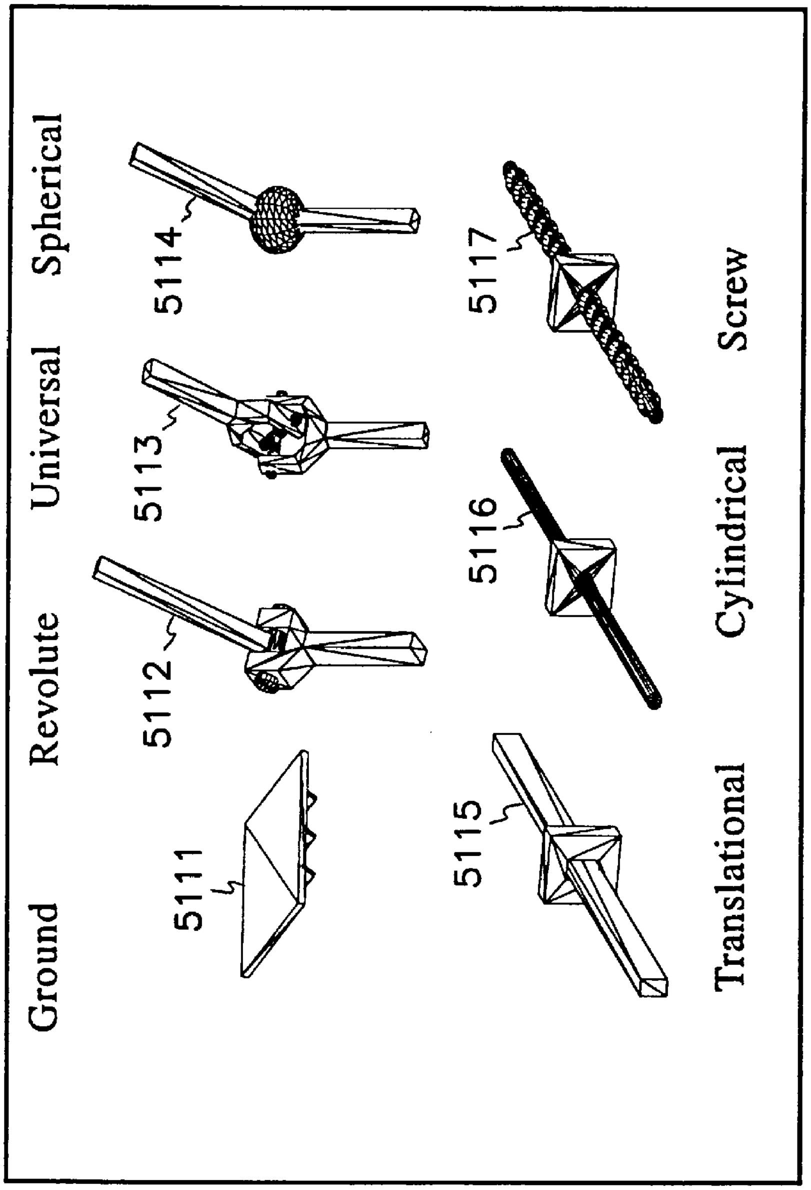
FIG. 5.11

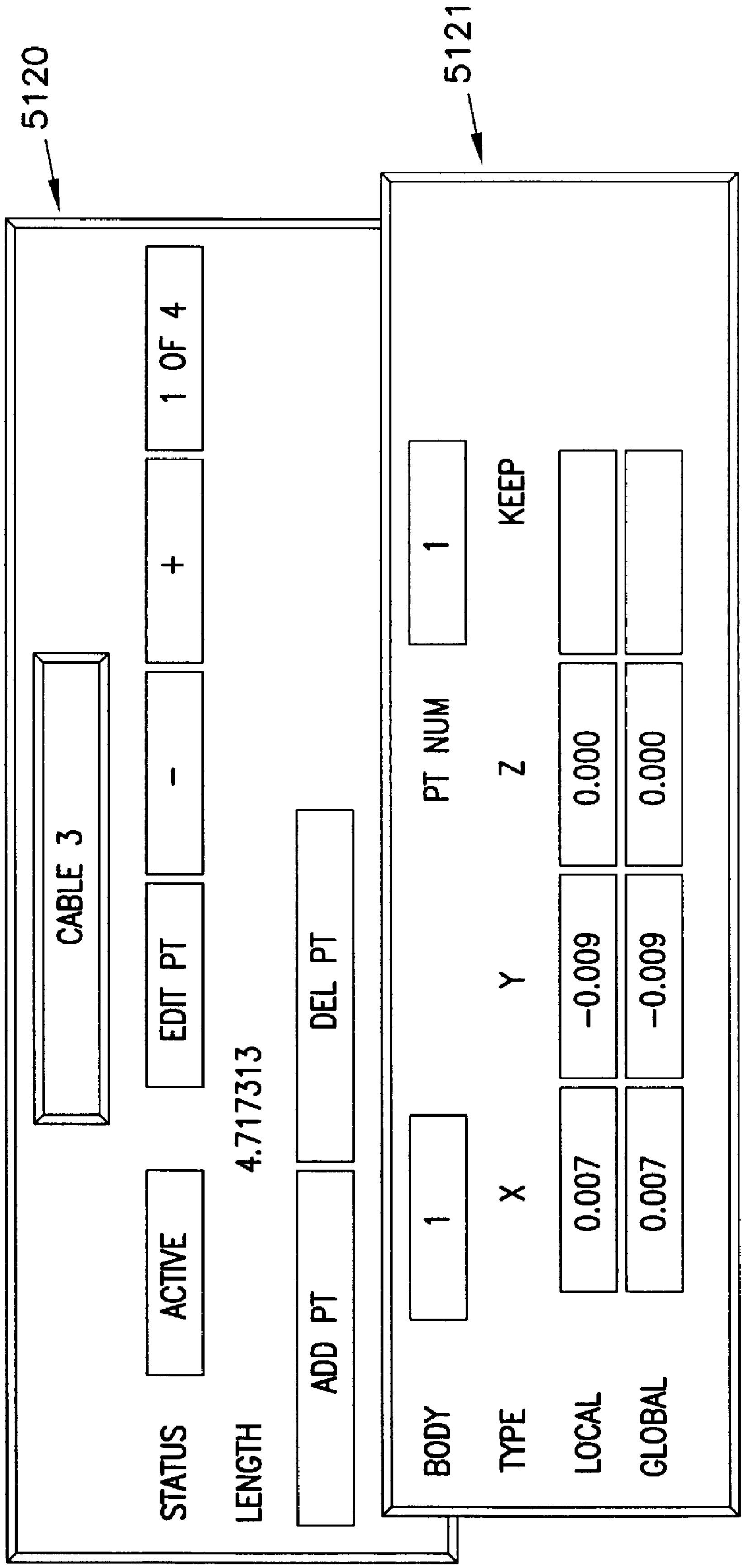
FIG. 5.12

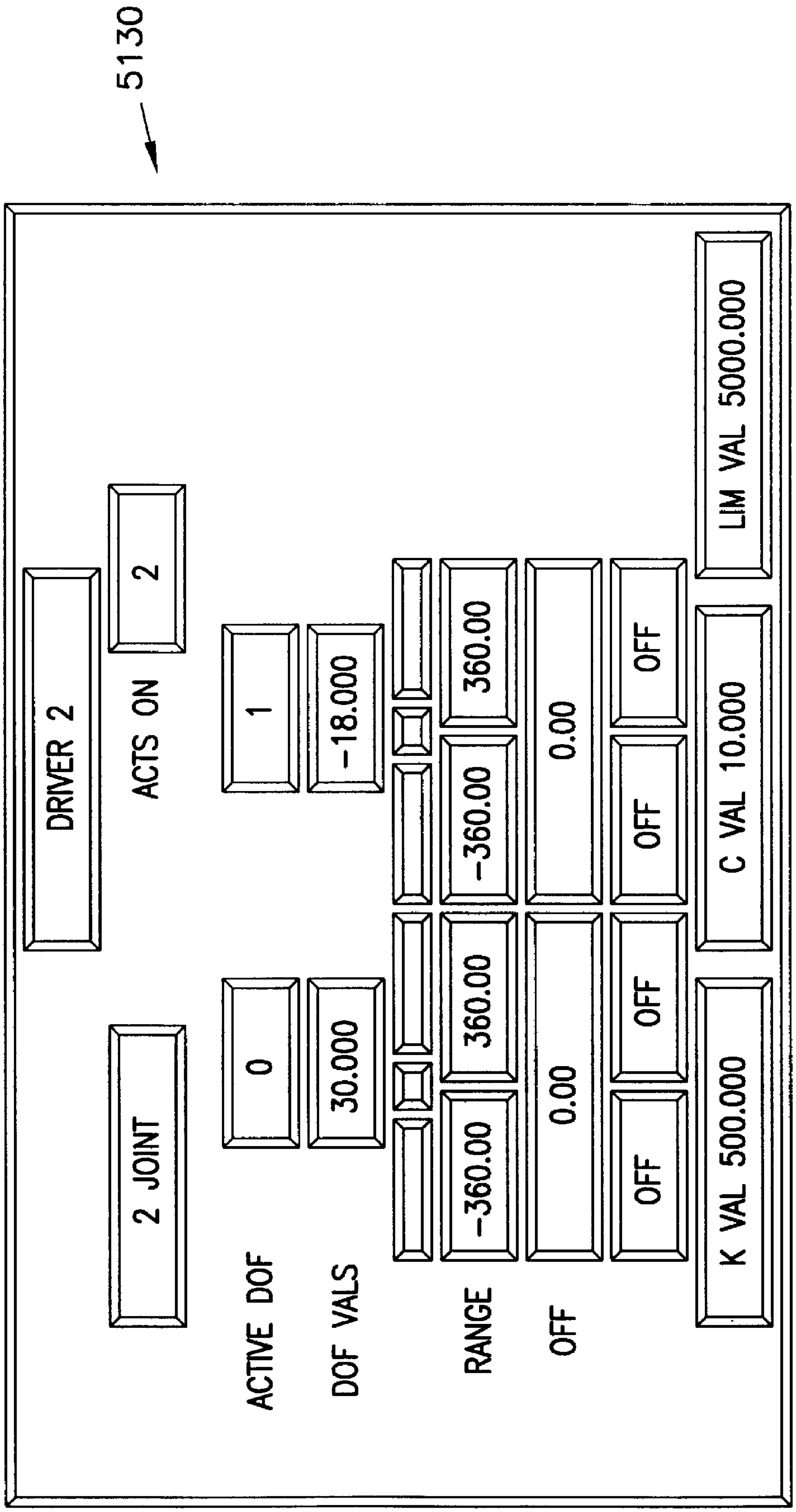
FIG. 5.13

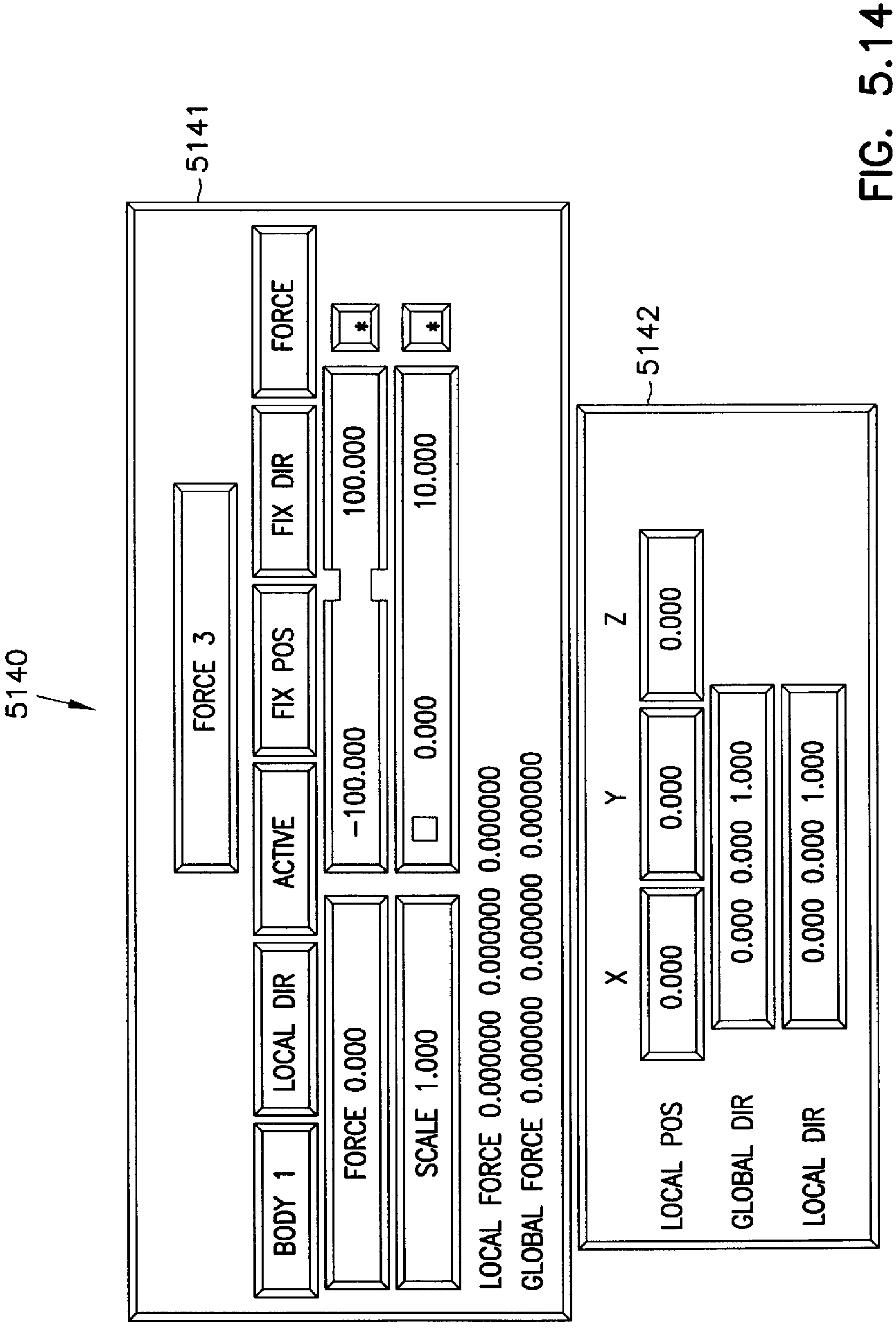
FIG. 5.14

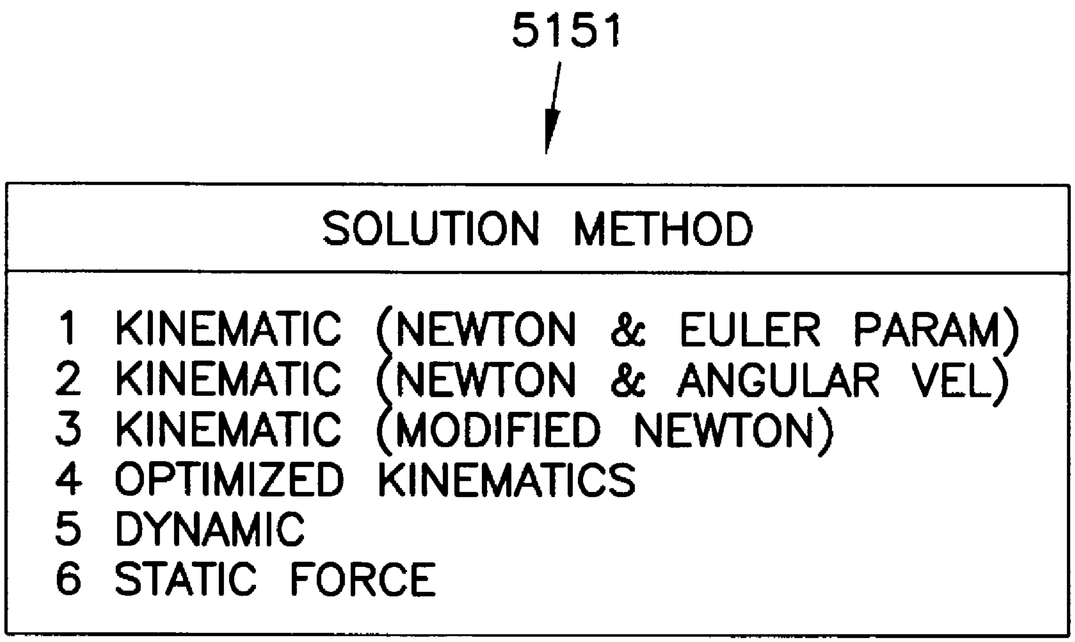
FIG. 5.15

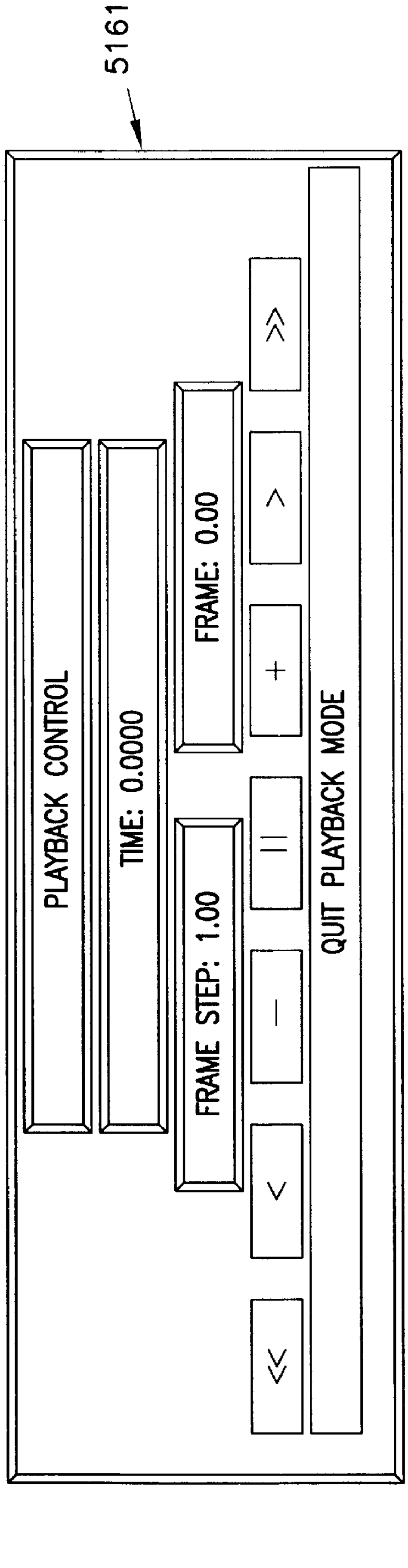
FIG. 5.16

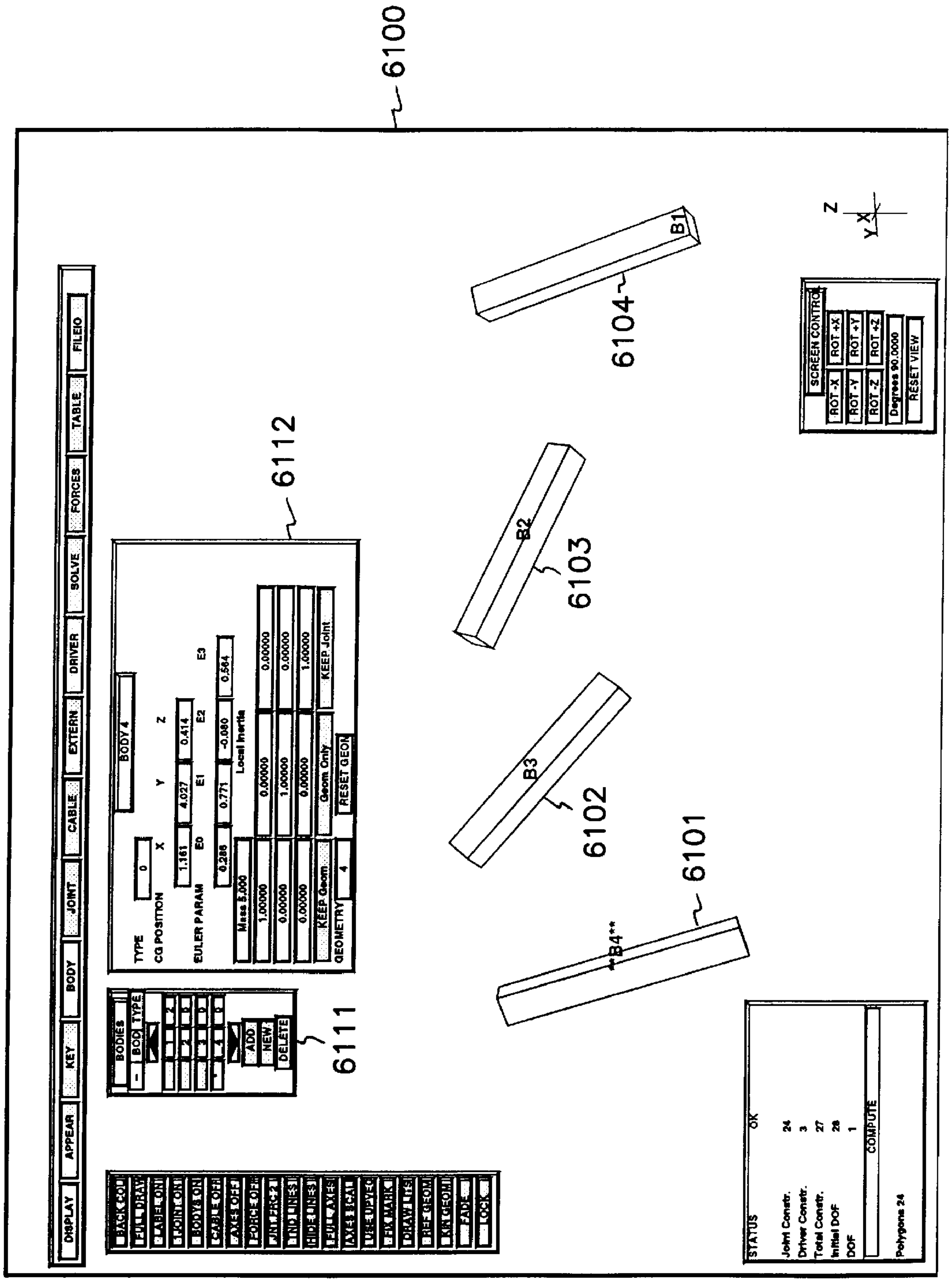
FIG. 6.1

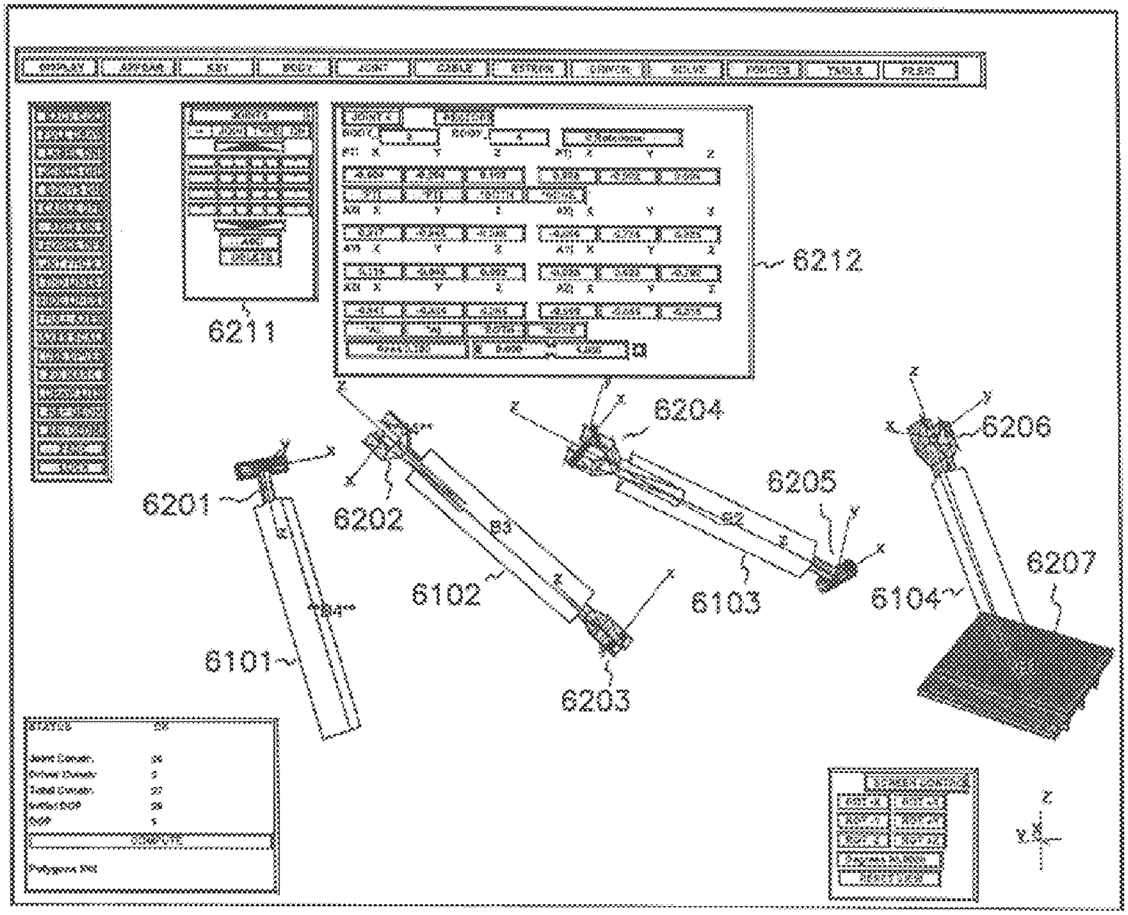
FIG. 6.2

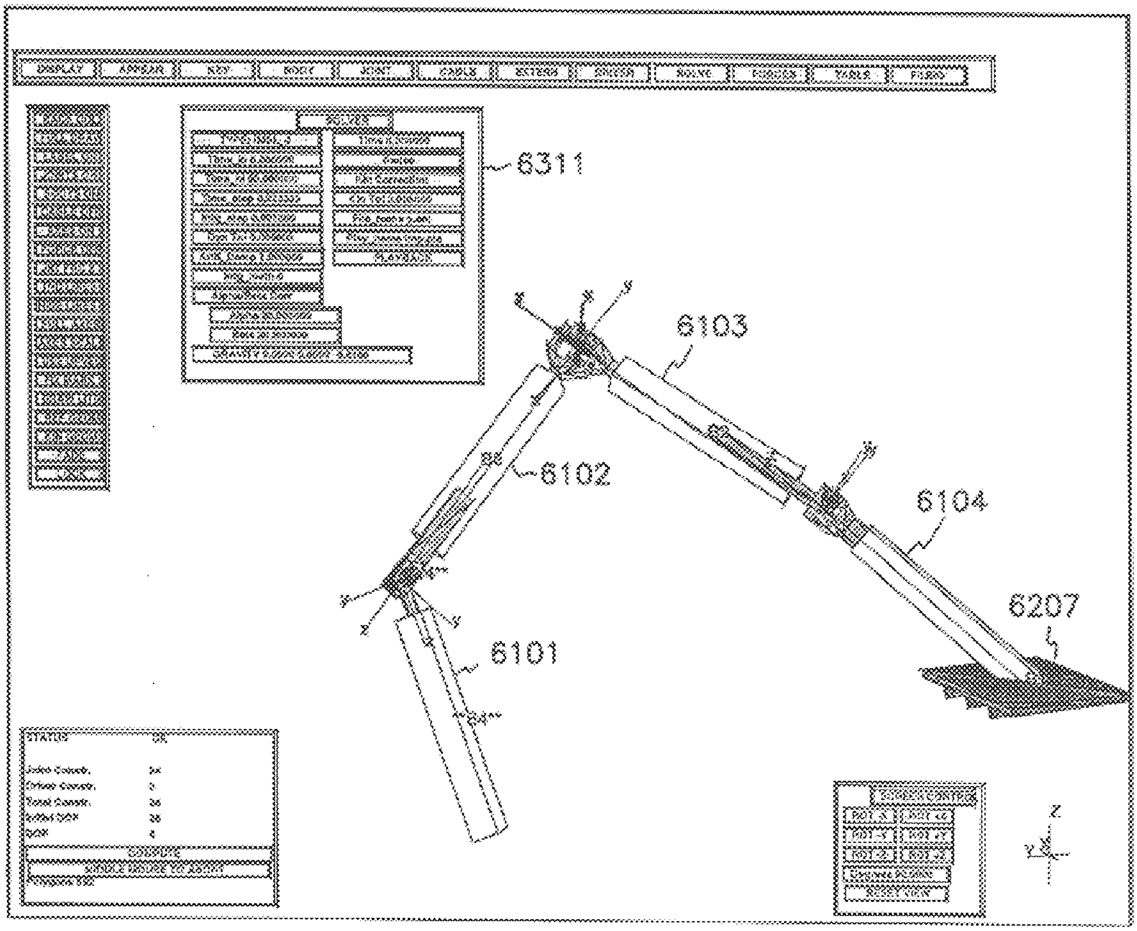
FIG. 6.3

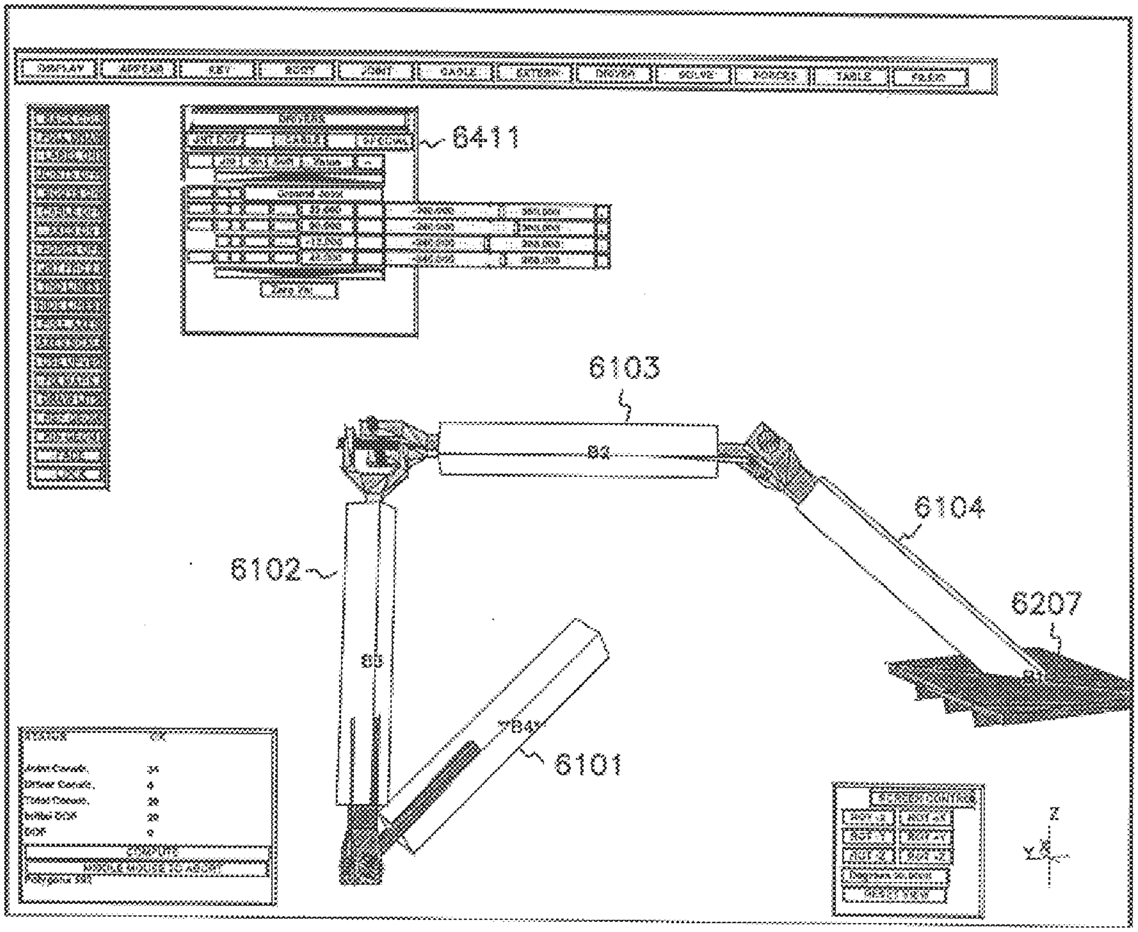
FIG. 6.4

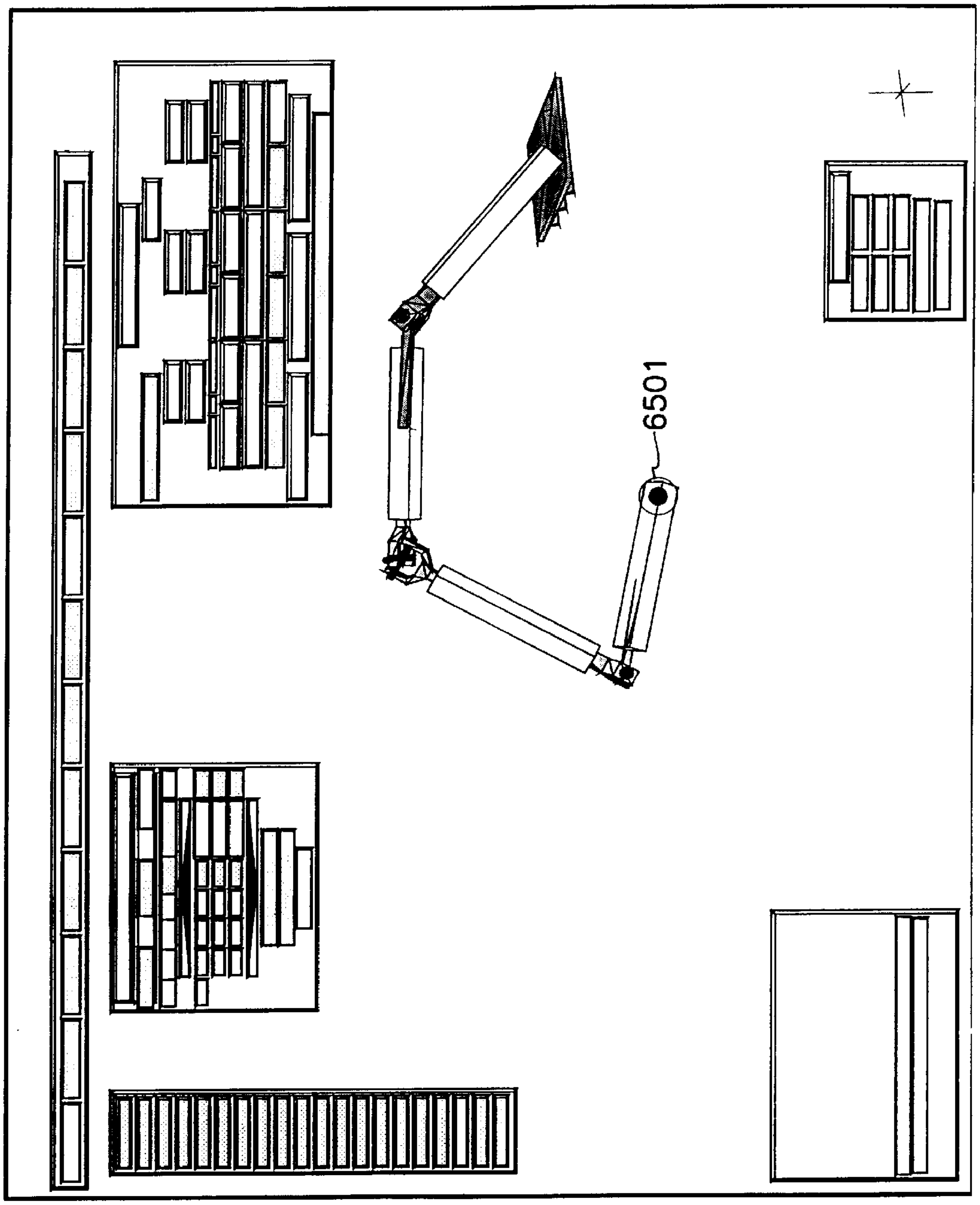
FIG. 6.5A

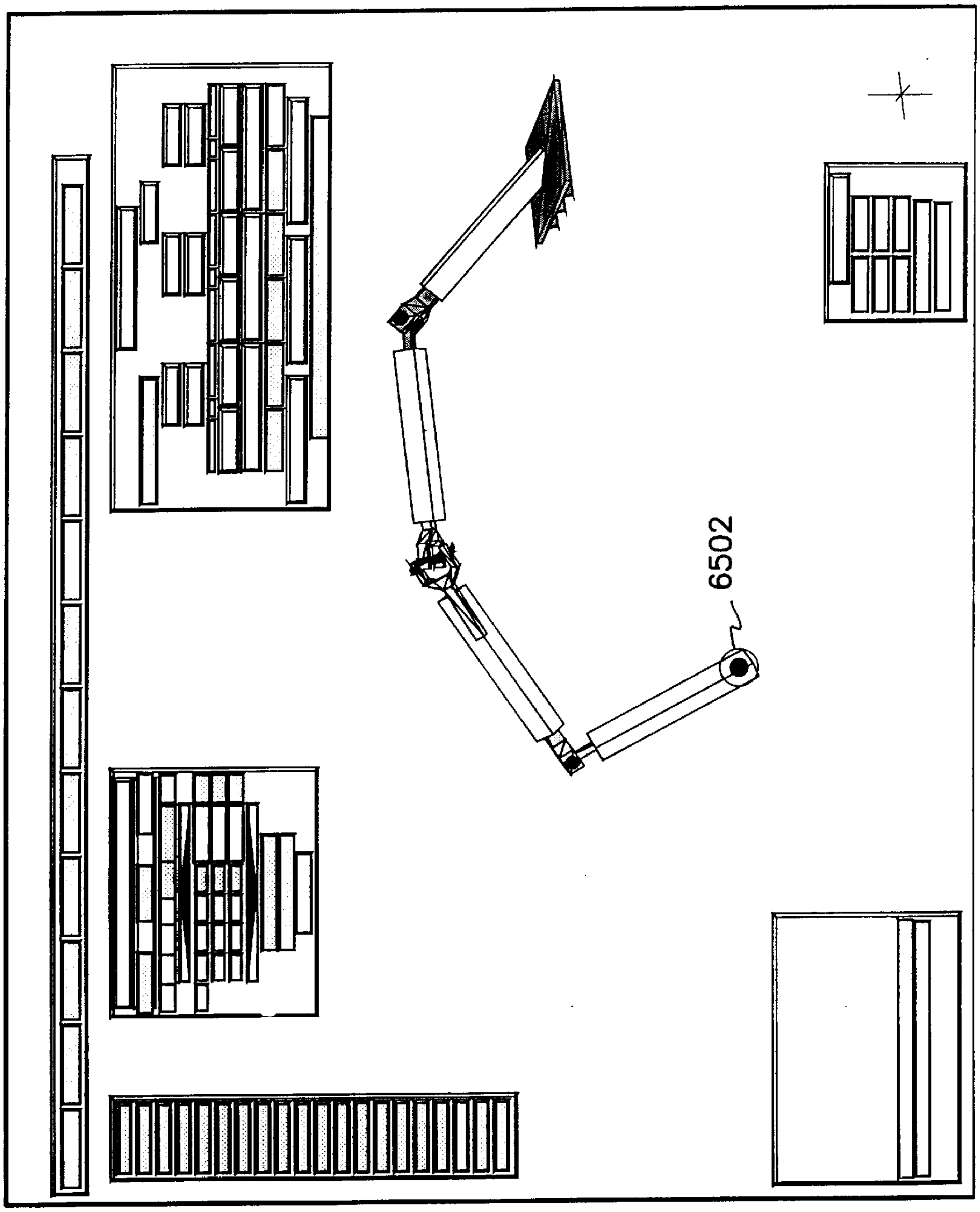
FIG. 6.5B

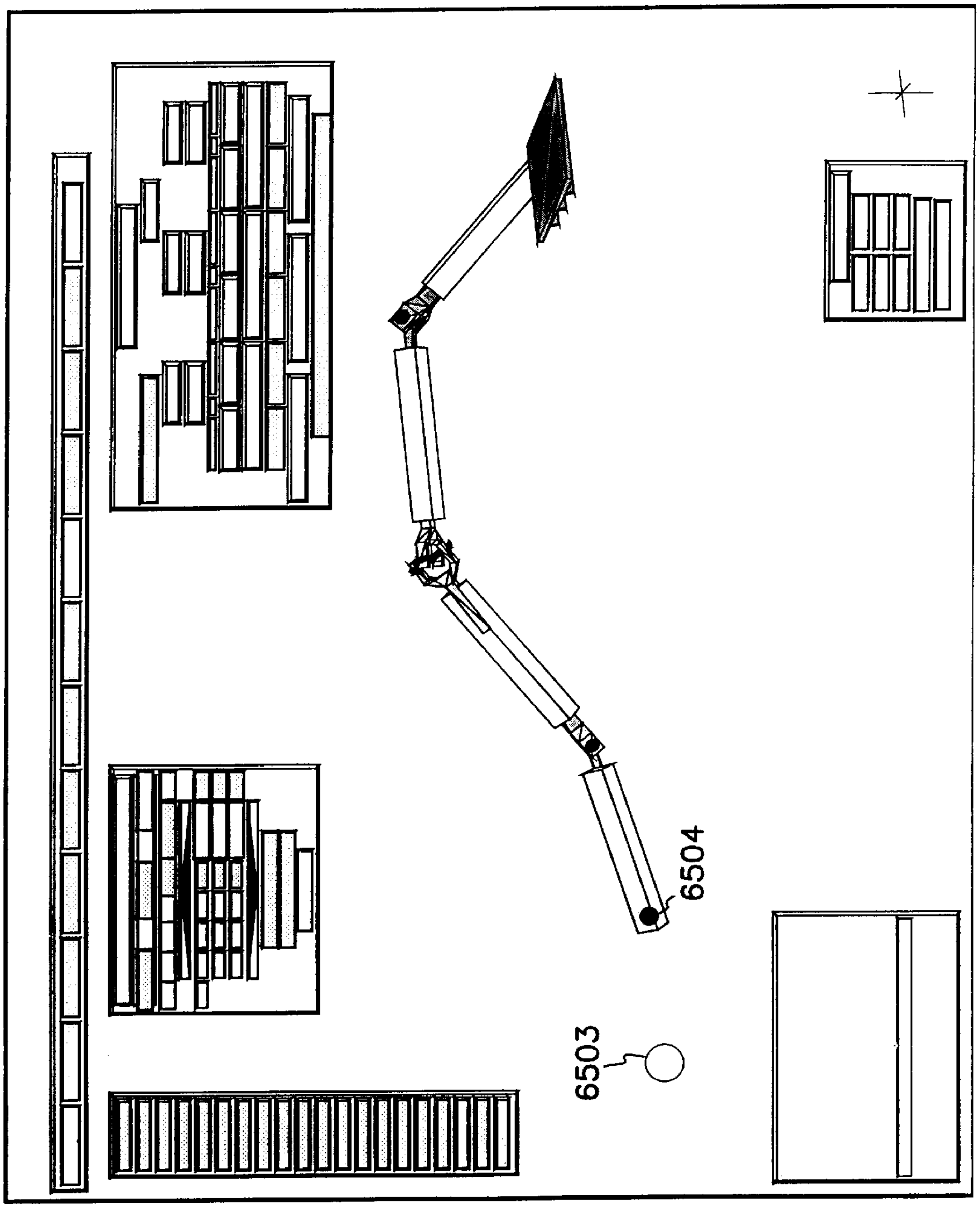
FIG. 6.5C

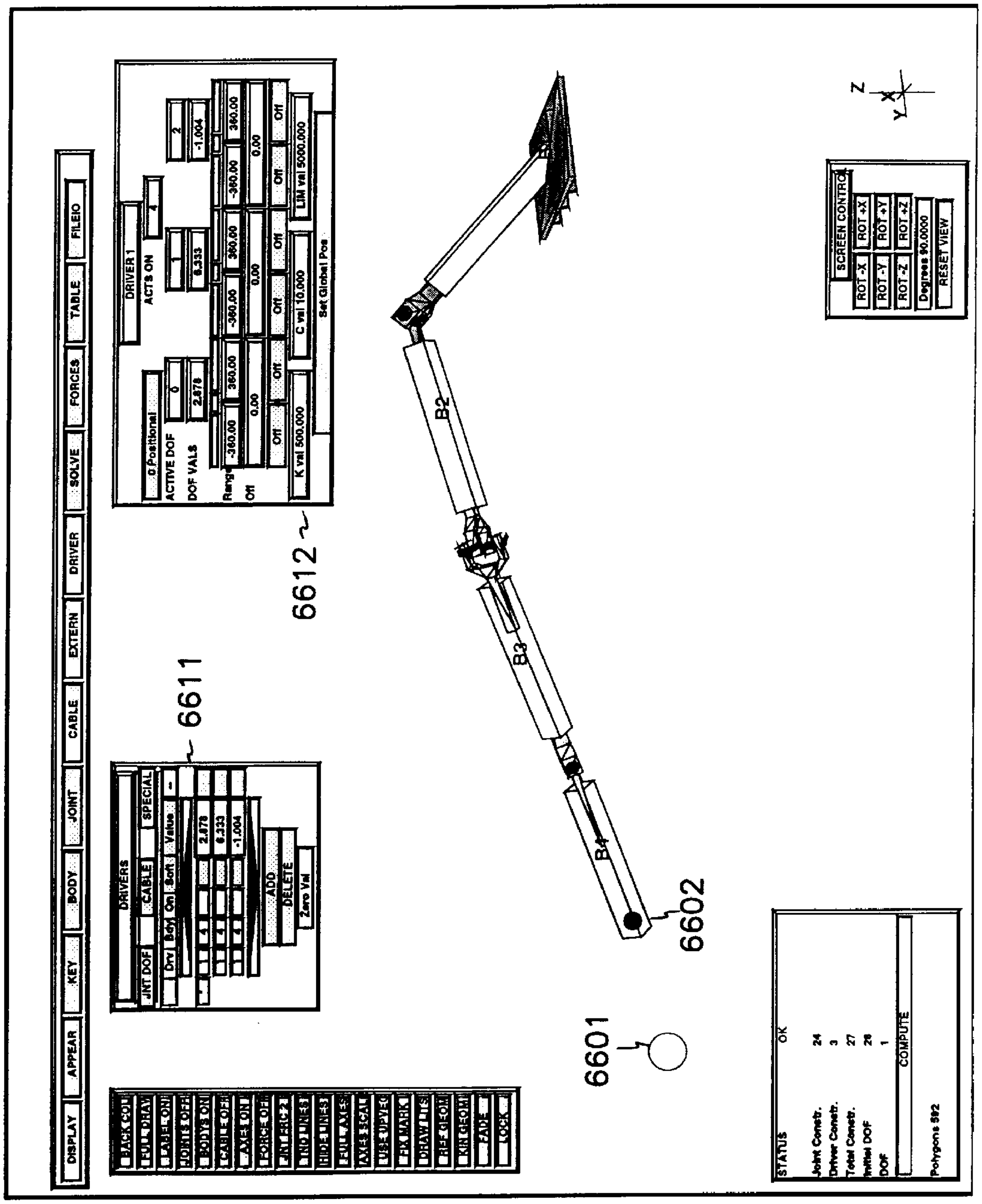
FIG. 6.6

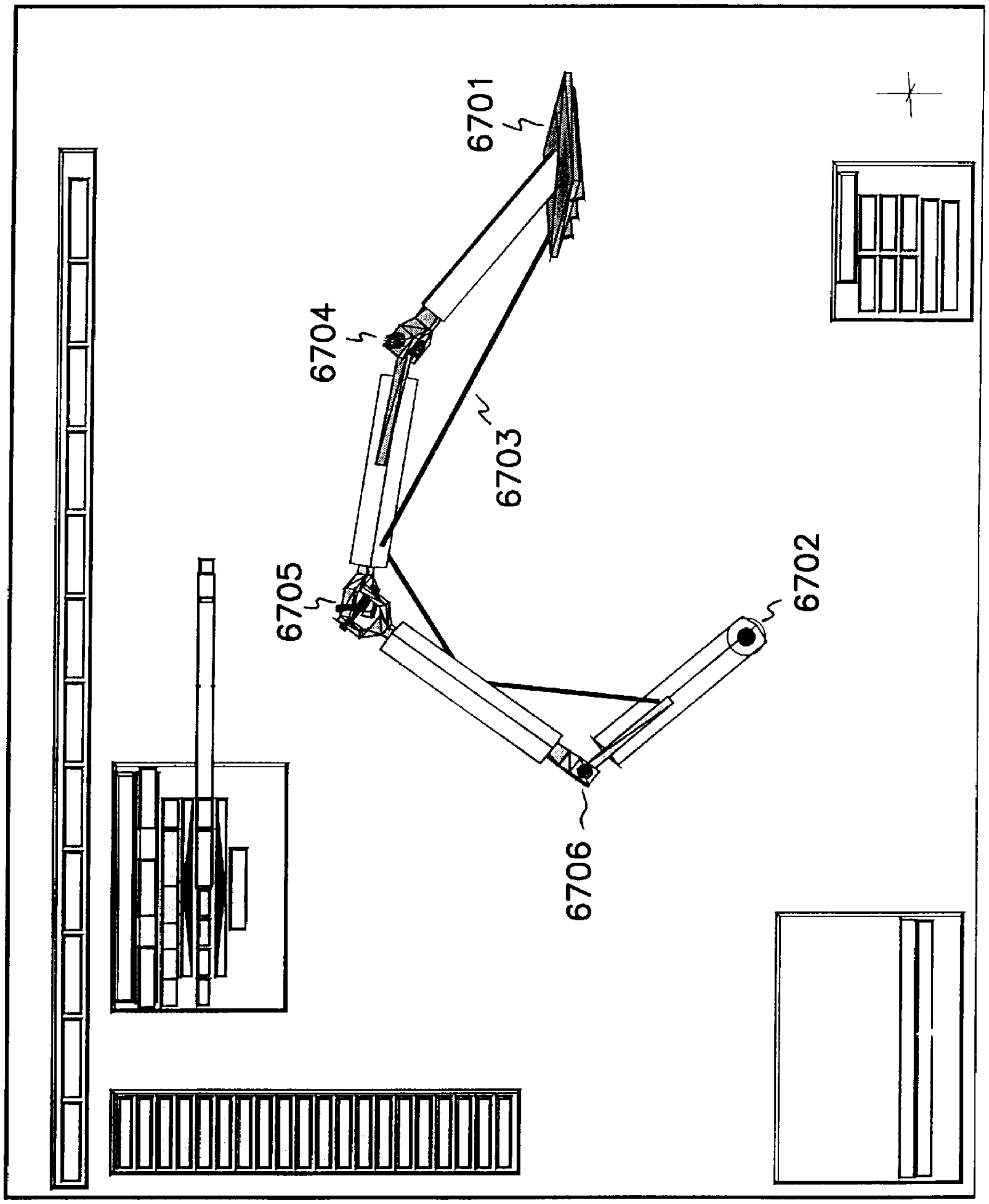
FIG. 6.7A

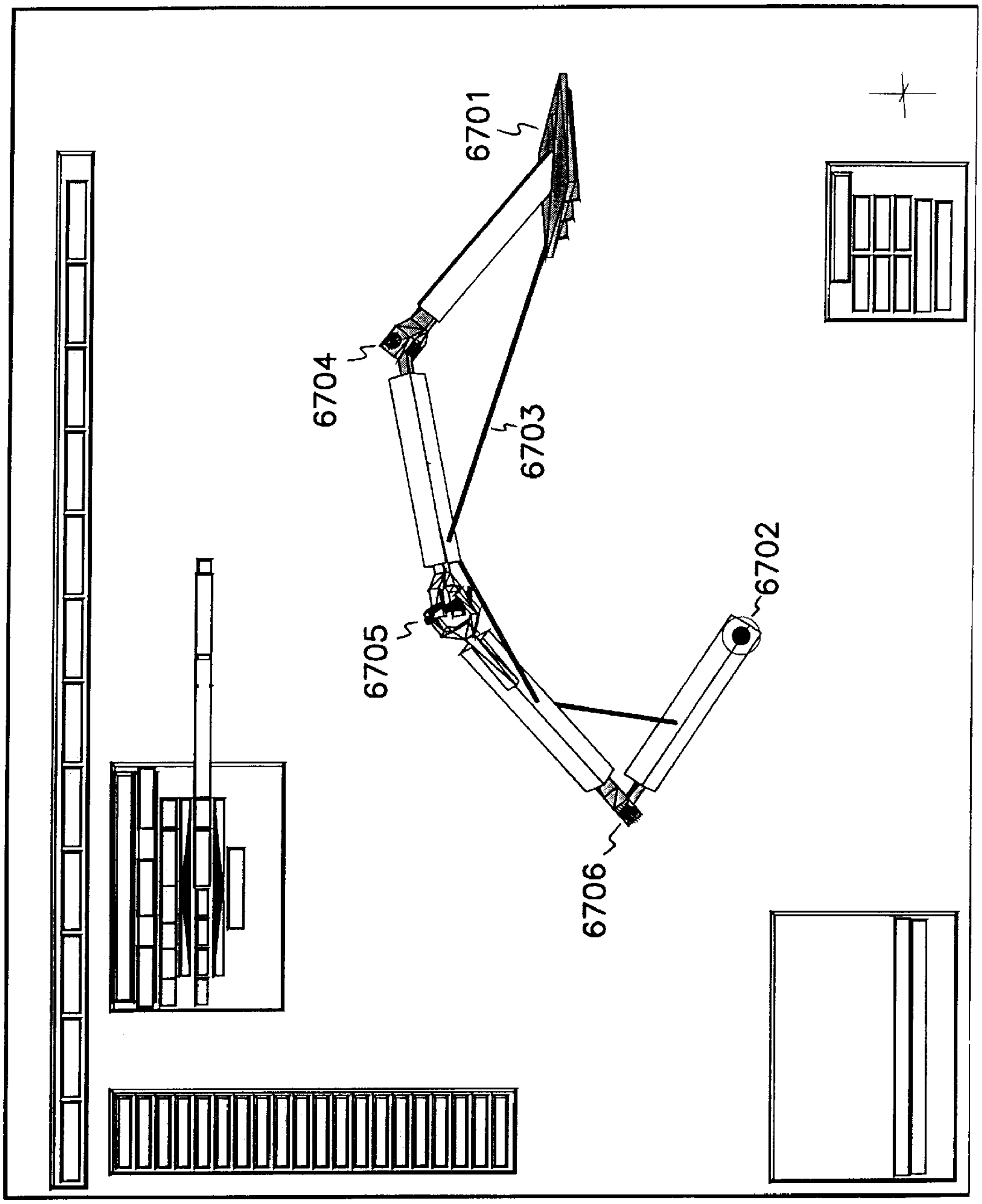
FIG. 6.7B

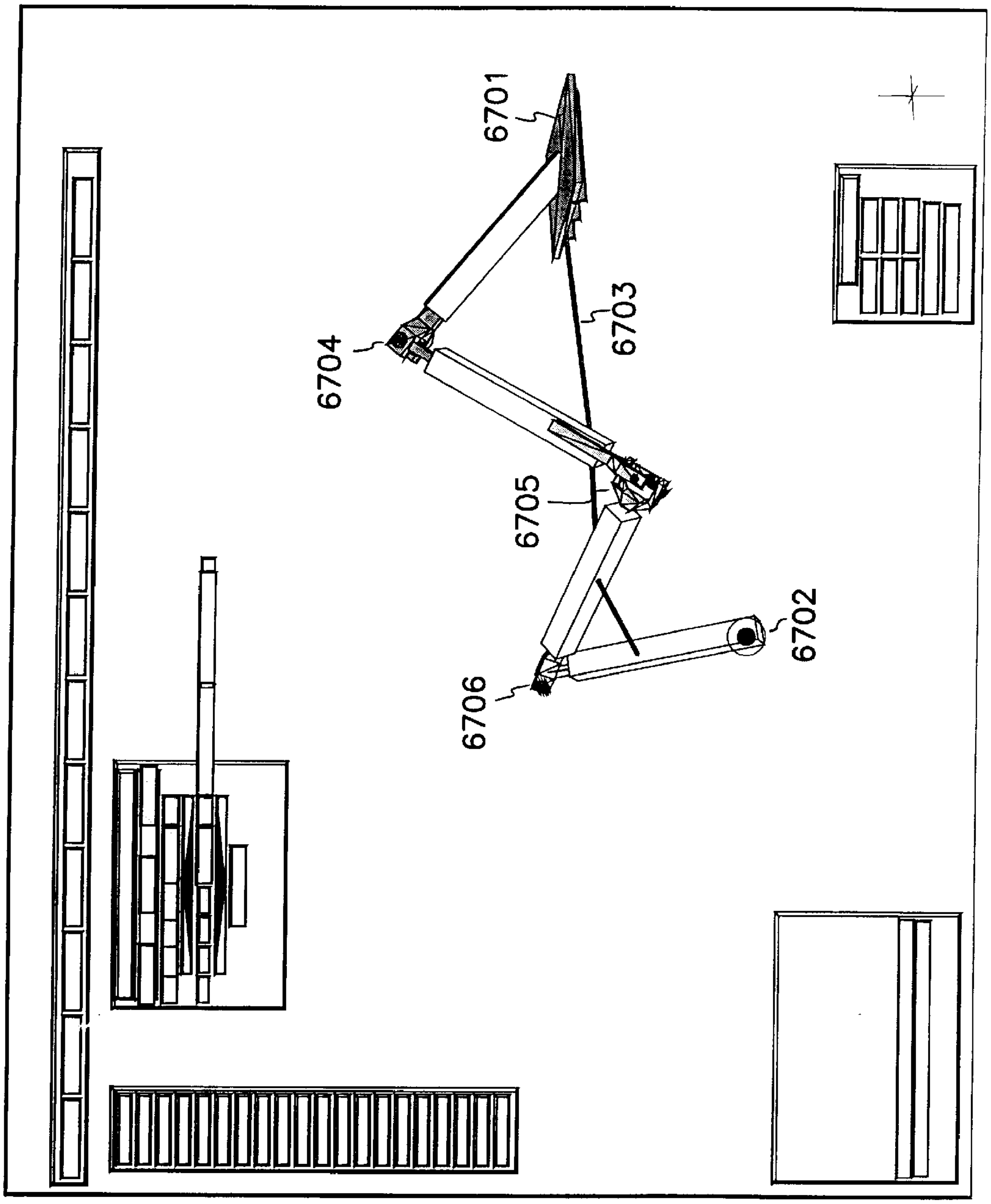
FIG. 6.7C

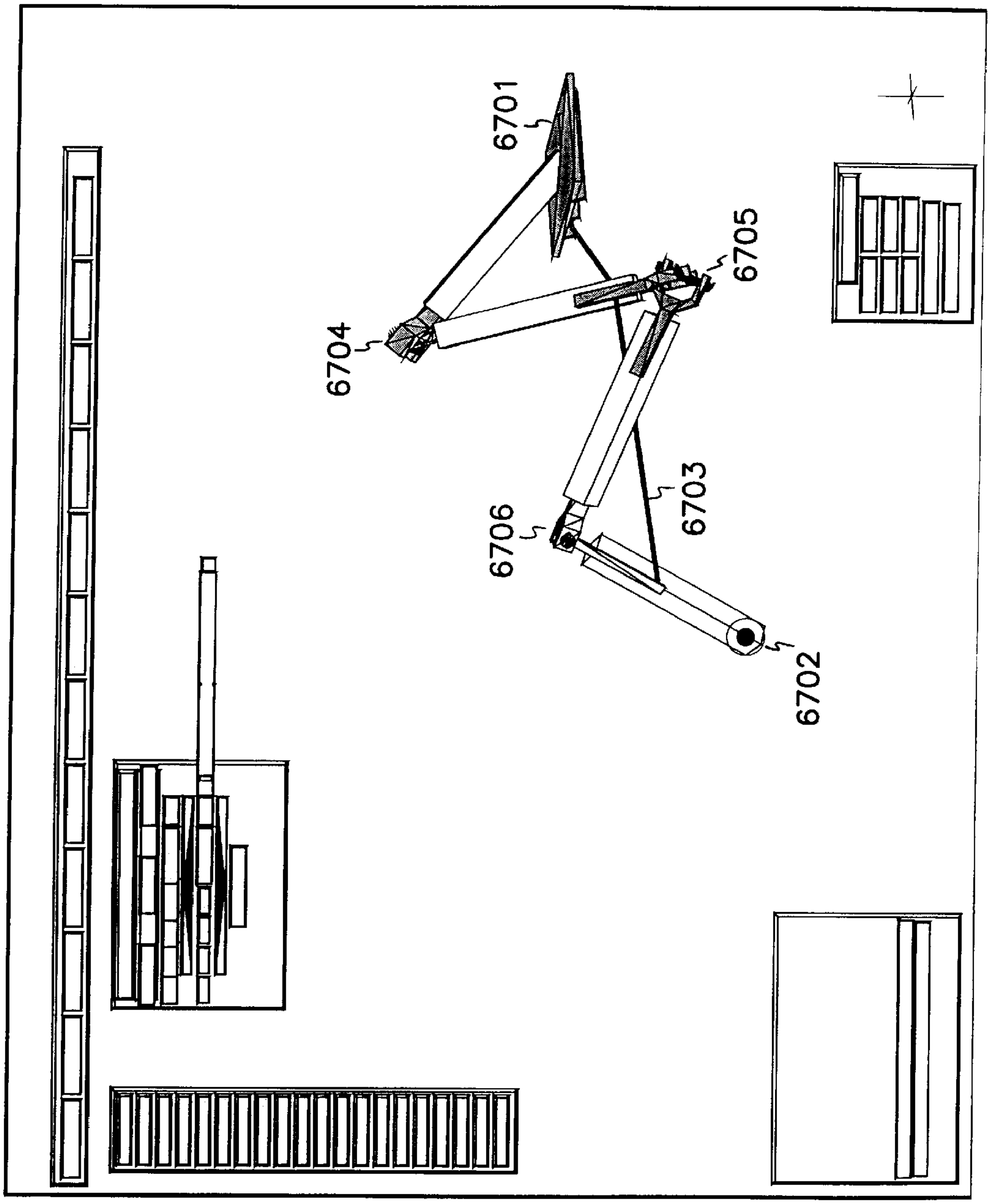
FIG. 6.7D

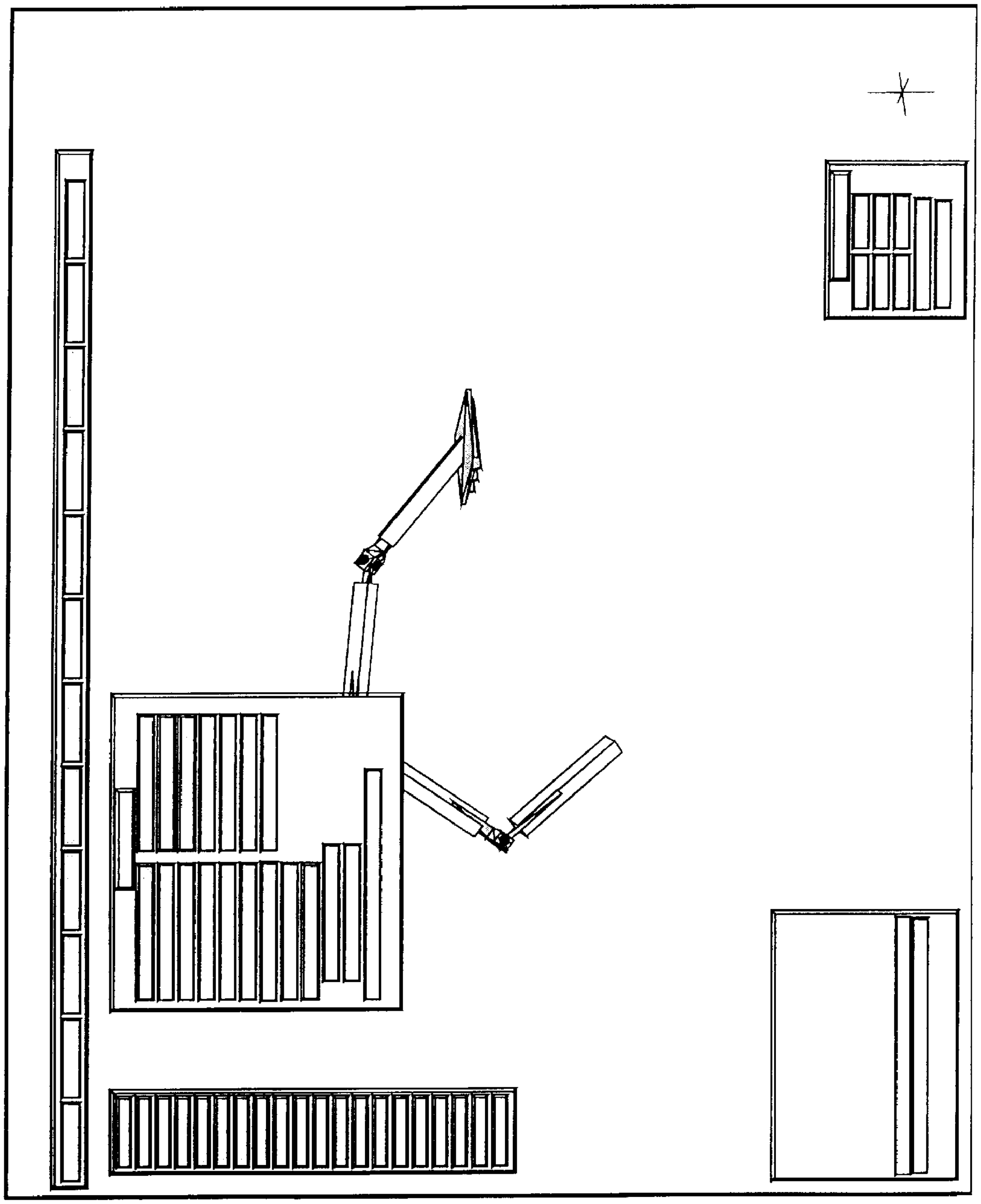
FIG. 6.8A

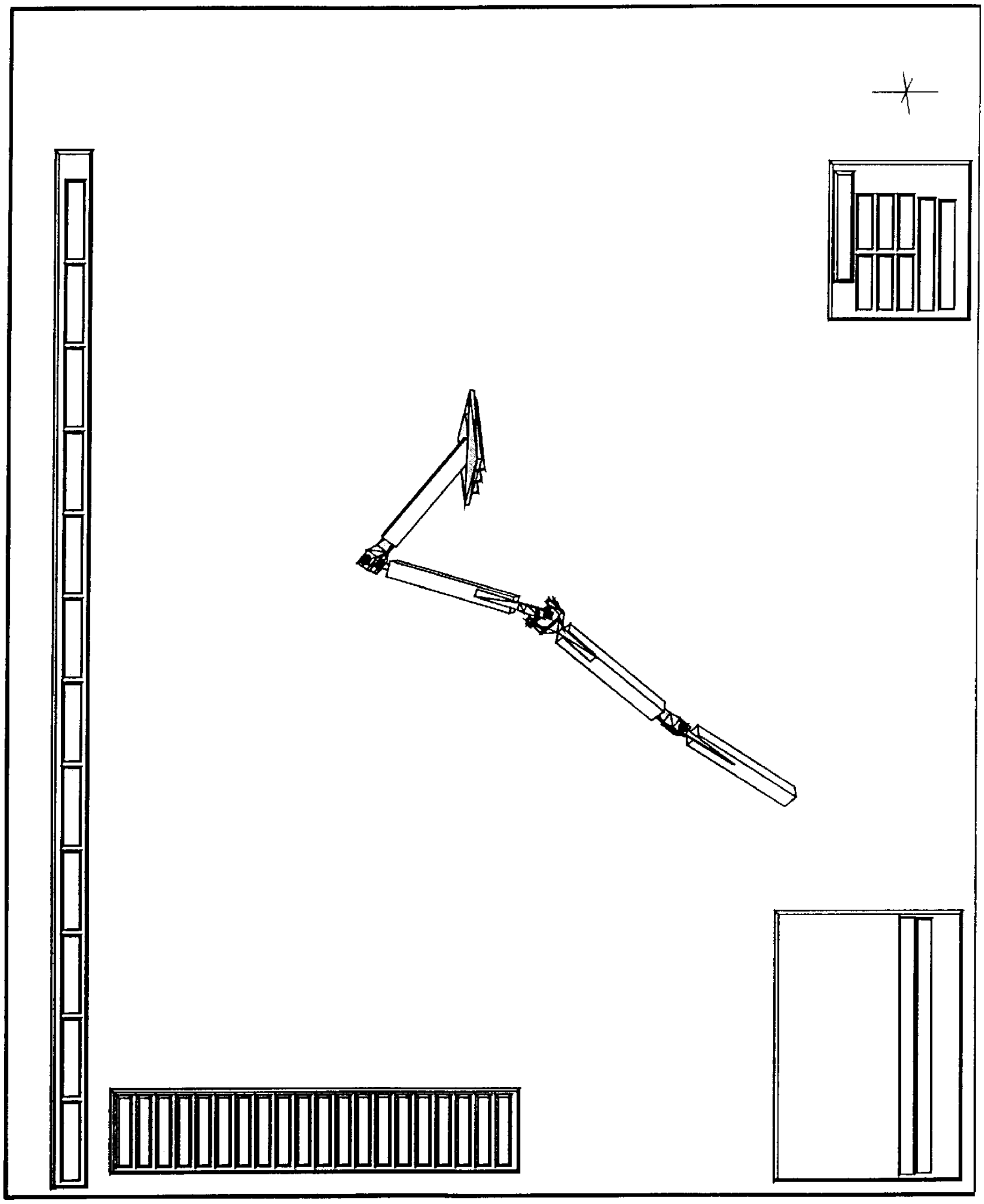
FIG. 6.8B

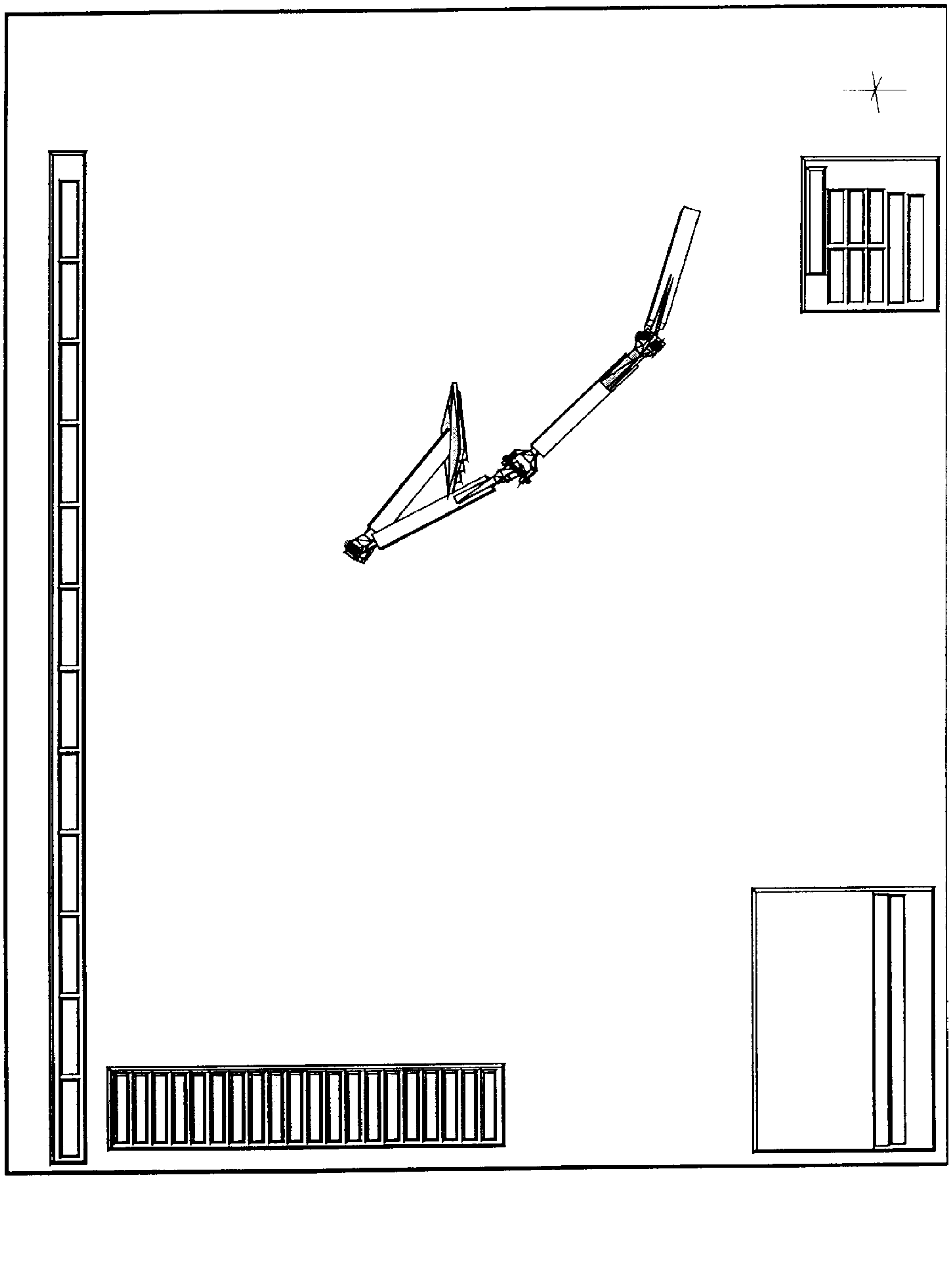
FIG. 6.8C

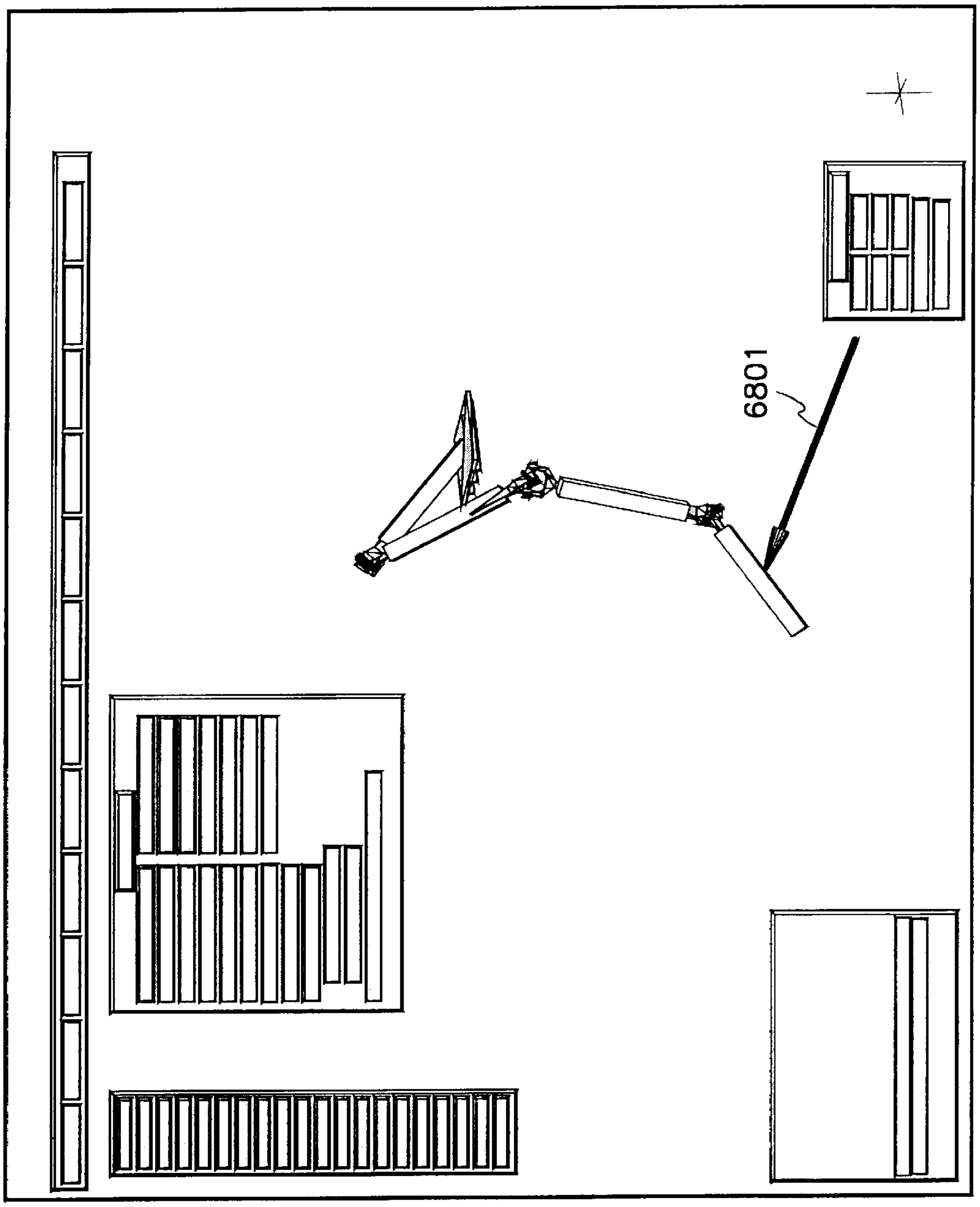
FIG. 6.8D

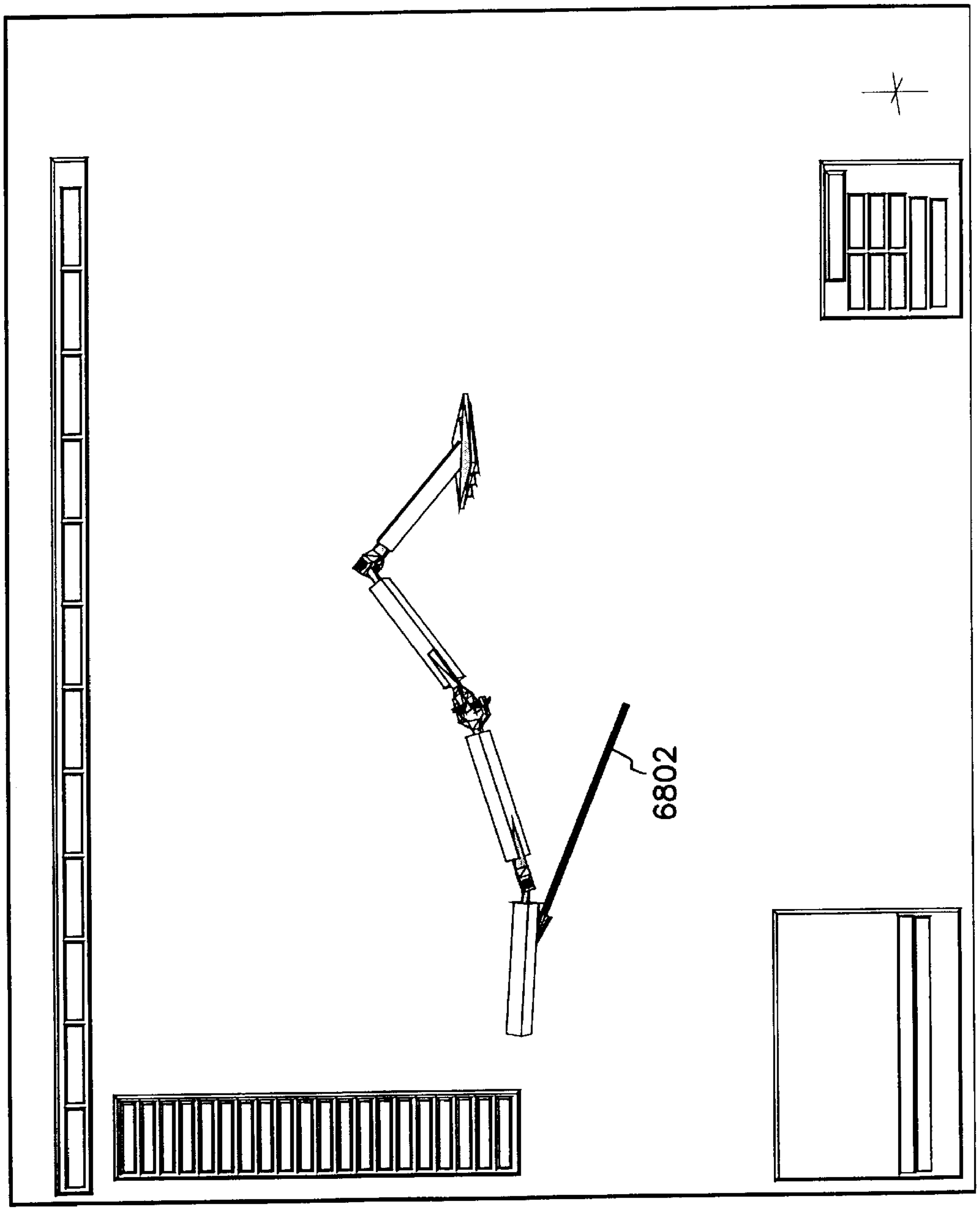
FIG. 6.8E

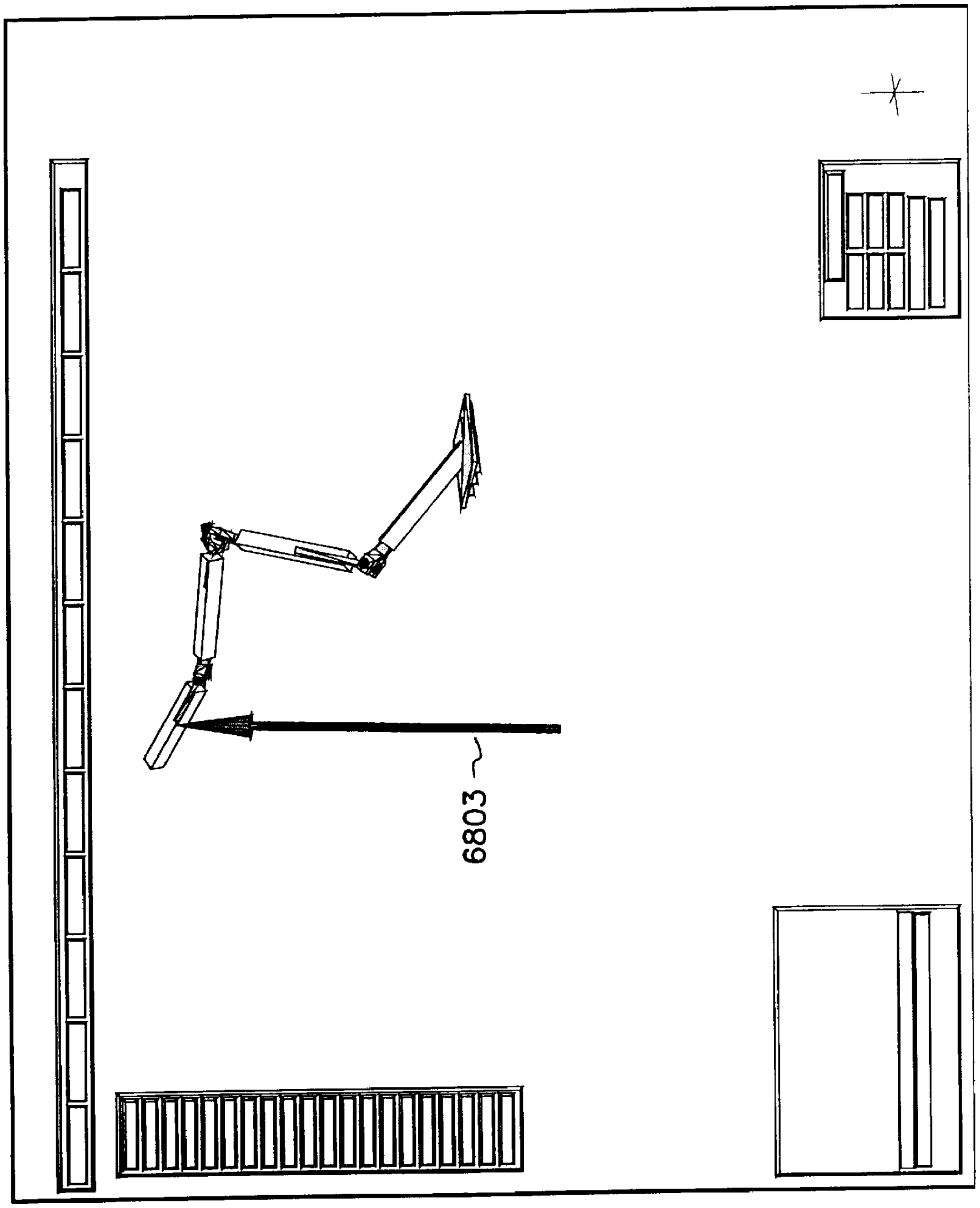
FIG. 6.8F

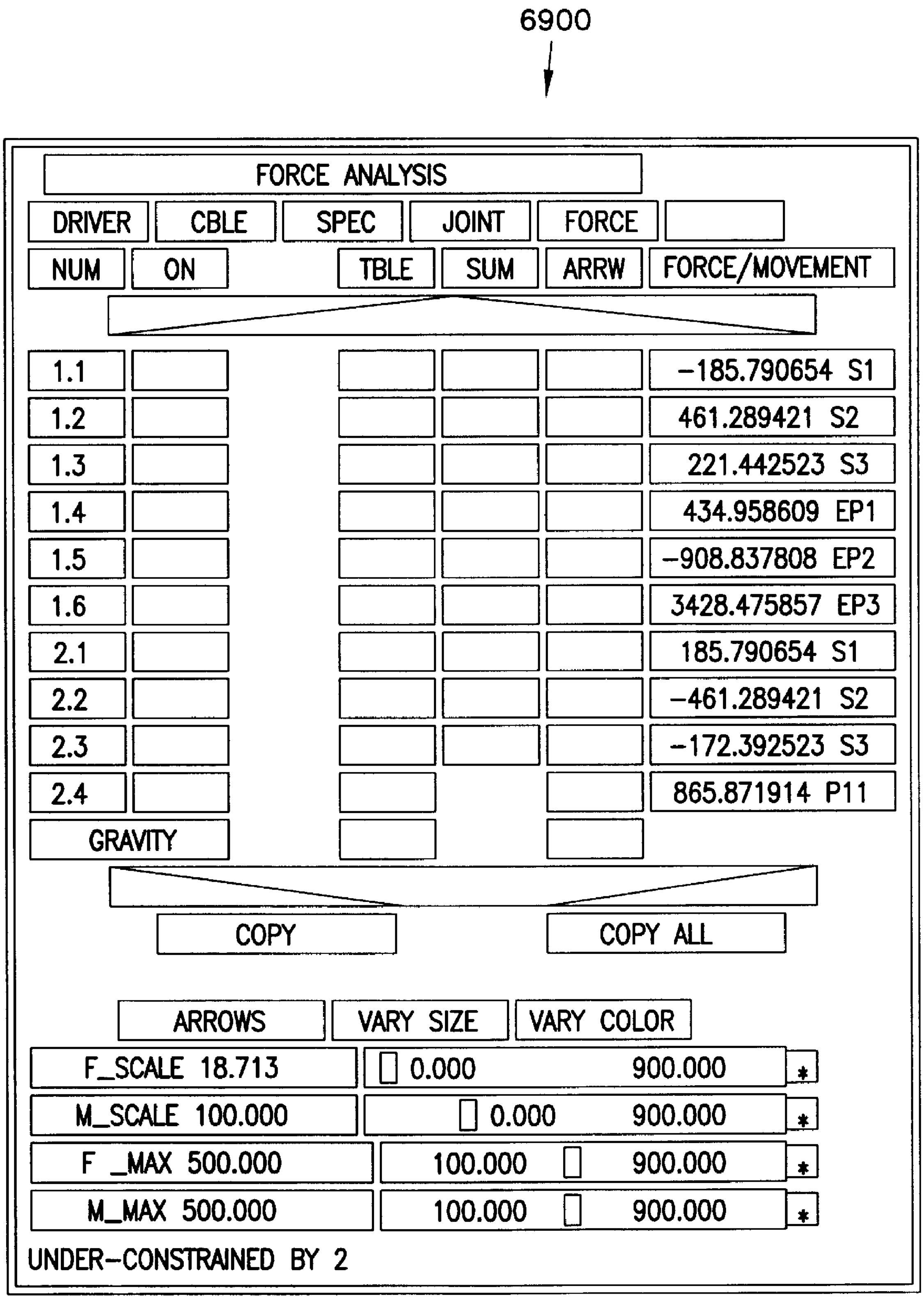
FIG. 6.9
6900 ↓
| FORCE ANALYSIS | | | | | |
|---|---|---|---|---|---|
| DRIVER | CBLE | SPEC | JOINT | FORCE | |
| NUM | ON | TBLE | SUM | ARRW | FORCE/MOVEMENT |
| 1.1 | | | | | −185.790654 S1 |
| 1.2 | | | | | 461.289421 S2 |
| 1.3 | | | | | 221.442523 S3 |
| 1.4 | | | | | 434.958609 EP1 |
| 1.5 | | | | | −908.837808 EP2 |
| 1.6 | | | | | 3428.475857 EP3 |
| 2.1 | | | | | 185.790654 S1 |
| 2.2 | | | | | −461.289421 S2 |
| 2.3 | | | | | −172.392523 S3 |
| 2.4 | | | | | 865.871914 P11 |
| GRAVITY | | | | | |
| COPY | COPY ALL |
|---|---|
| ARROWS | VARY SIZE | VARY COLOR |
|---|---|---|
| F_SCALE 18.713 | ☐ 0.000 | 900.000 | * |
| M_SCALE 100.000 | ☐ 0.000 | 900.000 | * |
| F_MAX 500.000 | 100.000 | ☐ 900.000 | * |
| M_MAX 500.000 | 100.000 | ☐ 900.000 | * |
UNDER-CONSTRAINED BY 2
FIG. 6.9

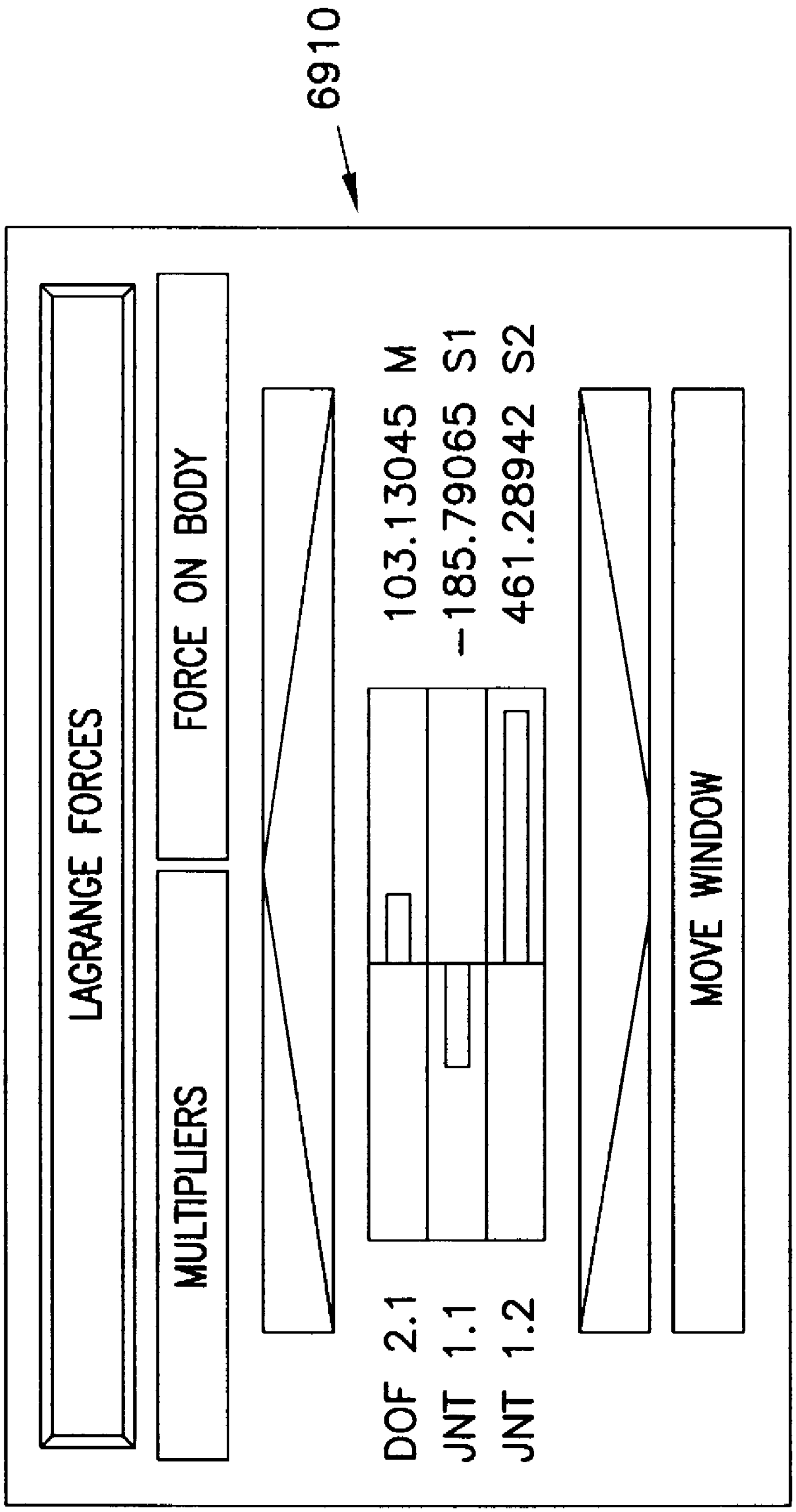
FIG. 6.10

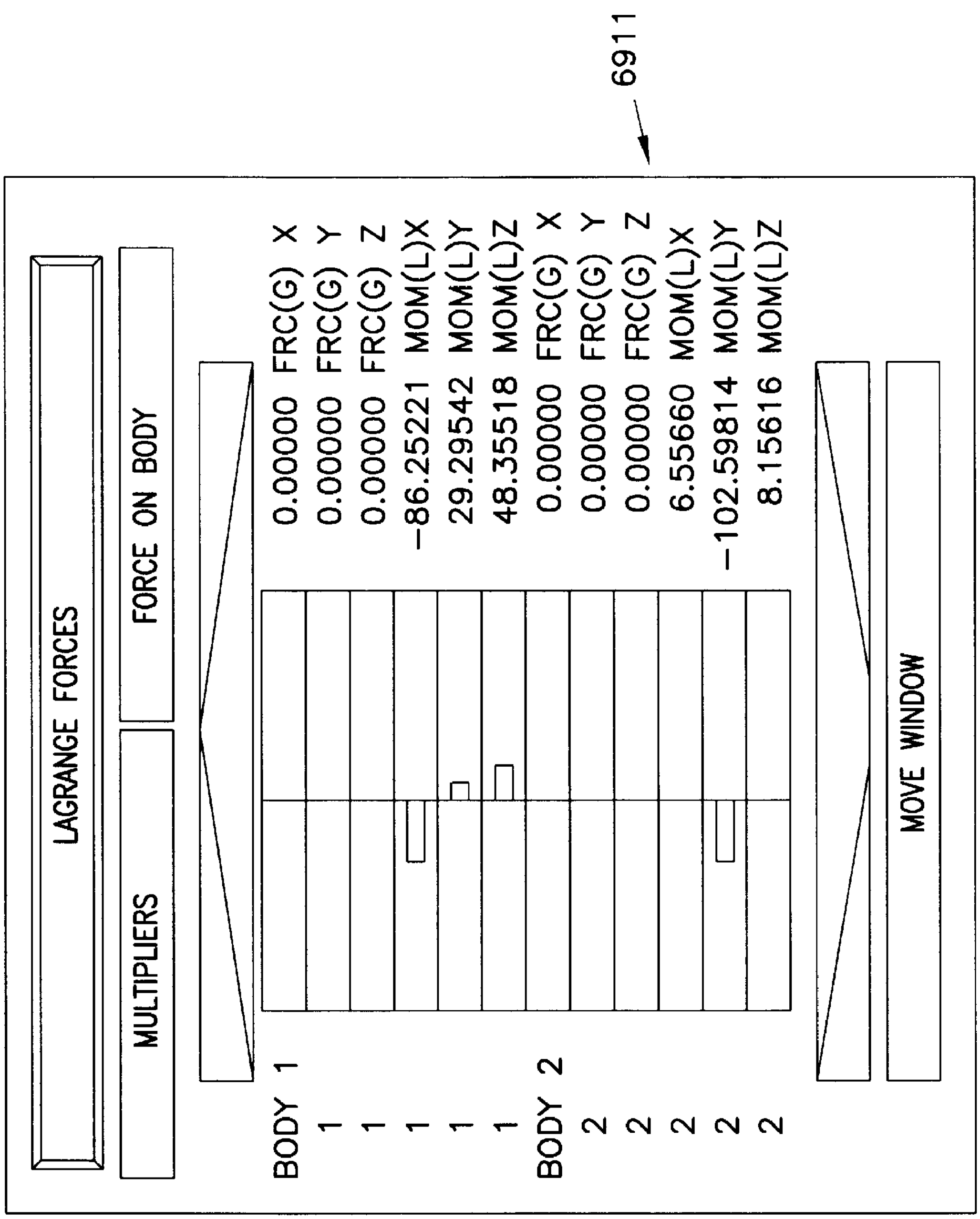
FIG. 6.11

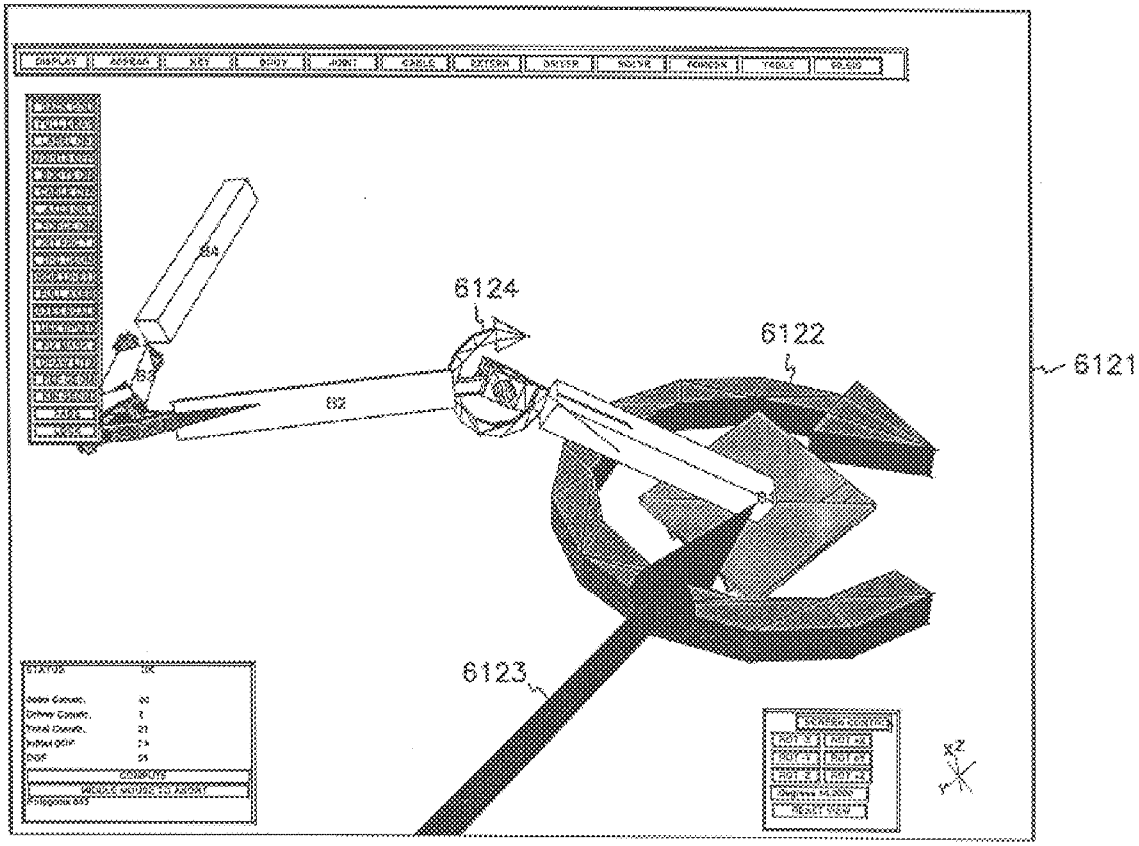
FIG. 6.12A

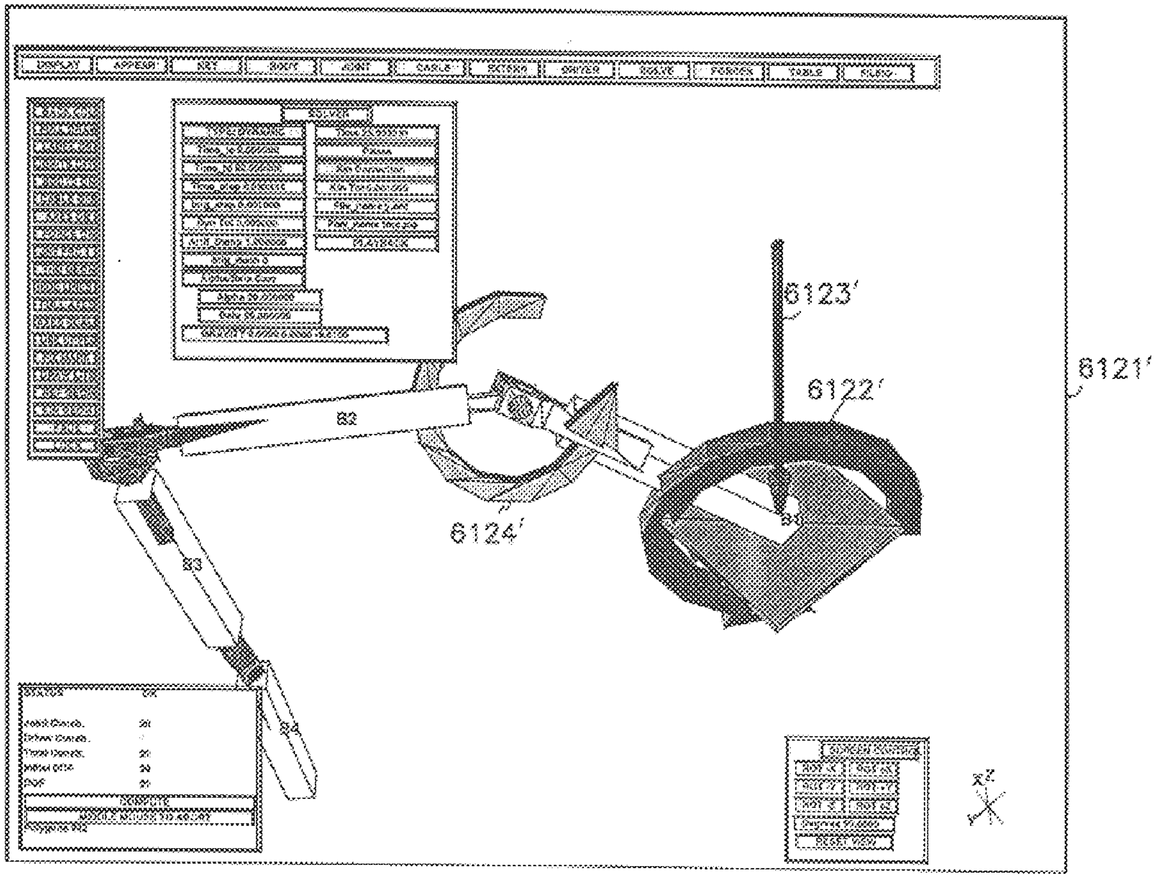
FIG. 6.12B

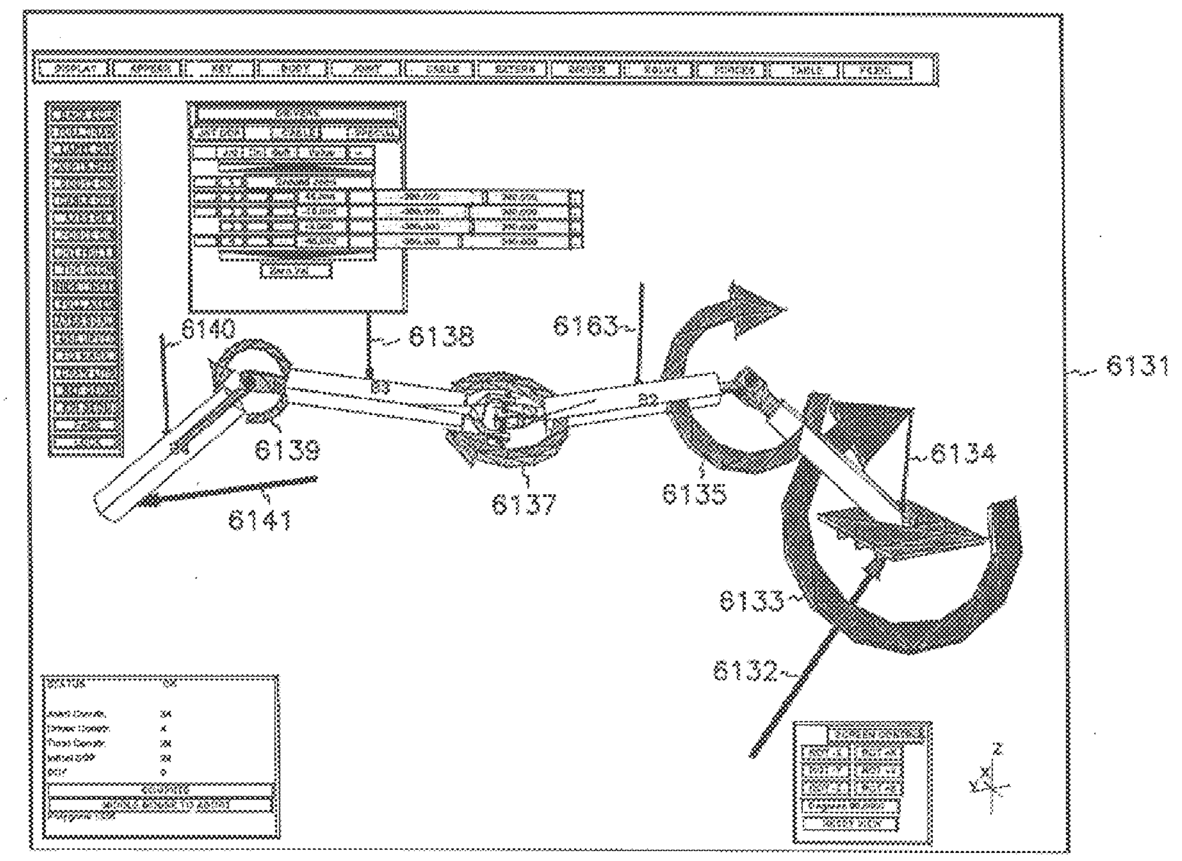
FIG. 6.13

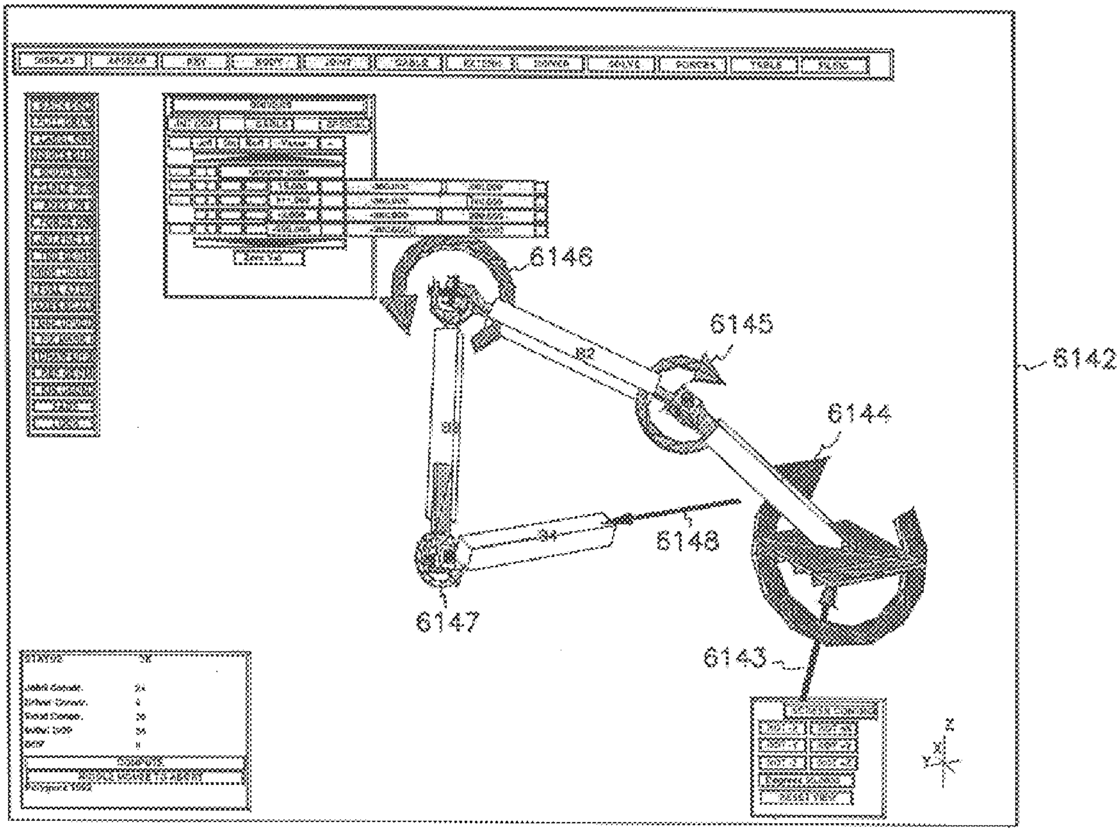
FIG. 6.14

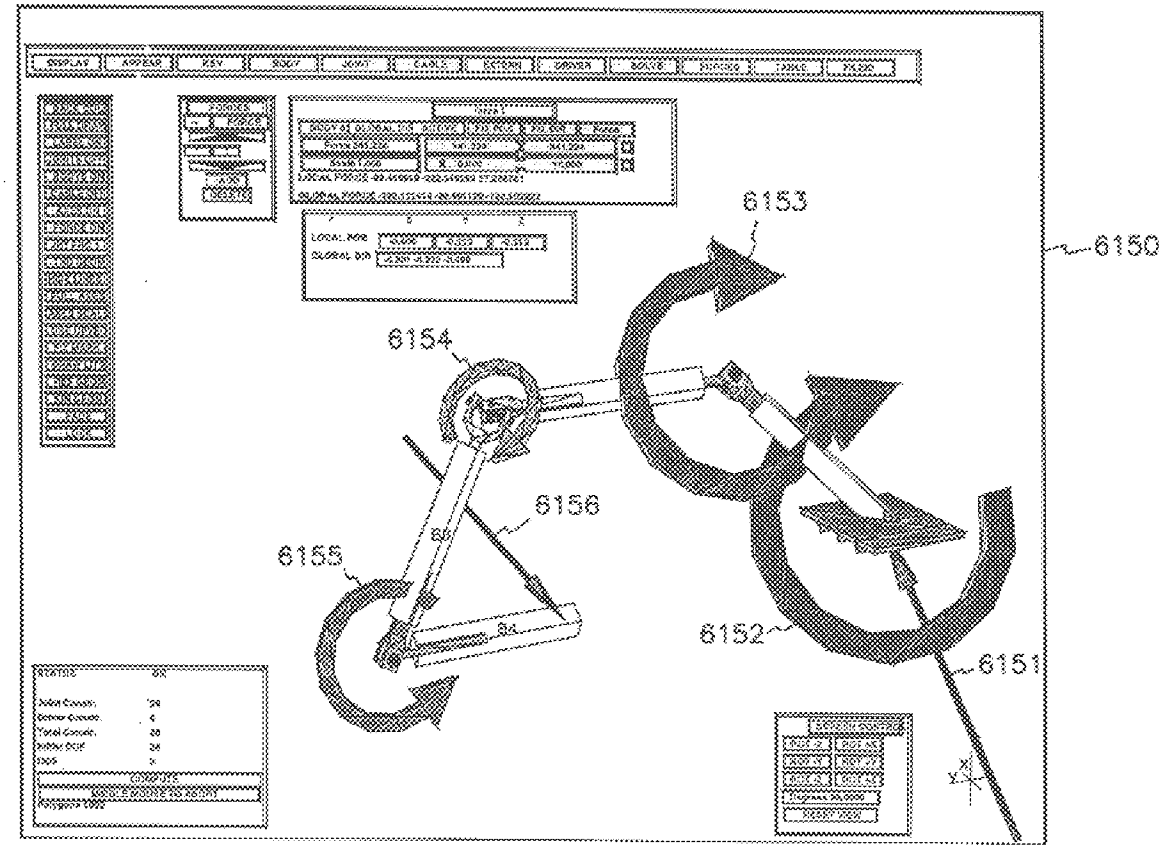
FIG. 6.15

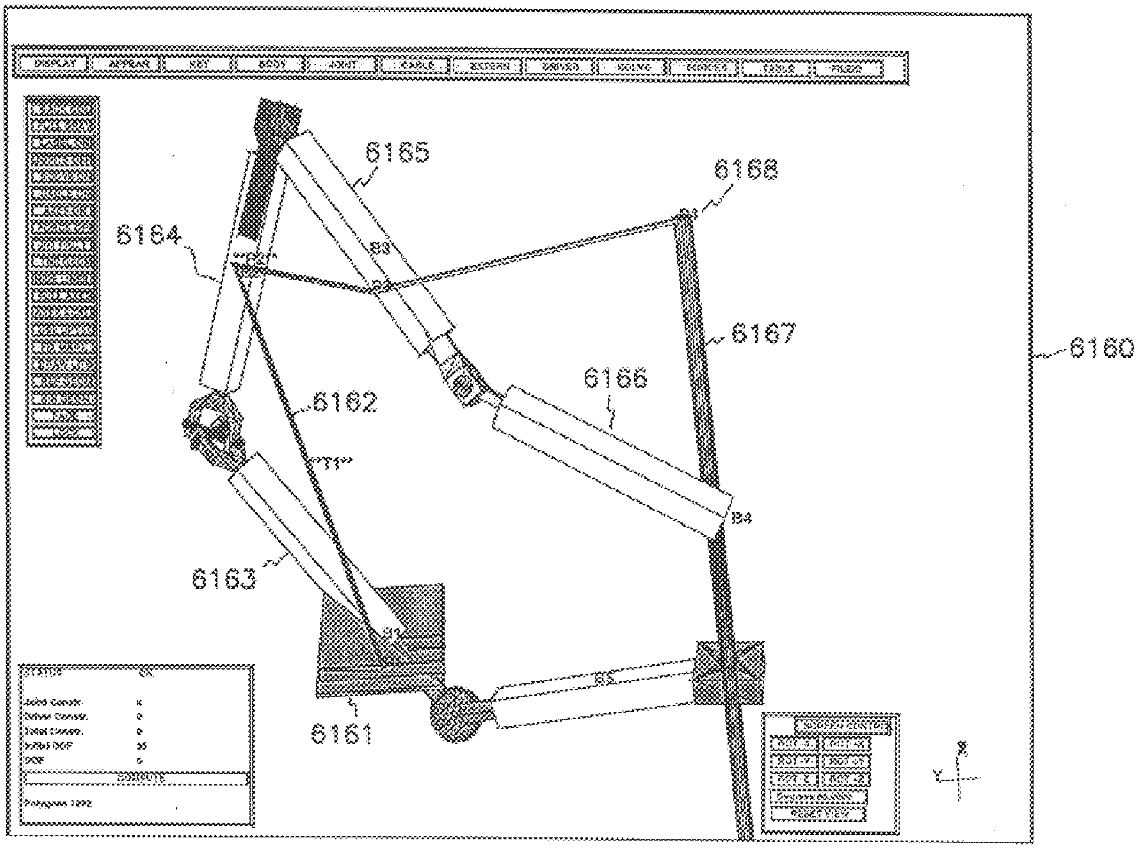
FIG. 6.16

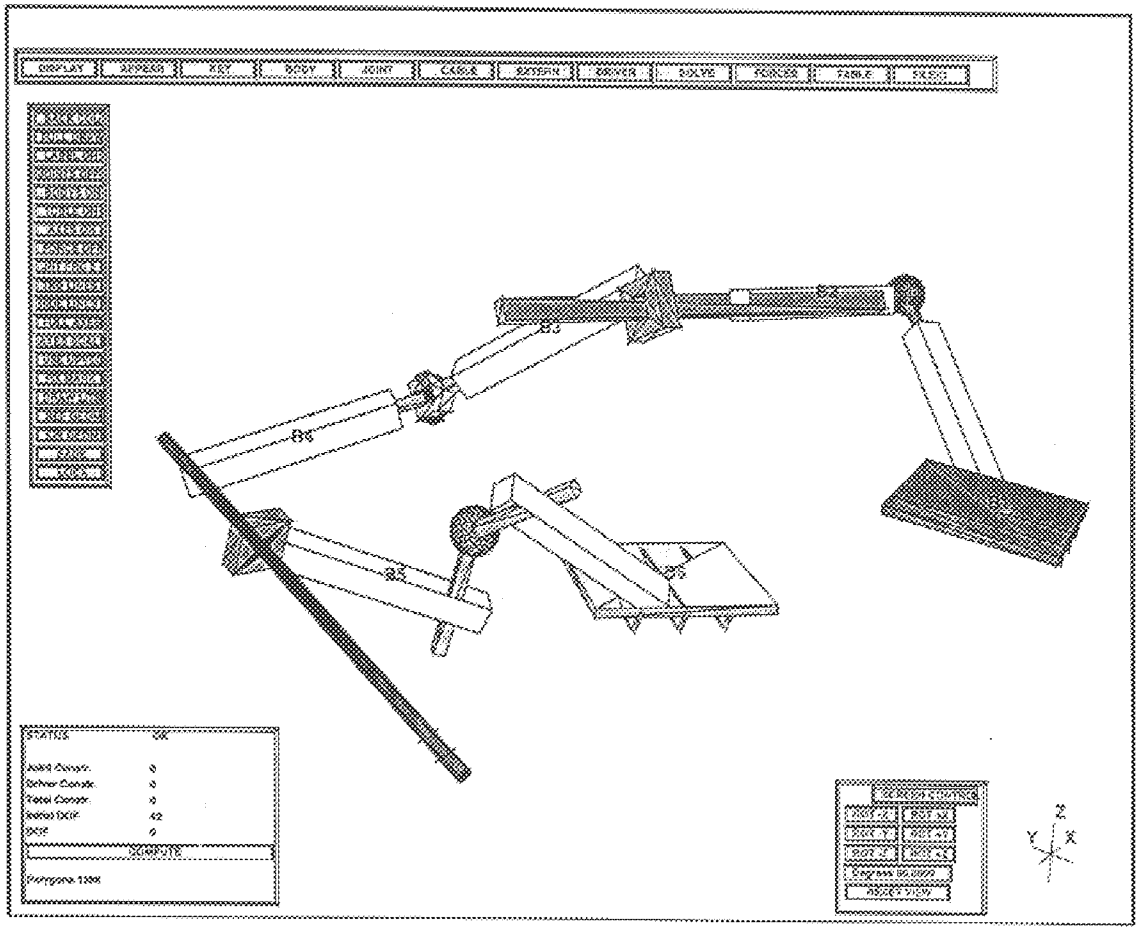
FIG. 6.17A

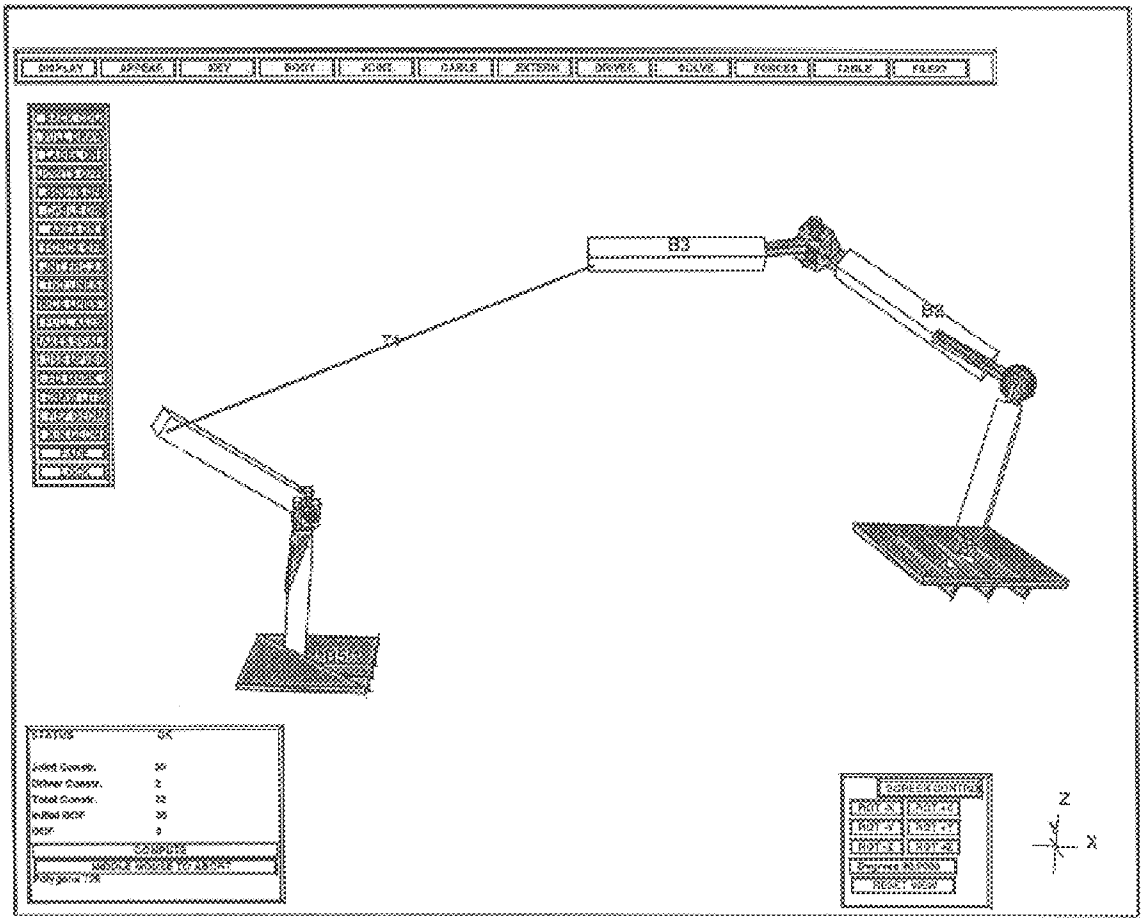
FIG. 6.17B

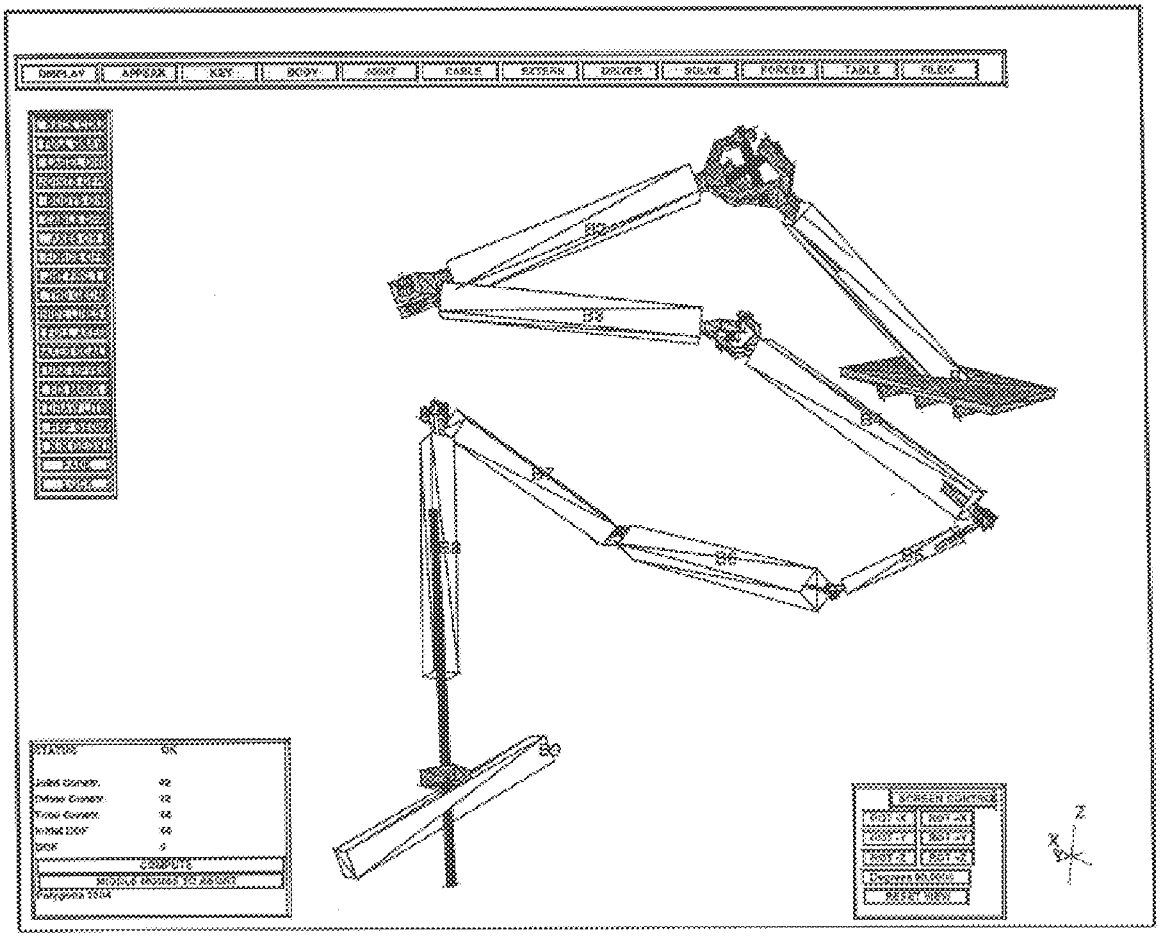
FIG. 6.17C

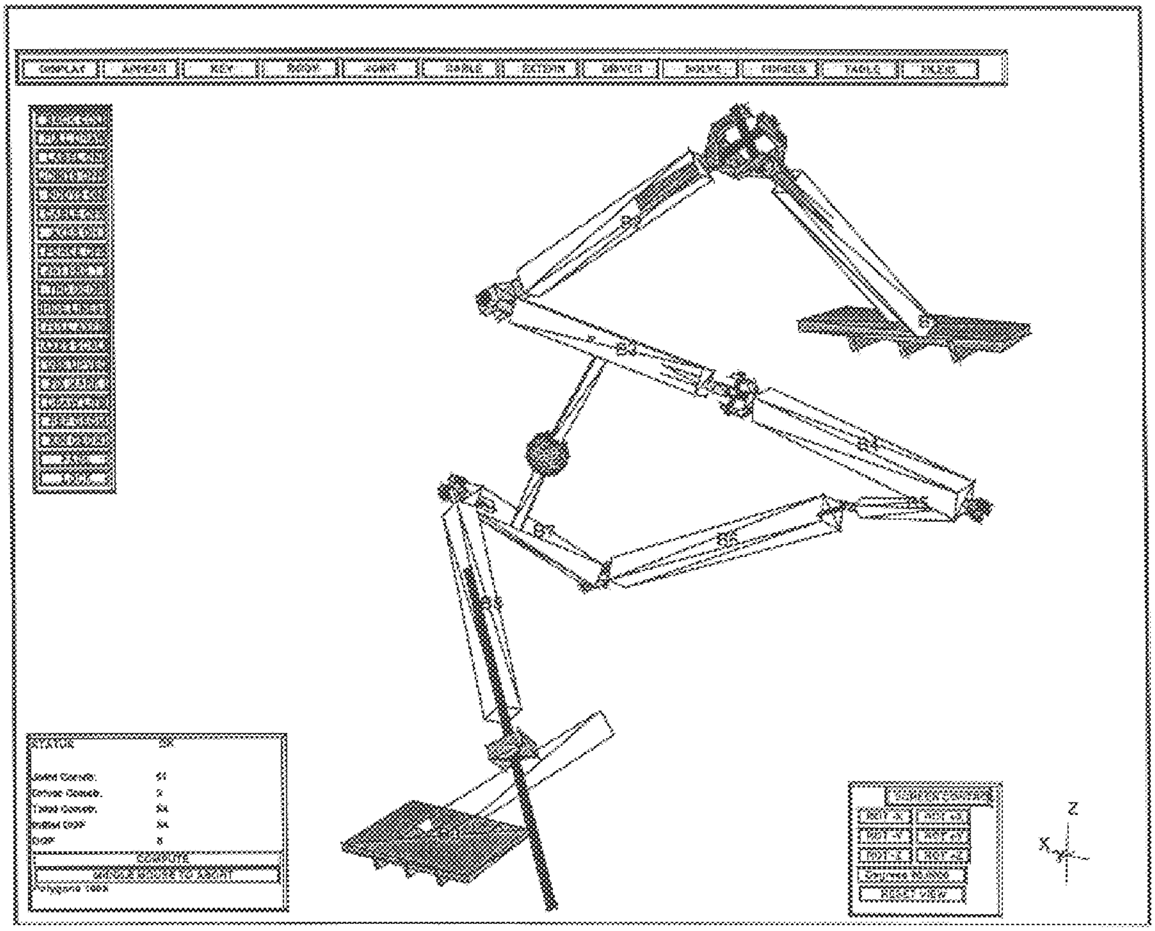
FIG. 6.17D

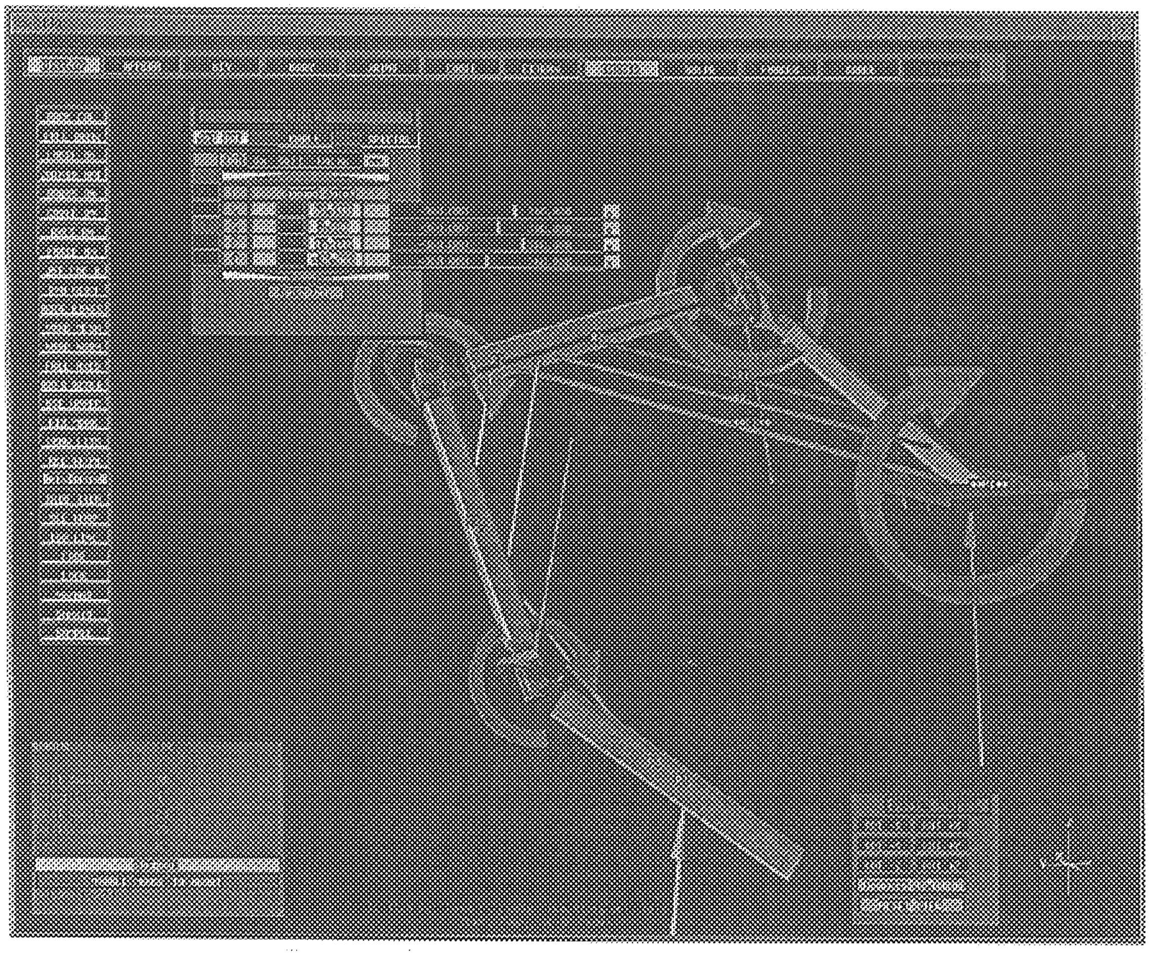
FIG. 6.18

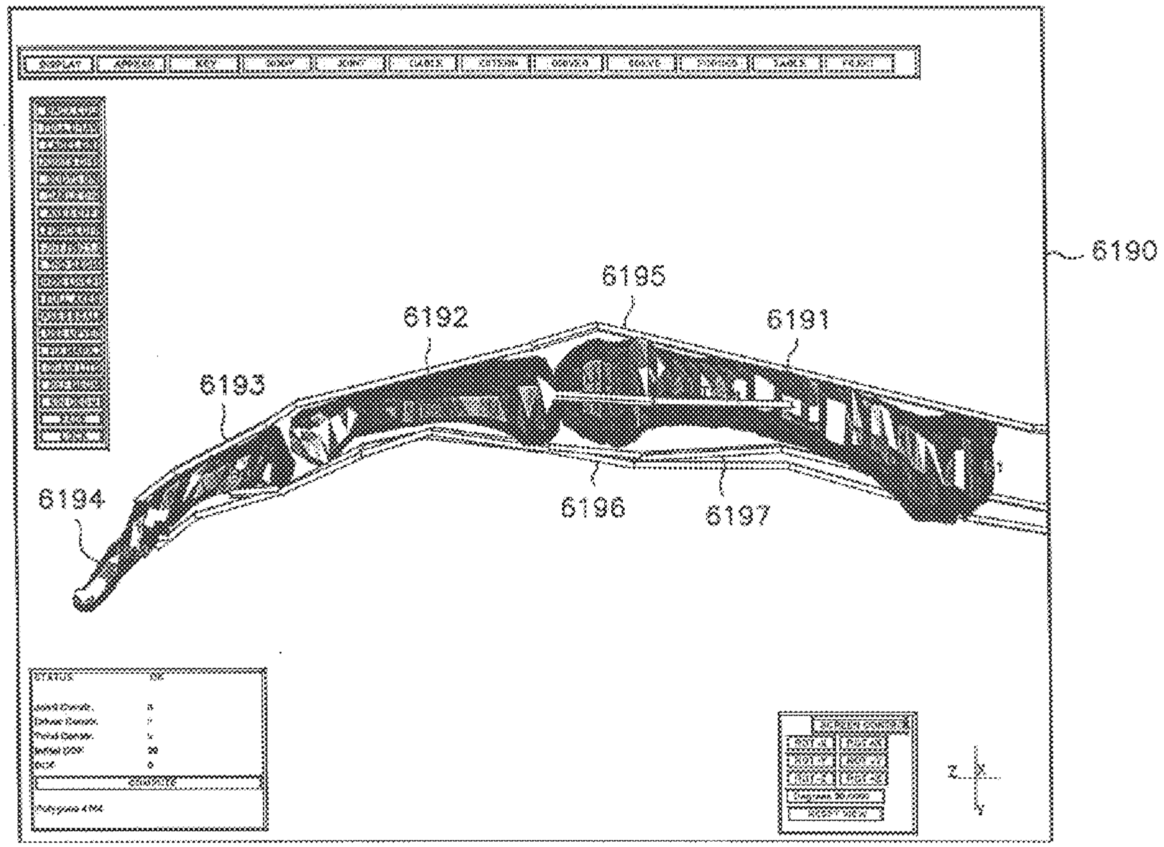
FIG. 6.19

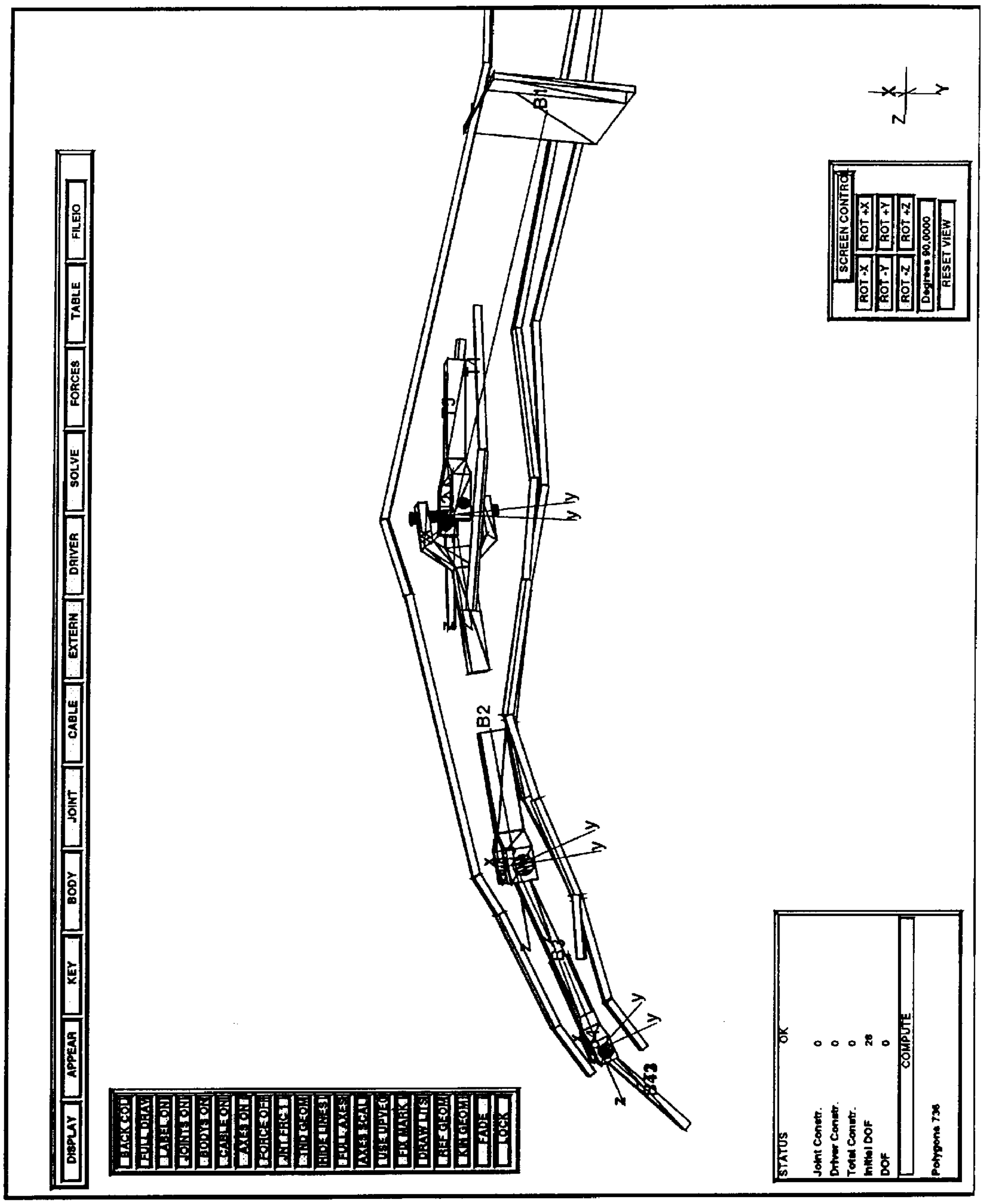
FIG. 6.20

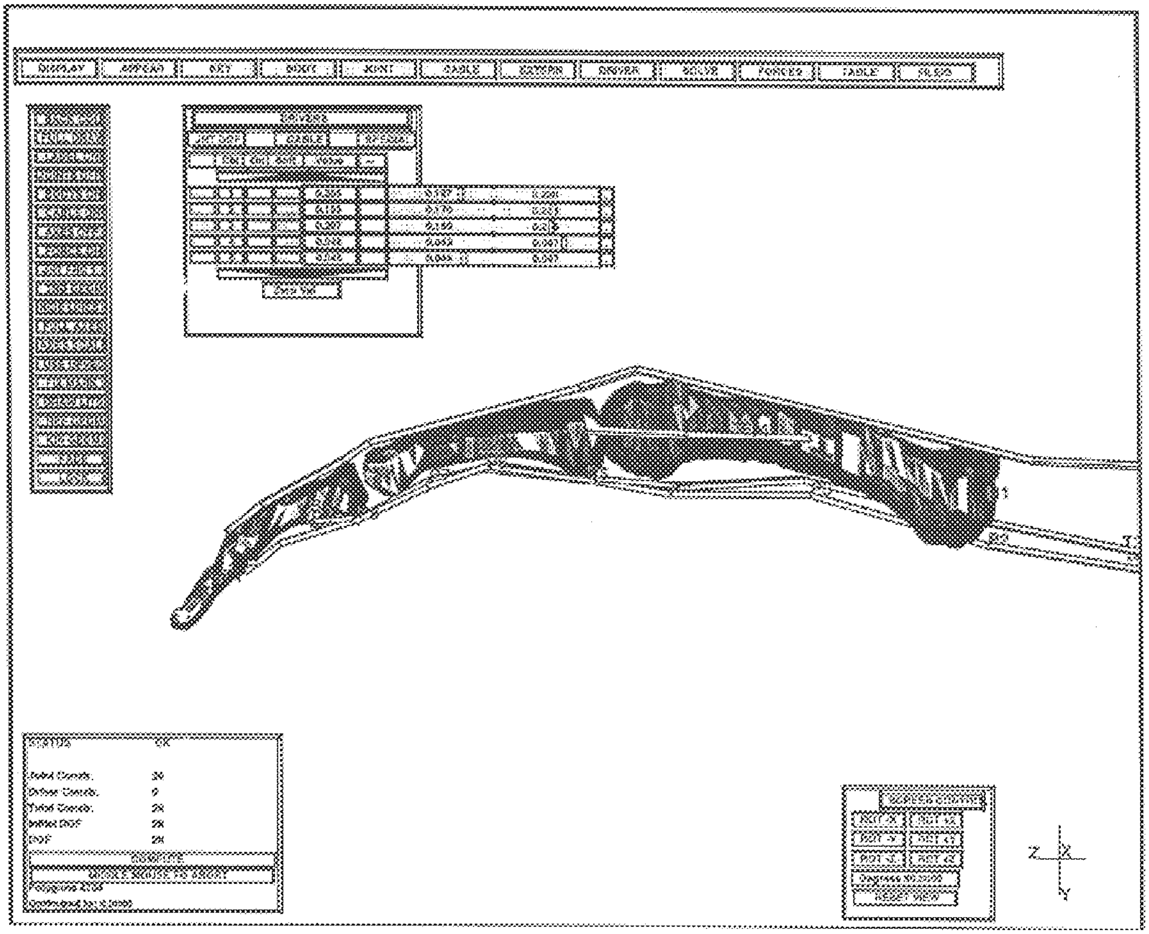
FIG. 6.21A

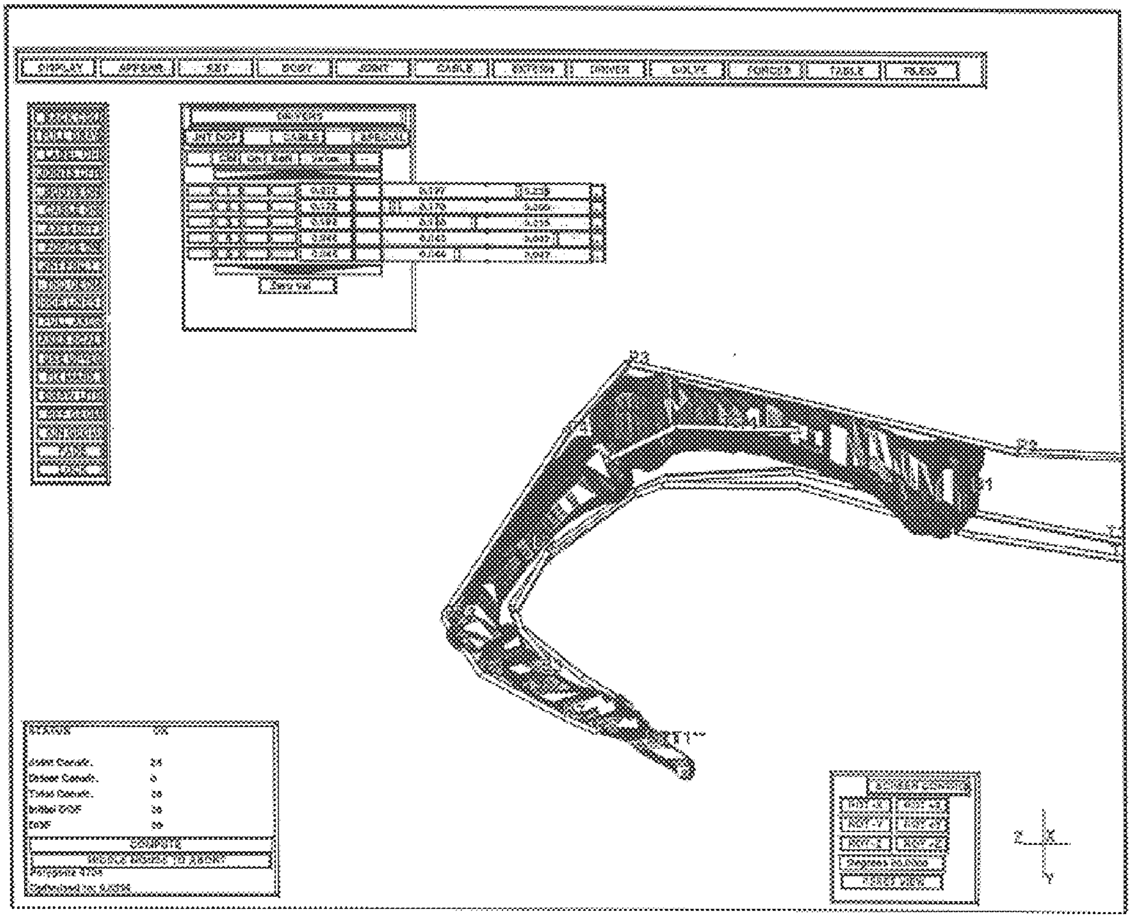
FIG. 6.21B

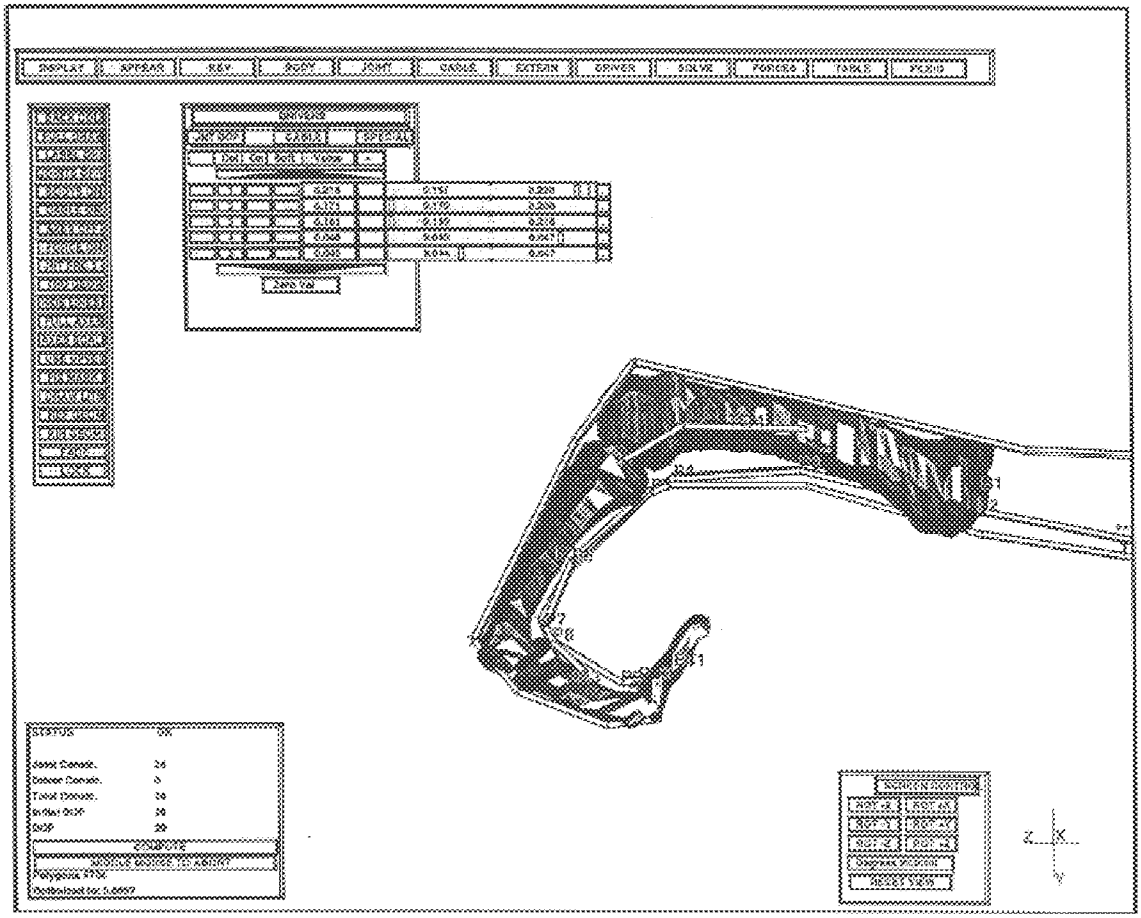
FIG. 6.21C

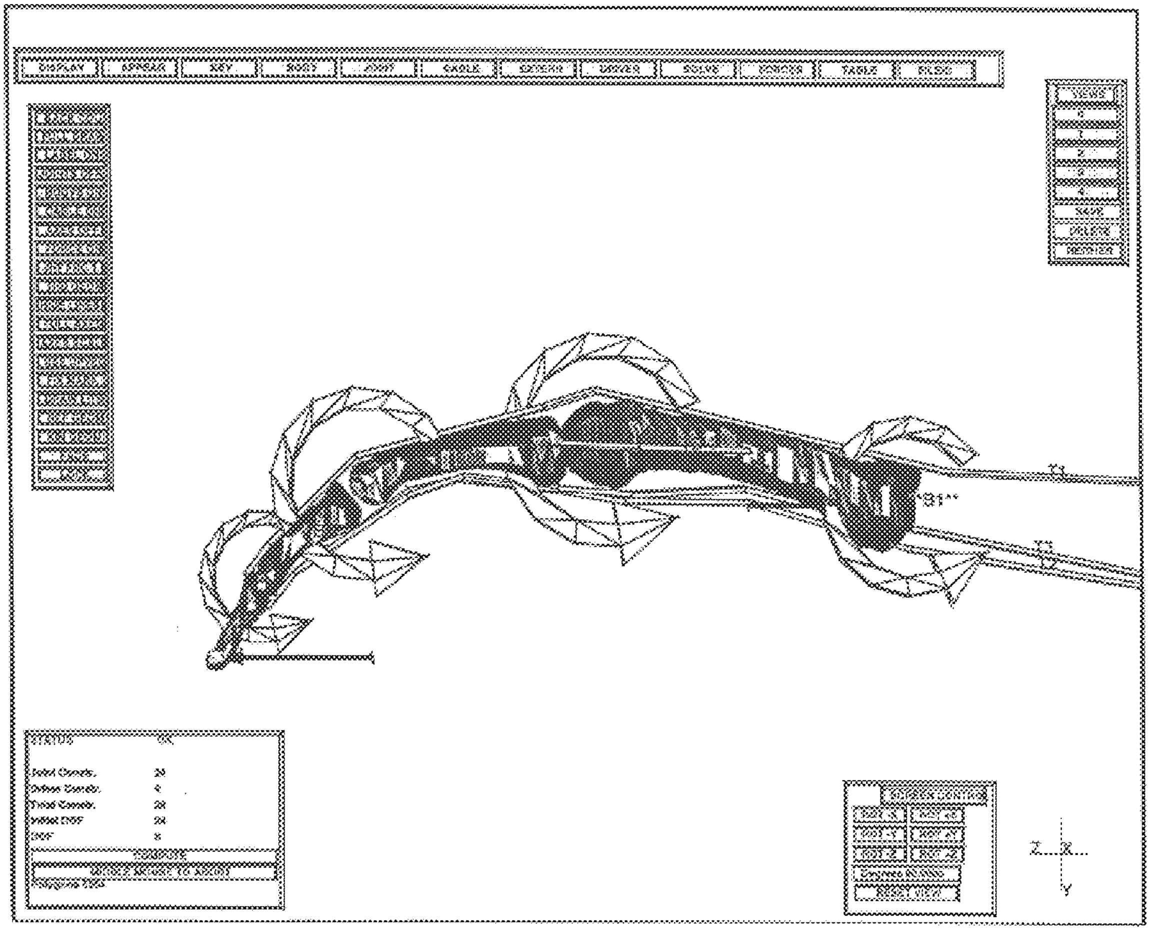
FIG. 6.22A

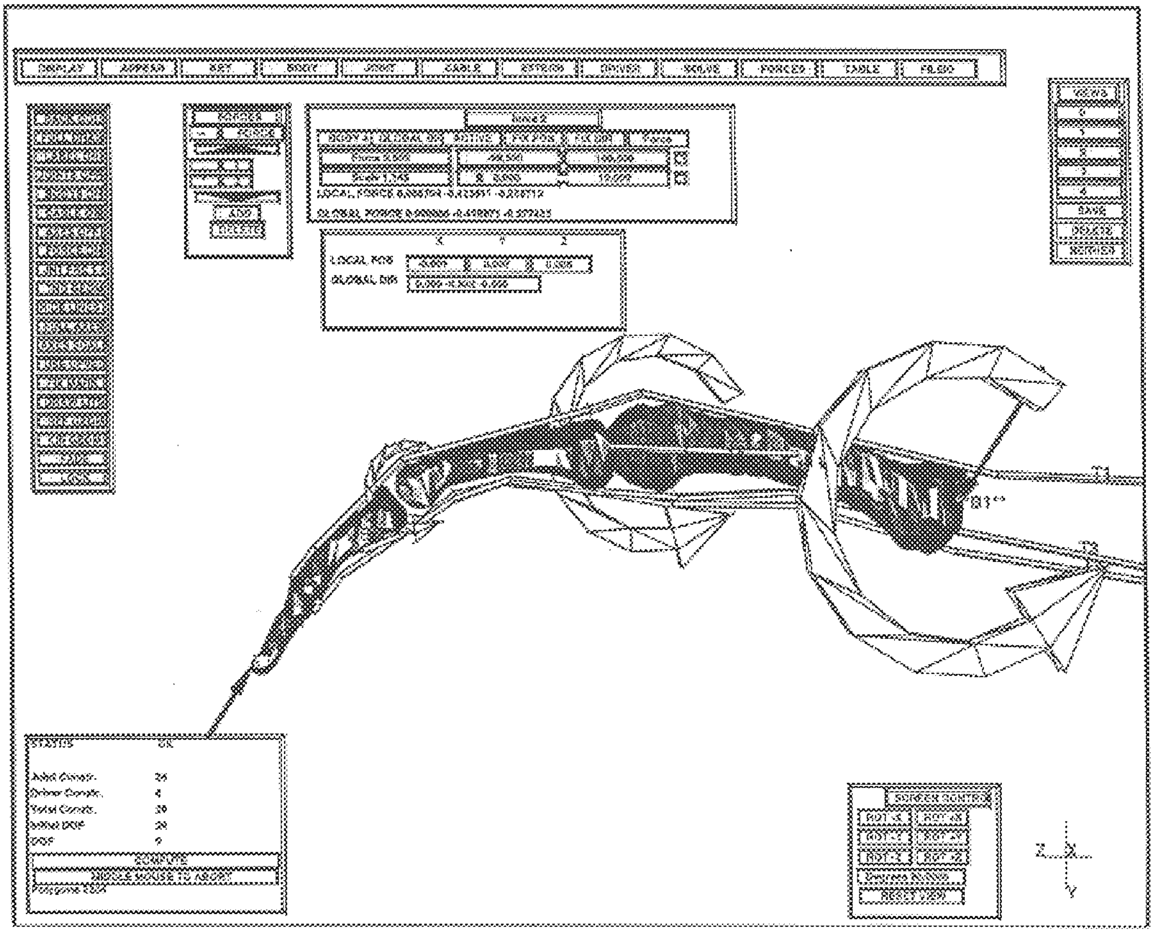
FIG. 6.22B

INTERACTIVE SYSTEM FOR SIMULATION AND DISPLAY OF MULTI-BODY SYSTEMS IN THREE DIMENSIONS

FIELD OF THE INVENTION

The present invention relates to computer simulation and display technology and more specifically to interactive computer simulation and display of multi-body systems in three dimensions, and applications to interactive real-time design, manipulation and control of multibody systems.

BACKGROUND OF THE INVENTION

Simulation of three dimensional multibody systems is a sophisticated analysis tool that is often used for design. Before a prototype is constructed, simulation provides a designer with a model that can be modified until a desired result is achieved. General purpose multibody dynamics packages are currently used around the world.

During the evolution of multibody simulation, three dimensional graphics became an important tool for both system definition and evaluation of simulation results. In fact, three dimensional graphics was an enabling technology for simulation of large, complex three dimensional systems. However, the process has remained essentially a batch operation in which the analysis of the results is not accessible until the solution is complete. Changes in the model require starting the process over.

Prior to the development of the digital computer, dynamic analysis of multibody systems required hand formulation and solution. This was a major disadvantage since it was necessary to reformulate the equations for each new system configuration. Only parameters such as length and mass could be varied without having to reformulate the equations. Changing the connectivity of the bodies or the type of joint between the bodies required reformulation of the equations.

In the mid 60's, computer programs were introduced that could both formulate and solve equations of motion for limited classes of multibody systems. Hooker and Margoulis (1965) and Roberson and Wittenburg (1966) developed general programs that required the system to be open loop and consist of only revolute joints. Since the 70's, many general purpose dynamics packages have been developed. The packages are usually distinguished from each other by the choice of coordinates used to define the position and orientation of each body. Early packages such as DYMAC (Paul and Krajcinovic, 1970), DRAM (Chace and Smith, 1971), and IMP (Sheth and Uicker, 1972) formulated the equations using Lagrangian joint coordinates or relative coordinates. These methods provide a minimal set of equations, but the derivation of the equations is complicated.

Two general packages, ADAMS (Orlandea et al., 1977) and DADS (Wehage and Haug, 1982) (Nikravesh and Chung, 1982), used a maximal set of equations. The global position and orientation of each body is defined by a set of Cartesian coordinates and a set rotational Euler angles or parameters. Each body is described with the same body fixed coordinate system. All aspects of the system such as force locations, joints and other constraints are all described with respect to this body fixed coordinate system. This enables the equation formulation to be handled in a very general way, regardless of the system topology. A drawback of this method is that it assumes the maximum of six degrees of freedom for each body. Therefore, six equations for each body are needed along with the constraint equations for each kinematic joint. This results in a large set of equations which slows the numerical solution and introduces numerical difficulties known as artificial stiffness. This can be overcome by using numerical algorithms for stiff systems or by applying velocity transformations to convert the Cartesian coordinates into relative coordinates (Kim and Vanderploeg, 1984).

Computer graphics is instrumental for analyzing three dimensional multibody simulation results. With out the aid of computer graphics, it is very difficult to interpret the relative motions of a multibody simulation. Computer graphics is a relatively recent development, but has made dramatic advances in the past few years. Initially, semi-interactive three dimensional computer graphics was possible using wire frame or line drawings, but complex objects were cumbersome to interpret. In the late 70's and early 80's, Evans and Sutherland developed the PS3000 computer system that was capable of rendering real time wire frame images.

Symbolic manipulation has been used to formulate the explicit equations of motion for general multibody systems (Hussain and Noble, 1984) (Wittenburg and Woltz, 1985) (Lynch, 1988). The methods previously discussed in this paper numerically evaluate the individual terms of the equations of motion at each time step. In contrast, this method derives the symbolic non-linear equations of motion for the system. The symbolic manipulation has to be performed only once for a given system configuration while the previous numerical formulations have to be reformulated at each time step. Symbolic formulations are often more efficient than the numerical approach, especially when the recursive properties of the system are utilized. The disadvantage is that for more complex systems, the size of the equations quickly become too large to handle.

In the mid 1980's, Silicon Graphics, Inc. began to market computer workstations with additional hardware dedicated to three dimensional graphics operations. Instead of relying on software, SGI developed hardware to efficiently perform the transformation and rendering of flat polygonal surfaces. Interactive three dimensional computer graphics became a reality. SGI also developed the graphics library, GL, which is built around this hardware graphics processor. The library simplified three dimensional graphics programming by eliminating the need to develop software using low level graphics languages.

Computer graphics has been incorporated into DADS, ADAMS, and other dynamic packages as a pre and post processing tool. The graphics incorporated into these packages provide an important visual result of the previously computed simulation. However, since graphic analysis is limited to only the final computed results, interactive control during the solution process (such as changing the system configuration or force inputs) is not available. Currently, a multibody system is usually defined by creating an input file that describes the bodies, joints and other system parameters. Any change in the system is made by altering this file and then re-running the dynamics package using the new input file. Computer graphics has thus far not been used as an interactive interface to the software that enables system step up, alteration of system configuration and display of the motion and force results during the solution process.

SUMMARY OF THE INVENTION

Described is a method and apparatus for simulating a multibody system on a computer. The invention provides for inputting into the computer a mathematical description of each body in the multibody system, specifying into the computer a force to act on one of the bodies, formulating a Jacobian matrix, solving kinematics constraints in the computer, graphically displaying a result of the solution of the kinematic constraints from the computer onto an electronic display, whereupon the user can interactively input a change to the multibody system into the computer and graphically display a result of the change to the multibody system from the computer.

Another aspect of the invention is to build a prototype which physically embodies the results of the simulation.

Yet another aspect of the invention is to use the method and system to simulate an anatomical system.

Yet another aspect of the invention is to solve for dynamic constraints.

Yet another aspect of the invention is to graphically display a representation of a force along with the first result.

Yet another aspect of the invention is to graphically display a representation of a moment along with the first result.

Yet another aspect of the invention is to graphically display both a representation of a force and a representation of a moment along with the second result.

BRIEF DESCRIPTION OF THE DRAWINGS

FIG. 4 shows a default body for simulation.

FIG. 12 shows the dynamic simulation screen as the dynamics solution is turned on.

FIG. 3.1 shows a screen display of a VIMS session.

FIG. 4.1 shows how a body is defined.

FIG. 4.2 shows how a spherical joint point constraint is set up.

FIG. 4.3 shows how a revoulte parallel axis constraint is set up.

FIG. 4.4 shows the general form of the Jacobian matrix.

FIG. 4.5 shows an example of a cable system.

FIG. 4.6 shows an example of a button menu.

FIG. 4.7 shows an example of a polygon surface.

FIG. 4.8 shows a sample BYU file.

FIG. 5.1 shows a flow chart of VIMS.

FIG. 5.2 shows a sample segment from a VIMS input file.

FIG. 5.3 shows the main menu bar.

FIG. 5.4 shows viewing direction controls.

FIG. 5.5 shows rotation function of the F3 key which varies as a function of screen location.

FIG. 5.6 shows a screen control menu.

FIG. 5.7 shows controls for editing system parameters.

FIG. 5.8 shows a body edit menu.

FIG. 5.9 shows a joint edit menu.

FIG. 5.10 shows a joint type menu.

FIG. 5.11 shows geometry for VIMS joints.

FIG. 5.12 shows a cable edit menu.

FIG. 5.13 shows a driver edit menu.

FIG. 5.14 shows an external force edit menu.

FIG. 5.15 shows a solution method menu.

FIG. 5.16 shows a dynamics playback menu.

FIG. 5.3.1 shows an embodiment of a display menu.

FIG. 5.3.2 shows an embodiment of a display attribute menu.

FIG. 5.3.3 shows an embodiment of a view menu.

FIG. 5.3.4 shows an embodiment of a light menu.

FIG. 5.3.5 shows an embodiment of a materials menu.

FIG. 5.3.6 shows an embodiment of a part desription menu.

FIG. 5.4.1 shows an embodiment of a body menu.

FIG. 5.4.2 shows an embodiment of a joint menu.

FIG. 5.4.3 shows an embodiment of a cable menu.

FIG. 5.4.4 shows an embodiment of a driver constraint menu.

FIG. 5.4.5 shows an embodiment of an external force menu.

FIG. 5.4.6 shows an embodiment of a force menu.

FIG. 5.4.7 shows an embodiment of a LaGrange force menu.

FIG. 5.4.8 shows an embodiment of a solution menu.

FIG. 5.4.9 shows an embodiment of a keyframe menu.

FIG. 5.4.10 shows an embodiment of a file input-output menu.

FIG. 6.1 shows an embodiment of a display showing four bodies defined.

FIG. 6.2 shows an embodiment of a display showing joints defmed in each body.

FIG. 6.3 shows an embodiment of a display showing solved kinematic configuration.

FIG. 6.4 shows an embodiment of a display showing new positions with user-defined drivers constraints.

FIG. 6.5 shows an embodiment of a display showing end point constraint.

FIG. 6.6 shows an embodiment of a display showing optimized end-point constraint.

FIG. 6.7 shows an embodiment of a display showing shortening a cable attached to four bodies.

FIG. 6.8 shows an embodiment of a display showing dynamic solution for pendulum system.

FIG. 6.9 shows an embodiment of a display showing force menu for dynamic solution.

FIG. 6.10 shows an embodiment of a display showing tablke of Lagrange multipliers.

FIG. 6.11 shows an embodiment of a display showing table of summed-force components.

FIG. 6.12 shows an embodiment of a display showing force arrows.

FIG. 6.13 shows an embodiment of a display showing static force analysis.

FIG. 6.14 shows an embodiment of a display showing static forces at different kinematic configurations.

FIG. 6.15 shows an embodiment of a display showing static forces with a different external force direction.

FIG. 6.16 shows an embodiment of a display showing five bar closed loop example.

FIG. 6.17 shows an embodiment of a display showing various configuration possible in VIMS.

FIG. 6.18 shows an embodiment of a display showing a print of a four-body system.

FIG. 6.19 shows an embodiment of a display showing a VIMS display of a finger model.

FIG. 6.20 shows an embodiment of a display showing joints and cable of the finger model.

FIG. 6.21 shows an embodiment of a display showing pulling the flexor tendon cables.

FIG. 6.22 shows an embodiment of a display showing joints moment forces.

DESCRIPTION OF THE PREFERRED EMBODIMENT

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 1:
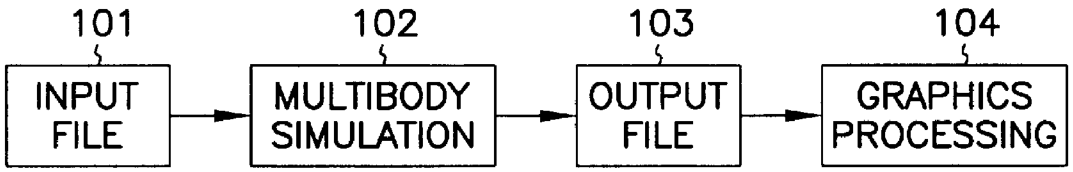
FIG. 1 shows a batch approach to multi-body dynamic simulation.

FIG. 1 shows a batch approach to the multi-bodied dynamic simulation. Input file 101 represents the users input data describing the system to be simulated. Multi-body simulation 102 represents a computer program running on a computer which operates on the parameters in input file 101 to create a output file 103 representing the simulated action of the multibody system as it dynamically moves in reaction to simulated applied forces. Output file 103 can be used to feed graphics processing 104, which represents a program running on a computer which takes the output file representing the movement of the multibody system and creates a graphics image to be displayed, representing the movement of the multi-body system.

Figure 2:
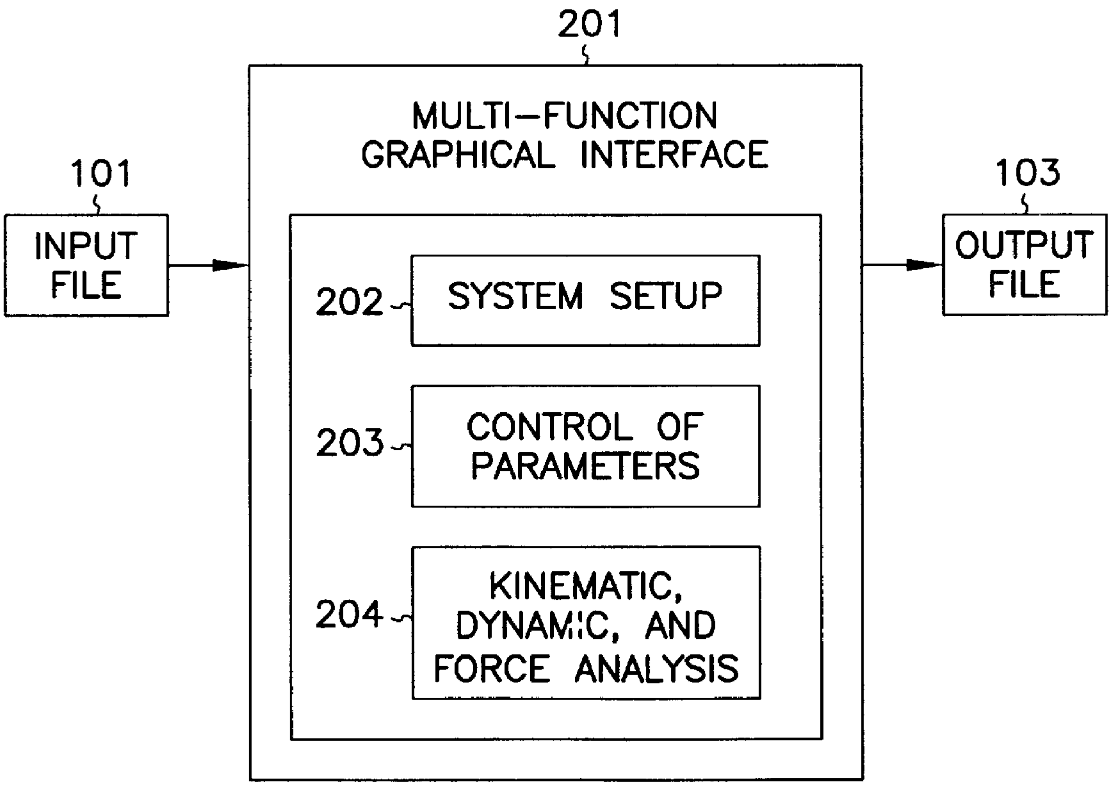
FIG. 2 shows an interactive multi-function graphical environment for multibody dynamic simulation.

FIG. 2 shows an interactive multi-function graphical environment for a multibody dynamic simulation according to the present invention. Again, input file 101 represents the user's description of the multibody system to be simulated. Input file 101 can be any computer-recognizable description of the bodies in the multibody system to be simulated. Multi-function graphical interface 201 represents a computer program which operates on input file 101, but also accepts interactive input from the user, who can dynamically change the system set-up, represented by block 202, can dynamically change control of parameters represented by block 203, and can dynamically change the kinematic dynamic and force analysis parameters represented by block 204. Multi-function graphical interface 201 also represents the dynamic simulation of the multi-bodied system and graphical display of the results to the user. Output file 103 is optional in this environment, and can be used to recreate interactive sessions, or to output specifications to allow a prototype to be built to match the simulated multibody system. In one embodiment, a numerically-controlled machine tool is controlled by the values in output file 103 to fabricate one or more components which were simulated by the system in order to make a physical embodiment of the simulated multiboyd system. In general, the output of program 201 is a graphical display of the simulated multibodied system in order that a user may interact with the visualization produced.

Figure 3:
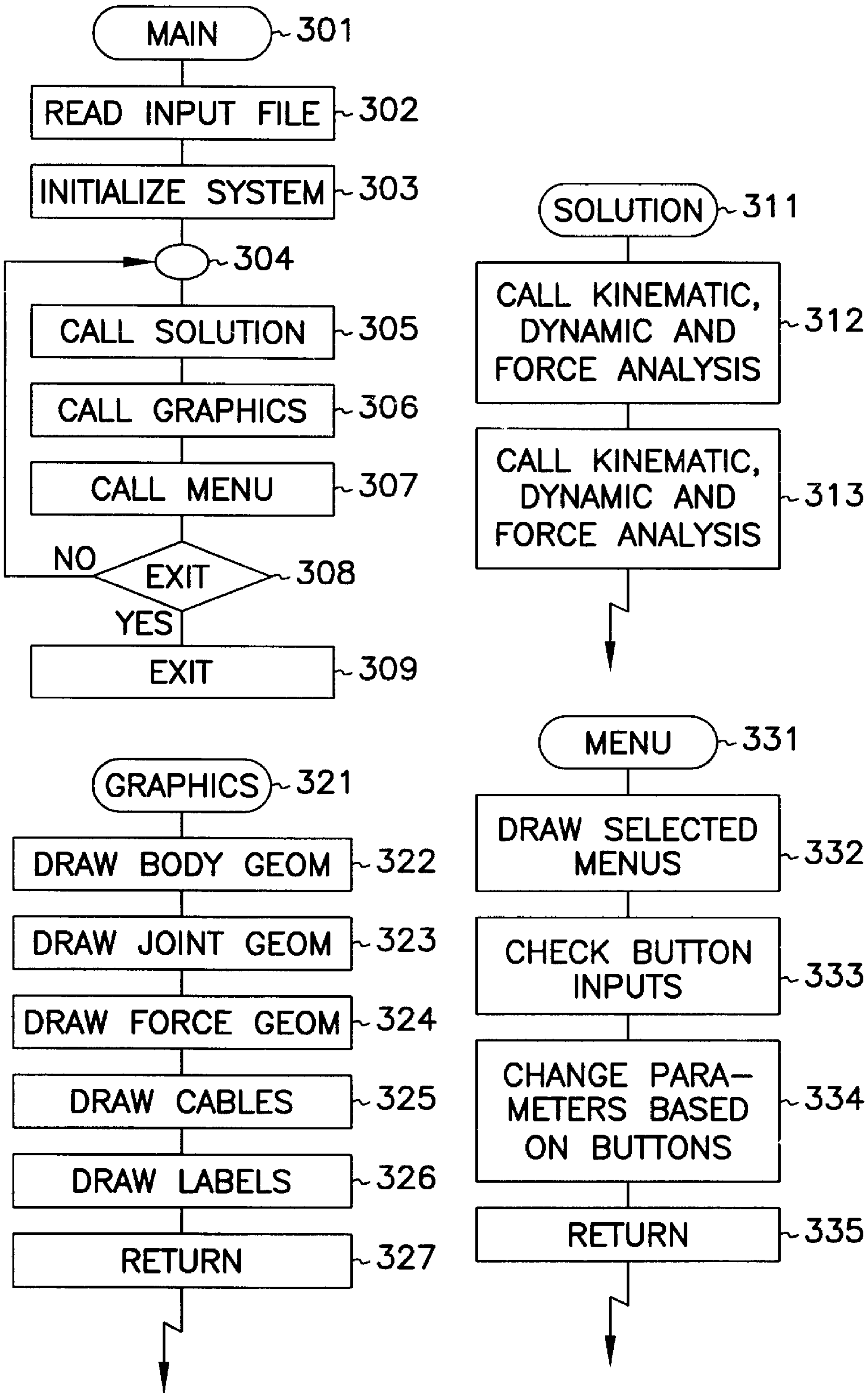
FIG. 3 shows a flow chart of the VIMS system.

FIG. 3 shows the flow charts of the VIMS system. Block 301 represents the input to the main computer program which operates the VIMS system. At block 302, the program reads the input file representing the parameters describing the bodies, joints, cables, dampers, springs, and other components in the multibody system. At block 303 the system is initialized. Block 304 is a collection point in the flowchart passing control to block 305. Block 305 does a call to the subroutine "solution" represented by blocks 311–313. Block 306 represents a call to the subroutine "graphics" represented by blocks 321–327. Block 307 represents a call to the subroutine "menu" represented by blocks 331–335. At block 308, a test is made to determine if the user wants to exit; if this test is satisfied, the program exits to block 309; if block 308 is not satisfied, the program passes back to node 304 and repeats the loop. At block 311, the subroutine "solution" is entered. Block 312 represents calls to the kinematic dynamic and forced subroutines which solve the multibody dynamic system sinulation. Block 313 represents a return to the caller, providing the new body positions and orientations which are to be graphically displayed. Block 321 represents an entry to the subroutine "graphics". Block 322 represents drawing the body geometry. Block 323 represents drawing the joint geometry. Block 324 represents drawing the force geometry. Block 325 represents drawing the cables in the system. Block 326 represents drawing the labels in the system. Block 327 is a return to the caller. At block 331 an entry to the "menu" subroutine is done. At block 332 selected menus are drawn. At block 333, button inputs are checked. At block 334, parameters are changed based on the button inputs. At block 335 a return is made to the caller.

FIG. 4 represents a graphical depiction of a default body, in this case body 401, which might be displayed on the graphical display.

Figure 5:
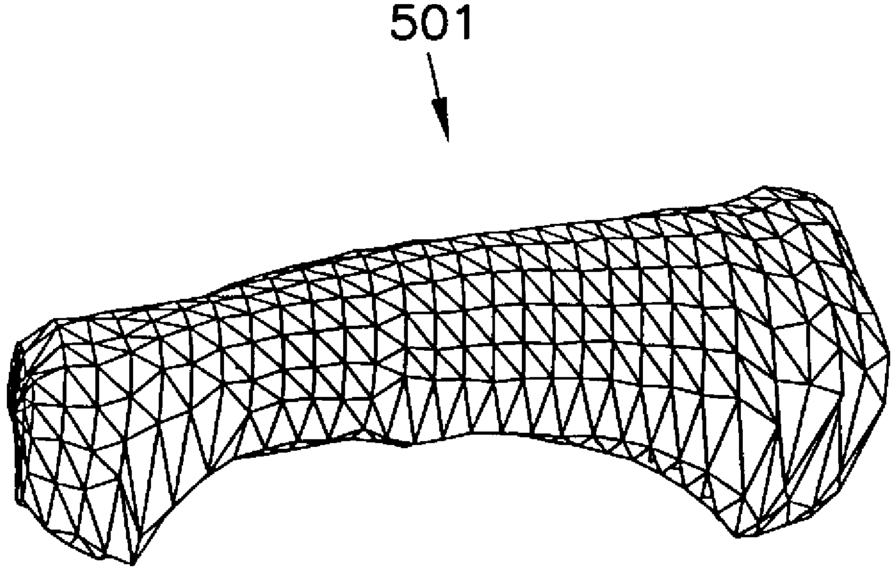
FIG. 5 shows an example user-defined body for simulation.

FIG. 5 represents a graphical depiction of a user-defined body 501.

Figure 6:
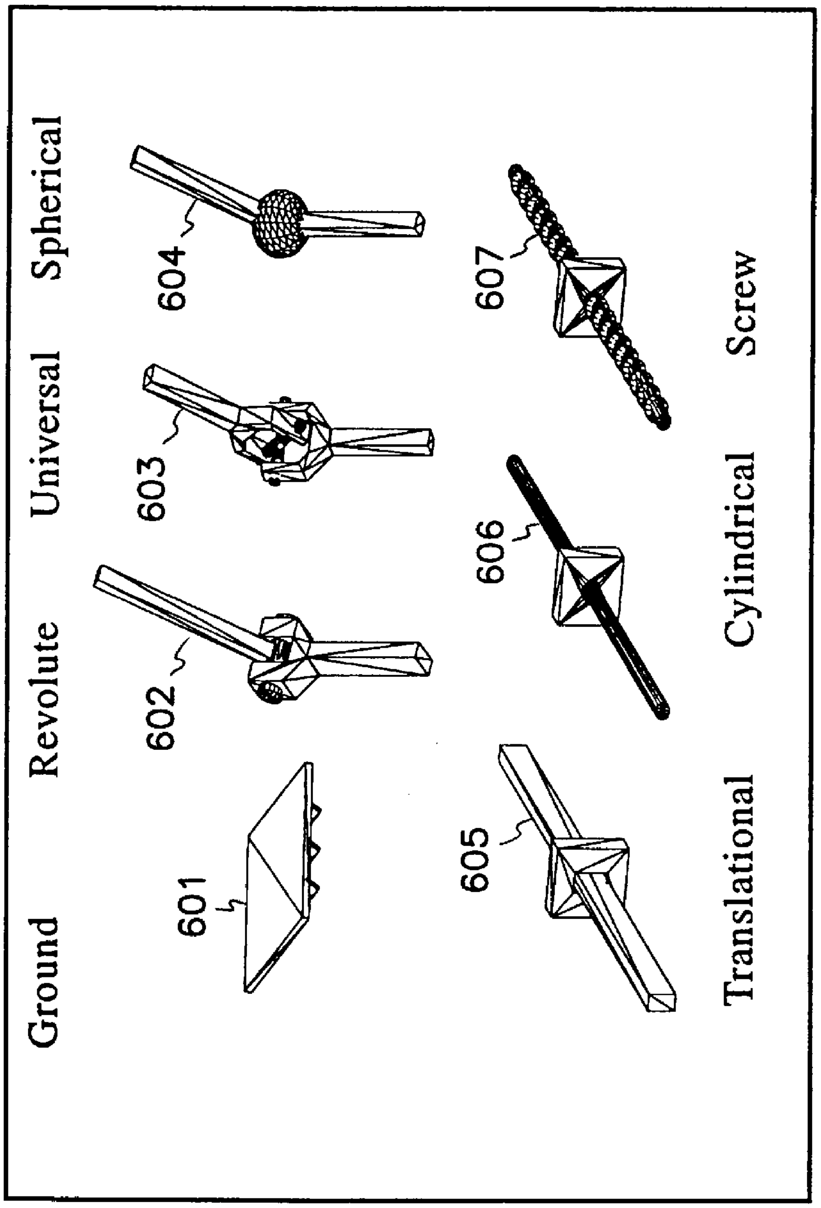
FIG. 6 shows VIMS joint icons used for graphical representation of the simulation.

FIG. 6 shows seven icons representing typical VIMS joints. Round joint 601 represents a fixed point in the three-dimensional space. Icon 602 represents a revolute joint. Icon 603 represents a universal joint. Icon 604 represents a spherical joint. Icon 605 represents a translational joint. Icon 606 represents a cylindrical joint. Icon 607 represents a screw joint.

Figure 7:
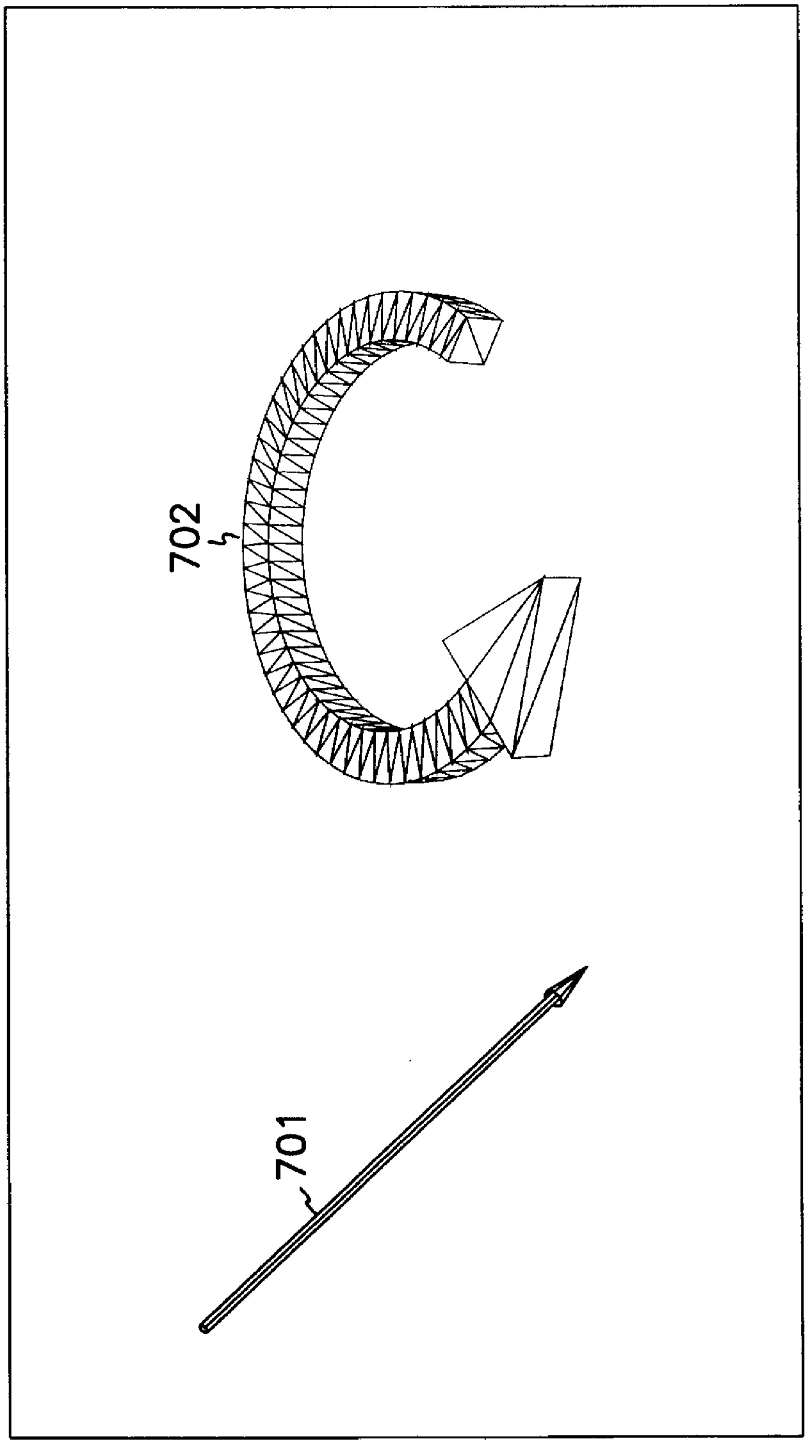
FIG. 7 shows VIMS force and moment icons used for graphical display of the simulation.

FIG. 7 shows icons for force and moment. Icon 701 represents a force vector. Icon 702 represents a moment.

Figure 8:
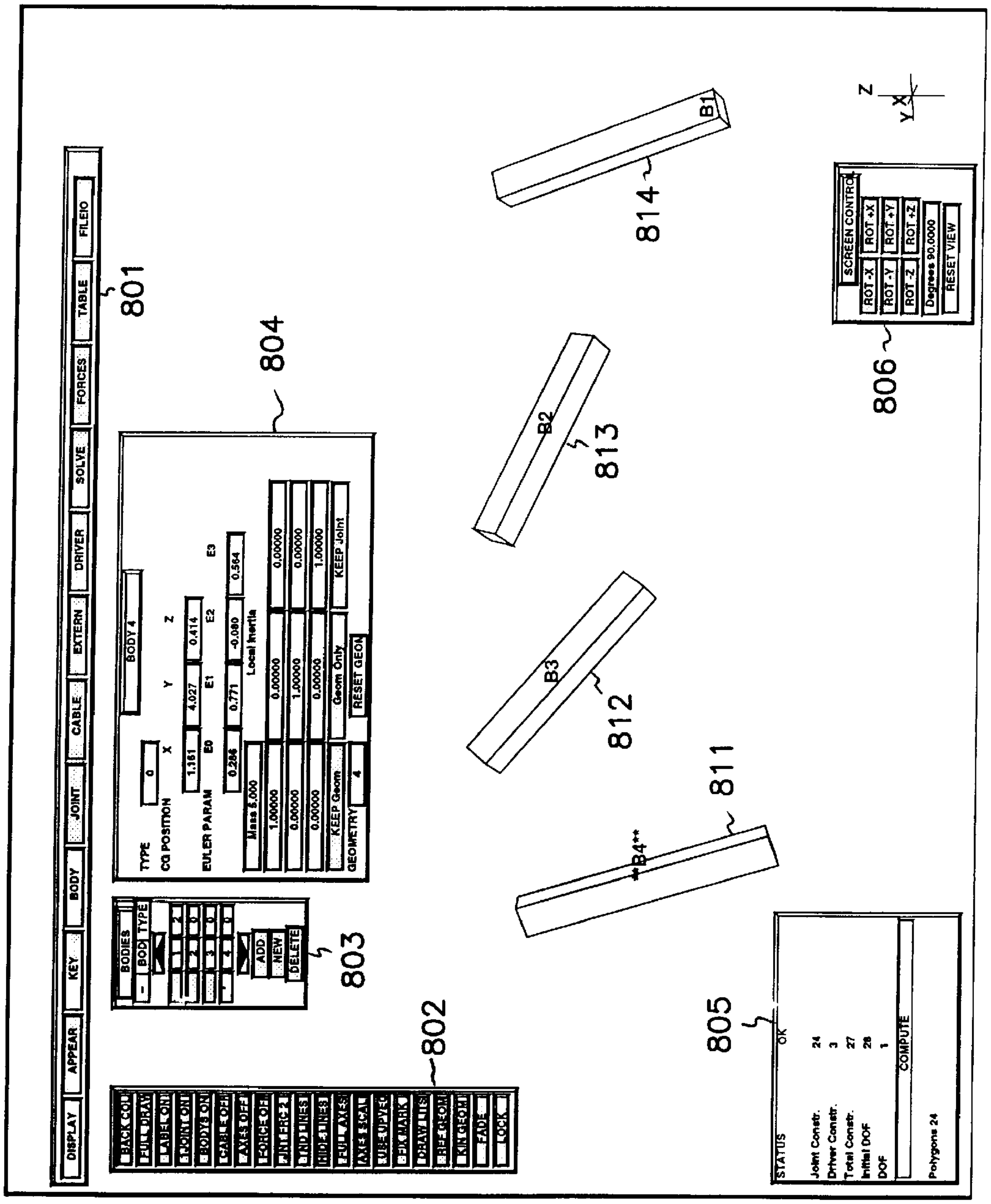
FIG. 8 shows an example of interactively positioned 3-D bodies in a simulation environment.

FIG. 8 shows interactively positioned three-dimensional bodies as display on the graphical display of one embodiment of the present invention. Menu 801 represents the overall menu buttons for the graphical system. Submenu 802 represents another button menu. Bodies menu 803 represents a menu which controls the creation and positioning of bodies. Body 4 menu 804 represents another menu for particular bodies. Status menu 805 shows the status of the system. Screen control menu 806 allows the user to control system screen functions. Bodies 811, 812, 813 and 814 represent typical bodies which may be created by the user, using bodies menu 803.

Figure 9:
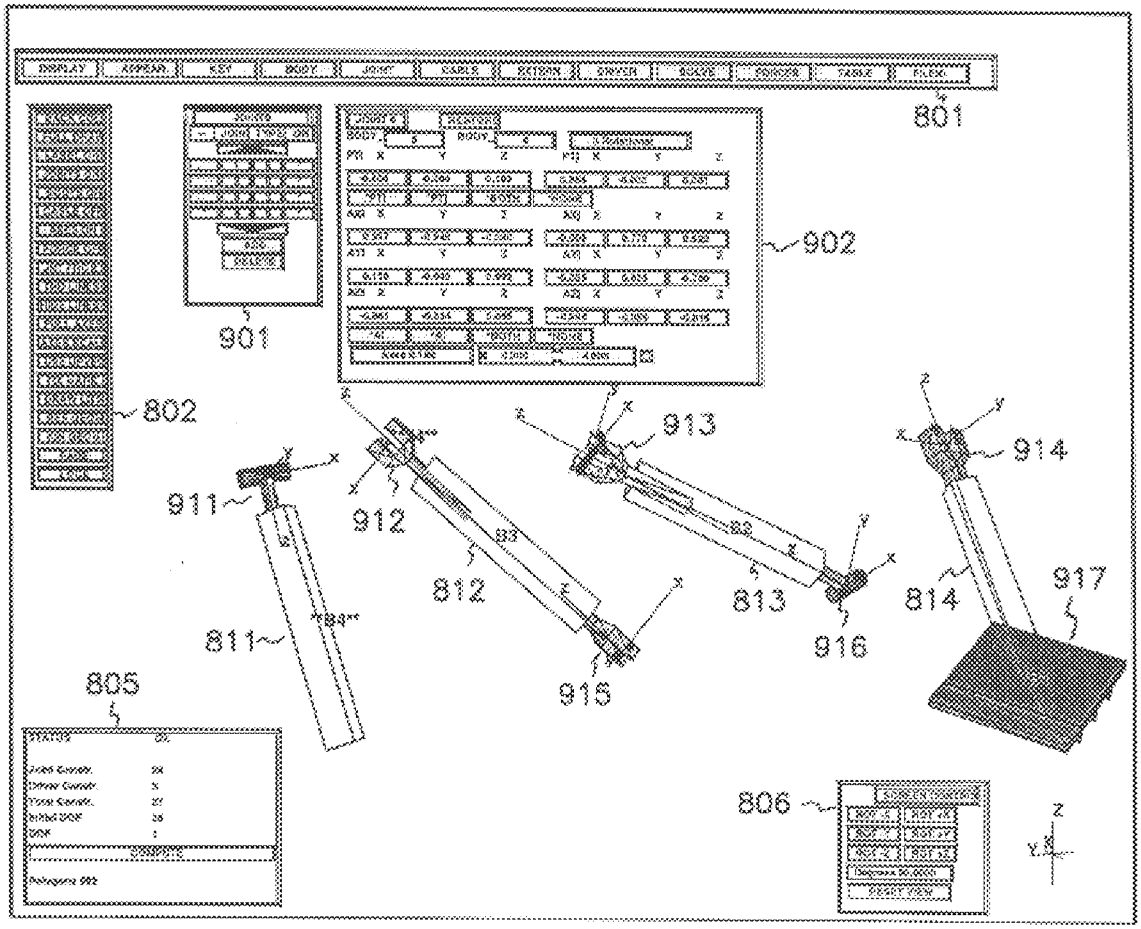
FIG. 9 shows an example similar to FIG. 8 adding kinematic joints.

FIG. 9 shows adding kinematic joints to the display shown previously in FIG. 8. FIG. 9 is much the same as FIG. 8 with the additional features of joints added to the bodies which were created in FIG. 8. Joint menus 901 and 902 allow the user to input particular joints on bodies on the systems. Joints 911, 912, 913, 914, 915, 916 and 917 represent certain joints added to the bodies shown previously in FIG. 8.

Figure 10:
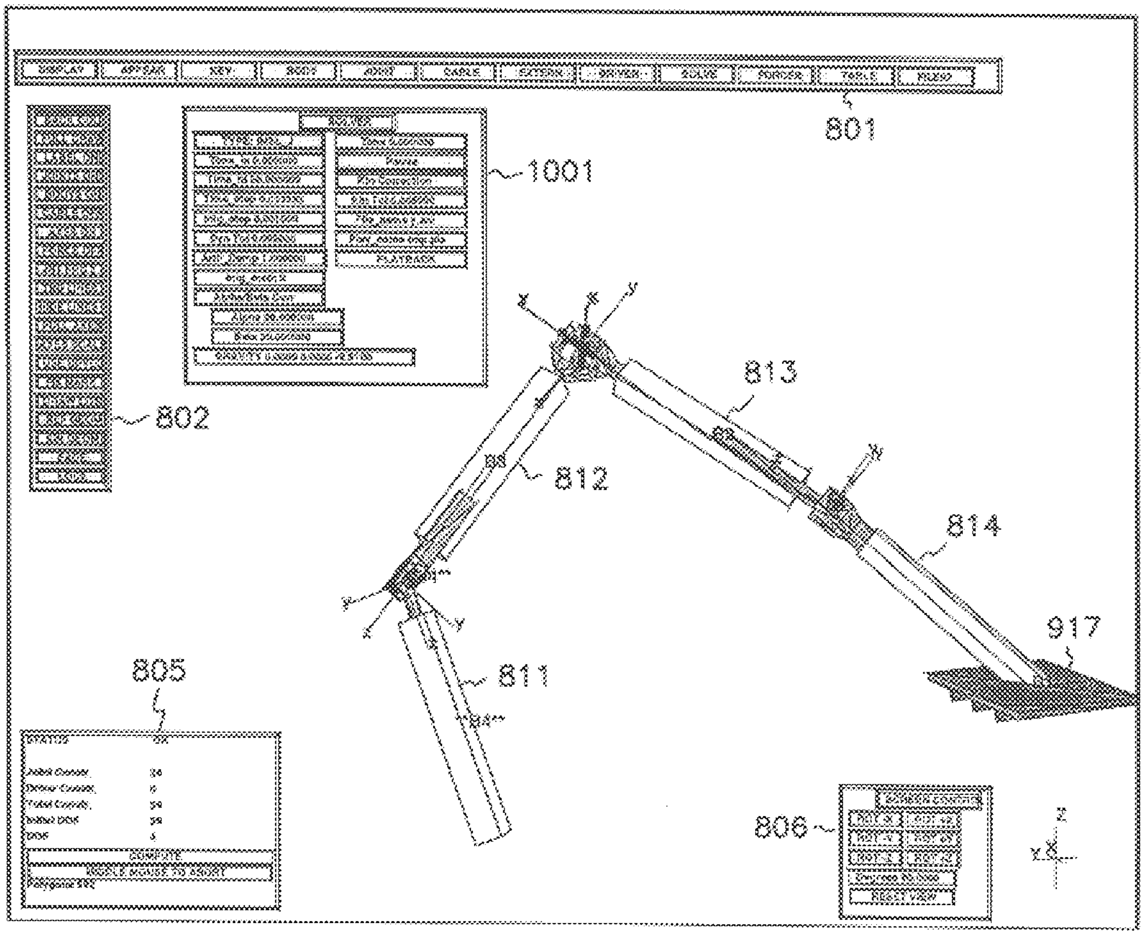
FIG. 10 shows an example of the graphical display solving the kinematic display set up in FIG. 8 and FIG. 9.

FIG. 10 shows the screen solving the kinematic system. Solver menu 1001 represents a menu allowing the user to specify and control the solution of the multibody system. Bodies 811, 812, 813 and ground joint 917 and the connecting joints represent one typical display of a system of a multi-body system simulation as described by the present invention.

Figure 11:
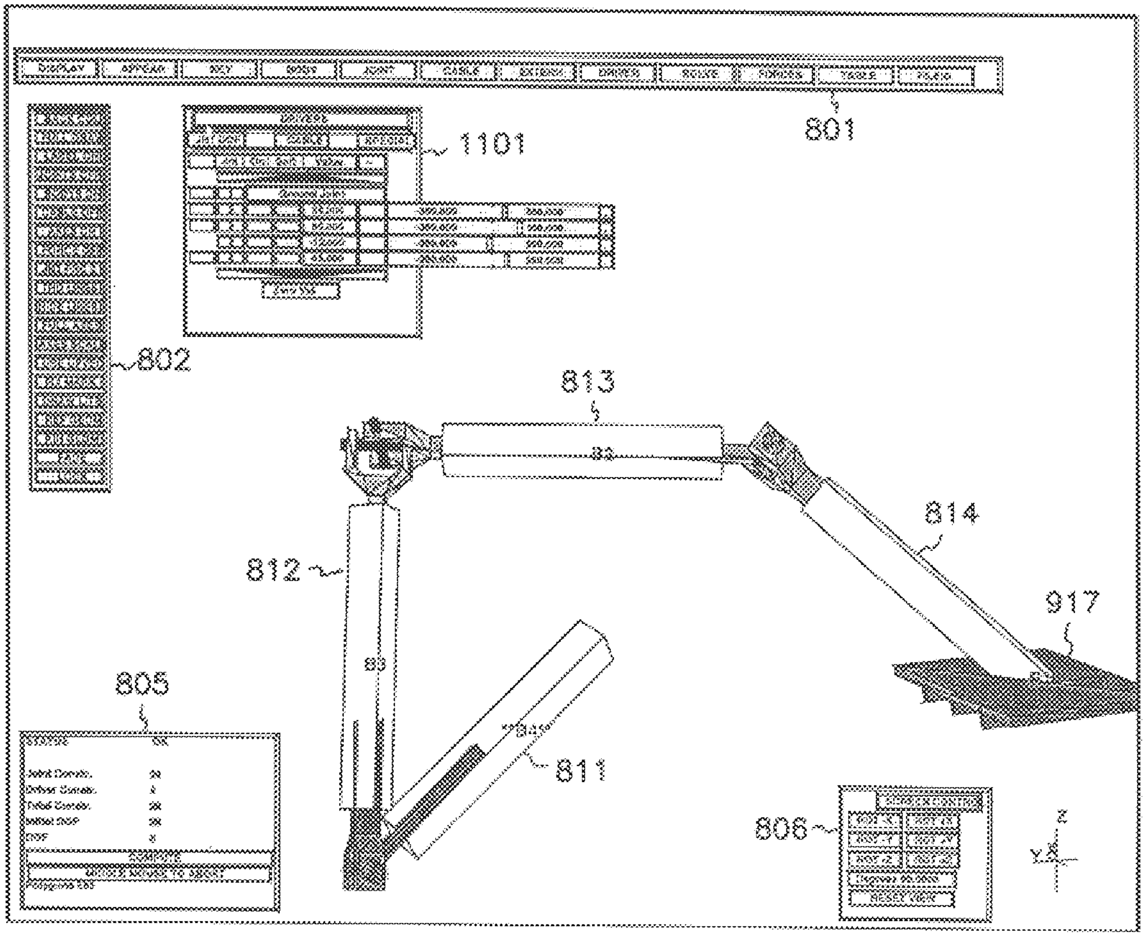
FIG. 11 shows changing the joint driver angles in a simulation.

FIG. 11 shows changing the joint driver angles. Driver menu 1101 allows the user to control joint drivers. Bodies 811–814 represent one particular position within a dynamic display of the multi-bodied system.

Figure 12:
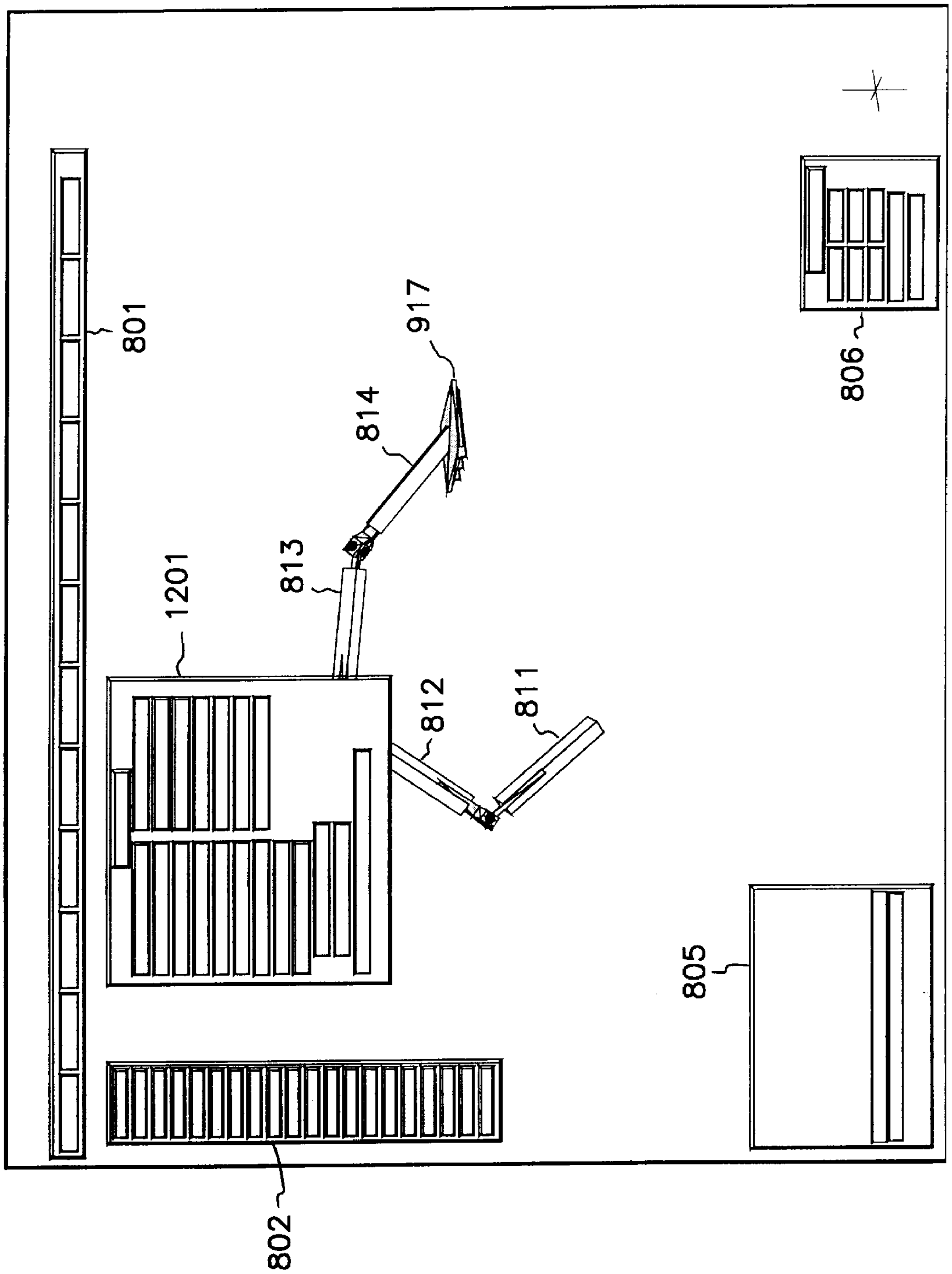

FIG. 12 represents an initial screen display which appears when the dynamics solution is turned on.

Figure 13:
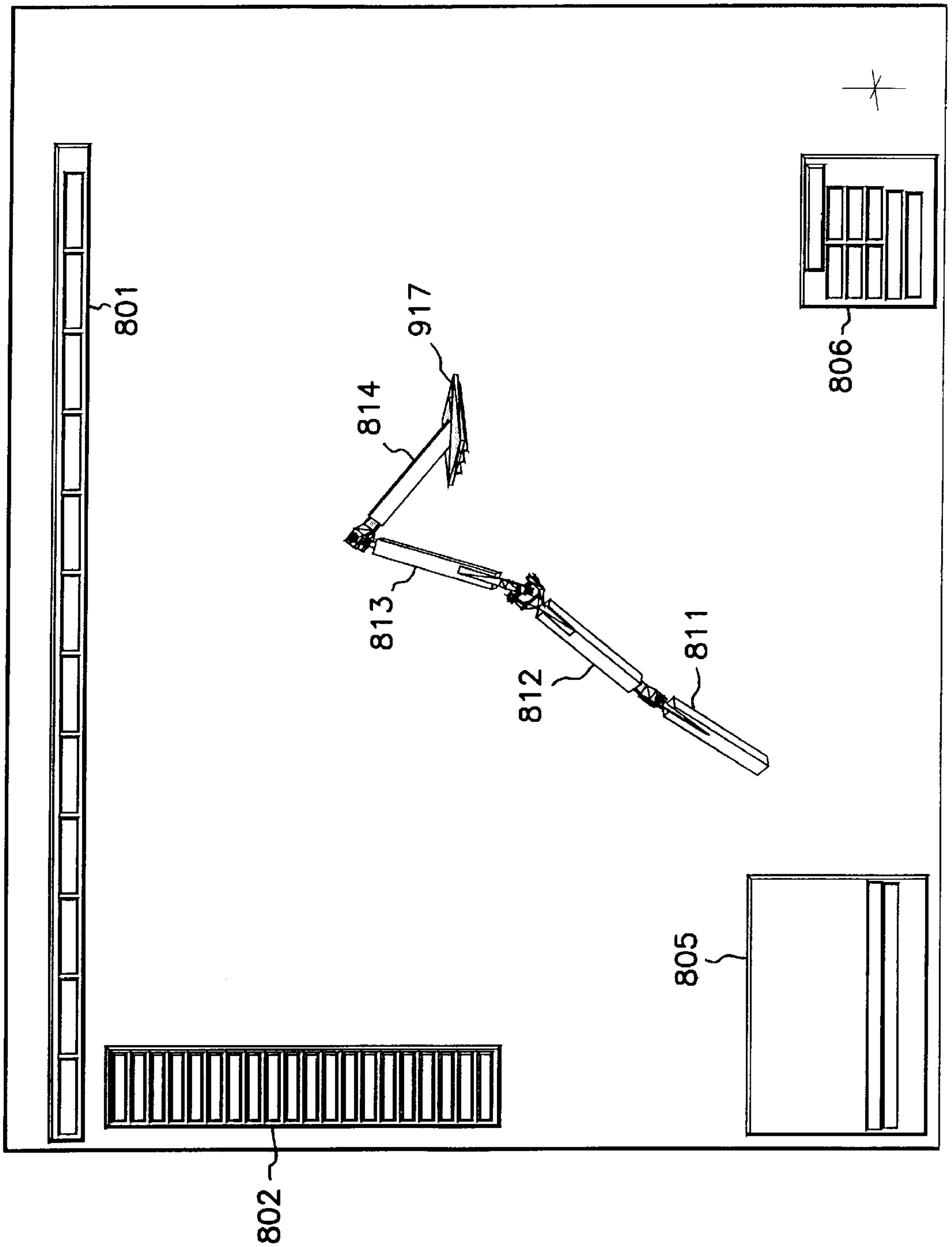
FIG. 13 shows a simulation display of how bodies fall under gravity.

FIG. 13 shows a typical display from the series of displays wherein bodies 811–814 are in the process of falling from the initial position as shown in FIG. 12.

Figure 14:
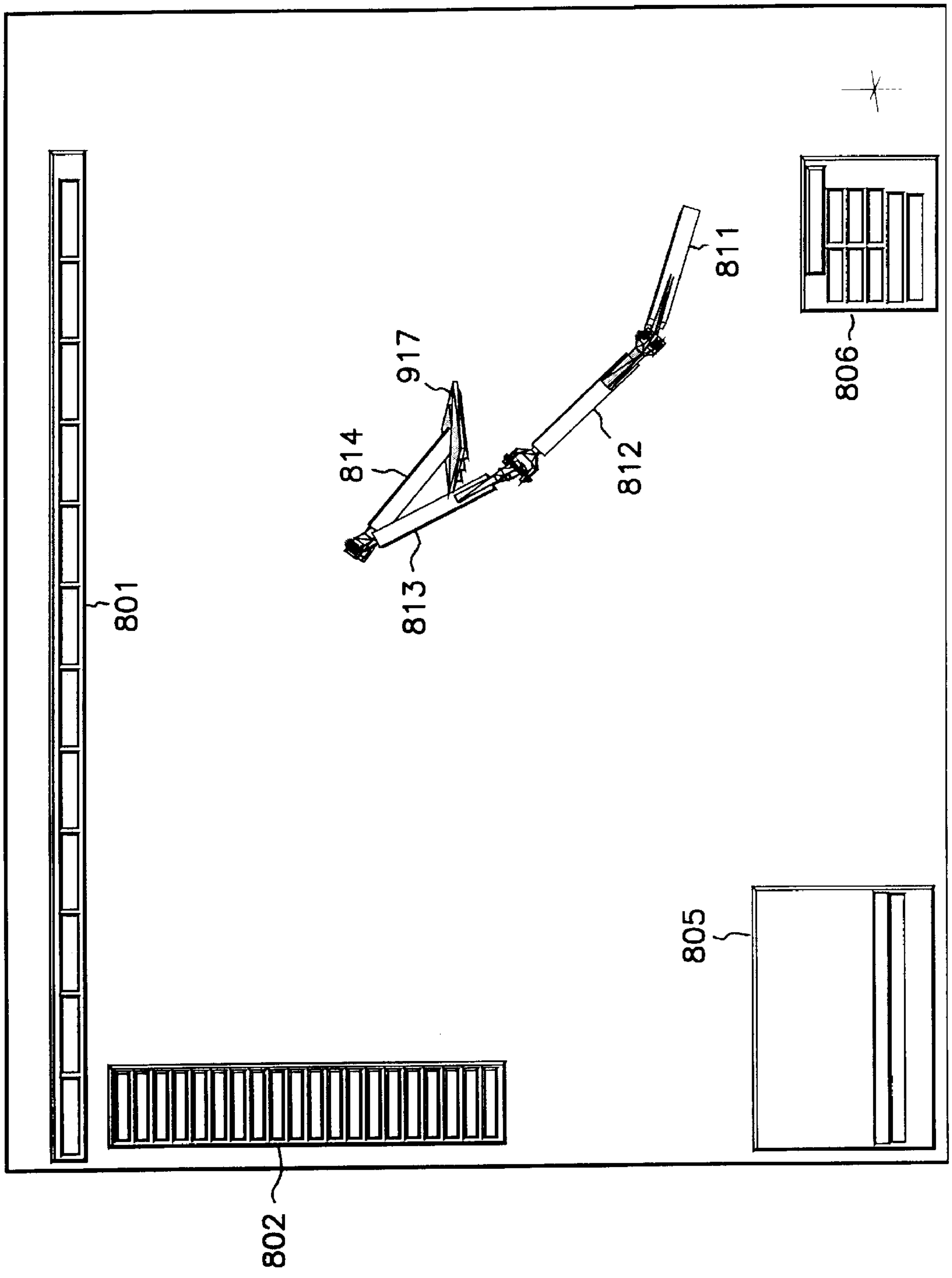
FIG. 14 shows a continuation of the dynamic solution started in FIG. 13.

FIG. 14 shows a subsequent display screen, wherein bodies 811–814 have moved to a further position in the dynamic solution of the multibody system.

Figure 15:
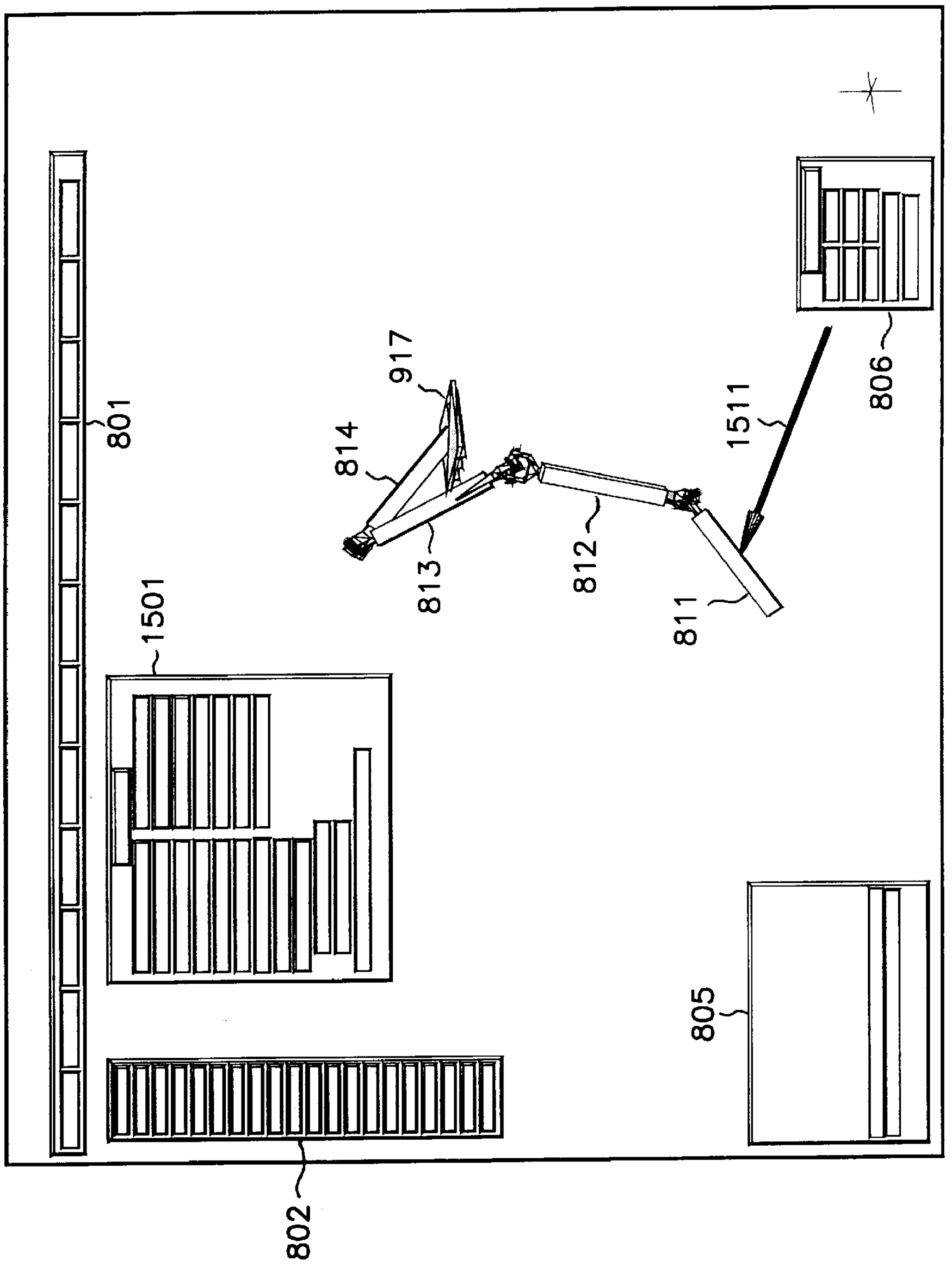
FIG. 15 shows a graphical display showing external force applied while integrating the equations.

FIG. 15 shows a display screen subsequent to FIG. 14, of the multi-body system with an external force 1511 applied to body 811 in the system as a result of the interactive input from a user after the display of FIG. 14. Menu 1501 represents the menu allowing user to specify the application of external force 1511.

Figure 16:
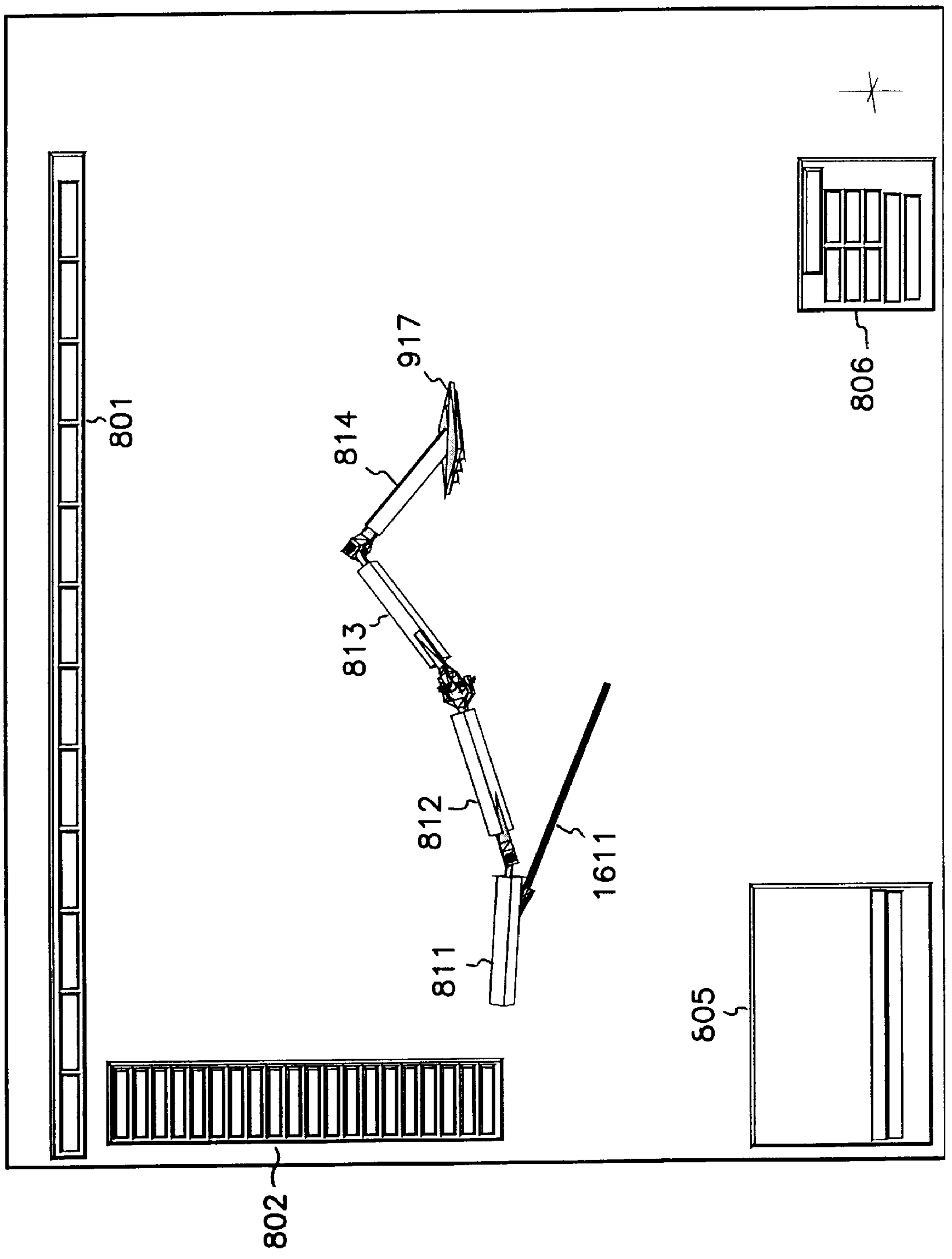
FIG. 16 shows the affect of an applied external force.

FIG. 16 shows a display of the effect or consequence of the applied force from FIG. 15. Force vector icon 1611 represents the current position, direction, and magnitude of force vector 1511 which was applied earlier in FIG. 15.

Figure 17:
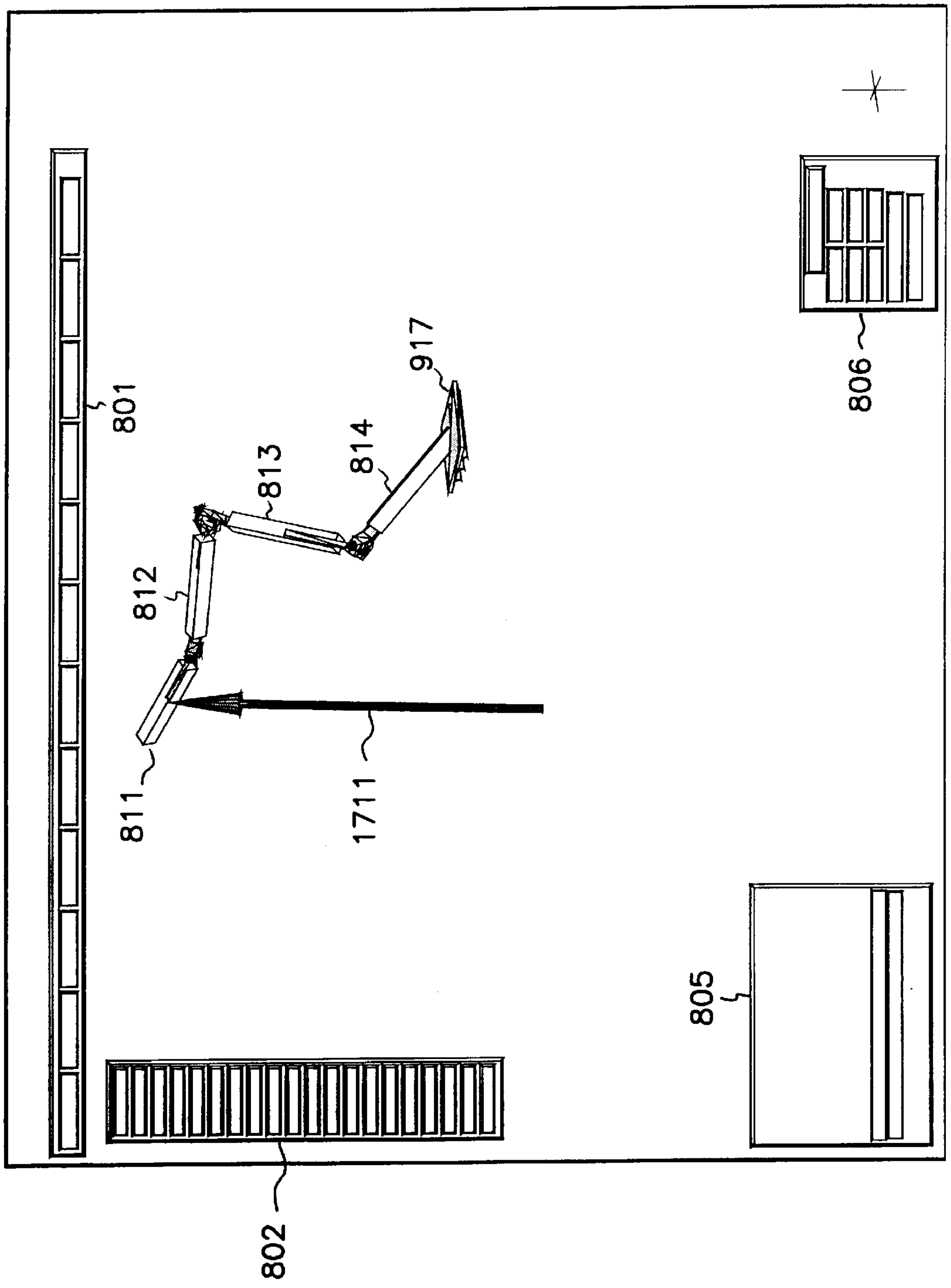
FIG. 17 shows display where the force direction is interactively altered by the user.

FIG. 17 shows a display of a force vector direction and magnitude interactively altered by the user. Force 1711 represents the force being applied to body 811 when the user has interactively altered the direction and magnitude from that originally depicted as force vector 1511 in FIG. 15.

Figure 18:
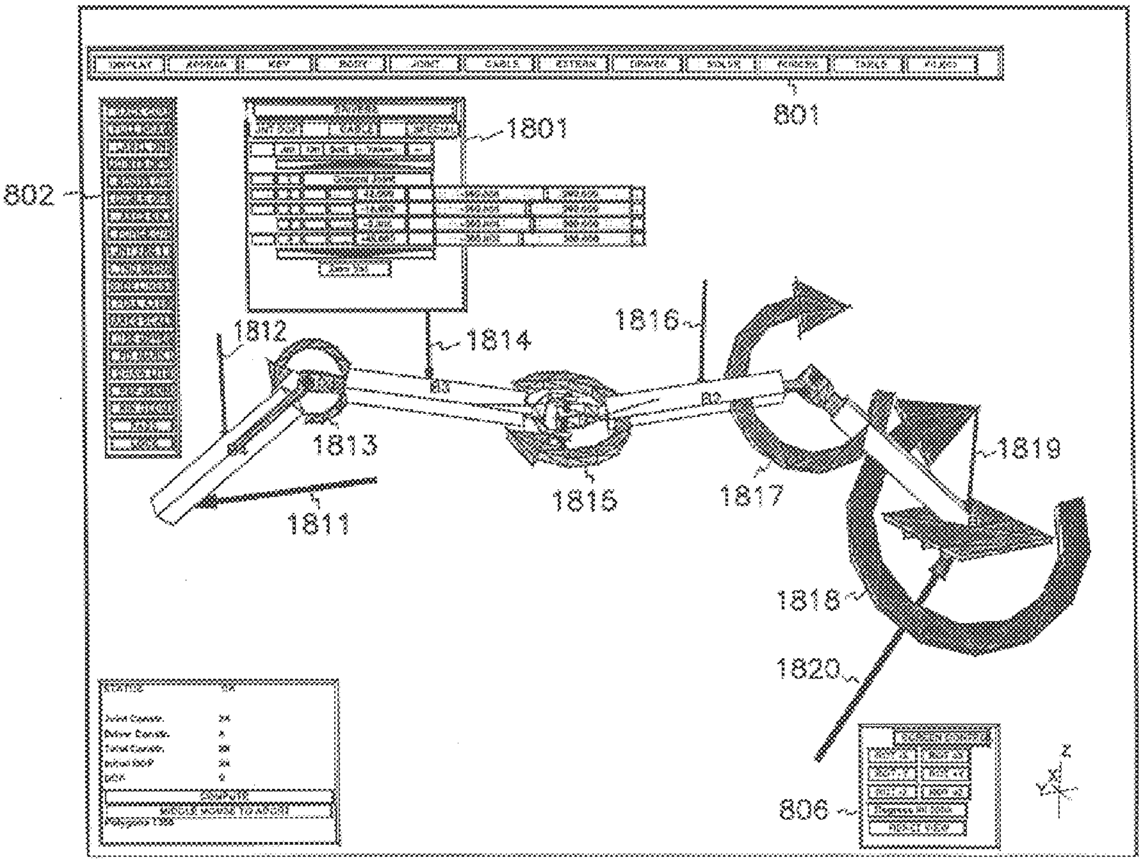
FIG. 18 shows a display of static force analysis.

FIG. 18 shows a display showing static force analysis. External force 1811 has a magnitude and direction as depicted by the size of the arrow displayed by icon 1811. Force icon 1812 shows the direction, magnitude, and point of application of the force of gravity applied on the center of gravity of member B4; Icon 1813 represents the moment on the joint between bodies B4 and B3 of the diagram. Force vector icon 1814 represents the force of gravity acting on body B3. Icon 1815 represents the magnitude and direction of the moment acting on the joint between bodies B3 and B2. In a similar manner force icon 1816 and force icon 1819 and force icon 1820 represent forces on the respective joints or bodies. Moment icons 1817 and 1818 represent the moments on the joints between bodies B3 and B1 and B1 and the ground joint, respectively.

Figure 19:
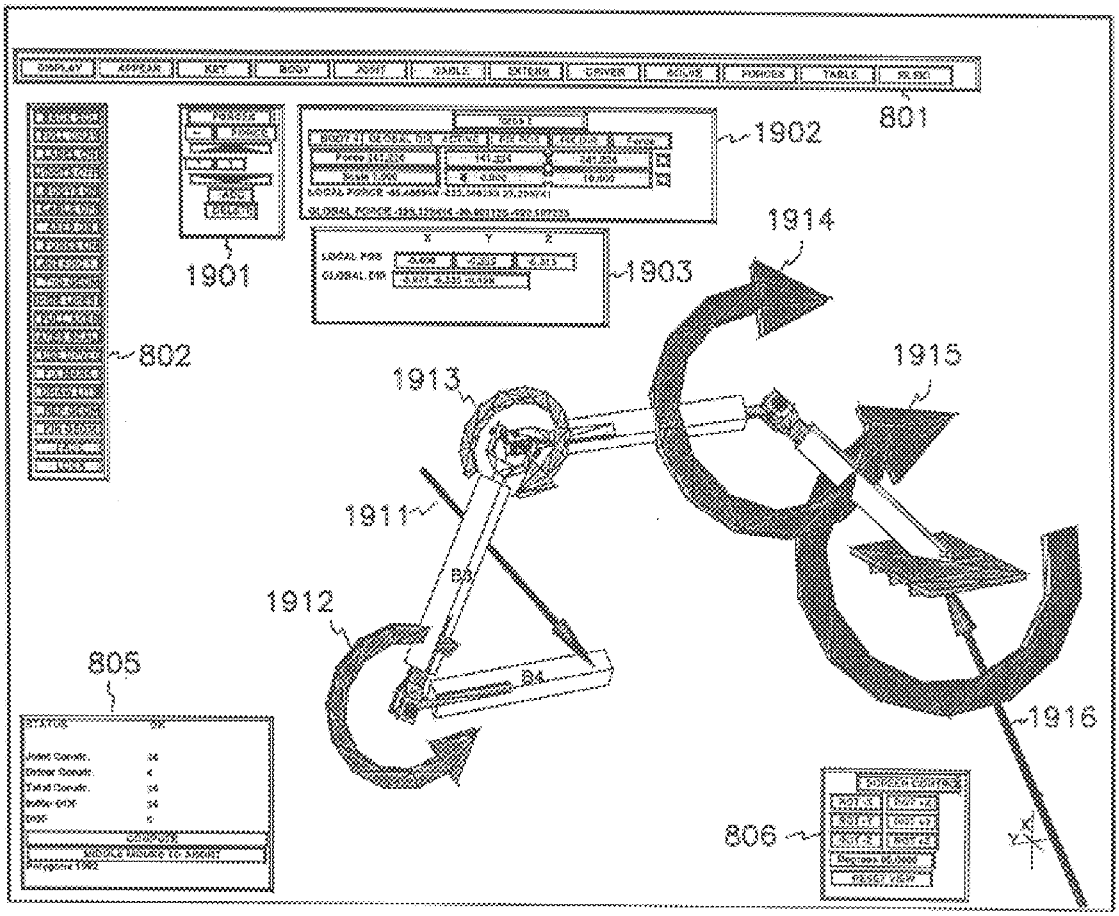
FIG. 19 shows the resulting static forces by varying the applied external force.

FIG. 19 shows the resulting static forces which result by varying the applied external force. External force 1911 represents a different angle and magnitude from the force shown applied on FIGS. 18 and 17. Moment icons 1912, 1913, 1914 and 1915 show the effect of the changed external force on the magnitude and direction of the moments applied to respective joints.

Figure 20:
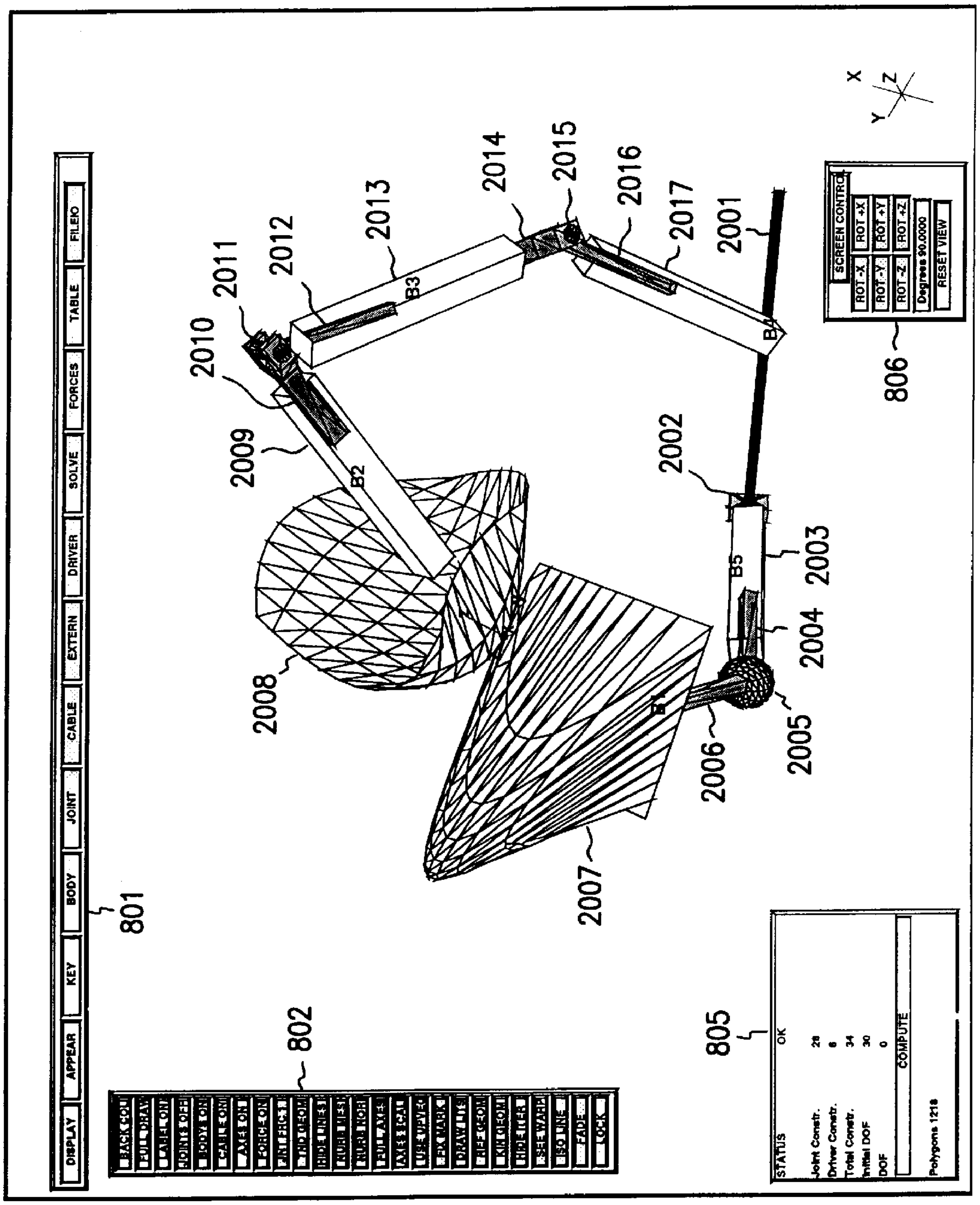
FIG. 20 shows closed loop kinematic system with a surface joint.

FIG. 20 shows a closed loop kinematic system with a surface joint. Surface 2007 represents a specified surface contour on one end of body B1. Surface 2008 represents a different specified surface contour on one end of body B2. The joint between surface 2007 and surface 2008, and the resultant motions of the various bodies of the multibody system can then be simulated by the computer.

Figure 21:
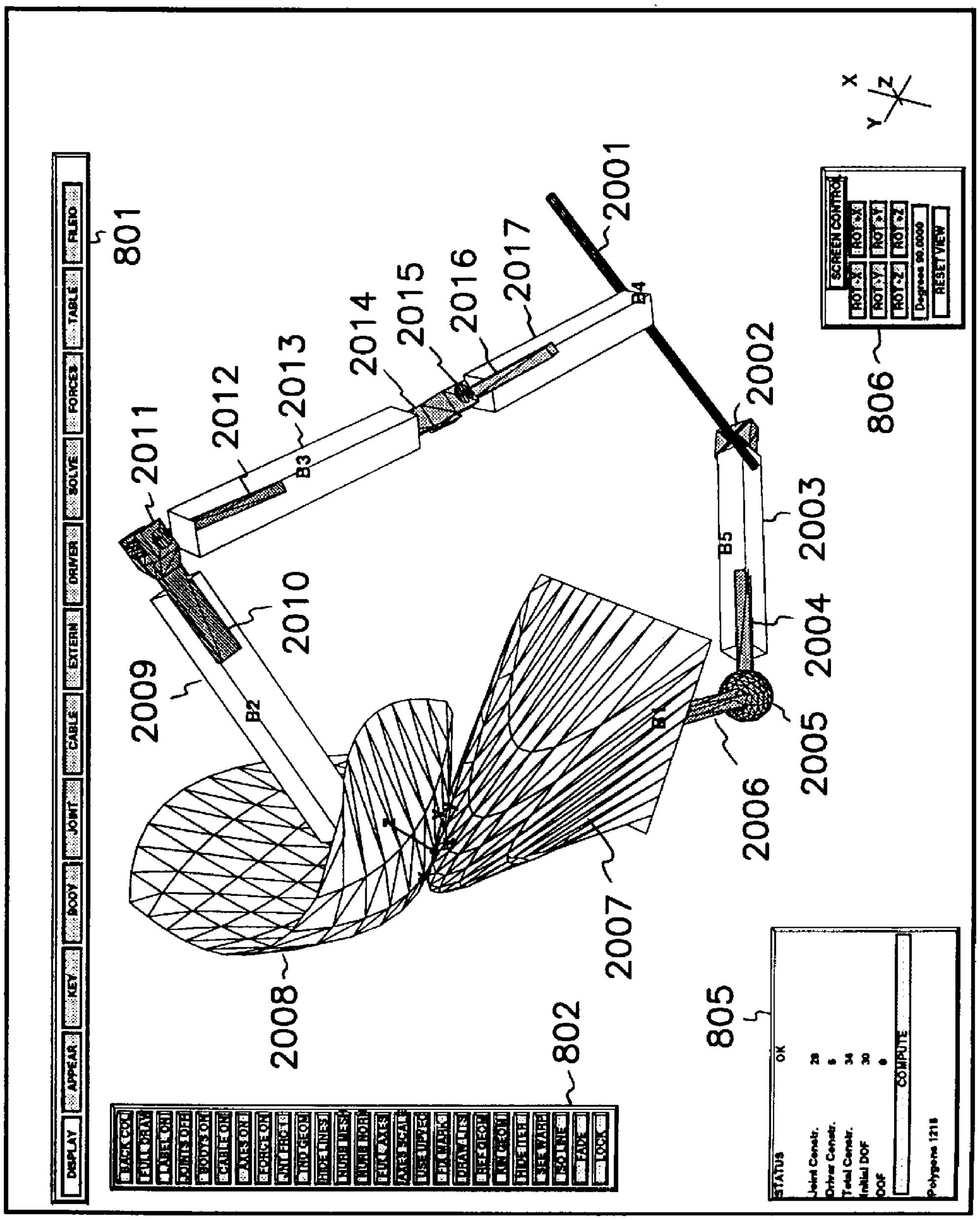
FIG. 21 shows a graphical display of sliding surface joints along one another.

FIG. 21 shows the bodies as depicted in FIG. 20, wherein surface 2007 has been slid relative to surface 2008, such that they contact at two different points along their respective surfaces, relative to the display shown in FIG. 20.

Figure 22:
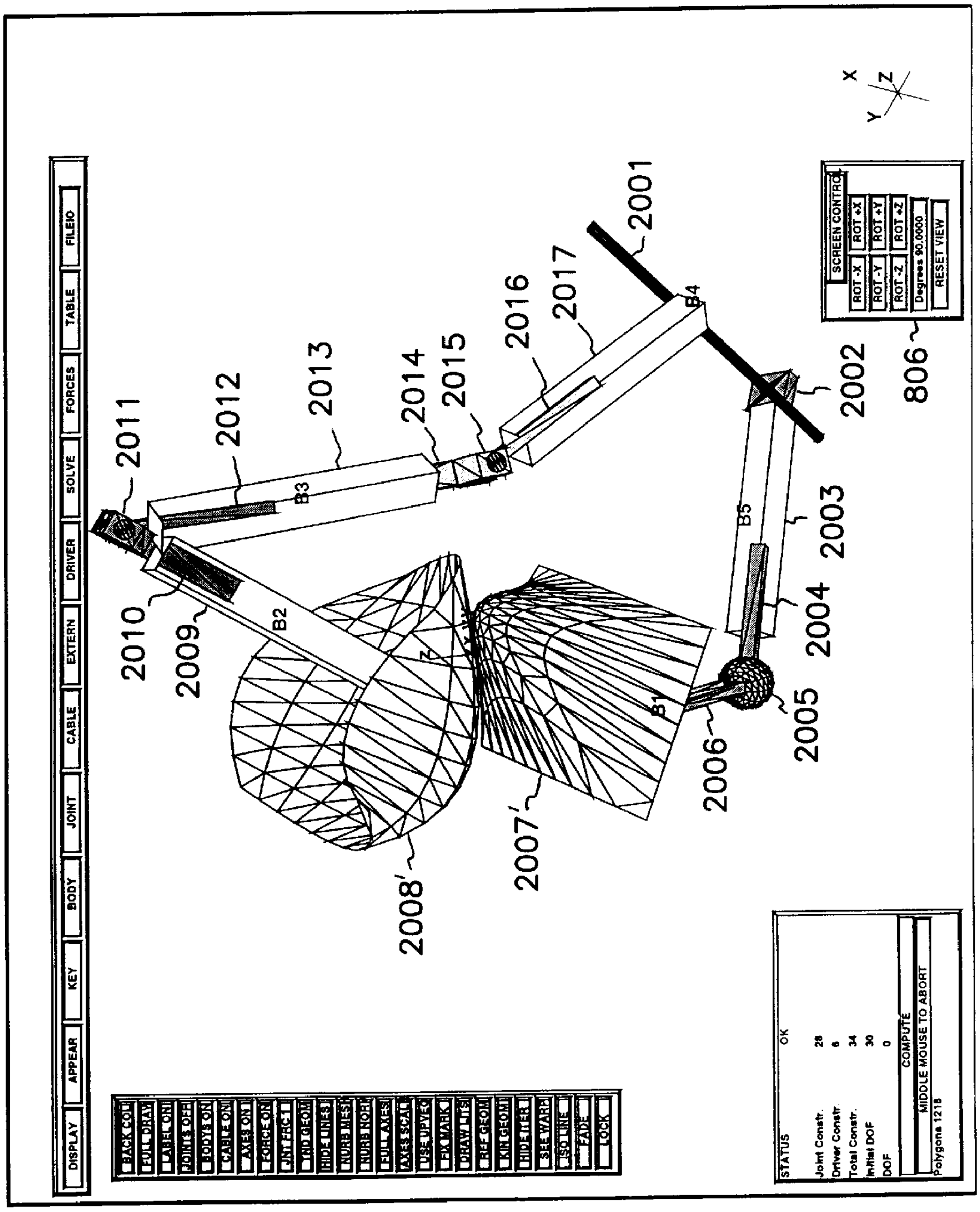
FIG. 22 shows interactively changing the surface shapes while solving the kinematics problems.

FIG. 22 shows the results on the graphical display, wherein the user has modified surface 2007 into surface 2007' and surface 2008 has been modified to surface 2008'.

Figure 23:
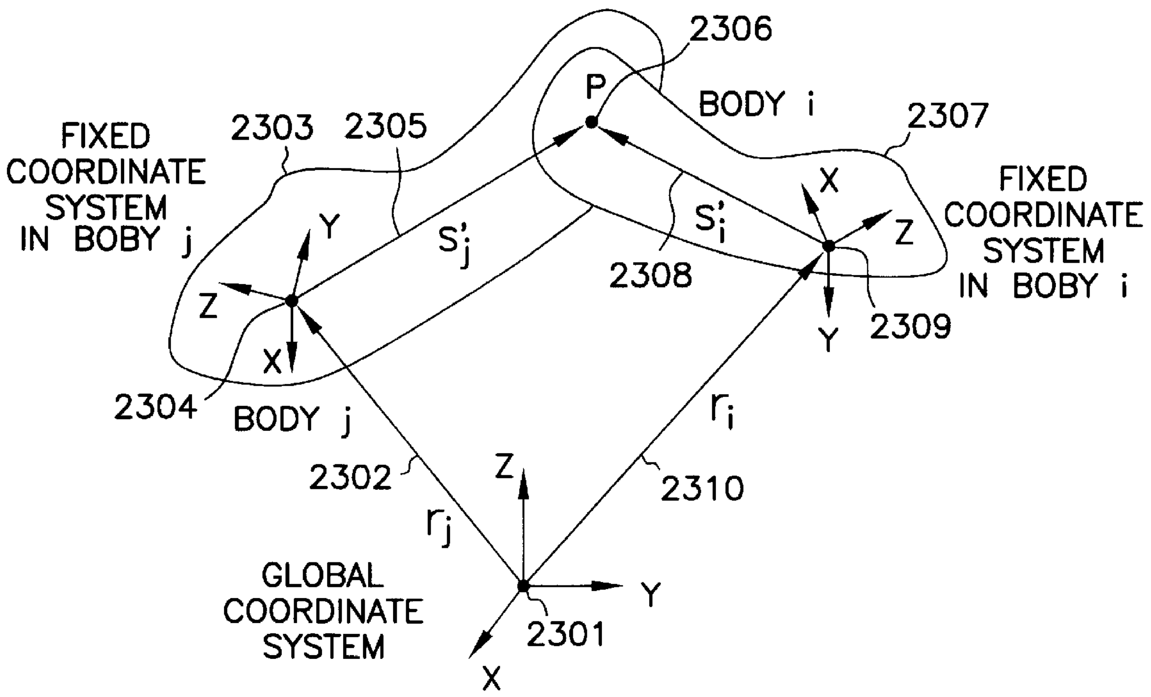
FIG. 23 shows an example of how spherical joint constraints are set up.

FIG. 23 shows a graphical representation of the mathematics involved in a spherical joint constraint. Origin 2301 represents the cartesian origin in the vectors involved in the joint.

The parameters describing the bodies of the multibody system to the computer can include parameters describing the mass, mass distribution and dimensions of the body, the position and characteristics of any joints connected to the body, any cables, springs, dampers or pulleys connected to the body, and any forces, including gravity, which are acting on the body.

There are many applications of such an interactive graphical simulation system, such as prosthesis design, surgery design and preparation, and reconstructive surgery in the biomedical and biomechanical fields, car usability and crash performance simulation and design, furnature ergonomic design, 4-arm simulation in the mechanical design field, and airplane and aerospace design. One feature that makes this method and system so useful is that the designer can input a hypothetical design, see how it acts, and change the design and do what-if scenarios and get feedback in real time to the changes. Once a satisfactory simulated design is produced and refined, the designer can then have a prototype fabricated with great confidance that the physical embodiment will closely match the simulated model. The real-time interactive user interface greatly improves the productivity of the user.

SECTION 1

General multibody simulation packages currently use a batch approach in which the user first creates an input file containing a description of the multibody system. The batch process is then initiated and the user waits until the entire simulation is computed before the results can be analyzed. Then, if a change in a parameter is desired, the input file is altered and the entire batch process is performed again. FIG. 1 details the general flow of the batch approach.

This paper enhances the utility of multibody simulation by creating an interactive graphics based environment for kinematic, dynamic, and force analysis. The interactive environment allows the user to make changes and visualize the results while a simulation is in progress. As shown in FIG. 2, the interactive interface combines the steps shown in FIG. 1 into a single interactive environment. The input file is optional since the system may be completely defined with the interactive interface. The output file is also optional since the simulation results are graphically displayed as they are computed. The input and output files are provided in order to allow a current session to be saved and used later.

VISUAL INTERACTIVE MULTIBODY SYSTEM-(VIMS)

The visual interactive multibody system, VIMS, is a software package developed to demonstrate the advantages of an interactive multibody analysis package. While current multibody software packages are a valuable tool for testing and development, their use has been limited because they require a very sophisticated user. VIMS is an attempt to expand the usefulness of multibody software packages by allowing the user to interactively enter and control system parameters using interactive computer graphics. The interactive three dimensional user interface provides an intuitive user friendly environment to develop multibody models and analyze complex systems. This type of intuitive interface will expose a wider range of engineers to the power of multibody analysis software.

VIMS provides the capability to visually construct general multibody systems and perform kinematic, dynamic, force, and optimized solutions. Multibody systems including open and closed-loop, three dimensional, rigid-body systems may be modeled. Currently, the software supports combinations of revolute, universal, spherical, translational, cylindrical, screw, arbitrary three dimensional surface contact joints, and cable/pulley systems. These complex surface contact joints and cable/pulley systems present many unusual and complex body interactions. The interactive environment provided here is ideal for manipulating and visualizing complex systems such as these.

Multibody models may be created using the visual interactive interface, or may be loaded through a user supplied text file. The text file may be constructed by hand in the traditionally way, or may be a file from a previous VIMS session. The text file contains both the graphical information that describes the shape and appearance of all bodies and the multibody information such as the body and joint parameters.

In constructing a new multibody system model, new bodies can be created and positioned in three dimensional space using the mouse, or by entering the position and orientation values through the keyboard. Any user defined geometry may be applied to the bodies to represent them graphically. Joints are then added between the bodies by again positioning and orienting them with either the mouse or keyboard. Likewise, cable/pulley systems and external forces can be entered with either the mouse or keyboard.

The basic operations of VIMS are shown in FIG. 3. Generally, after each iteration or time step, all button and menu parameters are checked for any changes. If any changes were found, the parameters are updated and the new values are immediately applied to the next iteration or integrated time step.

At any time, even while any of the solution process is progressing, any of the system parameters may be altered graphically or by inputting values with the keyboard. While a solution method is in progress, it is possible to visualize the effects of the varied parameter. For example, while solving the dynamic problem, it is possible to visualize the effect of rotating or removing some external force or removing a joint from the system all together. The capability to interactively modify and visualize any change in the system parameters is a primary advantage of this software and provides new and powerful insight to the user.

Many other visual techniques are integrated into the software. For example, force and moment icons give added insight to force analysis. VIMS displays forces and moments graphically with three dimensional arrows that represent both direction and magnitude. Also, color is used extensively. Cable/pulley systems are depicted with different colors to indicate their relative force. These arrows and color changes provide a powerful method to provide even more information to the user in an efficient and effective manner.

VIMS is designed to solve general, large motion, rigid, multibody problems. Deformable body and vibrational problems are not addressed in this paper. The basis of all computational solution methods for this paper is the formulation of constraint equations. It is important to note that this method iteratively solves the equations for the kinematic methods and has to re-solve the dynamic equations at each time step. Therefore, the explicit equations are not formulated.

Capabilities

VIMS currently has kinematic and force elements available as listed in Table 1. The constraint formulation method used in this paper allows any joint or driver types to be added to the program. Therefore, the formulation method is not limited to the joint types listed in Table 1. To demonstrate the generality of this method, a kinematic surface-surface joint model has been developed which allows two parametric surfaces to slide along one another. The user has the ability to interactively change the shape of either surface and visualize the kinematic results.

Drivers are also provided to control all degrees of freedom remaining for each joint. For example, the addition of a universal joint prompts VIMS to automatically formulate two driver constraints. These driver constraints may be activated by the user to control the two degrees of freedom of the joint. Several other types of drivers are also available to control the interaction between the bodies.

Force elements are also provided. Spring and damper systems may be connected between bodies or external forces and moments may be applied externally to any body.

Analysis Options

The kinematic solution process allows the user to control all driver degrees of freedom interactively. Whenever a slider is altered to change a driver, the graphics display is instantly updated to show the change in the system. When a valid solution does not exist for user defined DOF's or drivers, the kinematic system will keep iterating and never find a solution. To overcome this problem, an optimized solution method is also included in the software. This method enforces the joint constraint equations while the driver constraints are allowed to vary from the value the user specifies in order to find the closest valid solution. This closest solution is determined by minimizing a function of the driver constraint errors using a constrained optimization method. Therefore, if the driver values provided by the user give a valid solution, the process will minimize the driver constraint error to zero.

TABLE 1

VIMS ELEMENT LIBRARY

| Joints | Drivers | Force Elements |
|---|---|---|
| Ground | All Joint DOF | Spring/damper systems |
| Revolute | Point | External forces |
| Universal | Orientation | External moments |
| Spherical | Cable/pulley | |
| Translational | | |
| Cylindrical | | |
| Screw | | |
| Surface | | |

Control of the dynamic solution process works in much the same way as the kinematic process. When the dynamic solution is started, user defined external forces, kinematic drivers, and the initial configuration are used to formulate the equations. As the numerical integration proceeds, the motion is interactively displayed on the screen. Any system parameters may be altered at any time. For example, the direction or location of a force may be moved during a solution execution with the resulting motion instantly displayed. At any time, the joint and driver forces or moments may be displayed as lists of values, bar graphs, or graphical three dimensional icons mapped over the geometric display. Force arrows are displayed at their correct three dimensional location and direction, and the size of the arrow represents the magnitude. For large or complex systems, the speed of the computers used for this paper is not fast enough to integrate the equations in real-time. Therefore, the motion displayed during the integration is also stored to allow playback at real-time.

The optimized static force analysis allows forces to be calculated for redundant systems. For example, a single DOF joint may be held in place by ten force elements. If the system had only one force element, there would be only one solution and the solution would be straight forward. Since there are ten force elements when only one is needed to hold the joint in place, there are an infinite number of solutions that exist for the force distribution between force elements. Therefore, an optimal distribution must be specified by the user as a cost function. One acceptable method is to minimize the weighted sums of the squares of the forces. The method implemented for this software is a minimization using a quadratic cost function. The weighting on any joint, driver, or cable/pulley force or moment may be controlled by the user. As in the dynamic solution, the forces may be displayed as lists of numbers, bar graphs, or graphical arrows. Again the process is interactive. All forces exerted by joints, drivers, and eternal forces may be explicitly controlled by the user. For example, a driver moment on a revolute joint may be defined as 1 Nm. The other unknown forces and moments will automatically change in order to satisfy the static force equations. While performing any of the above operations, movement of the magnitudes and directions of the force and moment arrows are displayed as they are computed.

VIMS User Interface

The VIMS interface consists of several pull-down menus that allow addition and alteration of bodies, joints, springs and all other elements and parameters of the multibody simulation. Parameter values and coordinates for elements such as bodies, joints springs, and external forces may be entered in several ways. A button in the corresponding pull-down menu may be selected to enter the coordinates or orientation with the keyboard. The mouse may also be used to intuitively slide and rotate the element about the screen. Whenever a parameter is altered, the graphics display is immediately updated to reflect the change. This type of interface provides the feedback required for modeling complex multibody systems.

As stated earlier, all elements are represented on the screen as three dimensional geometric polygonal objects. Each defined body is initially displayed as a simple default geometry as shown in FIG. 4. The user may also define a specific geometry to be read in and used in place of the default geometry as shown in FIG. 5.

Joints icons are also displayed as three dimensional geometry. The seven common joint icons are shown in FIG. 6. For the surface constraint joints, the actual surfaces are drawn instead of a joint icon. This allows the user to visualize how the complex surface interactions are taking place and provides intuitive estimate of how the surface shapes will affect further motion.

Scaled force icons are also provided for intuitive display of the magnitude and direction of three dimensional force and moment vectors resulting from dynamic of static force analysis. These arrows, shown in FIG. 7, interactively change scale, rotate and translate based on how their computed directions and magnitudes change.

EXAMPLES

The following examples provide a glimpse of the advantages of an interactive environment for multibody simulation. Since a major aspect of the software is the display of motion, a full appreciation of the advantages is limited here. The package provides many queues by displaying full color shaded images. However, for clarity, black and white line drawings are provided for this paper. All the line images were produced by the VIMS software package and correspond to exactly what the user would see. The only difference is that instead of full color, shaded polygons rendered on the computer screen, hidden line images were produced for this paper.

General Open Loop System

This section briefly shows the steps taken to set up a simple multibody system inside of VIMS. Four bodies were added and randomly placed on the screen with the body menu as shown in FIG. 11. Next, two revolute joints and a universal joint were connected to each body as shown in FIG. 11. The joint coordinates were interactively placed in the local coordinates of the bodies by using the mouse to slide and rotate them on the screen.

Notice that the joints are currently all separated since the kinematic solution has not yet been activated. FIG. 11 displays the system after the kinematic solution method was initiated. Finally, FIG. 11 shows a different kinematic position based upon changes of the user defined joint driver angles. These driver angles were interactively manipulated by changing one of the four driver sliders displayed in the menu above the kinematic system. Note that since there are two revolute joints and one universal joint, there are four degrees of freedom that are required to be defined to obtain a unique kinematic solution.

After the kinematic solution has been used to configure the system in an initial configuration, the dynamic solution may be initiated. The motion depends on the forces due to gravity, and user applied external forces, drivers, and spring/dampers. While the system equations are being integrated, any of the parameters may be altered. For example, FIGS. 12, 13, and 14 demonstrate a kinematic system falling due to gravity. In FIG. 15 and FIG. 16, an external force was applied interactively during the solution process. Finally, FIG. 17 demonstrates the effect after the user interactively rotated the direction of the force. The integration may be paused at any time and the previous solution may be played back in realtime.

For the dynamic solution process, it is necessary to compute the Lagrange multiplier values at each time step. Since the multipliers specify the forces exerted by the constraints, dynamic force analysis is automatically provided by solving the system of dynamic equations. VIMS allows the user to view the forces in several ways. The forces may be displayed simply as a list of values or they may be viewed as dynamic bar charts. An alternative is to display the forces as three dimensional icon arrows that indicate the magnitude, direction and location of the forces and moments. This method provides a much more intuitive method for viewing the forces and moments, especially when the forces are changing due to the dynamic motion.

Static force analysis may also be performed with VIMS. FIG. 18 displays the resulting joint and driver forces and moments necessary to keep a system in static equilibrium. A user defined external force acts on the last body along with the forces due to gravity. FIG. 19 demonstrates the ability to interactively alter the direction and magnitude of the externally applied force or change the orientation of the system while visualizing the resulting changes in the joint and driver forces.

Closed Loop System with a Surface Joint

The following example describes a more complex multibody system to demonstrate the generality of VIMS. This model consists of a five body, closed loop system with a variety of joint types. The system consists of a complex surface/surface contact joint, two revolute joints, a cylindrical joint, and a spherical joint. The surface/surface joint consists of two user definable NURBS surfaces which are constrained to contact at some point in each surface where both normals are colinear. Also, several other specific geometries have been loaded into the system to clarify the body configurations.

FIG. 20 and FIG. 21 demonstrate the effect of changing the driver angle of one of the revolute joints. Notice how the surfaces are allowed to slide along one another and the other joint angles are all allowed to vary in order to satisfy the constraint equations. The user may also interactively change the shape of the surfaces and analyze the kinematic effect instantly. For example, FIG. 22 demonstrates the effect of pulling a control point of the lower surface in order to change the kinematic shape of the joint. Notice how the surface contact point and joint angles change to satisfy the constraint equations.

This paper broadens the usefulness of general multibody systems by developing a total interactive graphical interface. The software, called VIMS, is a multibody package with a user interface that provides interactive control and display of three dimensional multibody systems. With the graphical interface, the construction of the multibody system is more convenient and the interpretation of the results is extremely efficient and intuitive.

VIMS is capable of modeling a wide variety of mechanical systems. Both open and closed-loop models are supported. In addition, the equation formulation method allows any type of joint to be defined in the software. Currently, the seven most common types of three dimensional joints have been implemented in VIMS. A general surface/surface joint model has also been incorporated to model complex surface interaction analysis.

MULTIBODY SIMULATION THEORY

The formulation of the multibody simulation theory used in this paper is briefly described in this section. For a more in-depth discussion of multibody simulation using Cartesian coordinates and constraint equations, Nikravesh (1988) is recommended.

Body Definition

In order to compute the equations of motion for general systems, the formulation used for this paper depends greatly upon the general Cartesian coordinate method for defining body positions. In three dimensional space, a single unconstrained body has six degrees of freedom (dof). There are many ways to define the position and orientation of the body with respect to some fixed reference frame. Definition of the position of a body is straight forward. Three Cartesian coordinates may be selected to define the position. The orientation of the body is more difficult to define. Four Euler parameters are convenient for multibody simulation, as proven by Kim and Vanderploeg (1984) and Nikravesh (1988). For this method, four values are required to define three independent coordinates with no singularity problems. Also, the 3×3 transformation matrix can be obtained from the four Euler parameters without any trigonometric calculations. Since the matrix form is desired for computer implementation, this is an important aspect of Euler parameters. The Euler parameters can be thought of as a rotation, $\phi$, about a unit vector, u. The Euler parameter vector, p, is defined as $$p=\begin{bmatrix} e_0 \\ e_1 \\ e_2 \\ e_3 \end{bmatrix}=\begin{bmatrix} \cos\left(\frac{\phi}{2}\right) \\ u_1\sin\left(\frac{\phi}{2}\right) \\ u_2\sin\left(\frac{\phi}{2}\right) \\ u_3\sin\left(\frac{\phi}{2}\right) \end{bmatrix} \quad (1)$$

Therefore, the coordinates for each body may be represented as $$q_i=[r_i^T, p_i^T]^T \quad (2)$$

where $$r_i=[x_i y_i z_i]^T \quad (3)$$

defines the Cartesian position of the i'th body's center of gravity in some fixed coordinate system. The Euler parameter vector, $p_i$ defines the orientation with respect to the same coordinate system.

To make the method general enough both open and closed loop systems with any types of joints, points on each body are defined using the body fixed local coordinate system. This allows joints and forces to be defined in the same way for each body regardless of the system topology. Each body is initially unconstrained and has six DOF. This assumption makes it possible to apply any type of constraint or relation between the bodies. This generality is the primary advantage of this method. However, this method results in the maximum possible set of equations since six dynamic equations have to be defined for each body and also a kinematic equation for each constraint. These large sets of rather sparse equations require more computing time. While other methods are more efficient with respect to the number of generated equations, they have difficulty defining general systems.

Constraint Equations

So far, each body has been assumed to have six degrees of freedom. The approach taken in this paper is to look at joints and drivers as constraints that limit these six degrees of freedom. For example, if a revolute or hinge joint is desired to connect two bodies, five constraint equations are needed to define the joint. The result would be two bodies with one DOF between them. Three equations are needed to constraint some common point in each body to always coincide spatially. If these were the only constraints applied, the result would be a spherical joint. The definition of two more equations to keep a fixed vector in each body parallel to each other results in a revolute joint.

When the necessary number of joint and driver constraints are defined for a system, the nonlinear algebraic equations are algebraically iterated until they are all satisfied. When all constraints have been satisfied, the resulting coordinate values define the new kinematic positions and orientations for each body. The number of constraints must equal the total number of degrees of freedom. In other words, n equations are needed to solve n unknowns.

All joint parameters are defined in the local body fixed coordinate systems. For example, a spherical joint is defined by constraining a locally defined point in two separate bodies to coincide in global space as shown in FIG. 23. The local points, specified by $s'_i$ and $s'_i$, may be converted to global coordinates, $s_i$ and $s_j$, by pre-multiplying the local points by the respective body's 3x3 transformation matrix.

$$s_{i(3\times1)}=A_i(3\times3)s'_{i(3\times1)} \tag{4}$$

The distance between the global points is zero if the constraint is satisfied $$d=(r_j+s_j)-(r_i+s_i)=0 \tag{5}$$

Therefore, the constraint equation for a spherical joint, is written as $$\Phi=(r_j+A_js'_j)-(r_i+A_is'_i)=0 \tag{6}$$

All other kinematic constraint equations for joints and drivers are formulated in a similar manner as in Nikravesh (1988).

A matrix of the partial derivatives of the kinematic constraints with respect to each body coordinate is also formulated. This matrix, known as the Jacobian, is denoted as $\Phi_q$. For the kinematic solution, the partial derivatives are used to determine the necessary changes in body coordinates to satisfy the constraint equations. The Jacobian matrix is also used to formulate the dynamics equations and to compute the static force analysis.

Kinematics Problem

The kinematics problem is solved by first making an initial guess of all body coordinates and then formulating the constraint values and the Jacobian matrix based on the current body coordinates. The following linear system is solved and the body coordinates, constraints, and Jacobian are repeatedly updated until the constraint values approach zero.

$$[\Phi_q(q)]\Delta q=-\Phi(q) \tag{7}$$

When the all constraint equations are-equal to zero, all the joint and driver constraints are satisfied and the kinematic problem has been solved.

Dynamics Problem

The dynamics problem determines the body motion due to forces. The dynamic formulation uses the same body and joint descriptions and the same constraint and Jacobian formulations that were used in the previous kinematic problem. The dynamic problem is determined by first finding the body accelerations due to all forces acting on the bodies. Once the accelerations are determined, they are integrated once to determine the body velocities and again to determine the positional and orientational body coordinates.

The dynamic equations of motion for multibody rigid systems are derived using Lagrange's Equations to yield.

$$M\ddot{q}+h-g+\left(\frac{\partial\Phi}{\partial q_j}\right)^T\lambda=0 \tag{8}$$

where M is a combined mass and inertia matrix, h is the force vector due to the rotating body axes in Cartesian space, and g is the total generalized force vector. The Lagrange multipliers, λ, specify the forces exerted by the joint and driver constraints such that $$g_{constraint}=\Phi^T{}_q\lambda \tag{9}$$

The second time derivative of the kinematic constraint equations is $$\Phi_q\ddot{q}=-(\Phi_q\dot{q}-\dot{\Phi}_t \tag{10}$$

For convenience, the right hand side of Equation 10 is denoted as γ so that $$\Phi_q\ddot{q}=\gamma \tag{11}$$

The formulation of the γ values can be found in Nikravesh (1988).

Both Equation 8 and Equation 11 can be combined into the single set of equations $$\begin{bmatrix} M & \Phi_q^T \\ \Phi_q & 0 \end{bmatrix}\begin{bmatrix} \ddot{q} \\ \lambda \end{bmatrix}=\begin{bmatrix} g-h \\ \gamma \end{bmatrix} \tag{12}$$

The resulting system of algebraic equations are solved to obtain the accelerations, $\ddot{q}$, of the body coordinates. The accelerations are then integrated twice to determine the positions and orientations of the bodies. Therefore, the dynamic solution solves a mixed system of algebraic and differential equations.

Static Force Problem

With the current formulation of the Jacobian matrix, the formulation of static force analysis is straight forward. Using the relationship from Equation 9, if the Jacobian and the external forces are known, the joint and driver reaction forces may be determined. The formulation is shown below in Equation 13.

$$\Phi_q{}^T\lambda=g \tag{13}$$

where λ are the unknown constraint forces and g are the sums of the external forces and moments.

SECTION 2

NOMENCLATURE

In this thesis, mathematical symbols are used to represent scalars, vectors, and matrices. These three types of variables are distinguished by the case and typeface of the symbols. Scalar variables are represented as lower-case, lightface characters while vectors are represented by lower-case, boldface characters. Matrices are represented by upper-case, boldface characters. The matrices will often include added nomenclature to distinguish matrices that act between two bodies of a multi-body system. For example, a transformation matrix, A, form body j to body i is denoted as $A_{ij}$. For the kinematic constraint equations, Φ, special notation is also added to define the type of constraint and the number of degrees of freedom that it constrains. Thus, constraint equations may be represented as $\Phi^{(type,\ number\ of\ dof)}$.

a scalar variable a vector variable

A matrix variable $A_{ij}$ matrix variable specifying the transformation from body j to body i $A_i$ matrix variable specifying the transformation from body i to the inertial reference coordinate system $\Phi^{(s,3)}$ constraint equation for a spherical joint constraining three degrees of freedom The following notation may also be added to the above symbols to further distinguish the variables.

first time derivative with respect to time, ($\dot{a}$)

second time derivative with respect to time, ($\ddot{a}$)

' local variable, (a')

~3×3 skew-symmetric matrix, ($\tilde{A}$)

A transformation matrix d distance vector between two points f global Cartesian external force vector g generalized constraint force h Cartesian Coriolis correction vector $J'_i$ inertia tensor of body i in the body fixed coordinate system 1 length of a cable $M_i$ mass matrix of body i M system mass and inertia matrix N joint axes matrix $n_b$ number of bodies $n_{gc}$ number of generalized coordinates n global Cartesian external moment vector p Euler parameter q generalized coordinate position $\dot{q}$ generalized coordinate velocity $\ddot{q}$ generalized coordinate acceleration r Cartesian coordinate position $\dot{r}$ Cartesian coordinate velocity $\ddot{r}$ Cartesian coordinate acceleration T total system kinetic energy $y_i$ Cartesian and angular velocity vector γ right hand side of second time derivative of kinematic constraint λ Lagrange multiplier Φ kinematic constraint equation $\Phi_q$ constraint Jacobian matrix ω angular velocity $\omega'_i$ angular velocity of body i in body fixed coordinate system

INTRODUCTION

Multi-body simulation provides a very important tool for design and analysis. General multi-body simulation packages currently use a batch approach in which the user first creates an input file containing a description of the multi-body system. The batch process is then initiated and the user waits until the entire simulation is computed before the results can be analyzed. Then, if a change in a parameter is desired, the input file is altered and the entire batch process is performed again. FIG. 1 details the general flow of the batch approach.

This thesis enhances the utility of multi-body simulation by creating an interactive environment for kinematic, dynamic, and force analysis. The interactive environment allows the user to make changes and visualize results while a simulation is in progress. As shown in FIG. 2, the interactive interface combines the steps shown in FIG. 1 into a single interactive environment. The input file is optional since the system may be completely defined with the interactive interface. The output file is also optional since the simulation results are graphically displayed as they are computed. The input and output files are provided in order to allow a current session to be saved and used later.

In addition, this thesis develops a general purpose cable/pulley model for multi-body modeling. Because of the lack of adequate biomechanical modeling elements, general multi-body simulation packages are not used for biomechanical simulation. The motivation for this cable/pulley model is to expand the use of multi-body simulation techniques into biomechanical musculoskeletal applications.

2 LITERATURE REVIEW

2.1 Rigid Multi-Body Dynamics

Prior to the development of the digital computer, dynamic analysis of multi-body systems required hand formulation and solution. This fact severely limited the capability to analyze and design complex three-dimensional systems. Usually, the systems were approximated as two-dimensional or greatly simplified.

The advent of computers eliminated the need to solve the dynamic equations by hand. It was now possible to model a larger class of systems, but the complexity was still limited since the equations were derived by hand. A major disadvantage was that for each new system configuration, it was necessary to reformulate the equations. Only parameters such as length and mass could be varied without having to reformulate the equations. Changing the connectivity of the bodies or the type of joint between the bodies required reformulation of the equations.

In the mid 60's, computer programs were introduced that could both formulate and solve equations of motion for limited classes of multi-body systems. Hooker and Margoulis [1] and Roberson and Wittenburg [2] developed general programs that required the system to be open loop and consist of only revolute joints. In the 70's, more general programs were developed to handle closed loop systems and general types of joints.

Since the 70's, many general purpose dynamics packages have been developed. The packages are usually distinguished from each other by the choice of coordinates used to define the position and orientation of each body. Early packages such as DYMAC [5], DRAM [4] and IMP [3] formulated the equations using Lagrangian joint coordinates or relative coordinates. This results in a minimal set of equations, but the derivation of the equations is complicated and the generality of the packages is limited. Also the kinematic system setup is difficult to describe using relative coordinates.

ADAMS [6] and DADS [7,8] developed very general packages that use a maximal set of equations. The global position and orientation of each body is defined by a set of Cartesian coordinates and a set rotational Euler angles or parameters. Each body is also described with the same body fixed coordinate system. All other aspects of the system such as force locations, joints and other constraints are all described with respect to this body fixed coordinate system. This enables the equation formulation to be handled in a very general way, regardless of the system topology. The disadvantage of this method is that it assumes the maximum of six degrees of freedom for each body. Therefore, six equations for each body are needed along with the constraint equations for each kinematic joint. This results in a large set of equations which slows the numerical solution and introduces numerical difficulties known as artificial stiffness.

Kim and Vanderploeg [9,10] developed an improved method which uses a combination of the above two methods. Cartesian coordinates are used to define the system. Applying a velocity transformation, relative coordinates are then used to formulate the equations. This method produces a minimal set of equations while still remaining general and straight forward to use.

Symbolic manipulation has also been used to formulate equations of motion for general multi-body systems [11,12,13]. This method derives the symbolic non-linear equations of motion for the system while the previously discussed numerical methods evaluate the individual terms numerically at each time step. The symbolic manipulation has to be performed only once for a given system configuration while the numerical formulations have to be reformulated at each time step. Symbolic formulations are often more efficient than the numerical approach, especially when the recursive properties of the system are utilized.

2.2 Three-Dimensional Computer Graphics

Computer graphics is a relatively recent development, but has made dramatic advances in the past few years. Initially, semi-interactive three-dimensional computer graphics was possible using wire frame or line drawings. The wireframe objects could be drawn quickly, but complex drawings with many lines made the image cumbersome to interpret. Hidden line algorithms helped solve this problem but also slowed the rendering speed. In the late 70's and early 80's, Evans and Sutherland developed the PS3000 computer system that was capable of rendering real time wire frame images.

Methods were also developed that could efficiently render shaded surfaces. This was accomplished by algorithms that rendered only simple surface descriptions such as flat polygons. Complex surfaces could be rendered this way if they were broken down into many of these flat polygons. This method worked well, but for semi-complex objects, the rendering time could take several minutes per frame. Therefore, this method was still not feasible for interactive graphics applications.

More advanced methods were developed to render very realistic images using ray tracing, but these methods were several magnitudes slower than polygon rendering.

In the mid 1980's, Silicon Graphics, Inc. [14] began to market computer workstations with additional hardware dedicated to three-dimensional graphics operations. Instead of relying on software, SGI developed hardware to efficiently perform the transformation and rendering of flat polygonal surfaces. Interactive three-dimensional computer graphics became a reality. Since this time, computers several magnitudes faster have been developed and are now capable of rendering a million polygons per second. SGI also developed the graphics library, GL [15], which is built around this hardware graphics processor. The library simplified 3-D graphics programming by eliminating the need to develop software using low level graphic languages.

Computer graphics has been incorporated into DADS, ADAMS, and other dynamic packages as a pre and post processing tool. The graphics provide a visual result of the previously computed simulation, but the graphics simply displays the computed results and do not allow interactive control during the solution process such as changing the system configuration or force inputs. Currently, a multi-body system is usually defined by creating a text file that describes the bodies, joints and other system parameters. Any change in the system is made by altering this file and then re-running the dynamics package using the new file. Computer graphics has thus far not been used as an interactive interface to the software that enables system step up, alteration of system configuration, or display of motion and force results during the solution process.

2.3 Application to Biomechanical Modeling

One obvious application of multi-body dynamics modeling is biomechanical modeling. Biomechanics, computer graphics, and multi-body dynamics are all relatively young fields and research in each of these fields has been significantly enhanced by the development of the computer. Only recently has the cross disciplinary activity begun taking advantage of the strength of each discipline.

Biomechanics has thus far not made use of general purpose multi-body dynamics technology or the latest computer graphics technology. While several biomechanics simulation packages have incorporated graphics, state of the art computer graphics technology has not been used in biomechanics simulation. Most biomechanical models that have been developed so far were either developed by hand or were developed for a very specific purpose.

One of the major reasons multi-body dynamics packages have not been applied to biomechanics is that biomechanical systems present many unique challenges that do not exist for typical mechanical systems. Many mechanical systems usually consist of well defined joints such as revolute, universal, and spherical joints. Many biomechanical joints can be idealized to represent one of these joints, but many others, such as the knee, can not be accurately modeled with an ideal joint representation. Biomechanical systems also require a high level of control with non-traditional force actuators. Unlike typical force actuators, muscle and tendon force models can span several joints and have multiple attachment points. Force analysis of biomechanical systems also presents a unique problem since most biomechanical systems are redundant and any number of solutions are possible. Because of these differences, most general multi-body dynamics packages are not currently capable of modeling biomechanical systems.

Several computer packages have implemented limited computer graphics and/or general multi-body formulations for force analysis. Serig and Arvikar [16,17] initially developed a general package to evaluate forces in the lower extremities during walking and later generalized the code to model the entire body [18]. The modeling was limited to idealized types of joints and open loop systems. Muscles were modeled as multiple straight line segments connecting two or more bodies. Force analysis was performed by an optimization routine to minimize a linear sum of muscle forces and joint moments. Limited graphics were also used in this package. Still images of line drawings were displayed. Although this was a valuable means of interpreting the results, the graphics were not used in an interactive sense to assist in the analysis.

Buford et al. [19] designed a kinematic model of the hand that uses interactive 3-D line drawings to aid in the placement of tendon paths. The kinematic model was written specifically for the hand. The user is allowed to interactively control the joint angles and viewing position of the hand. The analysis of the system was limited to determining the resulting tendon lengths for given joint angles.

Delp et al. [20,21] developed an interactive computer graphics package to analyze the lower extremity. The general package enables modeling of most biomechanical systems. The package uses three-dimensional shaded computer graphics and system parameters can be altered interactively using the graphics interface. Since the main emphasis of this package is to analyze maximal muscle forces versus joint configurations, only maximal force and moment analysis is possible. For a given joint configuration, the length of each muscle system is calculated and all forces are derived entirely as a function of these lengths. Therefore, this package is well suited for specific types of biomechanical force analysis, but its application to general mechanical systems is limited.

This thesis presents a new approach to multi-body modeling that emphasizes a total interactive environment through computer graphics. This environment allows interactive control of system parameters, configurations, external inputs, motion analysis, and force analysis. In addition, the system also includes a new type of modeling element suited to modeling biomechanical systems.

3 OVERVIEW

This chapter describes the motivation for this thesis and gives an overall description of the capabilities and limitations of the software developed as a part of this thesis.

3.1 Motivation and Goals

Simulation of three-dimensional multi-body systems is a sophisticated analysis tool that is often used for design. Before a prototype is constructed, simulation provides a designer with a model that can be modified until a desired result is achieved. Once a design is determined, simulation also provides the capability to predict how the given system will perform.

Computer simulation provides access to system parameters that may be difficult to control in the real world. For example, changing gravity or changing how two bodies are connected is relatively easy when modeling the system on a computer, but is difficult when dealing with a physical system or prototype.

General purpose multi-body dynamics packages are currently used around the world, but currently, their use is limited to several fields of engineering. This can be attributed to two factors. First, these programs require a very sophisticated user with both an engineering and simulation background. Second, many areas of engineering have not been exposed to this technology. The alternative to using these programs is to develop specific equations for each system that is modeled. For example, the majority of models developed in the biomechanics field have all been specifically developed programs for specific parts of the body. This results from both the lack of adequate modeling elements for biological systems in these general purpose programs and the lack of exposure of these techniques to the bioengineering community.

For current multi-body packages, a user develops a text file in a given format to define the system parameters and configuration. Also, any change in the parameters or analysis must be included in this file before the dynamics analysis is performed. From here, the user executes the analysis using this file and has no control of the analysis until the solution process is complete. After evaluating the results, changes can be made to the system description file. The package is run again and the user waits again until the results are available. In many ways, the process resembles the trial and error design process using prototypes. First an initial system is built. Then it is tested to see if the correct results were obtained. If not, some parameters are changed and a new system is built and tested and so on. The use of computer simulation in the place of prototypes was a significant step forward in terms of reduced time and cost to develop a design. We believe that even more improvement is possible if the user were able to interactively change the system and analysis at any time in lieu of having to go through discrete trial and error steps.

In order to reach this next level, we propose to use an interactive computer graphics interface. Three-dimensional computer graphics and multi-body dynamics are naturally suited for one another. It is very difficult to express the position and motion of 3-D systems in an easy to understand form without using computer graphics. For example, suppose a system is made up of ten bodies, each requiring three values to describe position and three values for orientation. Sixty variables are needed to describe the positions of all ten bodies. If the bodies were in motion, sixty plots would be required to describe the motion. Even with all these plots, it would be very difficult to interpret the relative motion of the bodies or identify any errors in the motion. This information can easily be interpreted simultaneously displayed using computer animation.

Even though interactive computer graphics and multi-body dynamics are well suited for each other, only recently have they be combined. One reason is that interactive computer graphics has only recently become readily available to the average user of multi-body packages. Several packages now use computer graphics for pre and post processing the systems configuration. Graphically interactive control of the solution process has not yet been implemented. In order to expand the usefulness of general multi-body simulation, this thesis presents a package that provides total interactive control using an interactive computer graphics interface.

3.2 Developed Software and Capabilities

3.2.1 General capabilities

The software developed for this thesis demonstrates the advantages of providing a total interactive environment for multi-body design and analysis. The software, called VIMS, uses three-dimensional computer graphics to control all parameters required for definition and control of the multi-body systems. An entire multi-body system can be entirely defined using the graphics interface shown in FIG. 3.1. Unlike other general multi-body packages, a file containing the system parameters does not have to be created before running the package. This software enables the user to use pop down menus to add and configure bodies, joints, springs, and cable/pulley systems. The user may enter positions and orientations using the keyboard or may interactively do this visually using the mouse. After the system is created, it may be saved and reloaded at a later session.

In order to display the system, VIMS requires a geometric description each body that will appear on the computer screen. This information is provided through input files that contain a scene description and a multi-body description: The scene description defines how the bodies will be displayed. Such aspects as cameras, lights, colors, and the geometry or shape of the bodies are defined. The scene description has absolutely no effect on the multi-body computation. The geometry does not have any bearing on the inertia or mass of the body and no collision detection is performed. Therefore, the multibody computation is computed without any idea of the shape of the body and the geometry of the body is used only for display purposes. VIMS reads geometry described in the MOVIE.BYU format [29]. This is an ascii file that describes the coordinates of three dimensional vertices and the connectivity of the polygons.

Once a system is configured, the solution process may be executed. The available solution processes include kinematics, optimized kinematics, dynamics and optimized static force analysis. At any time during the solution process, system parameters or the system configuration may be altered. Also, throughout this entire process, the user has complete 3-D visual control of the system. The camera view can be interactively positioned at any time to view some desired area of the system, even while the system is in motion during the dynamics solution process.

3.2.2 Multi-body description

VIMS is designed to solve general large motion rigid multi-body problems. Deformable body and vibrational problems are not addressed in this thesis. The basis of all computational solution methods for this thesis is the formulation of constraint equations. It is important to note that this method iteratively solves the equations for the kinematic methods and has to re-solve the dynamic equations at each, time step. Therefore, the explicit equations are not formulated.

The position of each body is defined by three Cartesian coordinates for position and four Euler parameters for orientation. Each body also contains an identical local coordinate system. This identical coordinate system is used to define locations on each body such as joint, cable, and force locations. This enables the formulation of the constraint equations to be very general.

Since each body position is defined with a full set of coordinates, the equation formulation is general enough to allow any type of joint constraint to be defined between the bodies. Any specialized type of joint, such as a complex surface joint like the human knee, can be added to the program without having to change the formulation. Currently, all the basic kinematic joints are available. These include revolute, universal, spherical, translational, cylindrical, and screw joints. Most mechanical systems can be modeled with combinations of these joints.

Another type a element that has been developed in this thesis is a length constraint or cable/pulley constraint. A cable element is defined by multiple straight line segments connected in the local coordinate systems of any number of bodies. The constraint defines the combined length to be some specified value. Cable/pulley systems, such as tendons in a human finger, may be modeled this way. The constraint may be defined to carry tension only or, it may carry both tension and compression.

Another fundamental basis of all solution techniques used in this thesis is the Jacobian matrix of the constraint equations. The Jacobian consists of all the partial derivatives of each constraint equation. Because of the identical way each body was defined, the Jacobian matrix formulation is also general to implement.

3.2.3 Kinematic solution

The kinematic solution process allows the user to control all driver degrees of freedom interactively. Whenever a slider is moved to change a driver, the graphics display is instantly updated to show the change in the system. This software allows the user to change which driver is under control of the slider and how many driver DOF to control. For example, if a four DOF system is modeled, the user may choose to control only one of the four driver DOF and let the computer move the other three to a value where a valid solution exists.

When a valid solution does not exist for some user defined DOF's or drivers, the kinematic system will keep iterating and never find a solution. To overcome this problem, an optimized solution method is included in the software. This method demands the enforcement of the joint constraint equations while the driver constraints are allowed to vary from the value the user specifies in order to find the closest valid solution. This closest solution is determined by minimizing a function of the driver constraint errors using a constrained optimization method. Therefore, if the driver values provided by the user give a valid solution, the process will minimize to driver constraint error to zero. Using this method, joint limits may also be applied to each DOF. The disadvantage is that this method is much slower than the non-optimized kinematic solution.

3.2.4 Dynamic solution

Control of the dynamic solution process works in much the same way as the kinematic process. When the dynamic solution is started, all defined external forces control the motion of the system. All motion is interactively displayed on the screen, and all analysis control, and all system parameters can be altered at any time. For example, the direction or location of a force may be moved during a solution execution with the resulting motion instantly displayed. At any time, the joint and driver forces or moments may be displayed as lists of numbers, bar graphs, or graphical icons mapped over the geometric display. Force arrows are displayed at their correct 3-D location and direction while their size represents the magnitude. The current speed of the computers used for this thesis is not yet fast enough to integrate the equations in real-time. Therefore, the motion is also stored to allow playback at real-time.

3.2.5 Optimized static force analysis

The optimized static force analysis allows forces to be calculated for redundant systems. The human body consists of many redundant systems. For example, a single DOF joint may be held in place by ten muscles or force elements. If the system had only one force element, there would be only one solution and the solution would be straight forward. Since there are ten force elements when only one is needed to hold the joint in place, there exists an infinite number of solutions to the force distribution between force elements. Therefore, an optimal distribution must be specified by the user as a cost function. One acceptable method is to minimize the weighted sums of the squares of the forces. The method implemented for this software is minimization using a quadratic cost function. The weighting on any joint, driver, or cable/pulley force or moment may be controlled by the user. As in the dynamic solution, the forces may be displayed as lists of numbers, bar graphs, or graphical arrows. Again the process is interactive. Any driver may be included at any time and any driver value may be altered to change the arrangement of the system. Also, any of the forces may be explicitly controlled by the user. For example, a force in a tendon of the finger may be defined as 1 N tension. The other unknown forces will automatically change in order to satisfy the static force equations. While performing any of the above operations, movement of the magnitudes and directions of the force and moment arrows are displayed as they are computed.

4 THEORY/BACKGROUND

This chapter details the mathematics and structure of the theory used in this thesis. Both the multi-body formulations and the interactive interface are described. The multibody theory is best given by Nikravesh [22]. Through out this chapter, several numerical integration and optimization algorithms are used in the multi-body solution methods. These numerical algorithms are not covered in this thesis.

The first section of this chapter details the fundamental properties that serve as the basis for the various solution methods. In particular, body description in 3-D space and 3-D transformations are presented. The kinematics section defines the formulation of the kinematic constraint equations. The derivative of these constraint equations with respect to the body coordinates, known as the Jacobian, is also overviewed. This is followed by the development of the kinematic cable/pulley constraints. Optimized kinematics, dynamics, and static force analysis solutions are then presented in the following sections. The last section of this chapter overviews the three dimensional computer graphics theory used to visualize multi-body systems.

The formulation of the multi-body code for this thesis roughly follows the method presented in Nikravesh [22]. Nikravesh provides a more in-depth discussion of the equations and is recommended for extra insight into these formulations.

4.1 Fundamentals of Multi-Body Dynamics

This section presents the theory used to automatically formulate equations for rigid body kinematic, dynamic, and force analysis. The structure for the body and joint definitions presented in the following subsections provide a formulation for very general multi-body systems.

4.1.1 Body definition

In order to compute the equations of motion for general systems, the formulation used in this thesis depends on a general coordinate system for defining body positions. First, a general method to describe bodies in 3-D space is needed. Second, a method to model both open and closed loop systems is required. Third, a method for defining any type of joint between bodies is needed.

In 3-D space, a single unconstrained body has six degrees of freedom (DOF). There are many ways to define the position and orientation of the body with respect to some fixed reference frame. Definition of the position of a body is straight forward. Three Cartesian coordinates may be selected to define the position. The orientation of the body is more difficult to define. One method is to define a 3x3 transformation matrix of directional cosines. This is ideal for computer implementation since linear algebra can be used to relate various bodies and coordinate systems. The drawback is that since nine values are defining a three DOF problem, six of these values are redundant. Other methods, such as Euler and Bryant angles, use only three values. These methods consist of three order dependent, consecutive rotations about some fixed orthogonal coordinate system. The problem with these methods is that singularity problems exist at certain orientations.

The method used often in multi-body dynamics [22] and also used in this thesis consists of four Euler parameters. For this method, four values are required to define three independent coordinates, but there are no singularity problems. Also, the 3x3 transformation matrix described above can be obtained from Euler parameters without any trigonometric calculations. Since the matrix form is desired for computer implementation, this is an important aspect of Euler parameters. The Euler parameters can be thought of as a rotation, Φ, about a unit vector, u. The Euler parameter vector, p, is defined as $$p = \begin{bmatrix} e_0 \\ e_1 \\ e_2 \\ e_3 \end{bmatrix} = \begin{bmatrix} \cos\left(\frac{\Phi}{2}\right) \\ u_1\sin\left(\frac{\Phi}{2}\right) \\ u_2\sin\left(\frac{\Phi}{2}\right) \\ u_3\sin\left(\frac{\Phi}{2}\right) \end{bmatrix} \tag{4.1}$$

Since there are four values defining three DOF, the four values are not independent and are related by the equation $$p^Tp=e_0^2+e_1^2+_2^2+_3^2=1 \tag{4.2}$$

Therefore, a single unconstrained body may be defined by the set of coordinates $$q_i=[r_i^t, p_i^T]^T \tag{4.3}$$

where $$r_i=[x_iy_iz_i]^T \tag{4.4}$$

defines the Cartesian position of the i'th body's center of gravity in some fixed coordinate system. The Euler parameter vector, $p_i$, defines the orientation with respect to the same coordinate system.

It is also necessary to make assumptions about each body. To make the method general enough for any type of joint and open or closed loop systems, points on each body are defined using the body fixed local coordinate system. This allows joints and forces to be defined in the same way for each body regardless of the system topology. Each body is initially unconstrained and has six DOF. This assumption makes it possible to apply any type of constraint or relation between the bodies. This generality is the primary advantage of this method. However, this method results in the maximum possible set of equations since six dynamic equations have to be defined for each body and also a kinematic equation for each constraint. These large sets of rather sparse equations require more computing time. While other methods are more efficient with respect to the number of generated equations, they have difficulty defining general systems.

4.1.2 Body transformations

The description of the body's global orientation describes how the body's local coordinate system is transformed from the global coordinate system to its current orientation. The orientation transformation rotates one coordinate system to another. This orientation transformation can be described with the Euler parameters. The concept of a transformation matrix simplifies these transformations by allowing linear, algebra functions to transform one coordinate system to another.

As noted above, Euler parameters are convenient because the 3×3 transformation matrix of directional cosines is easy to compute in terms of Euler parameters. A transformation from coordinate system j to another system i can be written as [22].

$$A_{ij} = 2\begin{bmatrix} e_0^2 + e_1^2 - \frac{1}{2} & e_1e_2 - e_0e_3 & e_1e_3 + e_0e_2 \\ e_1e_2 + e_0e_3 & e_0^2 + e_2^2 - \frac{1}{2} & e_2e_3 - e_0e_1 \\ e_1e_3 - e_0e_2 & e_2e_3 + e_0e_1 & e_0^2 + e_3^2 - \frac{1}{2} \end{bmatrix} \quad (4.5)$$

Letting the global coordinate system be defined as coordinate system 0, the transformation of body i to the global coordinate system may be represented as $A_{0i}$. With this matrix, the global location of any local point in body i can be determine. Assume that vector, s', defines the point, p, in body i as shown in FIG. 4.1. s' defines the vector from the center of gravity to point, p, in body i's body fixed coordinate system. The same vector can be described in the global coordinate system, 0, by simply pre-multiplying the vector by the transformation matrix $A_{0i}$.

$$s = A_{0i}s' \quad (4.6)$$

Therefore, the actual location of the point from the global origin is $$r_p = r_i + A_{0i}s' \quad (4.7)$$

where $r_i$ is the vector from the global origin to the center of gravity of body i.

4.1.3 Velocity and acceleration

Differentiating Equation 4.7 results in the velocity equation $$\dot{r}_p = \dot{r}_i + \dot{A}_{0i}s' \quad (4.8)$$

where $\dot{r}_p$ is the global velocity of a fixed point, p, in body i. The derivative of the transformation matrix can be represented as $$\dot{A}_{0i} = \bar{\omega}_i A_{0i} \quad (4.9)$$

where $$\tilde{\omega}_i = \begin{bmatrix} 0 & -\omega_z & \omega_y \\ \omega_z & 0 & -\omega_x \\ -\omega_y & \omega_x & 0 \end{bmatrix} \quad (4.10)$$

and $\omega_x$, $\omega_y$ and $\omega_z$ and are the angular velocities of body i about the fixed global x, y and z axes. Now the global velocity of the point is written as $$\dot{r}_p = \dot{r}_i + \bar{\omega}_i A_{0i}s' \quad (4.11)$$

As with the position and orientation vectors, the positional velocity and angular velocity may be put into a single vector $$\dot{q}_i = [\dot{r}_i^T, \dot{p}_i^T]^T_{(7x10} \quad (4.13)$$

Also, the same can be done for acceleration $$\ddot{q}_i = [\ddot{r}_i^T, \ddot{p}_i^T]^T_{(7x1)} \quad (4.13)$$

Because angular velocity and angular acceleration are vectors, the Euler parameter derivatives do not have an advantage over the angular velocity form. Since the angular velocity vector consists of only three variables instead of four, it is often advantageous to use the angular velocity form. The relationships between the two forms are [22]

$$\omega_i = 2L_i\dot{p}_i \quad (4.14)$$

$$\dot{p}_i = \tfrac{1}{2}L_i^T\omega_i \quad (4.15)$$

where matrix, $L_i$, is $$L_i = \begin{bmatrix} -e_1 & e_0 & e_3 & -e_2 \\ -e_2 & -e_3 & e_0 & e_1 \\ -e_3 & e_2 & -e_1 & e_0 \end{bmatrix}_{(3\times4)} \quad (4.16)$$

The velocity and acceleration vectors may now be represented with only six components for each body $$\dot{q}_i = [\dot{r}_i^T, \omega_i^T]^T_{(6x1)} \quad (4.17)$$

$$\ddot{q}_i = [\ddot{r}_i^T, \dot{\omega}_i^T]^T_{(6x1)} \quad (4.18)$$

However, the position of the bodies are still represented with seven components as in Equation 4.3.

4.2 Kinematic Theory 4.2.1 Constraining the bodies

So far, each body has been assumed to have six degrees of freedom. The approach taken in this thesis is to look at joints and drivers as constraints that limit these six degrees of freedom. For example, if a revolute or hinge joint is desired to connect two bodies, five constraint equations are needed to define the joint. The result would be two bodies with one DOF between them. Three equations are needed to constraint some point in each body to always coincide spatially. If these were the only constraints applied, the result would be a spherical joint. The definition of two more equations to keep a fixed vector in each body parallel to each other results in a revolute joint.

When the necessary number of joint and driver constraints are defined for a system, the nonlinear algebraic equations are algebraically iterated until they are all satisfied. When all constraints have been satisfied, the resulting coordinate values define the new positions and orientations for each body. For this thesis, several different forms of Newton methods are used to solve the constraint equations.

The number of constraints must equal the total number of degrees of freedom. The total number of DOF of the entire system is six times the number of bodies, and therefore, this same number of constraints is required. If less constraints were defined, the system would be under-defined and the set of possible kinematic arrangements that would satisfy the set of constraints would be unlimited. For this reason, a n DOF system requires n constraints. In other words, n equations are needed to solve n unknowns. VIMS lets the user may define less constraint equations, but this is only allowed since the software automatically assigns extra constraints to keep the total number of constraints equal to the degrees of freedom.

4.2.1.1 Formulation of the joint constraints

This section presents a general method to define the joints and drivers. All joint parameters are defined, in the local body fixed coordinate systems. For example, when defining the common point for revolute joint, the point is defined in each body. If body i and body j are connected, the coinciding point is defined in both body i's and body j's local coordinate systems. The same process is used to define vectors common between the two bodies. Therefore, each kinematic joint is generally defined with the following information.

A body fixed point in the local space of body i, $s'_i$

A body fixed point in the local space of body j, $s'_j$

A 3×3 transformation matrix from body i's coordinate system to body i's joint axes, $N_i$ A 3×3 transformation matrix from body j's coordinate system to body j's joint axes, $N_j$ The 3×3 joint matrices define three orthonormal axis vectors that specify the joint axes orientations in each body.

$$N = \left[ \begin{bmatrix} x_1 \\ y_1 \\ z_1 \end{bmatrix}_X \begin{bmatrix} x_2 \\ y_2 \\ z_2 \end{bmatrix}_Y \begin{bmatrix} x_3 \\ y_3 \\ z_3 \end{bmatrix}_Z \right] \quad (4.19)$$

These matrices determine the orientation of the axis that the joint rotates about. For example, revolute joints in this thesis are defined to rotate about the x-axis which is defined by the first column of the joint matrix. Even though all three vectors are not always needed for all types of joints, the matrix provides a convenient way of guaranteeing that the rotation axes are orthonormal. Since this matrix provides a transformation from body space to joint axes space, the matrix form will also prove convenient later for graphically representing the joints orientations.

Constraint equations for most joints can be formulated from a combination of simpler constraints. These simpler constraints will be referred to as building block constraints in this thesis. Three of these simpler constraints provide enough flexibility to define revolute, universal, spherical, translational, and cylindrical joints. The three building block constraints consist of a common point constraint, a perpendicular axis constraint and a perpendicular axis/distance constraint. The common point element constrains the points specified by $s'_i$ and $s'_j$ in the two bodies to coincide. The perpendicular element constraints an axis defined in two bodies to remain perpendicular. Finally, the perpendicular axis/distance element constrains an axis in one body to remain perpendicular a distance vector between the two bodies. The distance vector is defined as the vector between the two global joint locations specified by $s_i$ and $s_j$. This constraint is used in the formulation of translational, cylindrical and screw joints.

From here on, the constraint equations are denoted by using the nomenclature defined by Nikravesh [22] as $$\Phi^{(type,\ number\ of\ constrained\ dof)}$$

For example, the common point constraint is represented as $\Phi^{(s,3)}$. This indicates that the constraint forms a spherical joint and limits three degrees of freedom. The perpendicular axis constraint and the perpendicular axis/distance constraint are represented as $\Phi^{(p1,1)}$, $\Phi^{(p2,1)}$ respectively. These equations are formulated in a homogeneous form so that $\Phi^{(s,3)}=0$.

FIG. 4.2 represents the common point or spherical constraint, $\Phi^{(s,3)}$. For the spherical joint, it is desired make the local points on each body to coincide globally. The local points can be easily converted to global points by Equation 4.7. The distance between the global points is zero if the constraint is satisfied $$d=(r_j+s_j)-(r_i+s_i)=0 \quad \Phi^{(s,3)}=(r_j+A_j s'_j)-(r_i+A_i s'_i)=0 \quad (4.20)$$

Note that the zero has been left off the transformation matrix, $A_i$. A transformation matrix with only one subscript is defined with respect to the global coordinate system. Therefore, $A_i$ is the same as $A_{0i}$.

The perpendicular axes constraints can be combined to constrain a common axis in each body to remain parallel such as a revolute joint requires. They may also be combined to generate the perpendicular axes constraints of a universal joint. The formulation of the perpendicular axes constraint is given as follows. Two normalized vectors in each body are defined to be constrained perpendicular to each other. The dot product of two perpendicular vectors is zero, $$\Phi^{(p1,1)}=n'^T_{ii} n_j=0 \quad (4.21)$$

or in terms of constant local vectors and global transformation matrices, $$\Phi^{(p1,1)}=n'^T_i A_i^T A_j n'_j=0 \quad (4.22)$$

where $n_i$ and $n_j$ are the defined perpendicular unit vectors. These joint axes are defined in the 3×3 joint matrices, $N_i$ and $N_j$. The columns of the 3×3 matrix are respectively the x, y, and z unit vectors. Therefore, the n vectors in Equation 4.21 are replaced with the desired columns of the N matrices. $\Phi^{(p1,1)(x,y)}$ will denote that this constraint uses the x-axis for body i and the y-axis for body j. An example of joint axes for a revolute is shown in FIG. 4.3. Note that the rotational DOF is about the x-axis. Also, note that the $y_i$-axis and the $x_j$-axis are perpendicular and the $z_i$-axis and the $x_j$-axis are perpendicular.

The perpendicular axes/distance constraint is derived in the same manner as above. For translational or cylindrical joints, the bodies are defined to align along a common vector. Two perpendicular axes constraints are used to keep the x-axis of the joint parallel. Two perpendicular axis/distance constraints are then used to also constraint the parallel vectors to lie colinear. Each perpendicular axis/distance equation constrains a joint axis to be perpendicular to the distance vector between the two joints by setting their dot product to zero.

$$\Phi^{(p2,1)}=n_i^T d=0 \quad \Phi^{(p2,1)}=n'^T_i A_i^T[(r_j+A_j s'_j)-(r_i+A_i s'_i)]=0 \quad (4.23)$$

where the distance vector, d, was defined in Equation 4.20. The notation $\Phi^{(p2,1)(y)}$ will denote that Equation 4.23 replaces $n'_i$ with the y-axis which is second column of the 3×3 transformation $N_i$ matrix.

Table 4.1 contains a complete list of the joint constraint building block equations used in this thesis. Note that a screw constraint is also included in this table. For the screw equation constraint, the rotation about the common colinear axis is a function of the translation along the axis. Table 4.2 lists the combinations of the building blocks used to construct each joint.

TABLE 4.1

Joint constraint building blocks

| Type | Constraint Equation |
|---|---|
| Spherical | $\Phi^{(s,3)} = (r_j + A_j s'_j) - (r_i + A_i s'_i) = 0$ |
| Perpendicular | $\Phi^{(p1,1)} = n'^T_i A_i^T A_j n'_j = 0$ |
| Perpendicular/ Distance | $\Phi^{(p2,1)} = n'^T_i A_i^T((r_j + A_j s'_j) - (r_i + A_i s'_i)) = 0$ |

TABLE 4.1-continued

Joint constraint building blocks

| Type | Constraint Equation |
|---|---|
| Screw | $\Phi^{(w,1)} = \theta_{screwset} - \theta_{actaul} = 0$ |
| | $\theta_{screwset} = \frac{\|d\|}{\text{pitchrate}} = \frac{\|(r_j + A_j s'_j) - (r_i + A_i s'_i)\|}{\text{pitchrate}}$ |
| | $\theta_{actaul}$ = actual rotation about axis |

TABLE 4.2

Joints defined by building blocks

| Joint Type | Constraint Equations Used | Description of Constrained motion |
|---|---|---|
| Revolute | | |
| SEE REVOLUTE JOINT 5112 ON FIG. 5,11 | $\Phi^{(s,3)}$<br>$\Phi^{(p1,1)(y,x)}$<br>$\Phi^{(p1,1)(z,x)}$ | Common point<br>X-axes parallel |
| Universal | | |
| SEE UNIVERSAL JOINT 5113 ON FIG. 5.11 | $\Phi^{(s,3)}$<br>$\Phi^{(p1,1)(x,y)}$ | Common point<br>Perpendicular axes |
| Spherical | | |
| SEE SPHERICAL JOINT 5114 ON FIG. 5.11 | $\Phi^{(s,3)}$ | Common point |
| Translational | | |
| SEE TRANSLATIONAL JOINT 5115 ON FIG. 5.11 | $\Phi^{(p1,1)(y,x)}$<br>$\Phi^{(p1,1)(z,x)}$<br>$\Phi^{(p1,1)(y,z)}$<br>$\Phi^{(p2,1)(y)}$<br>$\Phi^{(p2,1)(z)}$ | X-axes parallel<br><br>Fix rotation about x-axis<br>Colinear x-axes |
| Cylindrical | | |
| SEE CYLINDRICAL JOINT 5116 ON FIG. 5.11 | $\Phi^{(p1,1)(y,x)}$<br>$\Phi^{(p1,1)(z,x)}$<br>$\Phi^{(p2,1)(y)}$<br>$\Phi^{(p2,1)(z)}$ | X-axes parallel<br><br>Colinear x-axes |
| Screw | | |
| SEE SCREW JOINT 5117 ON FIG. 5.11 | $\Phi^{(p1,1)(y,x)}$<br>$\Phi^{(p1,1)(z,x)}$<br>$\Phi^{(p2,1)(y)}$<br>$\Phi^{(p2,1)(z)}$<br>$\Phi^{(w,1)}$ | X-axes parallel<br><br>Colinear x-axes<br><br>Rotation about x based on the distance, d |

4.2.2 Drivers and other constraints

Any type of constraint may be applied between any bodies by using the formulation described above. Therefore, drivers to kinematically control the degrees of freedom of the system are modeled in the same way.

A grounding constraint is described as setting the difference between the actual position and orientation and a fixed position and orientation equal to zero.

$$\Phi^{(ground,6)} = 0 = \begin{cases} r - r_{set} \\ e - e_{set} \end{cases} \quad (4.24)$$

where e is defined as the subset of the Euler parameters, $e[p_1, p_2, p_3]^T$ and r is location of the CG of the body in Cartesian coordinates.

Drivers for most joints are straight forward. A driver for a revolute joint rotation is defined by setting the difference between the actual rotation about the x-axis and a user defined rotation to zero. Generally, all of these driver constraints are formulated by taking the difference between the actual value and a user defined value. The actual value depends on the current relative positions of the bodies and is calculated at each iteration. The difficulty is not formulating the constraint equation for a revolute, but in finding the actual rotation values about the x-axis.

For the revolute, the rotation angle may be found by taking the dot product of the body defined joint coordinate axes. Since the x-axes of both bodies are constrained to be parallel, the z and x axes of both bodies lie in the same plane. Therefore, the rotation, θ, can be found by $$\theta = \begin{cases} a\cos(y_i \cdot y_j) & \text{if } a\cos(z_i \cdot y_j) < \pi \\ -a\cos(y_i \cdot y_j) & \text{otherwise} \end{cases} \quad (4.25)$$

where $y_i$, $z_i$, and $y_j$ are the joint axes vectors defined by $N_i$ and $N_j$.

A complete list of the driver constraints used in this thesis is given in Table A.2.

Assuming that an appropriate number of drivers have been assigned, the values of all the constraint equations are only a function the body coordinates. The kinematics may be solved by iterating all body coordinate vectors, $q_i$, until all constraint the equations, Φ(q), are equal to zero. First, an initial guess of all the bodies coordinate vectors, $q_i$, must be provided. Then the values of the constraint equations are determined. Unless the initial guesses were all correct, some of the constraint equations will not be zero. Therefore, the $q_i$ vectors are iterated in some way and the constraints are repeatedly checked until they are satisfied.

There are several iterative methods to update the $q_i$ vector based on the constraint error. Most of these techniques make use of the partial derivatives of the constraints with respect to each bodies coordinates, $\Phi_q$. The matrix, $\Phi_q$ is well known as the Jacobian matrix.

4.2.3 Formulation of the Jacobian matrix

The rows of the kinematic constraint equation partial derivatives are placed in the rows of the Jacobian matrix $\Phi_q$. For kinematics, the partial derivatives are used to determine the changes in body coordinates necessary to satisfy the constraint equations. The Jacobian matrix is also used to formulate dynamics equations and compute static force analysis.

The size of the Jacobian depends on the choice of body coordinates. For Euler parameters, the size of the Jacobian is $(7n_b)\times(7n_b)$ where $n_b$ is the number of bodies. Notice that since there are seven unknowns for each body, seven constraints are also required for each body. Since the four Euler parameters are not independent, the additional seventh constraint results from the relation between the Euler parameters for each body. Equation 4.2 defines this relation. In order to obtain a smaller matrix, angular velocities may be used instead. The size of the Jacobian will be $(6n_b)\times(6n_b)$. Since there are only six coordinates for each body, only six constraints are required for each.

Note that many entries of the Jacobian will be zero since bodies that are not directly involved with a joint or driver constraint do not affect the value of the constraint violation. Since most joints connect only two bodies, usually only two blocks of six or seven columns of the matrix will be non-zero. The rest of the columns would be zero. This results in a block structure for the Jacobian that is straight forward to formulate.

The overall form of the Jacobian is shown in FIG. 4.4. This is an example of a three body system, $n_b$=3, with the first body grounded. A revolute joint attaches the first and second bodies and a spherical joint attaches the second and third. Derivatives that are always zero are left blank. The x's represent indices where the derivatives are non-zero. These matrix entries vary with different body positions. Therefore, the Jacobian is also a function of the q vector. Also note how the Jacobian has been divided into many smaller matrices. The Jacobian, $\Phi_q$, may be calculated separately with respect to position, $\Phi_r$, and angular velocity, $\Phi_\omega$, or Euler parameters, $\Phi_p$. This enables the construction of tables that define the derivatives for various constraints as in Table A.1 and Table A.1 of Appendix A.

Most of the joint constraints are made up of the building block constraints, Therefore, for joints, only the derivatives of these blocks need to be determined. The non-zero derivatives of the spherical or common point constraint $\Phi^{(s\ 3)}$, are formulated below. It is assumed that bodies i and j are connected by the constraint.

$$\Phi^{(s,3)} = (r_i + A_i s'_i) - (r_j + A_j s'_j)$$

$$\Phi^{(s,3)}_{r_i} = \frac{\partial}{\partial r_i}((r_i + A_i s'_i) - (r_j + A_j s'_j))$$

Entries are computed for the Cartesian body coordinates, $r_i$ and $r_j$, and the local rotational angular velocities, $\omega'_i$ and $\omega'_j$. These form the non-zero block entries of the Jacobian.

$$\Phi^{(s,3)}_{r_i} = \frac{\partial}{\partial r_i}(r_i) = \begin{bmatrix} 1 & 0 & 0 \\ 0 & 1 & 0 \\ 0 & 0 & 1 \end{bmatrix} = I_{(3\times 3)}$$

$$\Phi^{(s,3)}_{r_i} = I_{(3\times 3)}$$

$$\Phi^{(s,3)}_{r_j} = -I_{(3\times 3)}$$

$$\Phi^{(s,3)}_{\omega_i} = \frac{\partial}{\partial \omega_i}((r_i + A_i s'_i) - (r_j + A_j s'_j))$$

$$= \frac{\partial}{\partial \omega_i}(A_i s'_i) = -A_i \tilde{s}'_i$$

$$\Phi^{(s,3)}_{\omega_i} = -(A_i \tilde{s}'_i)_{(3\times 3)}$$

$$\Phi^{(s,3)}_{\omega_j} = (A_j \tilde{s}'_j)_{(3\times 3)}$$

Likewise, the formulations for the Euler parameter method may be calculated. However, once one method's derivatives are determined, it is easy to convert between them using the relationships in Equation 4.14 and 4.15. For example, the above formulations in terms of the local angular velocities may be converted to Euler parameters by simply post-multiplying the terms by 2L as shown below.

$$\Phi_{r_i}{}^{(s,3)} = I_(3\times 3)$$

$$\Phi_{r_j}{}^{(s,3)} = -I_(3\times 3)$$

$$\Phi_{p_i}{}^{(s,3)} = -(A_i \bar{s}'i)2L_{i(3x4)}$$

$$\Phi_{p_j}{}^{(s,3)=}(A_j \bar{s}'j)2L_{j(3x4)}$$

Table A.1 and Table A.1 of Appendix A list the Jacobian entries the joints and drivers used in VIMS.

4.2.4 Solving the kinematics constraints

The software developed for this thesis uses one of four different Newton methods to solve the kinematic constraints.

4.2.4.1 Newton's method using Euler parameters

The first Newton method uses Euler parameters. The following steps are taken to solve the kinematics for a n-body system.

a. Guess $q_{(7nx1)}$ b. Calculate $\Phi(q)_{(7nx1)}$ c. If all $|\Phi_i(q)<\epsilon|$, $0<i<7n$, stop d. Calculate $\Phi_q(q)_{(7nx7n)}$ e. Solve the linear system $[\Phi_q(q)]\Delta q=-\Phi(q)$ for $\Delta q_{(7nx1)}$ f. Update $q_{(7n_b x1)}$: a=q+Δq g. Return to step b until step c. is satisfied The value, ε, in step c, is a small user defined error tolerance. Step e. is solved using a generic linear equation solver using Gaussian elimination.

4.2.4.2 Newton's method using angular velocities

The second method uses Newton's method in terms of virtual angular velocities. This is beneficial since it results in smaller matrices. The steps required are similar to the previous method, but step f. requires some additional relationships since the virtual change in angular velocity is returned instead of the required change in Euler parameters. Equation 4.15 handles this relationship. Body coordinates in terms of angular velocities are represented by $\bar{q}$. The kinematic constraint vector, $\bar{\Phi}$, is identical to the constraint vector in terms of Euler parameters except that the Euler parameter constraint for each body is not included.

a. Guess $q_{(7n_b x1)}$ b. Calculate $\bar{\Phi}(q)\ _{6n_b x1)}$ c. If all $|\bar{\Phi}_i(q)<\epsilon|$, $0<i<6n_b$, stop d. Calculate $\bar{\Phi}_{\bar{q}}(q)_{(6n_b x6ndi)}$ e. Solve the linear system $[\bar{\Phi}_{\bar{q}}(q)]\Delta\bar{q}=-\Phi(q)$ for $\Delta\bar{q}_{(6n_b x1)}$ f. Update $\underline{q}_{(7n_d x1)}$:

f.1. $q_r=\bar{q}_r$ f.2. $q_p=\frac{1}{2}L^T\bar{q}_{\delta\omega}$ f.3. q=q+Δq g. Return to step b until step c. is satisfied 4.2.4.3 Levenberg-Marquardt Newton's method using IMSL The third method uses the Levenberg-Marquardt algorithm. This is a Newton method that limits the step size for each iteration. The method is not any faster than the previous two, but it is much more stable when the matrices become ill-conditioned. The routine used for this is the IMSL [23] routine DNEQNJ. The Euler parameter approach is used for this method to avoid the complication of converting the virtual angular velocities within the IMSL routine.

a. Guess $q_{(7nx1)}$ b. Call subroutine DNEQNJ with the following information:

b.1. Error value, ε b.2. Maximum number of iterations to preform b.3. Initial guess for $q_{(7nx1)}$ b.4. Subroutine name that calculates $\Phi(q)_{(7nx1)}$ b.5. Subroutine name that calculates $\Phi(q)_{(7nx7n)}$ The fourth method uses an optimization method that minimizes the driver constraint values while always enforcing the joint constraints. This has several advantages and is detailed in Section 4.4.

4.3 Pulley Cable System

This section derives the constraint and Jacobian entries for a cable/pulley system. For biomechanical systems, such as the human finger, cable or tendon elements span across several joints. Kinematically, they constrain the motion of the bodies through length constraints. Using the cable elements implemented in this thesis, the user can interactively shorten a tendon and analyze the resulting position of the system. The cable element presented in this section provides cables consisting of multiple, straight line segments that can connect any number of bodies. The user may control the length of the cable as a driver or in a passive mode where the length is computed based on other driver inputs.

FIG. 4.5 shows how a cable system may be configured. The cable is defined by a series of point connections. For each point, the user defines the body number and the body fixed local coordinates of the point, $s'_i$.

Constraints presented to this point have had straight forward analytical derivatives. If constraints are more complex and analytical derivatives are not available, the Jacobian entries may be determined with a finite difference method. Therefore, any constraint equation may be modeled, but the solution may be slow if an explicit partial derivative expression is not available. For this reason, the cables are currently allowed to have only straight line segments. In the future, this method may be developed to include, splines, but the solution will be numerically slower.

4.3.1 Constraint equation

The cable/pulley constraint enforces the sum of the cable segments to equal a desired length. This constraint equation is valid for both straight line and splined cables.

$$\Phi^{(c1,1)}=(1_{actual})-(1_{set})=0 \tag{4.26}$$

The length of the cable can be determined by summing the individual segment lengths of the cable $$l_{actual}=\sum_{i=1}^{np-1}\|d_{i,i+1}\|=\sum_{i=1}^{np-1}\|((r_i+A_is'_i)-(r_{i+1}+A_{i+1}s'_{i+1}))\| \tag{4.27}$$

where np is the number of points, $A_i$ is the transformation matrix for the body that point i is attached, and $s'_i$ is the position of the point in the local coordinate system of the body.

The cable formulated above allows the user to constrain the cable to any length. Therefore, the formulation provides a cable that the user can kinematically both push and pull. In real life, flexible cables do not usually carry compression. If a tension only cable is desired, the following constraint may be used in place of Equation 4.26.

$$\Phi^{(c2,1)}=\begin{cases}(l_{actual})^2-(l_{set})^2 & l_{actual}>l_{set}\\ 0 & \text{otherwise}\end{cases}. \tag{4.28}$$

Later, another form of this constraint will be required. Currently, this form works well for kinematics and dynamics, but for static force analysis, it is convenient to keep the form consistent with the other constraints. The reason for this conversion is discussed in section 4.5.6.1. The following form will be used for the static force section only.

$$\Phi^{(c1,1)}=1_{actual}-1_{set}=0 \tag{4.29}$$

4.3.2 Jacobian matrix entries

The derivation of the partials derivatives for the cable constraint are formulated below.

$$\begin{aligned}\Phi_q^{(c1,1)} &= \frac{\partial}{\partial q}\Phi^{(c1,1)}=\frac{\partial}{\partial q}((l_{total})^2-(l_{set})^2)=\frac{\partial}{\partial q}((l_{total})^2)\\ &= 2(l_{total})\frac{\partial}{\partial q}(l_{total})=2(l_{total})\sum_{i=1}^{np-1}\frac{\partial}{\partial q}(l_i)\end{aligned}$$

-continued where $$\frac{\partial}{\partial q}(l_i)=(d_i^Td_i)^{1/2}=\frac{1}{2}\frac{\frac{\partial}{\partial q}(d_i^Td_i)}{(d_i^Td_i)^{1/2}}=\frac{1}{2}\frac{\frac{\partial}{\partial q}(d_i^Td_i)}{l_i}$$

and $$\frac{\partial}{\partial r}(d_i^Td_i)+-2d_i^T$$

$$\frac{\partial}{\partial \omega}(d_i^Td_i)=2d_i^TA_k\tilde{s}'_i$$

so that $$\frac{\partial}{\partial r}(l_i)=-\frac{1}{2}\frac{2d_i^T}{l_i}=-\frac{d_i^T}{l_i}=-\frac{d_i^T}{\|d_i\|}=$$

–direction of segment $$\frac{\partial}{\partial \omega}(l_i)=\frac{1}{2}\frac{2d_i^TA_k\tilde{s}'_i}{\|d_i\|}=\frac{d_i^T}{\|d_i\|}A_k\tilde{s}'_i=\frac{\partial}{\partial r}(l_i)A_k\tilde{s}'_i$$

$$\Phi_r^{(c1,1)}=-2(l_{total})\left[\sum_{i=1}^{np-1}\frac{d_i^T}{\|d_i\|}\right] \tag{4.30}$$

$$\Phi_\omega^{(c1,1)}=2(l_{total})\left[\sum_{i=1}^{np-1}\frac{d_i^T}{\|d_i\|}A_k\tilde{s}'_i\right] \tag{4.31}$$

where k=body number used by point i

The Jacobian entries for the force analysis version used in Equation 4.29 are $$\Phi_r^{(c2,1)}=\sum_{i=1}^{np-1}-\frac{d_i^T}{\|d_i\|} \tag{4.32}$$

$$\Phi_\omega^{(c2,1)}=\sum_{i=1}^{np-1}\frac{d_i^T}{\|d_i\|}A_k\tilde{s}'_i \tag{4.33}$$

Note that the $\Phi_r$ and $\Phi_\omega$ do not include the body indices indicating the respective Jacobian block entries such as $\Phi_{r_i}$. To compute the individual body or block Jacobian entries, only the sum of the cable segments that are connected to the desired body are computed. For example, if only the j'th segment of a cable were attached to body i, the Jacobian block entries for this body would be $$\Phi_{r_i}^{(c2,1)}=-\frac{d_j^T}{\|d_j\|}$$

$$\Phi_{\omega_i}^{(c2,1)}=\frac{d_j^T}{\|d_j\|}A_i\tilde{s}'_j$$

A nested loop is used to successively add up the derivatives with respect to each body. This is best described using a flow chart of the code used to calculate the derivatives. Assume a segment is made up of np points with the points stored in the array pt[np] and the body numbers stored in the array body[np]. This is not computationally the most efficient way to perform the formulation, but was written for clarity.

a. Initialize
   a.1. Set Jacobian entries to zero
   a.2. Calculate current length, $\mathbf{1}_{total}$
b. Loop i=1 to n−1
   b.1. Set $p_i$=pt[i] and $p_j$=pt[i+1]
   b.2. Set $b_i$=body [i] and $b_j$=body [i+1]
   b.3. Calculate global distance vector between the points, $$d=(r_{b_j}+A_{b_j}p_j)-(r_{b_i}+A_{b_i}p_i)$$

b.4. Normalize:

$$\hat{d} = \frac{d}{\|d\|}$$

b.5. Increment the Jacobian Values for the current bodies b.5.a. $\Phi_{r_{b_i}}^{(c1,1)} = \Phi_{r_{b_i}}^{(c1,1)} - 2(l_{total})\hat{d}$ b.5.b. $\Phi_{r_{b_j}}^{(c1,1)} = \Phi_{r_{b_j}}^{(c1,1)} + 2(l_{total})\hat{d}$ b.5.c. $\omega_{r_{b_i}}^{(c1,1)} = \Phi_{r_{b_i}}^{(c1,1)} + 2(l_{total})\hat{d}A_{b_i}\overline{p}_i$ b.5.d. $\omega_{r_{b_j}}^{(c1,1)} = \Phi_{r_{b_j}}^{(c1,1)} - 2(l_{total})\hat{d}A_{b_j}\overline{p}_i$ c. Continue Loop This cable model works well for particular cases, but it is easy to design systems where the cable systems may become unstable due to the orientation of the cables with respect to the location of the joints. Also, systems that require redundant cables, which are especially important in biomechanics, can not be handled with the previous kinematic solution methods. Therefore, the next section introduces an optimized method to handle these situations.

4.4 Optimized Kinematics

Another kinematic method in VIMS optimizes any number of driver constraints. This method has several advantages. This method is able to find a "best" solution if the current driver values specify some unreachable orientation. It also allows the number of drivers to exceed the number of DOF, as commonly occurs in most biomechanical muscle systems. This is accomplished by finding the minimum of a function of the constraint error values. For this software, the minimized function is the sum of the weighted squares of the errors. The disadvantage of this method, is that it is more compute intensive, and therefore, is only recommended for the situations presented.

This software uses the IMSL algorithm DNCONG for constrained optimization. It minimizes the cost function while demanding enforcement of the joint constraints.

Another advantage of this algorithm is that it allows the application of inequality constraints. Limits may be put of the range for any selected DOE. The inequality constraints are straight forward and are of the same form as the driver constraints. These inequality constraints result in even a larger increase in the compute requirements of the optimized kinematics.

The following is the list of steps used for the kinematic optimization method.

a. Call subroutine DNCONG with the following information b. Maximum number of iterations to preform c. Number of joint constraint equations d. Number of inequality equations e. Initial guess for $q_{(7nx1)}$ f. Upper and lower bounds on $q_{(7nx1)}$ g. Subroutine name that calculates the cost function value and the joint constraint values h. Subroutine name that calculates the derivative of the goal function and the Jacobian of the joint constraints.

The software for this thesis puts limits only on the range of the DOF's. The optimization formulation described above also allows the placement of upper and lower bounds on each of the bodies' Cartesian coordinates and Euler parameters. For this thesis the upper and lower bounds for step f. are set to large numbers to ignore these bounds.

4.4.1 Subroutine for step g. of the optimization method

For step g., the subroutine uses the same constraint values as derived in section 4.2. The formulations presented in section 4.2 are used to calculate the kinematic joint constraints, the driver constraints, and the inequality constraints. DNCONG calls the subroutine in step g with some altered q vector and the subroutine returns the value of the cost function, the joint constraint values and the inequality values for the new q.

g.1. Subroutine called with new $q_{(7nx1)}$ g.2. Update all A matrices based on $q_{(7nx1)}$ g.3. Calculate the joint constraint errors g.4. Calculate the inequality constraint values g.5. Calculate the current value of the goal function $$\sum_{i=1}^{ndrivers} (\text{driver constraint error})^2$$

4.4.2 Subroutine for step h. of the optimization method

Step h. of the optimization method calls a subroutine to compute the partial derivatives for the cost function, joint constraints, and inequality constraints. Since the cost function is computed from the driver constraints, the driver Jacobian entries developed in section 4.2 may be used to compute the partial derivatives of the cost function. The driver values were squared and summed to compute the cost function, and therefore, each driver Jacobian entry is multiplied by a correction value of $2\Phi_i$ and then summed together to determine the partials of the cost function. Thus, $$\frac{\partial f}{\partial q} = \sum_{i=1}^{ndrivers} (2\Phi_i)\Phi_{q_i} \quad (4.34)$$

where $\Phi_i$ are the constraint equations for the active drivers. DNCONG calls the subroutine in step h. of the optimization method with an altered q vector. The subroutine returns the partial derivatives of the cost function, joint, constraints, and inequality constraints for the new q vector.

h.6. Subroutine called with new $q_{(7nx1)}$ h.7. Calculate the joint constraint Jacobian h.8. Calculate the inequality constraint Jacobian h.9. Calculate the current derivative of the goal function h.10. Multiply each row, i, by $2\Phi_i$ h.11. Sum each column, j, so that $$\text{goal}_q[j] = \sum_{i=1}^{ndrivers} \Phi_{qi,j}$$

4.5 Dynamic Formulation

The previous sections dealt only with kinematics and positional analysis based on user defined driver values. This section describes the transition to dynamics which computes the motion of bodies due to forces. The dynamic formulation uses the same body and joint descriptions and the same constraint and Jacobian formulations that were used in the previous kinematic sections. The dynamic equations in this thesis are formulated using angular velocities instead of the Euler parameters. This reduces the number of algebraic dynamic equations and reduces the number of coordinates that are integrated.

Several new input considerations must be provided for dynamic analysis. First, a new element is developed to allow user supplied external forces and moments. Like the joint descriptions, the forces are described entirely with respect to the body fixed coordinate systems. Since all the bodies have been described with identical coordinate systems, all forces are processed exactly the same regardless of the systems topology. The center of gravity for each body is assumed at the origin of the bodies' local coordinate systems. Also, the mass and local inertias are required for each body. User defined spring and damper elements are provided at any driver input location.-This allows a defined driver, such as a cable constraint, to become a spring/damper element instead of a rigid constraint.

For dynamic analysis, the body coordinates are determined by first finding the body accelerations due to all forces acting on the bodies. Once the accelerations are determined, they are integrated once to determine the body velocities and again to determine the positional and orientational coordinates. It should be noted that the kinematic constraint equations are not directly applied since the accelerations of the coordinates are solved for, not the coordinates values themselves.

In order to solve for the accelerations, the second time derivative of the constraints is needed instead of the constraint values themselves. The constraint values are only implicitly used to reduce error in the system. This error is discussed later in this section.

4.5.1 Derivation of the dynamic equations

The dynamic equations of motion for multi-body rigid systems are derived here using Lagrange's Equations. It is assumed that the bodies and joints have been defined as previously discussed in section 4.1.1. Lagrange's equations of motion for an unconstrained, n degree of freedom system is [9]

$$\frac{d}{dt}\left(\frac{\partial T}{\partial \dot{q}_j}\right)-\frac{\partial T}{\partial q_j}-g_j=0,\quad j=1,2,\ldots,n_{gc} \tag{4.35}$$

where T is the total kinetic energy of the system, $q_j$ is the j'th generalized coordinate, $g_j$ is the generalized force for the j'th generalized coordinate and $n_{gc}$ is the number of generalized coordinates.

The kinetic energy, $T_i$, of a single rigid body, i, is $$T_i=\tfrac{1}{2}\dot{r}_i^T M_i \dot{r}_i+\tfrac{1}{2}\omega'^T_i J'_i \omega'_i \tag{4.36}$$

where $r_i$ is the velocity of the CG, $\omega'_i$ is the local angular velocity vector, $M_i$ is the 3x3 diagonal mass matrix and $J'_i$ is the 3x3 local inertia tensor about the CG of body i. Therefore, the total kinetic energy of the system is $$T=\sum_{i=1}^{n_b}\left[\frac{1}{2}\dot{r}_i^T M_i \dot{r}_i+\frac{1}{2}\omega'^T_i J'_i \omega'_i\right] \tag{4.37}$$

where $n_b$ is the number of bodies in the system.

The generalized force vector, $f_i$, consists of the sum of forces and moments on body i. The forces, f, are defined at the CG of body i and in the direction of the global coordinates axes of the inertial reference frame. The moments, n' are defined about the local body fixed coordinate system of body i.

$$f_i=\begin{bmatrix}\Sigma f_X\\ \Sigma f_Y\\ \Sigma f_Z\\ \Sigma n'_x\\ \Sigma n'_y\\ \Sigma n'_z\end{bmatrix} \tag{4.38}$$

4.5.1.1 Constrained dynamics

While Equation 4.38 allows the application of external forces, the internal joint and driver constraint forces also have to be included for constrained dynamic equations. Each constraint opposes system motion that would violate the constraint by exerting constraint forces and moments on the bodies that the constraint connects. These constraint forces are written as [22].

$$g_{constraint}=\Phi^T_q\lambda \tag{4;39}$$

where λ is a vector of Lagrange multipliers. Therefore, the total generalized force is the sum of g and $g_{constraint}$. The Lagrange equations for a constrained system with workless constraints can therefore be written as [24]

$$\frac{d}{dt}\left(\frac{\partial T}{\partial \dot{q}_j}\right)-\frac{\partial T}{\partial q_j}-g_j+\left(\frac{\partial \Phi}{\partial q_j}\right)^T\lambda=0,\quad j=1,2,\ldots,n_{gc} \tag{4.40}$$

Applying Equation 4.37 and Equation 4.38, Equation 4.40 becomes [9]

$$M\ddot{q}+h+g+\left(\frac{\partial \Phi}{\partial q_j}\right)^T\lambda=0 \tag{4.41}$$

where M is the combined mass and inertia matrix, h is the force vector due to the rotating body axes in Cartesian space, and g is the total generalized force vector.

The number of equations resulting from Equation 4.41 is equal to the number of generalized coordinates. For this thesis, six coordinates are provided for each body, and therefore, Equation 4.41 provides six dynamic equations for each body. In addition to the unknown generalized accelerations, $\ddot{q}$, the Lagrange multipliers, λ, are also unknowns in Equation 4.41. The number of unknowns is equal to six times the number of bodies plus the number of constraints, but the number of equations is only six times the number of bodies. Therefore, an extra set of equations are needed to relate the constraint forces and generalized body accelerations.

4.5.2 Second time derivative of the constraint equations

Constrained systems with dependent generalized coordinates pose an interesting challenge to solve. Although the constraints must be satisfied, it is straight forward to add the kinematic constraint acceleration equations to Equation 4.41 to yield a complete set of equations enabling a solution for $\ddot{q}$ and λ.

Taking the first time derivative of the constraint equation $$\Phi(q,t)=0 \tag{4.42}$$

velocity equation is obtained $$\Phi_q\dot{q}+\Phi_t=0 \tag{4.43}$$

Taking the second time derivative results in the acceleration equation $$\Phi_q\ddot{q}+(\Phi_q\dot{q})_q\dot{q}+\Phi_t+2\Phi_{qt}\dot{q}+\Phi_{tt}=0 \quad (4.44)$$

Generally, most constraints do not contain products of time and coordinate values and do not contain time to the second power. Therefore, it is generally accepted [22] that the last two terms may be dropped to obtain $$\Phi_q\ddot{q}=-(\Phi_q\dot{q})_q\dot{q}-\Phi_t \quad (4.45)$$

The right hand side of Equation 4.45 is denoted as γ so that $$\Phi_q\ddot{q}=\gamma \quad (4.46)$$

The γ values for all the joint and driver constraint equations used in this thesis are listed along with the Jacobian entries in Table 4.1, Table A.1, and Table A.2.

4.5.3 Matrix form of the constrained dynamics equations

Both Equation 4.41 and Equation 4.46 can be combined into the single set of equations $$\begin{bmatrix} M & \Phi_q^T \\ \Phi_q & 0 \end{bmatrix}_{(6n_b\times 6n_b)} \begin{bmatrix} \ddot{q} \\ \lambda \end{bmatrix}_{(6n_b\times 1)} = \begin{bmatrix} g \\ \gamma \end{bmatrix}_{(6n_b\times 1)} \quad (4.47)$$

The resulting system of algebraic equations are solved to obtain the accelerations, $\ddot{q}$, of the body coordinates. The accelerations are then integrated twice to determine the positions and orientations of the bodies. Therefore, the dynamic solution solves a mixed system of algebraic and differential equations.

An alternate form of Equation 4.47, is used in this thesis since angular velocities are desired as generalized coordinates. Therefore, Equation 4.47 may be written instead as $$\begin{bmatrix} M & \Phi_q^T \\ \Phi_q & 0 \end{bmatrix}_{(6n_b\times 6n_b)} \begin{bmatrix} \dot{y} \\ \lambda \end{bmatrix}_{(6n_b\times 1)} = \begin{bmatrix} g \\ \gamma \end{bmatrix}_{(6n_b\times 1)} \quad (4.48)$$

where $$y=[y_1^t y_2^T \ldots y_n^{\%}]^T_{(6n_b x1)} \quad (4.49)$$

and $$y_i=[\dot{r}_i^T \omega'_i]^T_{(6x1)} \quad (4.50)$$

Therefore, $$\dot{y}_i=[\ddot{r}_i^T \dot{\omega}'_i]^T_{(6x1)} \quad (4.5)$$

Note that the local angular velocity is used here. Therefore, all inertias and moments used in Equation 4.48 are defined with respect to the individual body coordinate systems while the force vectors are still defined globally in the fixed coordinate system.

The matrix M in Equation 4.48 is the Cartesian mass and inertia matrix $$M=\begin{bmatrix} M_1 & & & & & 0 \\ & J'_1 & & & & \\ & & \cdot & & & \\ & & & \cdot & & \\ & & & & \cdot & \\ 0 & & & & M_{n_b} & \\ & & & & & J'_{n_b} \end{bmatrix}_{(6n_b\times 6n_b)} \quad (4.52)$$

where $M_i$ is the 3×3 mass matrix for body i $$M_i=\begin{bmatrix} m_i & & 0 \\ & m_i & \\ 0 & & m_i \end{bmatrix}_{(3\times 3)} \quad (4.53)$$

and $m_i$ is the mass of body i. $J'_i$ is the local 3×3 inertia tensor in body i $$J'_i=\begin{bmatrix} j_{xx} & j_{xy} & j_{xz} \\ j_{yx} & j_{yy} & j_{yz} \\ j_{zx} & j_{zy} & j_{zz} \end{bmatrix}_{(3\times 3)} \quad (4.54)$$

The vector h is the Cartesian Coriolis and centrifugal force vector that accounts for the fact the body defined coordinate axes and the inertial tensor are rotating with respect to the fixed coordinate system.

$$h=[h_1^T h_2^T \ldots h_{n_b}^T]_{(6_b x1)}^T \quad (4.55)$$

where the individual $h_i$ vector for each body is $$h_i=[0^T(\omega'_i J'_i \omega'_i)^T]_{(6x1)}^T \quad (4.56)$$

the external force vector is $$f=[f_1^T f_2^T \ldots f_{n_b}^T]_{(6n_b x1)}^T \quad (4.57)$$

where $$f_i=[r_i^T n'^T_i]_{(6x1)}^T \quad (4.58)$$

$r_i$ is the external force vector acting at the CG of body i expressed in global Cartesian coordinates. $n'_i$ is the external moment vector applied to body i expressed in body i's local coordinate system.

4.5.4 Error correction methods

The solution of the dynamics equations is a mixture of algebraic and differential equations. If error is introduced into the system when solving the algebraic equations, the error is passed onto the positions when the accelerations are integrated. This error will accumulate in the velocities and positions. In other words, the solution of Φ=0 may be unstable which will result in non-zero values of Φ and $\dot{\Phi}$.

Constraint stabilization is a simple method to reduce the constraint error. This method is used in the developed software and is often called the αβ method. In order to keep the system stable, the kinematic acceleration equation, $\dot{\Phi}=0$, is converted to the second order system $$\Phi+2\alpha\Phi+\beta^2\Phi=0 \quad (4.59)$$

which is guaranteed to be stable if α>0 and β≠0. Applying this equation and Equation 4.43 into Equation 4.46 results in $$\Phi_q\ddot{q}=\gamma-2\alpha(\Phi_q\dot{q}+\Phi_t)-\beta^2\Phi \quad (4.60)$$

and the new system of equations is written as $$\begin{bmatrix} M & \Phi_q^T \\ \Phi_q & 0 \end{bmatrix}_{(6n_b z 6n_b)} \begin{bmatrix} \dot{y} \\ \lambda \end{bmatrix}_{(6n_b\times 1)} = \begin{bmatrix} g \\ \gamma-2\alpha(\Phi_q\dot{q}+\Phi_t)-\beta^2\Phi \end{bmatrix}_{(6n_b\times 1)} \quad (4.61)$$

which is the same as Equation 4.48 except that the right hand side vector has been altered to stabilize the constraint violation.

The problem with this method is that the values for $\alpha$ and $\beta$ are arbitrary. Values at a configuration may not be the best for another. Because this is a second order system, the response of the constraint error can be controlled by the selection of $\alpha$ and $\beta$ parameters. The values essentially represent spring and damping values, and therefore, determine the decay time and oscillation period about the correct solution. $\alpha$ and $\beta$ are usually selected to be heavily damped. Note that attempts to increase $\omega_n$ on or decrease response time of the constraint violation can cause additional stiffness in the system and affect the efficiency of the numerical integration.

Another method approaches the error accumulation by recognizing that all the coordinates, q, are not independent due to the constraints, $\Phi$. This method, known as the coordinate partitioning method, partitions the coordinates into a dependent set, $q_n$, and an independent set, $q_v$. The algebraic equations (Equation 4.48) are solved exactly the same as before for the accelerations. Instead of integrating all coordinates, only the independent accelerations are integrated. The position and velocity of the dependent coordinates are then found by applying the kinematic constraint and velocity equations [22]

$$\Phi(q_u, q_v)=0 \tag{4.62}$$

$$\Phi_{q_u}\dot{q}_u=-\Phi_{q_v}\dot{q}_v \tag{4.63}$$

This method has two advantages; it controls the constraint error at the level specified in the Newton iteration and also reduces the number of coordinates that are integrated. The disadvantage is that some method is needed to determine how to partition the coordinates correctly. This method has not yet been implemented in the software developed for this thesis.

The most efficient method to reduce error is to transform the coordinates to relative coordinates before solving the dynamic equations. This would result in a minimal coordinate set. This method, introduced by Kim and Vanderploeg [9], uses a Cartesian set of coordinates in order to easily define the system parameters such as body orientation, joints, and force parameters.- The coordinates are then transformed by applying a velocity transformation matrix that relates the velocities of the generalized or relative coordinates to the Cartesian coordinates. With the transformed coordinates, a QR decomposition of the Jacobian matrix is used determine the independent set of coordinates and eliminate the constraint forces. This method has not yet been implemented in this software.

4.5.5 Defining and applying external force elements

With the above formulation, any external force may be applied to the system by simply inserting it into the right hand side of Equation 4.48. All force elements such as springs, dampers, and soft constraints are applied by calculating the effective force and moment acting on each body. The force vector, $g_i$, is the sum of all forces and moments acting on body i.

A spring-damper element may be applied to the system as follows. The force in a spring-damper system is $$\text{force}=(k_{val})x+(c_{val})\dot{x} \tag{4.64}$$

where x is the length difference between the free length and current length of the spring-damper. The distance between the points defining the spring is $$d=(r_j+A_j s'_j)-(r_i+A_i s'_i) \tag{4.65}$$

where $r_i$ is the vector from the fixed coordinate system to the body defined coordinate system and $s'_i$ is the location of the point in body i. The velocity between the points is $$\dot{d}=(\dot{r}_j+A_j\omega'_j s'_j)-(\dot{r}_i+A_i\omega'_i s'_i) \tag{4.66}$$

Therefore, the tension force in the spring is $$\text{tension}=[\|d\|-\text{length}_{set}]k_{val}+\|\dot{d}\|c_{val} \tag{4.67}$$

and the force vector is $$f_{s_i}=\frac{d}{\|d\|}\ \text{tension} \tag{4.68}$$

$$f_{s_j}=-\frac{d}{\|d\|}\ \text{tension} \tag{4.69}$$

But this force vector does not necessarily act at the CG of the body, but at some point $s'_i$ in the body. Therefore, the force is converted to force at the CG and a moment. For a global force that is moved from the point, $s'_i$, to the CG, the resulting global moment is $$\begin{aligned} n &= \tilde{s}_i f_{s_i} \\ &= A_i \tilde{s}'_i A_i^T f_{s_i} \end{aligned} \tag{4.70}$$

this can be converted to the local moment vector $$\begin{aligned} n' &= A_i^T A_i \tilde{s}'_i A^T_i f_{s_i} \\ &= \tilde{s}'_i A^T_i f_{s_i} \end{aligned} \tag{4.71}$$

These forces and moments are added to the right hand side force vector, g. Therefore, the force vector for body i becomes $$g_i = g_i + \begin{bmatrix} f_{s_i} \\ \tilde{s}' A^T_i f_{s_i} \end{bmatrix} \tag{4.72}$$

and the force vector for body j becomes $$g_j = g_j - \begin{bmatrix} f_{s_j} \\ \tilde{s}' A^T_j f_{s_{ij}} \end{bmatrix} \tag{4.72}$$

4.5.6 The Lagrange multipliers

The Lagrange multipliers are the constraint reaction forces or moments. The Lagrange multipliers for the joints specify how much force or moment is exerted by the joint in order maintain the constraints. The multipliers for the rotational drivers indicate how moment is required to keep the joint at some specified angle. The multipliers for the cable constraints indicate how much tension is in the cable.

The software developed for this thesis allows the user to define drivers to act as spring/damper forces instead of constraint equations. The external forces exerted by these drivers may be calculated from the Jacobian entries previously defined for the drivers in section 4.2. This is advantageous for complex drivers such as cable/pulley drivers that apply several forces on different bodies. The Jacobian entries may be used to formulate the directions and magnitudes of the force and moment vectors and which bodies they are applied to. Given the magnitude of the driver constraint force or moment, Equation 4.39 may be used to compute the external force vector acting on the system as a result of the spring/damper driver. Thus, $$g_{constraint_i}=\Phi_{i_q}{}^T\lambda_i \tag{4.74}$$

where $\Phi_{i_q}$ are the constraint derivatives that would make up a row of the Jacobian if it were an actual driver constraint. $\lambda_i$ is the magnitude of the spring-damper driver's constraint force or moment. This force vector is then added to the existing external force vector for the system. If a driver cable constraint were defined as a spring/damper system, and the tension was determined based upon its current length, the external force vector, g, would become $$g = g + [\Phi_q^{(c2,1)}]^T \text{ tension} \tag{4.75}$$

Note that the second form of the cable constraint is used here. The first form's Lagrange multiplier, $\lambda_i$, would not equal the tension force since it was computed from a constraint calculated from the squares of the cable lengths.

4.5.6.1 Static force analysis

With the current formulation of the Jacobian matrix, the formulation of static force analysis is straight forward. Using the relationship from Equation 4.39, if the Jacobian and the external forces are known, the joint and driver reaction forces may be determined. The formulation is shown below in Equation 4.76.

In order to algebraically solve the system, the number of unknowns must equal the number of equations. Referring to Equation 4.76, the equations represent the sum of forces and moments on each body. Therefore, the number of equations is $6n_b$. The number of unknowns is the number of Lagrange multipliers for the joint and driver constraints. This implies that the Jacobian must be a square matrix to have a unique solution.

This also implies that there must be $6n_b$ constraints, and therefore, all degrees of freedom for the system must be constrained. Obviously, if all DOF were not constrained, the system would not be static and the application of static force equations would not be valid.

When the defined system has too many constraints, there will be more unknowns than equations. This is common in biomechanical systems where several muscles constrain a single DOF. The system has an infinite number of solutions and the system of equations in Equation 4.76 can not be uniquely solved. A "best" solution can be obtained from the infinite set of solutions by using some criteria to optimize the solution. One method is to minimize a quadratic function of the resulting forces or Lagrange multipliers.

To solve the redundant systems, this thesis uses the quadratic optimization solver, DQPROG, from IMSL [23]. The subroutine solves the quadratic programming problem with linear equality and inequality constraints. The inequality constraints are necessary for solving for the force in tension only cables. Since the force in these tendons can not be negative, an inequality constraints are applied to keep the force positive.

To solve for the optimized static forces, the following steps are used.

a. Define the position of all degrees of freedom
b. Solve the kinematic system for the new positions-orientations
c. Compute the right hand side force-moment summations: g (4.76)

Constraint Equations

Sums of forces on body 1; Sums of moments on body 1

$$\begin{bmatrix} \frac{\partial\Phi_1}{\partial x} & \frac{\partial\Phi_2}{\partial x} & \frac{\partial\Phi_3}{\partial x} & \frac{\partial\Phi_4}{\partial x} & \frac{\partial\Phi_5}{\partial x} & \cdot & \cdot \\ \frac{\partial\Phi_1}{\partial y} & \frac{\partial\Phi_2}{\partial y} & \frac{\partial\Phi_3}{\partial y} & \frac{\partial\Phi_4}{\partial y} & \frac{\partial\Phi_5}{\partial y} & - & - \\ \frac{\partial\Phi_1}{\partial z} & \frac{\partial\Phi_2}{\partial z} & \frac{\partial\Phi_3}{\partial z} & \vdots & \vdots & - & - \\ \frac{\partial\Phi_1}{\partial\omega'_x} & \vdots & \vdots & - & - & - & - \\ \frac{\partial\Phi_1}{\partial\omega'_y} & - & - & - & - & - & - \\ \frac{\partial\Phi_1}{\partial\omega'_z} & - & - & - & - & - & - \\ \vdots & - & - & - & - & - & - \end{bmatrix} \begin{bmatrix} \lambda_1 \\ \lambda_2 \\ \lambda_3 \\ \lambda_4 \\ \vdots \end{bmatrix} = \begin{bmatrix} \Sigma F_x \\ \Sigma F_y \\ \Sigma F_z \\ \Sigma M'_x \\ \Sigma M'_y \\ \Sigma M'_z \\ \vdots \end{bmatrix}$$

Transpose of the jacobian, $(\Phi_q^T)_{(6n_b \times 6n_b)}$

Constraint Forces, $\gamma_{(6n_b \times 1)}$

Sums of External Forces, $g_{(6n_b \times 1)}$ c.1. Set: $g=0$ c.2. Add all user defined external forces and moments: $g=g+g_i$ c.3. Subtract all user defined constraint forces and moments from RHS $g=g-\Phi_q^T\lambda_{set}$ c.4. Append the inequality RHS to the force RHS $$r = \begin{bmatrix} g_{(6n_b \times 1)} \\ p_{(n_{ineq} \times 1)} \end{bmatrix}_{((6n_b+n_{ineq}) \times 1)}$$

d. Set up the transpose of the Jacobian, $A_{(n_{eqn} x n_{var})}$ d.1. Set up Jacobian for all unknown equality constraint values, $(\Phi_q^{eq})_{(n_{cstr} x 6n_b)}$ d.2. Transpose the Jacobian $(\Phi_q^{eq})^T_{(6n_b x n_{cstr})}$ d.3. Set up the inequality equations, $N_{(n_{ineq} x n_{eqn})}$ d.4. Append the inequality equations to the transposed Jacobian $$A = \begin{bmatrix} (\Phi_q^{eq})^T \\ N \end{bmatrix}_{((6n_b+n_{ineq}) \times n_{cstr})}$$

e. Set up weighting matrices, $H_{(n_{var} x n_{var})}$ and $K_{(n_{var} x 1)}$ f. Call subroutine DQPROG with the following information f.1. Number of Lagrange multiplier variables, $n_{var}=n_{cstr}$ f.2. Number of equations and inequality equations, $n_{eqn}=6n_b+n_{ineq}$ f.3. Quadratic weighting matrix, $H_{(n_{var} x n_{var})}$ f.4. Linear weighting vector, $k_{(n_{var} x 1)}$ f.5. Transpose of Jacobian and inequality equations, $A_{(n_{eqn} x n_{var})}$ f.6. Right hand side of sums of forces and inequality values, $r_{((6n_b+n_{ineq}) x 1)}$ The algorithm then minimizes $$\min_{\gamma \in \mathfrak{R}^n} k^T\lambda + \frac{1}{2}\lambda^T H \lambda \tag{4.77}$$

subject to $$(\Phi_q^{eq})^T\lambda = g$$

and $$N\lambda = p$$

It is often desirable to set some multiplier force to a specific value. For example, a user may want to set a force in a tendon and visualize the change in the rest of the system forces. Equation 4.39 may be applied to easily handle this. Since the multiplier value is defined by the user in this case, the sum of the forces acting on each body can be obtained and added to the right hand side force vector as in step c.3 above.

For step e above, the weighting matrices may be defined in any way as long as H is positive definite. If the objective is to minimize the sums of the squares of the forces, then the k-vector may set to zero and H defined as an identity matrix. This would set an equal weighting on all force and moment values. If different weighting was desired, the values of the diagonal could be varied relative to each other. For example, if the second multiplier force were desired to be minimized to a smaller value, the entry $A_{(2,2)}$ could be assigned a value of ten while all other diagonals were set to a value of one.

Biomechanics literature indicates that minimization of a weighted sum of the squares of the muscle forces provide good results. One method defines different weighting coefficients proportional to the cross-sectional area of the muscles. This tends to equally distribute and, at the same time, minimize the strain in the muscles.

For step d.3 of the static force analysis, the inequality constraints for the forces are easily defined. Entries in the equation are zero except the entry that corresponds to the force to be constrained. This entry is given a value of 1.0 while the right hand side is given the limiting value. For the tension only cables, the non-zero equation entry is set to negative one and the right hand size is set to zero. This will force the tension to be greater than zero.

An additional capability of this formulation is that user defined external forces may be set as unknowns. For example, the direction of an external force may be defined, but the user may want to allow the magnitude of the force to be an unknown. The magnitude of the force is then computed along with the constraint forces and moments to satisfy the static equilibrium equations.

This is possible by creating a special constraint that defines the change in the force on the body with respect to a change in the body coordinates. The following Jacobian block entry may be used to allow the magnitude of a given force direction to be calculated along with the other unknown Lagrange constraint forces and moments.

$$\Phi_q^{(f,1)}=[\hat{r};\ \bar{s}'_i A^T_i \hat{r}] \tag{4.78}$$

The vector, $\hat{r}$, is the normalized direction of the force and $s'_i$ is the location of the force on the body. This Jacobian entry can then be appended to the other Jacobian entries in Equation 4.76.

4.6 Three-Dimensional Computer Graphics

This section briefly describes the main techniques used to create an interactive interface. The interface was written using Silicon Graphics graphics library, known as GL. The library handles low level graphics processes such as transformations, lighting, and: shading. Much literature exists on these lower level processes [26,27,28] and therefore, are not discussed in this thesis. Mainly, this section discusses how the GL library was applied to create the interactive interface.

Definition of geometric objects, their spatial transformations, their material appearance, and light locations are provided by the user while GL uses this information to render a shading scene. Input is handled by creating graphical buttons on the screen with GL and using the mouse to select the buttons.

4.6.1 Interactive buttons and menus

An interactive set a graphical buttons and controls are drawn onto the screen to create a virtual control panel that allows input and displays output. These buttons were originally developed for the computer animation package, ERNIE [25]. The mouse may be used to select buttons, open menus, and control values by using sliders. An example of these buttons is shown below in FIG. 4.6. Pressing the left mouse button while the mouse cursor is inside of a button selects the button. The button then performs any number of functions such as prompting the user to enter a value with the keyboard. Likewise, if the mouse were pressed and held while in a slider button, the mouse's cursor position would dictate the value of the variable assigned to the slider. Four sliders are shown in the right hand side of FIG. 4.6.

An advantage of using the graphical interface to input information instead of constructing a text file is that the graphical interface can prompt the user for required information and indicate whether the input information is valid or not. Another advantage is that any specified change in the system can be seen immediately. For example, if the direction of a force arrow on a body is changed using the interface, the change is immediately displayed on the screen. For the developed software, the interactive control panel method allows control all parameters of the multi-body system 4.6.2 Geometry description Three-dimension al objects represent the shape of the bodies for the multi-body system. For this thesis, the objects are defined with many flat polygons to approximate surfaces. A simple example of a polygonal object is shown in FIG. 4.7. When enough polygons are used, curved surfaces can be accurately represented. Flat polygons are used for this thesis because the graphics hardware used is specifically developed to handle shading of flat polygons at very high rates. Also, the polygons are easy to store and manipulate. Therefore, all the geometry is represented by arrays of vertex coordinates and connectivity specifications for the polygons.

The BYU format [29] is used for this thesis. An example BYU file for a cube is shown in FIG. 4.8. The first line defines how many objects, polygons, vertices, and connections the file contains. The next line specifies the ranges of polygons representing each object. This is followed by the coordinates for each vertex. Finally, the list of vertex connections are provided. Notice that a negative vertex connection number indicates that it is the last point of the polygon and that the next vertex connection starts a new polygon.

4.6.3 Viewing and object transformations

The geometry positions and orientations and the viewing directions can be controlled by providing GL with a transformation matrix before drawing the objects. Like the transformation matrices used for multi-body systems, transformations can be applied to control the geometric object orientations and positions and transform their position from one coordinate system to another. Multi-body matrices are usually post-multiplied to the existing transformations, but many computer graphics matrices are pre-multiplied to the current transformation. The pre-multiplication is used so that the viewing matrix is applied to the transformation first instead of last. Thus, the viewing transformation is applied only once. This difference may be handled by simply transposing the transformation matrices to make the two methods compatible.

GL has a single viewing transformation matrix. When an object is drawn, the current state of this transformation matrix is automatically applied to the drawn object geometry. Every point, line, or surface drawn is multiplied by the matrix so that the resulting object appears rotated and translated on the screen. The transformation matrix is first multiplied by a viewing transformation to change the viewing position and orientations of all objects. Then, before each object is drawn, the transformation of each object's orientation is multiplied on top of the viewing matrix.

The transformation matrix is a 4×4 matrix that contains both orientation and transformation information. The 3×3 matrix is the transpose of the matrix described in the multi-body theory since the matrix is pre-multiplied instead of post-multiplied. Thus, the transformation matrix is

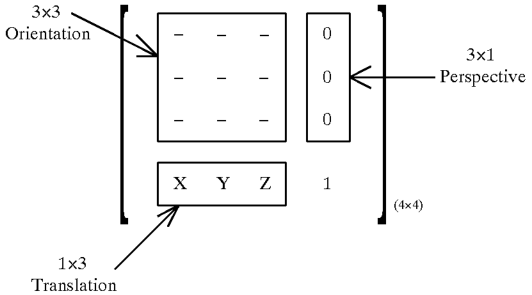

(4.79)

GL can "push" the current matrix to store the current matrix and it can "pop" the matrix to retrieve the stored matrix. Therefore, the process for drawing several objects to the screen is listed below.

a. Apply the viewing matrix
b. Loop i: 0 to number of bodies
 b.1. Push current matrix
 b.2. multiply the transformation matrix by the matrix for body i, $A_i$
 b.3. Draw body i
 b.4. Pop matrix to get back old matrix
c. Continue step b Likewise, the geometry for each joint may be displayed to show how the bodies are connected. This process makes use of the orthonormal joint transformation matrices, $N_i$, which were defined in the multi-body theory. The joints can be drawn at their correct position and orientation by the following steps d. Loop k: 0 to number of joints
 d.1. Find bodies i and j that joint k connects
 d.2. Draw joint in body i
 d.2.a. Push matrix
 d.2.b. Multiply transformation matrix by matrix for body i, $A_i$
 d.2.c. Multiply transformation matrix by matrix for joint i, $N_i$
 d.2.d. Draw joint i geometry
 d.2.e. Pop matrix
d.3. Draw joint in body j
 d.3.a. Push matrix
 d.3.b. Multiply transformation matrix by matrix for body i, $A_j$
 d.3.c. Multiply transformation matrix by matrix for joint i, $N_j$
 d.3.d. Draw joint j geometry
 d.3.e. Pop matrix
e. Continue step d

5 VISUAL INTERACTIVE MULTI-BODY SOFTWARE (VIMS)

The visual interactive multi-body system, VIMS, is a software package developed for this thesis to demonstrate the advantages of an interactive multi-body analysis package. While current multi-body software packages are a valuable tool for testing and development, use has been limited because they require a very sophisticated user. VIMS is an attempt to expand the usefulness of multi-body software packages by allowing the user to interactively enter and control system parameters using computer graphics. The interactive three-dimensional user interface provides an intuitive user friendly environment to develop models and analyze complex systems. This intuitive interface will expose a wider range of engineers to the power of multi-body analysis software.

5.1 Introduction

VIMS provides the capability to visually construct general multi-body systems and perform kinematic, dynamic, force, and optimized solutions. Multi-body systems including open and closed-loop, three-dimensional, rigid-body systems can be modeled. Currently, the software supports combinations of revolute, universal, spherical, translational, cylindrical, screw joints, and cable/pulley systems.

Multi-body system models may be created using the visual interactive interface, or may be loaded through a user supplied text file. The text file may be constructed by hand the traditionally way, or may be a file from a previous VIMS session. This text file contains both the graphical information that describes the shape and appearance of all bodies and the multi-body information such as the body and joint parameters.

In constructing a new multi-body system model, new bodies can be created and positioned in 3-D space using the mouse, or by entering the position and orientation values through the keyboard. Any user defined geometry may be applied to the bodies to represent them graphically. Joints are then added between the bodies by again positioning and orienting them with either the mouse of keyboard. Likewise, cable/pulley systems and external forces can be entered with either the mouse or keyboard.

At any time, even while any of the solution methods is activated, any of the system parameters may be altered graphically or by inputting values with the keyboard. While a solution method is in progress, it is possible to visualize the effects of the varied parameter. For example, while solving the dynamic problem, it is possible to visualize the effect of rotating or removing some external force or removing a joint from the system all together. The capability to interactively modify-and visualize any change in the system parameters is a primary advantage of this software and provides new and powerful insight to the user.

Many other visual techniques are integrated into the software. For example, force and moment icons give added insight to force analysis. VIMS displays forces and moments graphically with 3-D arrows that represent both direction and magnitude. Also, color is used extensively. Cable/pulley systems are depicted with different colors to indicate their relative force. These arrows and color changes provide a powerful method to provide even more information to the user in an efficient and effective manner.

5.2 Overview

This section describes the overall setup of the VIMS software and the general format of the various menus.

5.2.1 General setup

VIMS is a software program that combines multi-body systems with computer graphics. The flow chart show in FIG. 5.1 gives an overview of VIMS functionality and structure. The main steps of the loop consist of recomputing new positions of the bodies, graphically displaying the new positions, and drawing the menu buttons. A significant portion of the software is devoted to drawing the menu buttons and performing the respective action when a button is selected.

Since VIMS can create the entire system graphically, the user does not necessarily need to know the format of the input files. However, if it is desired, all information may be entered into a text file and read into VIMS. The input files that VIMS reads consist of two sets of data. The first set consists of the graphical description and display information. The format of this information is consistent with the format used by the animation package ERNIE [25]. Ernie is convenient for setting up and rendering animations, but it has no motion control or multi-body definition. Since ERNIE works well for describing graphical appearance and creating computer animations, VIMS has incorporated a compatible graphical definition format This way, the appearance of a collection of bodies can be setup within ERNIE and then directly loaded into VIMS without any alteration required. Also, once computed motion is developed in VIMS and saved to a data file, the same VIMS/ERNIE file may be read back into ERNIE to render an animation of the computed motion. For this reason, VIMS has only basic control over display parameters.

The second set of data in the input file is the multi-body data. This information defines the kinematic configuration of the system, physical properties of the bodies and other information associated with the multi-body simulation. This is the same information that is usually entered by hand with traditional multi-body analysis software.

The general format for the multi-body data consists of the beginning of each line or paragraph specifying the type of data that follows. Any time the first character of a line consists of a equal sign, a new paragraph type is defined by the number following the equal sign. A portion of an input file is shown in FIG. 5.2. The "=1" defines that the following paragraph describes a body. Within the paragraph, each new group of information begins with a letter that relates to a specific type of information. For example, the line that starts with "C" defines that line will contain the value of the mass of the body. To make the file easier to understand, each new line of data contains a single text word that describes what type of information the line contains. This text is ignored when the file is read, and therefore, serves only the purpose to document the data. The text cannot contain any spaces since VIMS expects a single string of characters. At least one character must also exist. A full example of an input file is provided in Appendix B.

5.2.2 Global Tools 5.2.2.1 Button and Slider Structure

VIMS makes use of a library of buttons and sliders developed for ERNIE[25]. The buttons are activated or selected by positioning the mouse cursor over the respective button and pressing the left mouse button. The effect of pressing the button varies depending on the type of button. Toggle buttons allow the user to tarn a single parameter off or on with the color of the button representing the current state. Other buttons prompt the user for values to be entered through the keyboard when they are selected. Therefore, the buttons serve two purposes; displaying a parameter value and allowing the user to enter new values for the parameter.

Sliders allow smooth control of a single parameter value. The left side of the slider displays the current value while the right side contains the slider. A new value may be entered by the keyboard by selecting the button displaying the current value. If the left mouse button is pressed while the cursor is in the right hand side of the slider, the current value of the parameter is controlled by the position of the mouse.

5.2.2.2 Menu Structure

The VIMS interface consists of pop-down menus that can be accessed using the main menu bar as shown in FIG. 5.3. The pop-down menus enable the user to control both graphical and multi-body parameters. When a menu button is selected, the respective menu window is displayed below the main menu bar and remains until another menu button is selected. Therefore, only one pull-down menu is displayed at a time. The exceptions to this are the viewing, display parameters, and table menus which remain even when other menus are selected. Since the first two of these menus are often used to manipulate the display, it is convenient to keep the menus constantly displayed.

The pull-down menus also have sub-menus that can be selected. For example, if the joint button is selected from the main menu bar, a menu containing the list of joints is displayed. If one of these joints is selected, a sub-menu is displayed that allows the joint to be edited.

5.2.2.3 Viewing Controls

During any phase of the analysis, the mouse may be used to change the viewing position or orientation. The global coordinates of the multi-body system are not changed during this process, only the viewing position and direction are altered. When the mouse is moved and one of the function keys at the top of the keyboard is pressed, the view can be translated, rotated, or zoomed in. The functions of the keys are shown in FIG. 5.4.

The transformations are performed in screen space where the x-axis lies alone the horizontal of the screen, the y-axis lies along the vertical and the z-axis points out of the screen. Therefore, when the F1 key is pressed and held while the mouse is moved to the right, the system will always move in the x-direction of the screen. This relation is always true and is independent of the current orientation or view of the system. Likewise, the rotation is also in screen space. Moving the mouse to the right will always rotate the system view about the y-axis of the screen. An up and down motion rotates about the screen's x-axis. As shown in FIG. 5.5, rotation about the z-axis can be performed by positioning the mouse near the edge of the screen before pressing the F3 key.

The rotations are applied about a user defined point referred to as the center of rotation point. This point can be translated in the same manner as the viewing position, by using the F6 and F7 function keys. This allows the user to pick a center of rotation reference point on an body or anywhere in space. Also, when zooming using the F2 key, the zoomed direction is toward this point.

The view may also be controlled using the screen control menu displayed in the lower right corner of the screen (FIG. 5.6). This menu allows the screen to be reset to the initial view and allows a user defined rotation step about any of the three axes.

5.2.2.4 Mouse Controlled System Parameter Values

In addition to the sliders and the keyboard, the VIMS interactive interface also allows control of the position and orientation of the system parameters by using the mouse. The various edit menus contain different buttons that define which parameters the mouse controls. The functionality of the mouse is identical for control of all of the parameters. The positioning and orientation controls are performed in the same manner as the viewing controls and the transformations are performed in screen space. Since the objects are moved in screen space, the mouse controls are intuitive and are independent of the current orientation of the system or view.

Once the user has defined the parameter to interactively control in the edit menu, the parameter can be controlled by moving the mouse and holding down the translation or rotation buttons. The buttons for transforming the system parameters are different than those used for viewing transformations. This allows both the viewing and parameter transformations to be used at the same time. The keyboard buttons for parameter control are shown in FIG. 5.7.

5.3 Display Attributes Menus

The following menus define the display attributes of the multi-body system. The values that these menus control have no effect on the multi-body parameters and thus no effect on the solution of the system. These parameters control only the visualization process. Unlike the system parameter pop-down menus, any number of viewing and display attribute menus can be popped down at any one time. Popping down a system parameter menu has no effect on which display attribute menus are displayed.

All display parameters are initially entered using a VIMS or ERNIE input file. If no input file is specified, a set of default display parameters is used. If the visual parameters are altered using the following menus, the altered visual data is saved in the VIMS output file.

5.3.1 Display Menu

The viewing menu controls the primary aspects of the screen display. The buttons can be toggled to specify whether to display any combination of the joint axes, body geometry, and cables. They can also be toggled to specify that all joints, bodies, and tendons that are not currently active are not displayed. This is useful when a complex system with many bodies is modeled. Another option is to draw a simple bounding box representation of the geometry in place of the full geometry. Other options include, scaling all joint and axes geometry, changing the background color, and keeping a fixed viewing up-vector.

5.3.2 Display Attribute Menu

The display attribute menu provides control of whether the camera, light, material, and part menus are displayed. Any combination of the four menus may be displayed at once.

5.3.3 View Menu

The camera menu contains a list of stored views. Selecting one of the views loads the saved viewing direction and position and center of rotation position into the current view being displayed. Also, if the current view has been altered with the mouse and function keys or through the screen control menu, the altered view can be stored for later use 5.3.4 Light Menu The light menu allows the lights that were entered in the input file to be turned on or off. Currently the user cannot alter any other parameters of the lights interactively. However, the data in the input file can be edited to change the position, direction and intensity of the lights.

5.3.5 Material Menu

The material menu provides a list of possible material definitions that may be used to define the material properties of the surfaces. These material definitions can then be applied to particular geometries in the part description menu.

The appearance of the 3-D geometry is a function of the light positions the orientation of the geometry and the description of the material properties of the geometry. Each material is described by an ambient, diffuse, and specular color and a shininess value. The ambient color defines the surface color of the geometry regardless of its orientation to the lights and independent of the viewing direction. The diffuse color describes the dependance of the surface color on the orientation of the surface with respect to the light sources. The specular color defines the dependance of the material color on the orientation of the surface with respect to both the light sources and the viewing direction. The final scalar value defines the shininess of the surface by describing whether the specular reflections or highlights are diffused across a large or small surface area. Small shininess values diffuse the highlights over a larger area.

All materials are initially entered through the VIMS input file. The material parameters can be altered by selecting the appropriate parameter circle. A three bar slider will be displayed to control the red, green, and blue intensity values of the parameter.

5.3.6 Part Description Menu

Each geometry object may be described by any number of geometry parts. This allows a single body of the multi-body system to be described by a combination of different geometry parts. For example, a multi-body system of an automobile might be modeled with the chassis considered as a single body. The geometry of the car could be represented by separate geometries for the windows, exterior body panels and the interior. Each of these geometries is referred to as an object's part.

The material and display of each part is controlled through the part menu. Any of the materials defined in the material menu may be assigned to any part. Five display modes may also be set for each part. The part may be turned off, drawn as a wireframe bounding box, the full geometry drawn as a wireframe, the full geometry drawn with flat shading or the full geometry drawn with smooth shading. If the same mode is desired for all parts, the first row of buttons above the part list assigns all parts to the selected drawing mode.

5.4 System Description Menus

The following menus control all multi-body parameters. The pop-down menus for the body, joint, cable, and external force elements all consist of a menu listing the currently defined elements. New elements can be added by selecting the add button at the bottom of the menus. A default element is then created and added to the list. Any of the element's default parameters can be edited by selecting the respective button in the list. An edit menu will be displayed to allow control of the parameters.

Generally, the above mentioned menus are first used to set up the multi-body system. Then the driver menu is used to set any desired degrees of freedom. Then the solution menu is used to set the solution method and other parameters and to start the solution process. Once the solution is running, any of the previously set parameters can be interactively altered using the edit menus. Also, at any time, any of the viewing parameters can be changed.

5.4.1 Body Menus

Generally, all other elements such as joints, cables, and forces are defined locally in the assigned bodies. Therefore, the bodies of a multi-body system are usually defined before any other elements.

The body menu is a list of the currently defined bodies. A new body can be added to the list by selecting the add button in the body menu. The body parameters can then be edited by selecting the button to the left of the listed body.

The body edit menu in FIG. 5.8 defines the position, orientation, mass and inertia of the selected body. Note that the position on orientation controls are for initial conditions only since the values will change once a solution is started. Geometry to represent the body can also be applied by providing the geometry object's number.

The position and orientation may be altered by selecting the appropriate buttons and entering new values with the keyboard. The mouse controls may also be used to transform the body in the screen coordinates.

The three buttons below the inertia values control effect of the mouse on the CG of the body, the geometry attached to the body, and the joints attached to the body. The left most button keeps the geometry in the same global position while only the CG of the body is moved with the mouse. Since the geometry is defined in the local coordinate system of the body, the geometry will move with the transformed body position unless this button is selected. The middle button instead specifies that only the geometry is transformed by the mouse while the location of the bodies' center of gravity is kept constant. The last button defines that the global position of the joints connected to the body should be kept constant while the CG of the body is moved with the mouse.

Like the body menu, the joint menu contains a list of the defined joints. The right most buttons allow the individual joints to be turned on or off. New joints are added by selecting the add button and defining the reference number of the new joint. Whenever a joint is created, a degree of freedom entry is automatically set up in the joint section of the driver menu. The number of degrees of freedom for the driver is determined by the type of joint selected. By default, the driver created for the joint is inactive.

The joints can be edited by selecting the button to the left of the desired joint number. The joint edit menu in FIG. 5.9 contains inputs to control the two bodies constrained by the joint. The pop-down menu in FIG. 5.10 is used to select any of the seven joint types.

The local positions of the joint axes in each body are specified. The local orientation matrices that define the joint axes orientations in each body are also specified. Again, these values may be controlled by keyboard input or by using the mouse to transform the axes. The effect of the mouse transformations depends on the buttons specified below the joint axes values. The transformation may apply to either one of the bodies local joint axes or it may apply to both of them. Note that if only one of the joint axes is moved, the joint's kinematic constraint will likely not be satisfied. Therefore, if this operation is performed while a solution method is active, unpredictable results will occur. In any case, both joint axes may be moved together without any problems.

Each joint is represented by two pieces of geometry. One piece is displayed using body i's joint axes and the other with bodies j's joint axes. For example, the revolute is displayed as two interconnecting geometries as show in FIG. 5.11. The slider at the bottom of the joint edit menu controls the scale of these two geometry pieces. This scale is multiplied by the global axes scale value that is defined in the view menu.

5.4.3 Cable Menus

The cable menu lists the currently defined cable/pulley systems.

When a cable is added to the list, a default cable is constructed. Since each cable must consist of at least two points, the default cable is initially defined to have two points with both defined in the first body. The cable edit menu in FIG. 5.12 is used to create, edit or delete points. The points are defined in the local coordinate system of the body they are attached to.

The menu provides both keyboard and interactive mouse control of the points. The buttons following the local and global coordinates of the point indicate whether the user wants to keep the local or global position of a point constant when the body number is changed. Since of each of these points is defined in the body fixed coordinate system that it is attached, changing the attachment body number and keeping the same local coordinates will result in a different global position of the point. In this case, the button following the global coordinates is selected if the user wants to keep the global position constant when switching bodies.

Each time a new cable is created, a driver constraint is automatically added to the driver menu and by default is turned off. This added driver defines the length constraint on the cable and also defines whether the cable is tension only or if it can carry both compression and tension.

The cables are graphically represented by three-dimensional line segments drawn between the defined cable points. Also, points on the currently selected cable are labeled. Any of these points can be interactively picked and moved on the screen by using the mouse.

5.4.4 Driver Constraint Menus

There are three types of drivers in VIMS. The three groups are separated into joint, cable and special drivers. Whenever a joint is defined, a driver is automatically assigned in the driver menu. This driver controls the degrees of freedom left unconstrained by the joint. Also, when a cable is defined, a cable driver is also automatically added to allow a length constraint to be applied to the cable. The third group of drivers are special constraints that may be added with the driver menu. Special drivers include constraining a point on a body to a set global point in space or constraining the orientation of a body to be set to some global orientation. The top three buttons of the driver menu determine which group of drivers is displayed in the menu.

The driver menu displays the current value of the constraints of the selected group of drivers. Along side each driver are several buttons that control the activity of the driver. The left most button pops up an edit menu for the driver. The buttons under the heading "on" toggle the driver on or off. The buttons under the heading "soft" control whether the driver is applied as a constraint (hard) or as external forces (soft). If a kinematic solution method is active, soft constraints will be ignored. The button to the right of the driver value toggles the display of a slider.

When new drivers are created, they are initially turned off and are inactive. When the driver is inactive, the driver values are updated to correspond to the current state of the driver positions. For example, a driver for a revolute joint has one degree of freedom. If it is turned off, the rotation of the revolute joint is free to move. During some solution process, the revolute may move to satisfy other constraints in kinematics or it might move when external forces are applied for the dynamic solution. Whenever the revolute angle changes, the value of the degree of freedom related to the driver will be updated.

The driver edit menu shown in FIG. 5.13 allows the user to put limits on the range of the driver. For example, the angle of a revolute may be constrained to rotate in some limited range. If the limit were exceeded in the dynamic solution mode, a moment would be externally applied to force the angle back into the valid range. The magnitude of the force is a function of the value of the LIM button and the value of the violation of the limit constraint.

If the driver is a soft constraint, the two buttons at the bottom of the edit menu control the spring and damping values that determine the magnitude of the exerted force. With these values, the drivers can be made to act as spring/damper elements instead of constraints.

For cable drivers, the driver edit menu contains a set of added buttons to toggle between cables that can exert only tension or both tension and compression.

5.4.5 External Force Menus

External user defined forces and moments can be added with the external force menu. The menu lists the currently defined external forces.

External forces can be edited by selecting the button to the left of the force. The external force edit menu shown in FIG. 5.14 defines the orientation of the force or moment in either global space or in the local space of a body. The point that the force acts is always defined in the local space of the affected body. The magnitude is also defined in this menu. Additional buttons define whether the force/moment is active and if it is globally oriented or if it depends on the orientation of the affected body.

Buttons are also provided to let the user fix the global position or orientation of the force when the assigned body is switched. This is useful since the position and possibly the orientation of the force are defined in the local body fixed coordinate system of the assigned body. Therefore, if the body number if changed, the global force position and orientation would change if these buttons were not selected.

The forces and moments are represented graphically by three-dimensional arrows. The moment is depicted with a curved arrow and the force is shown using a straight arrow. The orientation and size of the arrows correspond to the orientation and magnitude of the applied forces or moments.

Like the other edit menus, the orientation and position of the force can be edited interactively by the mouse.

5.4.6 Force Menu

The force menu is important for both the static force and dynamic solution methods. While the results of the dynamic solution is not dependent on the settings in this menu, the display of the results can be performed through this menu. Conversely, the results of the static force solution depend of the settings in this menu. In fact, the static analysis can not be performed without setting the parameters in this menu first.

For the dynamic solution, the constraint forces are always computed since they are required to solve the dynamic equations. Therefore, this menu is used only to display the resulting forces and moments. The menu also controls how the individual forces are displayed.

For the static force solution, the computed constraint forces are computed depending only on whether they are turned on in the force menu. The driver constraint settings are ignored for the static force solution. The reason for this is to allow the kinematic and static force computation to be independent. The kinematic solution is first solved using the driver menu settings and then the static force solution is computed using the force menu settings for which constraints are active. This allows the multi-body system to be positioned using the drivers and interactively visualize the changes in the computed static forces with different driver positions.

The force menu consists of five selectable groups of constraints. The separate groups consist of constraints for joint drivers, cable driver, special driver, the joint constraints, and external force constraints. All the driver constraints located in the driver menu are represented in their respective groups in this menu. The external force constraint group allows external forces to be applied to the system. If the external force constraint is defined as unknown, the solution will determine a magnitude for the force that satisfies the static force equations. However, the direction of the force is always a known and is not varied.

Each constraint has several buttons associated with it, depending on what group of constraints is displayed. The "on/off" button and "set" button are the only buttons that do not relate to the dynamic solution method. The other buttons control how the force in the constraint is displayed. The "on/off" button defines that the constraint is active. The number of active constraints must be equal or greater than the number system degrees of freedom (six times the number of bodies). Otherwise, some degrees of freedom would not be constrained and the static solution would not exist. However, the number of active constraints can be more than the degrees of freedom since the static force analysis solution solves redundant or under constrained systems. The last line of the force menu indicates by how much the system is over or under constrained.

The "copy" and "copy all" buttons copy the state of the driver constraints for the current driver group or for all driver groups. This makes it easier to initially define the active constraints. Also note that all the joint constraints are always active and cannot be turned off. The only way to turn them off is to turn the joint off in the joint menu.

The "set" button indicates that the constraint force is known. The constraint force is converted to external forces and moments in the static force equations. The constraint force is entered by selecting the right most button and entering a value with the keyboard. This is useful when representing complex external forces. For example, suppose that a single cable connects several bodies. If it is desired to constrain the cable tension to a specified tension, an external force and moment has to be calculated and entered for every body that it connects. The set button can be used instead to let the computer calculate the required forces and moments on each body.

The right most button of each constraint displays two types of information. By default, the button displays the value of the constraint force or moment. The button may also display the weighting of the constraint by selecting the button at the top of the column. The weighting values define the relative influence of each constraint force on the optimized cost function. Initially these weights are all set to 1.0 to indicate that all constraints are weighted equally.

The weights are only used if the system has been defined as redundant within the force menu. If the system is not redundant, a unique solution exists and the optimization is not needed. Since an infinite number of solutions exist for a redundant system, an optimization is preformed to obtain the best solution as specified by the cost function. The weights defined in this force menu are used by the optimization to minimize a weighted function of the constraint forces and moments.

The other buttons associated with each constraint determine how the constraint force is visualized. The button, labeled "tble", indicates that the constraint value will be included in the table menu's Lagrange multiplier display. The table window menu displays a bar chart and values of the constraint forces. Only the constraints tagged in the force menu are displayed. This makes it possible to display a select group of values without having to display all the values.

The button labeled "sum" indicates that the constraint force is added to the table menu's body display. Some Lagrange or constraint forces are difficult to interpret since they indicate only a constraint value and not a direction. In fact, the value may be a combination of both force and moment. In order to make the values more intuitive, all constraints tagged with the "sum" button are converted to forces and magnitudes in the principle axes directions. They are then displayed as the composite sum of forces and moments acting on the respective bodies. For example, a screw driver constraint has only one constraint value, but it is difficult to determine what force effect it has the bodies that it connects. The "sum" option can be used to determine the composite forces and moments on each body.

The "arrow" button indicates that a 3-D force and moment arrow should be displayed to represent the direction and magnitude and position of the constraint force. This is useful to visualize the 3-D forces acting on the system. When solving the dynamics the user can observe the movement of the direction, position and magnitude of all the constraints. The scale of all these arrows can be set with the sliders at the bottom of the force menu.

The forces due to gravity may also be shown as 3-D arrows or included in the table menu's "body" section.

Three other buttons control the display of all constraint values. The first button allow all the 3-D arrows to be turned on or off. The second controls whether the size of the arrows is varied with the magnitude of the constraint forces. The last button defines whether the color of the cables should be varied with respect to their constraint force.

5.4.7 Table Menu

The table menu displays a user specified list of constraint forces represented as a bar chart. The only forces displayed are those that are tagged in the force menu as "tble" and/or "sum". The main purpose of this window is to let the user look at select forces without having to display all of the forces.

The table menu contains two types of lists. The multiplier list simply displays the value of the respective Lagrange multipliers. The body list displays the effect of the tagged forces on their respective bodies. All the forces that were tagged as "sum" in the force menu are converted to composite forces on the affected bodies. Therefore, the force and moment components about the x, y, and z axes of the bodies may be displayed.

The table menu is allowed to remain open even when other menus are popped open. This is to allow the user to see the changes of the forces when other multi-body parameters are changed. A button is provided at the bottom of the window to allow the table menu to be repositioned at any location on the screen.

5.4.8 Solution Menu

The solution menu controls the solution process. The first button controls the type of solution. When the button is picked a pop-up menu is displayed to choose the type of solution as shown in FIG. 5.15. The solution can be turned on in the status menu. Two other buttons control the error tolerance of the kinematic and dynamic solutions. The rest of the buttons are associated with the dynamics solution only. The buttons can control the integration parameters such as the integration time step, the integration time range, and the output time step. The menu also provides control of the $\alpha\beta$ constraint stabilization values and the gravity vector. Artificial damping can also be applied to the system with this menu.

The user can also define a file to save the integration results at each time step. The file stores the position and Euler parameters for each body at each time step. Therefore, playback of a previously computed dynamics integration is also possible. When the animation is paused or stopped, the playback button can be selected. Since the playback uses stored data and does not have to perform the integration, the display rate is much faster. In playback mode, only the time control menu shown in FIG. 5.16 is displayed. The time control menu has controls similar to a video tape player and allows the user to play or search through the stored position data. During the playback, the view can still be rotated and positioned to allow the user to see the data from different view points.

5.4.9 Keyframe Menu

The keyframe menu contains a list of previously saved body positions and driver values of a multi-body system. When the configuration of a multi-body is changed, the configuration can be stored for later use in a keyframe. This is especially useful when a large system is modeled where it takes a lot of effort to reset the drivers to get back to some desired position. It is also useful to have a saved keyframe when a solution method blows up since both the positions and orientations of the bodies and the driver values are saved. This prevents the user from having to re-input the initial guesses for the positions and orientations of the bodies.

Selecting any of the keyframe buttons loads the stored settings over the current body positions and driver values. When a keyframe save button is selected, the user is prompted to pick a number to save the keyframe as. If the entered number already exists, the new keyframe will write over the old keyframe stored under that button. Otherwise a new keyframe button containing the current data is added to the list.

5.4.10 Fileio Menu

The fileio menu allows the user to write an output session file or exit VIMS. When the "write" button is pressed, an output session file containing all graphical and multi-body parameters is written. This file can later be used as a VIMS input file to load in a saved multi-body configuration and graphics state.

The VIMS output session file and saved dynamics integration data file (as specified in the solution menu) are compatible with the animation program, ERNIE. For compatibility with ERNIE, each body of the multi-body system must be associated with a unique geometry object. Although VIMS allows the same geometry object to be applied to many multi-body bodies, the output session file needs to have a unique object for each body. Therefore, if the same geometry object is used by more than one body, VIMS asks the user if copies of the geometry object should be created to provide unique objects for each body. If the user agrees to this, the output session may be used directly with ERNIE. Otherwise, the output VIMS file will not be compatible with ERNIE. However, either form of the session file is compatible with VIMS.

6 EXAMPLES

The interactive modeling software written for this thesis, VIMS, is capable of modeling a wide range of rigid multibody systems. The systems may consist of any combination of the seven joint types included in VIMS and may be open or closed-loop. While most mechanical systems can be modeled with the joints provided in VIMS, some systems may require different types of joints. Although VIMS currently has only seven types of joints, the theory and structure that VIMS uses (chapter 4) allows any type of kinematic joint to be implemented in a straight forward manner.

For visualization, any general shape may be displayed for each body by providing BYU type geometric files. The purpose of these geometries is to provide a visual interpretation of the multi-body system in 3-D space. The geometries can also be used as a reference for the placement of bodies, joints, and cables. For example, the geometry of a scanned and digitized human finger may be used to interactively place the joints at their correct location between the bones.

Many drawings of the screen are displayed in the following sections. All of them, except for two color prints, are simplified drawings of the screen. The actual appearance of the computer screen is similar to the two color prints included at the end sections 6.1 and 6.2. The black and white images do not include the various colors that distinguish the various buttons and indicate which options are selected. Also, color is used in VIMS to distinguish between various types of force arrows and to indicate the tension in the cables. While the actual 3-D geometry is displayed as shaded geometry on the computer screen, the black and white drawings in this thesis are line drawings with the hidden lines removed in order to provide sharper images for photocopying.

The two following sections demonstrate the capabilities of VIMS and the possible applications of a visual interactive multi-body analysis package. The first section includes examples of generic multi-body systems. The second section describes the specific application of kinematic and force analysis of a human index finger.

6.1 Generic 3-D Open and Closed loop Mechanical Systems

The following examples are created entirely within VIMS and without any external input files. Since no files are read in, default geometry and display descriptions are automatically used to describe the geometry shapes, material colors, and viewpoints. The user can choose from these simple geometry shapes and colors to represent each body visually.

A simple open loop system is modeled to show the main features of VIMS. A more complex closed-loop system is then developed to show the generality of VIMS. Finally, several other examples of multi-body systems that VIMS is capable of modeling are shown.

6.1.1An Open Loop, Four Body Mechanism

A Four degree of freedom pendulum with a universal and two revolute joints is modeled below. A three arm pendulum will result since one of the bodies will be assigned as a base body and will be grounded. After the system is modeled, each solution method is applied to the multi-body system and the results are shown in numerous images.

6.1.1.1 Constructing the Model

The program is started by typing the program name "VIMS". Since no input files are included, VIMS' default geometry is used to represent the bodies.

First, the four bodies are defined. The bodies are added with the body menu and edited with the edit body menu.

Each time a body is added, a default geometry object is displayed on the screen as a representation of the body. Any one of the other default geometries may be assigned to the body with the edit menu. A new bodies' center of gravity (CG) is initially always located at the global origin. The body may be positioned with either the mouse or by entering the coordinates of the CG. Note that this process just sets the initial positions of the body. When the kinematic solution is applied, the bodies initial positions and orientations are used as initial guesses. The solution will then iterate the new body positions. Therefore, these positions do not have to be defined at their exact final positions. FIG. 6.1 shows the VIMS interface with four bodies defined and positioned to arbitrary locations.

Now that the bodies have been defined, joints may be applied between them. Four joints are added since the ground constraint is actually considered a joint in VIMS. Once a joint is added, the type of joint and the two bodies that it connects can be set with the joint edit menu. The location and axes orientation of the joint is set in both bodies by entering the coordinate values or using the mouse to move them on the screen. The joints are defined as in Table 6.1.

The multi-body system has now been defined. Since the kinematics solution has not been applied yet and the joint constraints are not satisfied, the joints do not connect correctly yet as shown in FIG. 6.2.

TABLE 6.1

Joints of an open loop system

| Joint | Joint Type | Body i | Body j |
|---|---|---|---|
| 1 | Ground | 1 | — |
| 2 | Revolute | 1 | 2 |
| 3 | Universal | 2 | 3 |
| 4 | Revolute | 3 | 4 |

6.1.1.2 Kinematics

The kinematic solution will compute the new body positions to satisfy the joint constraints and will results in the joints connecting properly. The solution menu is used to select one of the kinematic Newton's methods and to set the constraint error tolerance.

The solution is turned on with the status menu in the lower left corner of the screen. Instantly, the bodies change their position to satisfy the constraints and the joints are linked together correctly as in FIG. 6.3.

When the joints were defined, drivers were automatically entered into the driver menu to allow constraints on the degrees of freedom that were not constrained by the joints. Initially these drivers are turned off. Therefore, the previous kinematic solution solved a kinematic system that had four degrees of freedom undefined since the drivers were turned off. Since there is an infinite number of solutions for a under-defined system such as this, the computer picks four arbitrary coordinates to constrain. The four coordinates selected are based on a decomposition of the Jacobian matrix to yield the four coordinates with the minimal gradients. This results in four degrees of freedom which have the least probability of changing and yield a stable solution. This will be useful later in this example when We only want to move the end point of the pendulum system and are not concerned about the degrees of freedom between bodies. Since this is a four degree of freedom system and the end point constraints three of these, a single degree of freedom is left over. This method allows the computer to arbitrarily constrain the left over DOF.

The driver menu can be used to turn on the four drivers for the system's four degrees of freedom. When the active driver values are altered, the positions of the bodies change to reflect the change in the driver values. The sliders can be used to rotate or translate the joint's degrees of freedom. FIG. 6.4 shows an new configuration resulting from a change in the driver values.

6.1.1.3 Constraining the End of the Pendulum

Since this is an open-loop system, any user defined driver angles will result in a valid solution. However, if a special constraint is applied to constrain the 3-D position the end of the pendulum, the system becomes a closed-loop system. Three of the four degrees of freedom are constrained by the end point constraint while the other degree of freedom may be constrained by any of the four joint angles drivers.

If we are not concerned about forcing one of the joint angles to remain set to some specified driver angle, all the joint angle drivers may be turned off. The resulting system will be under-defined by one degree of freedom, but since VIMS compensates for this, all the joint angles can be let to freely rotate while the end point is moved on the screen as in FIG. 6.5. The end point constraint is indicated by a circle and dot combination.

The circle represents the driver constraint position and the dot represents the point on the body that is being constrained. Notice that the circle and dot do not overlap in FIG. 6.5*c* since the driver position defined a invalid configuration, and therefore, no kinematic solutions exists.

Now that this is a closed-loop system, the constraints can be defined such that there is no valid solution. For example; if the end point constraint were defined to extend further than the fully extended pendulum could reach, a solution that satisfies all the constraints would not exist as is FIG. 6.5*c*. In this case, the solution would keep iterating until a maximum number of iterations was reached and no solution would be returned. Optimized kinematics are used to over come this problem.

6.1.1.4 Optimized Kinematics

For the case above, the driver constraints may result in a system where all the constraints can not be satisfied. The optimized kinematic solution method can be used to find the closest possible solution. Instead of satisfying all the constraints, only the joint constraints are satisfied while the driver constraint errors are minimized to provide an approximate solution.

When the end point driver is moved too far away from the system, the optimized kinematics finds a solution that minimizes the distance between the driver point and the point at the end of the pendulum as in FIG. 6.6.

6.1.1.5 Applying Limits

When the optimized kinematics solution is used, limits can be applied to the driver degree of freedom values. When driver with limits is turned off, the specified driver limits will constraint the associated degrees of freedom to remain between the specified limits.

6.1.1.6 Adding Cable/pulley Systems

Cable/pulley systems may also be added to the system with the cable menu. For this example a single tendon is connected to points on the grounded body 1, and to points in body 2, body 3, and body 4.

A driver entry is automatically created in the driver menu. When the cable driver is turned on, the cable may be pushed and/or pulled depending on whether it is defined as compression or tension type cable as set in the cable edit menu. FIG. 6.7 demonstrates the effect of shortening the length of the cable while the end point on body four is constrained globally.

6.1.1.7 Dynamics

The kinematic solution is initially used to position the multi-body system to some desired initial conditions. The dynamics solution is then turned on. If the drivers are turned off, the system falls from the initial position under the influence of the gravity vector as set in the solution menu. As the solution process computes each new time step, the 3-D graphics are updated to show the new positions and orientations. Also at each time step, VIMS checks whether any system parameters have been changed and incorporates the changes into the dynamic integration. To control the system, the drivers and joints may be turned on or off and the driver values may varied at any time.

Cables and other drivers are initially defined as constraint elements, but they may be converted to spring-damper force elements by selecting "soft" button next to the driver. Also, external force and moments may be added and manipulated during the integration by using the extern and extern edit menus.

Note that these changes can be applied while the system is still integrating. FIG. 6.8 shows a sequence of images from a dynamics integration run. All drivers were turned off and the system fell under the influence of gravity. FIG. 6.8*a* through FIG. 6.8*c* show a single swing of the integration. While the system was integrating, a user defined force was applied to body four at a constant global direction as shown in FIG. 6.8*d*. FIG. 6.8*f* demonstrates that the external force may be repositioned and changed in magnitude at any time.

At any time, the solution can be paused or stopped and the saved motion data can be played back using the playback menu. While in the playback mode, the user can view the moving system from any direction to allow the user to close in on a particular area or see bodies that are obstructed in other views.

6.1.1.8 Force Analysis

Force analysis can be performed for either static or dynamic systems. Output can take the form of numeric values, bar charts, or 3-D displays of the forces. When the 3-D force arrows are displayed for the joint constraint forces, there is an equal and opposite force acting on the two bodies that the joint connects. Since the color of the arrows are not displayed in the figures, it would be confusing to display the force arrows acting on both of the bodies. Therefore, only the force arrows that act on the second or j'th bodies are displayed. Both sets can be turned on by selecting the "JNT FRC 1" or "JNT FRC 2" button in the display menu.

For the previous dynamics solution, the force menu can be used to access the Lagrange multiplier values associated with the constraints. These multipliers are the joint and driver constraint forces that were computed during the dynamics solution. The force values are indicated in the right most column of the force menu as shown in FIG. 6.9.

These same joint and driver values may be viewed as a bar chart table using the table menu. For example, if the "tble" buttons are selected for drivers 1.1, 1.2, and 2.0, the table menu would appear as shown in FIG. 6.10.

The driver or joint force and moment values may also be displayed a composite force and moment acting on each body. If the "sum" button is selected for a joint or driver, such as driver 2.0, the sum section of the table menu would appear as in FIG. 6.11.

Since driver 2.0 affects only the first and second bodies, only these bodies are listed. Note that the single multiplier value can now be more easily interpreted as the x, y, and z components acting on bodies 1 and 2.

Perhaps the most intuitive method for displaying the 3-D forces is to display them as 3-D arrows that indicate their location, magnitude, and direction. If the "arrow" button were selected for both driver 2.0 and joint 1, the forces would be displayed as in FIG. 6.12. When these arrows are turned on, the user may visualize how the forces change in direction and magnitude as the dynamics are computed over time. FIG. 6.12 shows forces for two time steps from the previously computed dynamic solution. Since VIMS stores the body positions and constraint forces for each time step, the playback mode may be used to replay both the body movement and the constraint force history.

For static force analysis, the solution method is changed to the force analysis method and the active constraints are selected in the force menu. The system can be made to be redundant by turning on all joint angle and cable constraints in the force menu. For a redundant system, the force analysis computes an optimal solution based on minimization of a weighted function of the constraint forces. The static 3-D forces for a configuration with a user defined external force on body four is shown in FIG. 6.13. Note that gravity is in effect for these solutions and the force arrows due to gravity are also shown in FIG. 6.13. The driver moments are shown to resist the combination of the applied external force and the gravity forces. Also, the ground joint force is shown on body 1. Notice that all the arrows were not turned on in FIG. 6.13. To keep the image from getting too cluttered, only the driver forces were displayed while the joint forces were not.

FIG. 6.14 shows how the forces change as the kinematic position changes. The direction and magnitude of the external force is kept the same as in FIG. 6.13. Even though the external force passes through the center of the end joint, the driver moment is not zero since gravity is also acting on the bodies. In this and the following images, only the graphical force arrows are turned off, but gravity still acts on the system. FIG. 6.15 displays changes resulting from a change in the direction and magnitude of the user defined external force. Notice how the 3-D arrows make it easy to observe how the computed forces change when the external force is varied. The external force arrows and constraint forces are difficult to distinguish in these black and white images, but they are easily distinguished on the computer screen since different colors are used. A color print of a VIMS session that shows these differences is included in at the end of this chapter.

Any of the constraint forces may be set to a value specified by the user. For example, if the cable were desired to have a force of 10.0 N, the cable becomes an external force element exerting forces on the bodies it connects. The other constraint forces in the system would compensate for the added external forces to satisfy the static force equations. The cable force is set by selecting the "set" button for the cable constraint in the force menu. The tension in the cable is then determined by the value that the user enters in the constraint force button.

6.1.2 A Closed-loop Five-body System

In this section, the previous four body open loop system is extended to a five body closed-loop system. One extra body is added along with a translational and spherical joint.

FIG. 6.16 shows the closed loop kinematic system as configured in VIMS and Table 6.1 list the joints used for the closed loop system.

The extra body and joints are added to the system in the same manner as with the previous example. The extra body is added and positioned to an initial guess. Then the two joints are added and defined to connect their respective bodies. The joint locations and orientations are then configured in each body.

TABLE 6.2

Joints of the closed loop system

| Joint | Joint Type | Body i | Body j |
|---|---|---|---|
| 1 | Ground | 1 | — |
| 2 | Universal | 1 | 2 |
| 3 | Revolute | 2 | 3 |
| 4 | Revolute | 3 | 4 |
| 5 | Translational | 4 | 5 |
| 6 | Spherical | 5 | 1 |

Again, the kinematic joints do not need to be linked together correctly since the kinematic solution will compute the new body positions and orientations necessary to satisfy the constraints. There are now eight possible joint drivers but only two degrees of freedom. Therefore, the user can define only two of the possible eight drivers to be active.

Since this is a closed loop system, a solution for the two defined driver values may not exist. It is usually recommended that all the drivers be turned off when computing the kinematic solution for the first time. This will let the computer choose the constraints. It will be more likely to find a solution from the initial body positions when less constraint limitations are applied to the system.

6.1.3 Other Multi-body Systems

These examples demonstrate the wide range of systems that may be modeled with VIMS. The previous examples were relatively simple in order to explain the basics of VIMS. Several more complex configurations that have been modeled in VIMS are shown in FIG. 6.17.

6.2 Biomechanical Analysis of a Human Index Finger

This section presents analysis of an idealized biomechanical model of the human index finger. The finger model developed here provides a starting point for developing biomechanical systems with VIMS. This example is intended to demonstrate the advantages of an interactive environment to analyze biomechanical systems rather than to show numerical results.

This example takes a different approach for setting up the system than the previous examples. For this example, a geometric model of the bones of the human index finger are initially loaded into VIMS. Then the bodies, joints and tendons are modeled using this geometry as a reference for placing these elements.

As noted previously, VIMS does not require an initial input file to model a multi-body system. However, when a particular geometric representation is desired for the multi-body system, an input file must be provided. The input file is needed in this case to define the BYU file names of the finger geometry. The input file defining the geometry information may be constructed by hand or by using the computer animation package, ERNIE.

The force analysis section is probably the most interesting part of this example. External forces may be applied to the end of the finger while the tendon and joints forces are analyzed. The forces can be graphically moved, rotated or changed in magnitude while the changes in the tendon and joint forces are visualized. Also a global force can be applied to the finger while it is kinematically moved to visualize how the changes in forces are affected by the position of the finger.

6.2.1 Constructing the Multi-body System

The geometry of a human hand was obtained from a computed tomography (CT) scan of a human hand. The surface of each bone was reconstructed by fitting splines around the outer edges of the bones in the CT data. The spline curves were then grouped together to form splined surfaces. Finally, the surfaces were broken down into large sets of flat polygons.

For this example, the analysis program is started by typing the command name, VIMS, followed by the name of the ERNIE file. The ERNIE file defines the geometry files to read and the display attributes such as lights, camera views, and materials.

When started this way, VIMS appears with a blank graphics screen and several menus. The geometry of the finger does not appear until a body is added to the multi-body system. When a new body is added, the geometry object assigned to the body is displayed on the screen.

When bodies have been added for each bone listed in Table 6.3, the full geometry of the finger is displayed. For new bodies, the center of gravity (CG) of each body is initially located at the global origin. The next step is to use the body edit menu to graphically position the CG of each body to it's correct location within the bone's geometry.

Next, the joints listed in Table 6.4 are added and positioned between the bones. For this example, a universal joint is used for the Metacarpophalangeal joint while revolute joints are used for the Interphalangeal joints [30].

The tendons in Table 6.5 are also added by using cable/pulley systems. The cables are graphically positioned and connected to the bones using the mouse and reference points on the bone geometry. The lumbrical is not modeled in this example since its end

TABLE 6.3

Bones used for biomechanical model

| Body | Bone Name |
|---|---|
| 1 | Metacarpal |
| 2 | Proximal Phalange |
| 3 | Medial Phalange |
| 4 | Distal Phalange |

TABLE 6.4

Joints used for biomechanical example

| Joint | Joint Name | Type of Joint | Body i | Body j |
|---|---|---|---|---|
| 1 | — | Ground | 1 | — |
| 2 | Metacarpophalangeal | Universal | 2 | 3 |
| 3 | Proximal Interphalangeal | Revolute | 3 | 4 |
| 4 | Distal Interphalangeal | Revolute | 4 | 5 |

TABLE 6.5

Tendons modeled for biomechanical example

| Cable | Tendon Name |
|---|---|
| 1 | Extensor Apparatus |
| 2 | Flexor Sublimis |
| 3 | Flexor Profundus |
| 4 | Radial Interosseous |
| 5 | Ulnar Interosseous |

points are connected to two other tendons.

FIG. 6.19 displays the full appearance of the finger model in VIMS. FIG. 6.20 displays the finger model with the geometry turned off to show the joint configuration.

6.2.2 Kinematics

The finger model is kinematically controlled in the same way as the previous examples. This system has four degrees of freedom, and therefore, four joint angle drivers have been automatically created for the joints. Also, five cable drivers have been created. Therefore, there are five possible extra constraints that could make the system over constrained.

The finger model may be positioned using either the joint angle drivers or the cable drivers or a combination of both. Controlling the finger with the joint drivers is simple and always results in a solution. The cable drivers are more difficult to use since the configurations of the cables are always changing with different body orientations. Therefore, the cable may find itself in a configuration where the cable has no physical way to constrain the system. An example of this is when a cable passes through the center of rotation of a joint that it connects. At this point, the system is unstable and the derivative of the rotation change to a change in length is undefined.

When controlling the system with cables, it is usually better to use the optimized kinematic solution method. This method can handle over constrained systems which arise often since two cable driver constraints may end up controlling the same degree of freedom at some body configuration. This method is also advantageous since it allows limits to be applied to the joints so that the joints may not "bend backward". The frames in FIG. 6.21 demonstrate the effect of pulling on the flexor tendons (cables 2 and 3).

6.2.3 Force Analysis

The static force analysis of the finger model has many interesting visual results. With the force analysis model, the effective forces in the finger can be visualized while external forces or kinematic position of the finger are varied.

The static analysis is performed on the finger under the effect of a global external force of 1.0 N applied on the distal phalange in the positive z direction. Two cases will be examined. The first will look at the effective joint moments and the second will look at the tendon and joint constraint forces.

For the first case, the effective joint moments required to resist the external force are desired. In an actual finger, these resisting moments are applied by the cables, but in order to determine and display the effective moments at each joint, the joint angle drivers are turned on while the cable constraints are inactive. Therefore, only the driver moments and joint constraints keep the finger kinematically defined for this case. The effective magnitude and direction of the driver moments can be seen in FIG. 6.22 for two different external force directions.

For the second case, the tendon and joint forces are desired. All the joint drivers are turned off. The system is kinematically held in place by only the joints and the tendons. However, there are five tendons and only four degrees of freedom. Therefore, the force analysis computes an optimized force result depending on the weighting values of each constraint. For this example, all weights are set to 1.0.

The kinematic configuration can be controlled interactively while the computed static forces change with respect to the new configuration. The forces in the tendons may be displayed with many force arrows, but since a force is applied at each point of the cable, the 3-D arrow for the cables quickly become cluttered. The forces in the tendons are usually represented by varying the color of the tendons based on the cable's tension.

It is also interesting to visualize how a user defined tension in one of the tendons affects the other computed tendon and joint forces. For example, when the "set" button is activated for the ulnar interosseous (cable 5), the tendon becomes an external force element. The tension in the tendon is taken from the force entered in the force/moment button. Picking this button and entering a new value changes the tension in the tendon. The other tendon and joint forces are then recomputed to satisfy the static force equations with the applied external forces.

7 CONCLUSION

This thesis provides the framework for a visually interactive multi-body analysis system. General multi-body systems are a powerful tool for design and analysis, but their use has been limited to a narrow range of experts. As an attempt to broaden the usefulness of general multi-body systems, this thesis develops a total interactive graphical interface.

7.1 Accomplishments

The software developed for this thesis, called VIMS, provides a multi-body package with user interface that provides interactive control and display of 3-D multi-body systems. With the graphical interface, the construction of the multi-body system is more convenient and the interpretation of the results is more intuitive than previous multi-body systems.

A system has been developed that can model a wide variety of mechanical systems. Both open and closed-loop models are handled and the equation formulation method allows for any type of joint to be incorporated into the software. Also, a new element has been implemented to make biomechanical modeling possible, the cable/pulley systems. Interactive kinematic, dynamic, and force analysis can all be performed on the modeled systems.

A. CONSTRAINT, JACOBIAN, AND GAMMA TABLES

Table A.1 and Table A.2 list all the joint and driver constraint equations used in the developed multi-body software package, VIMS.

TABLE A.1

Joint constraint equations used in VIMS

| Constraint | Description | Constraint Equation |
|---|---|---|
| $\Phi^{(s,3)}$ | Common Point | $(r_j + A_j s'_j) - (r_i + A_i s'_i)$ |
| $\Phi^{(p1,1)}$ | Perpendicular Axis | $n'^T_i A^T_i A_j n'_j$ |
| $\Phi^{(p2,1)}$ | Perpendicular Axis/Distance | $n'^T_i A^{T((r}_i{}_j + A_j S'_j) - (r_i + A_i s'_i))$ |
| $\Phi^{(w,1)}$ | Screw Rotation | $\Phi^{(w,1)} = \theta_{screwset} - \theta_{actaul} = 0$ <br> $\theta_{screwset} = \frac{\lVert d \rVert}{pitchrate} = \frac{\lVert (r_j + A_j s'_j) - (r_i + A_i s'_i) \rVert}{pitchrate}$ <br> $\theta_{actaul}$ = actual rotation about axis |
| $\Phi^{(gnd,6)}$ | Ground | $\begin{cases} r - r_{set} \\ e - e_{set} \end{cases}$ |
| $\Phi^{(rev,5)}$ | Revolute | $\Phi^{(s,3)}$ <br> $\Phi^{(p1,1)(y,x)}$ <br> $\Phi^{(p1,1)(z,x)}$ |
| $\Phi^{(unv,4)}$ | Universal | $\Phi^{(s,3)}$ <br> $\Phi^{(p1,1)(x,y)}$ |
| $\Phi^{(sph,3)}$ | Spherical | $\Phi^{(s,3)}$ |
| $\Phi^{(tra,5)}$ | Translational | $\Phi^{(p1,1)(y,x)}$ <br> $\Phi^{(p1,1)(z,x)}$ <br> $\Phi^{(p1,1)(y,z)}$ <br> $\Phi^{(p2,1)(y)}$ <br> $\Phi^{(p2,1)(z)}$ |
| $\Phi^{(cyl,4)}$ | Cylindrical | $\Phi^{(p1,1)(y,x)}$ <br> $\Phi^{(p1,1)(z,x)}$ <br> $\Phi^{(p2,1)(y)}$ <br> $\Phi^{(p2,1)(z)}$ |
| $\Phi^{(scw,5)}$ | Screw | $\Phi^{(p1,1)(y,x)}$ <br> $\Phi^{(p1,1)(z,x)}$ <br> $\Phi^{(p2,1)(y)}$ <br> $\Phi^{(p2,1)(z)}$ <br> $\Phi^{(w,1)}$ |

TABLE A.2

Driver constraint equations used in VIMS

| Constraint | Description | Constraint Equation |
|---|---|---|
| $\Phi^{(drev,1)}$ | Revolute Driver | $\theta_{angle} - \theta_{driver\ value}$ |
| $\Phi^{(dunv,2)}$ | Universal Driver | $\theta_{angle1} - \theta_{driver\ value1}$ <br> $\theta_{angle2} - \theta_{driver\ value2}$ |
| $\Phi^{(dsph,3)}$ | Spherical Driver | $\theta_{angle1} - \theta_{driver\ value1}$ <br> $\theta_{angle2}$–θdriver value2 <br> $\theta_{angle3} - \theta_{driver\ value3}$ |
| $\Phi^{(dtra,1)}$ | Translational Driver | $distance_{actual} - distance_{driver}$ |
| $\Phi^{(dcyl,2)}$ | Cylindrical Driver | $\theta_{angle1} - \theta_{driver\ value1}$ <br> $distance_{actual} - distance_{driver}$ |
| $\Phi^{(scwd,1)}$ | Screw Driver | $Distance_{actual} - distance_{driver}$ |
| $\Phi^{(dcbl1,1)}$ | Cable Driver1 | $(length_{actual})^2 - (length_{driver})^2$ |
| $\Phi^{(dcbl2,1)}$ | Cable Driver2 | $length_{actual} - length_{driver}$ |
| $\Phi^{(dpos,3)}$ | Global Point Driver | $r_{body} - r_{driver}$ where r is a 3-D vector |
| $\Phi^{(dori,3)}$ | Global Orientation Driver | $e_{body} - e_{driver}$ where e the vector of the last three Euler Parameters, $e_1$, $e_2$, and $e_3$ |

Table A.3 and Table A.4 contain the Jacobian and gamma entries for all the constraints used in VIMS. The Jacobian entries consist of the partial derivatives of the constraints with respect to the bodies positional and rotational coordinates. The rotational Jacobian entries are formulated here in terms of the angular velocity. The entries may be converted to the Euler parameter form using the relation in Equation 4.14 and Equation 4.15. The gamma values are the second time derivative terms of the, constraint equations as formulated in Equation 4.45. The gamma values listed here are also formulated in terms of the angular velocities.

In Table A.3, the vectors, $s^p$ and $s^b$, are the global vectors from the center of gravity of the body to the location of the joint. The rest of the s vectors are the axes vectors that define the orientation of the joint in global space. The respective joint axes vectors will be substituted for the s vectors depending on which axes are to be constrained by the constraint. The vector, $e_i$ is the Euler parameter vector, $[e_1 e_2 e_3]^T$.

In Table A.4, the vectors, $s^p$ is the global vector from the center of gravity of the body to the location of the joint. The $s'^k_i$ and $s'^{k+1}_j$ are the locations of the cable point numbers k and k+1 in the local space of bodies i and j. The rest of the vectors are the axes vectors of the joints in global space, s, and in local space, s'. The respective joint axes vectors will be substituted for the s vectors depending on which axes are to be constrained by the constraint. Also, $l_t$ is the total length of the cable. The vector, $e_i$ is the Euler parameter vector, $[e_1 e_2 e_3]^T$. The vector, $\dot{r}_i$ is the velocity of the center of gravity of body z.

TABLE A.3

Joint Jacobian and gamma entries

| Constraint | $\Phi_{r_i}$ | $\Phi_{\omega_i}$ | $\Phi_{r_j}$ | $\Phi_{\omega_j}$ | Gamma, $\gamma$ |
|---|---|---|---|---|---|
| $\Phi^{(s,3)}$ | $I$ | $-\bar{s}^p{}_i A_i$ | $-I$ | $\bar{s}^p{}_j A_j$ | $-\omega_i \dot{s}^p{}_i + \omega_j \dot{s}^p{}_j$ |
| $\Phi^{(p1,1)}$ | $0^T$ | $-s_j{}^T \bar{s}_i A_i$ | $0^T$ | $-s_i{}^T \bar{s}_j A_j$ | $-2\dot{s}_i{}^T \dot{s}_j + \dot{s}_i{}^T \bar{\omega}_i s_j + \dot{s}_j{}^T \bar{\omega}_j s_i$ |
| $\Phi^{(p2,1)}$ | $-_i{}^T$ | $-(d + s^b{}_i)^T \bar{s}_i A_i$ | $s_i{}^T$ | $-s_i{}^T \bar{s}^b{}_j A_j$ | $-2\dot{d}^T \dot{s}_i - s^T \omega_i s_i + \dot{s}_i{}^T (\omega_i \dot{s}^b{}_i - \omega_j \dot{s}^b{}_j)$ |
| $\Phi^{(w,1)}$ | $-s_i{}^T$ | $-s'_i$ | $s_i{}^T$ | $s'_j$ | $0$ |
| $\Phi^{(gnd,6)}$ | $I$ | $0^T$ | — | — | $0^T$ |
| | $0^T$ | $\frac{1}{2}\bar{e}_i + Ie_o$ | — | — | $-\frac{1}{2}(\dot{\bar{e}}_i + Ie_o)\omega'_i$ |
| $\Phi^{(scw,5)}$ | $0^T$ | $-s_j{}^T \bar{s}_i A_i$ | $0^T$ | $-s_i{}^T \bar{s}_j A_j$ | $-2\dot{s}_i{}^T \dot{s}_j + \dot{s}_i{}^T \bar{\omega}_i s_j + \dot{s}_j{}^T \bar{\omega}_j s_i$ |
| | $0^T$ | $-s_j{}^T \bar{s}_i A_i$ | $0^T$ | $-s_i{}^T \bar{s}_j A_j$ | $-2\dot{s}_i{}^T \dot{s}_j + \dot{s}_i{}^T \omega_i s_j + \dot{s}_j{}^T \omega_j s_i$ |

The rest of the Joint entries are not listed since they are just combinations of the above entries

TABLE A.4

Driver Jacobian and gamma entries

| Constraint | $\Phi_{r_i}$ | $\Phi_{\omega_i}$ | $\Phi_{r_j}$ | $\Phi_{\omega_j}$ | Gamma, $\gamma$ |
|---|---|---|---|---|---|
| $\Phi^{(drev,1)}$ | $0^T$ | $-s'^T{}_i$ | $0^T$ | $s'^T{}_j$ | $0$ |
| $\Phi^{(dunv,2)}$ | $0^T$ | $-s'^T{}_i$ | $0^T$ | $(A_j{}^T A_i s'_i)^T$ | $(\bar{\omega}'_j A_j{}^T A_i s^i{}_i - A_j{}^T A_i \bar{\omega}'_i s'_i)\omega'_i$ |
| | $0^T$ | $(A_i{}^T A_j s'_j)^T$ | $0^T$ | $-s'^T{}_j$ | $(\omega'_i A_i{}^T A_j s'_j - A_i{}^T A_j \omega'_j s'_j)\omega'_j$ |
| $\Phi^{(dsph,3)}$ | $0^T$ | $\frac{1}{2} L_j L_i^T$ | $0^T$ | $\frac{1}{2} L_j L_i^T$ | $-\frac{1}{2}(\dot{L}_j L_i^T + L_j \dot{L}_i^T)\omega'_i + \frac{1}{2}(\dot{L}_i L_j^T + L_i \dot{L}_j^T)\omega'_j$ |
| $\Phi^{(dtra,1)}$ | $-s^T{}_i$ | $0^T$ | $s^T{}_i$ | $0^T$ | $A_i \bar{\omega}'_j s'_i(\dot{r}_i - \dot{r}_j)$ |
| $\Phi^{(dcyl,2)}$ | $-s^T{}_i$ | $0^T$ | $s^T{}_i$ | $0^T$ | $A_i \omega'_j s'_i(\dot{r}_i - \dot{r}_j)$ |
| | $0^T$ | $-s'_i{}^T$ | $0^T$ | $s'_j{}^T$ | $0$ |
| $\Phi^{(scwd,1)}$ | $-s^T{}_i$ | $0^T$ | $s^T{}_i$ | $0^T$ | $A_i \bar{\omega}'_j s'_i(\dot{r}_i - \dot{r}_j)$ |
| $\Phi^{(dcb11,I)}$ | $\Sigma -f_k$ where $f_k = 2l_t \hat{d}_k^T$ | $\Sigma f_k$ where $f_k = 2l_t \hat{d}^T \bar{s}^p{}_i A_i$ | $\Sigma f_k$ where $f_k = 2l_t d_k^T$ | $\Sigma -f_k$ where $f_k = 2l_t \hat{d}^T \bar{s}^p{}_j A_j$ | $\sum_{k=0}^{npts-1} [-2\dot{d}^T \dot{d} + 2l_t \hat{d}^T [(A_i \tilde{\omega}'_i A_i \tilde{\omega}'_i s'^k_i) - (A_j \tilde{\omega}'_j A_j \tilde{\omega}'_j s'^{k+1}_j)]]$ |
| $\Phi^{(dcb12,1)}$ | $\Sigma -f_k$ where $f_k = d_k^T$ | $\Sigma f_k$ where $f_k = d^T \bar{s}^p{}_i A_i$ | $\Sigma f_k$ where $f_k = d_k^T$ | $\Sigma -f_k$ where $f_k = d^T \bar{s}^p{}_j A_j$ | $\sum_{k=0}^{npts-1} [(-d^T d) + d^T[(A_i \omega'_i A_i \omega'_i s'^k_i) - (A_j \omega'_j A_j \omega'_j s'^{k+1}_j)]]$ |
| $\Phi^{(dpos,3)}$ | $I$ | $-A_i \bar{s}'_i{}^p$ | — | — | $-A_i \bar{\omega}'_i \bar{\omega}'_i s'_i{}^p$ |
| $\Phi^{(dori,3)}$ | $0$ | $\frac{1}{2}\bar{e} + Ie_o$ | — | — | $0^T$ |

```
**Geometry and Kinematic file for bio dynamics**
FILE NAME:3bar_2doi.eai
*******************************************
CAMERA 1
at 18.508310 -5.227594 -2.877271
from -9.153973 5.570661 1.389188
upvector 0.130258 -0.057394 0.989818
near 0.100000
far 1326.000000
fov 30.850000
twist 0.000000
mark 0.000000 0.000000 0.000000 1.000000
CAMERA 2
at 9.148077 -8.367733 -19.545341
from -3.036369 2.726258 5.523959
upvector 0.632913 -0.545772 0.549138
near 0.100000
far 1326.000000
fov 30.850000
twist 0.000000
mark 0.000000 0.000000 0.000000 1.000000
CAMERA 3
```

-continued

```
at 13.976233 -17.826878 8.482791
from -3.357815 4.282939 -2.038006
upvector 0.753478 0.646819 0.117882
near 0.100000
far 1326.000000
fov 30.850000
twist 0.000000
mark 0.000000 0.000000 0.000000 0.000000
CAMERA 4
at -20.371056 -12.277232 -4.402253
from 4.894184 2.949628 1.057650
upvector -0.507598 0.860145 -0.049951
near 0.100000
far 1326.000000
fov 30.850000
twist 0.000000
mark 0.000000 0.000000 0.000000 0.000000
LIGHT 1 OFF
Icolar 0.700 0.700 0.700
ambient 0.035 0.024 0.008
position 1.000 -1.000 -1.000 0.000
spotdirection 0.000 0.000 0.000
```

-continued

LIGHT 2 ON
Icolor 0.700 0.700 0.700
ambient 0.108 0.120 0.120
position −1.000 0.200 0.200 0.000
spotdirection 0.000 0.000 0.000
LIGHT 3 ON
Icolor 0.800 0.800 0.800
ambient 0.024 0.008 0.024
position 0.200 0.900 0.400 0.000
spotdirection 0.000 0.000 0.000
LIGHT 4 OFF
Icolor 0.500 0.500 0.500
ambient 0.090 0.090 0.090
position −15.083 26.444 −13.979 1.000
spotdirection 0.000 0.000 0.000
MATERIALS
1 0.42 0.42 0.42 1.00 39.00 0.51 0.52 0.52
1 ambient 0.15 0.17 0.18
2 0.89 0.06 0.05 1.00 37.00 0.40 0.27 0.21
2 ambient 0.12 0.15 0.15
3 0.88 0.05 0.07 1.00 98.12 0.37 0.37 0.40
3 ambient 0.00 0.00 0.00
4 0.02 0.03 0.03 1.00 14.95 0.11 0.13 0.12
4 ambient 0.00 0.00 0.00
5 0.13 0.13 0.14 1.00 45.21 0.87 0.90 0.89
5 ambient 0.00 0.00 0.00
6 0.58 0.58 0.58 1.00 53.80 0.93 0.91 0.92
6 ambient 0.00 0.00 0.00
GEOMETRY
1 1 geom/blocks.byu 1 1
2 1 geom/blocks.byu 2 2
3 1 geom/blocks.byu 3 3
4 1 geom/blocks.byu 4 4
5 1 geom/blocks.byu 5 6
6 1 geom/blocks.byu 6 8
PART ATTRIBUTES
1 1 smooth 1
2 1 smooth 1
3 1 smooth 1
4 1 smooth 1
5 1 smooth 5
6 1 smoth 6
OFFSETS
1 1 trans 0.593 −0.034 0.012 0.000 0.000 0.000
1 1 rot 3.463 −37.620 50.451 0.000 0.000 0.000
2 1 trans 0.041 0.024 0.030 0.000 0.000 0.000
2 1 rot 10.246 −26.903 1.001 0.000 0.000 0.000
3 1 trans 0.058 0.033 −0.008 0.000 0.000 0.000
3 1 rot 52.338 5.494 20.502 0.000 0.000 0.000
DYNAMICS 3bar.ani
**********System file for bio dynamics**********
FILE NAME:3bar.eai
**************************************
=0 System:
A Numbody 3
B Numjoint 3
C Numpoints 0
F NumKeys 0
J Gravity
0.000000000000e+00 0.000000000000e+00 −9.810000000000e+00
K Numtendons 2
L Axes__Scale 1.300000
M BG__Color 12 12 14
**************************************
**********BODIES**********
=1 Bodies:
A Body__number 0
B Type 2
C Mass 5.000000000000e+00
D Local Inertial Tensor
1.000000000000e+00 0.000000000000e+00 0.000000000000e+00
0.000000000000e+00 1.000000000000e+00 0.000000000000e+00
0.000000000000e+00 0.000000000000e+00 1.000000000000e+00
H Positional Euler Parameters
1.000000000000e+00 −1.407572114129e−16
−3.544677298035e−17 −3.538159505480e−17
I Position of CG
0.000000000000e+00 0.000000000000e+00 0.000000000000e+00
J Velocity of CG
1.608292864391e−14 −1.850154366856e−14 4.912670428097e−15
K Angular Velocity of CG
−5.375436288785e−14 6.184898112490e−17 −1.585210758269e−14
L Geometry 1

---

A Body__number 1
B Type 0
C Mass 5.000000000000e+00
D Local Inertial Tensor
1.000000000000e+00 0.000000000000e+00 0.000000000000e+00
0.000000000000e+00 1.000000000000e+00 0.000000000000e+00
0.00000000000Oe+00 0.000000000000e+00 1.000000000000e+00
H Positional Euler Parameters
−8.293284460306e−01 −1.413921762946e−01
−3.452962297437e−01 −4.159243859308e−01
I Position of CG
1.404394872543e+00 1.626534618366e+00 9.187397724473e−01
J Velocity of CG
2.482198828956e+00 1.022584043307e+00 4.152681239895e+00
K Angular Velocity of CG
1.482595826025e+00 −6.598083408740e+00 1.6992924274770e+00
L Geometry 2

---

A Body__number 2
B Type 0
C Mass 5.000000000000e+00
D Local Inertial Tensor
1.000000000000e+00 0.000000000000e+00 0.000000000000e+00
0.000000000000e+00 1.000000000000e+00 0.000000000000e+00
0.000000000000e+00 0.000000000000e+00 1.000000000000e+00
H Positional Euler Parameters
−3.782574633513e−01 −7.529425678437e−01
5.376874731205e−01 −2.984898988639e−02
I Position of CG
1.946960157015e+00 2.960139996982e+00 3.150078443525e−01
J Velocity of CG
1.466729647785e+00 −6.003906751713e−01 7.621006382153e+00
K Angular Velocity of CG
−3.169389830134e+00 4.663841689938e+00 −1.840854791342e+00
L Geometry 3

---

**************************************
**********JOINTS**********
=2 Joints:
A Joint__number 0
B Type 5
C Bodies 0 1
L Axis__Scale 0.326087
M Grounded Position
0.000000000000e+00 0.000000000000e+00 0.000000000000e+00
N Grounded Euler Parmeters
1.000000000000e+00 −1.417302805887e−16 −3.601376857670e−17
−3.601376857670e−17

---

A Joint__number 1
B Type 2
C Bodies 0 1
D Joint connection point in body i
8.302789330482e−01 9.327298998833e−01 9.709570407867e−01
E Joint connection point in body j
−8.087265572258e−01 −5.876295914538e−02 −3.952328588982e−01
F Joint connection axis point in body i
−8.279807043732e−01 1.778356688208e−01 5.318105189640e−01
G Joint connection axis point in body j
−1.899704225694e−01 9.812663695547e−01 −3.205542902212e−02
H Perpendicular vector in ito joint axis i
2.154995916100e−01 −7.746413800068e−01 5.945508038823e−01
I Perpendicular vetor in j to joint axis j
−4.757954629193e−01 −6.345472778144e−02 8.772640280939e−01
J Relative angle for each axis
0.000000000000e+00 0.000000000000e+00 0.000000000000e+00
K Relative angular velocity for each axis
0.000000000000e+00 0.000000000000e+00 0.000000000000e+00
L Axis__Scale 0.200000

---

A Joint__number 2
B Type 0
C Bodies 1 2
D Joint connection point in body i
8.102165063888e−01 4.235208049342e−02 4.552116026913e−01
E Joint connection point in body j -continued 8.076040787980e−01 3.329707441499e−01 −5.865634042954e−02
F Joint connection axis point in body i
−1.663096378631e−01 9.776870696579e−01 1.283319842344e−01
G Joint connection axis point in body j
−3.033222832697e−01 7.657626363264e−01 −5.671006764927e−01
H Perpendicular vector in ito joint axis i
−4.501731276560e−01 −1.910702359117e−01 8.722593192882e−01
I Perpendicular vetor in j to joint axis j
1.471120638373e−01 −5.503710413822e−01 −8.218575043652e−01
J Relative angle for each axis
0.000000000000e+00 0.000000000000e+00 0.000000000000e+00
K Relative angular velocity for each axis
0.000000000000e+00 0.000000000000e+00 0.000000000000e+00
L Axis__Scale 0.170000

*************************************
**********TENDONS**********
−6 Tendons,
A Tendon__number 0
B Number__points 2
C Set__Length 0.000000000000e+00
D List of points (body, localx, localy, localz)
0 0 3.152719438076e−01 3.411812186241e−01 3.529029488564e−01
1 1 0.000000000000e+00 0.000000000000e+00 0.000000000000e+00

A Tendon__number 1
B Number__points 3
C Set__Length 0.000000000000e+00
D List of points ( body, localx, localy. localz)
0 0 8.929161727428e−02 1.922058016062e−01 2.014590203762e−01
1 1 2.700790886433e−01 2.884321392974e−02 1.454958099855e−01
2 2 −3.687014740202e−01 −1.320378039598e−01 4.187303486035e−02

*************************************
**********INTEGRATION**********
=7 Integration:
A start__time 0.000000000000e+00
B end__time 5.000000000000e+01
C time__step 3.333333000000e−02
D integ__step 1.000000000000e−03
E Dynamic__Tolerance 5.000000000000e−03
F partition? 0
G Alpha__Beta 2.000000000000e+01 2.000000000000e+01
H Alpha__Beta__On 1
I Artif__Damping 1.000000000000e+00
J File__Name y.ani
K Kinematic__Tolerance 5.000000000000e−03
L Play__Name tmp.pla
*************************************
**********DRIVERS*********
=8 Drivers:
A driver__number 0 0
B Type 2
C Act__On 0
D Active 0 0 0
E Offset 0.000000000000e+00 0.000000000000e+00
0.00000000000oe+00
F Diver Limits
−3.600000000000e+02 3.600000000000e+02 0.000000000000e+00
−3.600000000000e+02 3.600000000000e+02 0.000000000000e+00
−3.600000000000e+02 3.600000000000e+02 0.000000000000e+00
G Soft 0
H Soft__Val 5.000000000000e+02 1.000000000000e+01
5.000000000000e+03
I Val 0000000000000e+00 0.000000000000e+00 0.000000000000e+00
J Slider__Span 720.000000 720.000000 720.000000
K Range__On 0 0 0 0 0 0
L Slider__On 0 0 0
M Force__Active 0 0 0 0 0 0
N Force__Display 0 0 0 0 0 0
O Force__Set 0 0 0 0 0 0
P Constraint Force/Moments
0.000000 0.000000 0.000000
0.000000 0.000000 0.000000
Q Show__Arrows 0 0 0 0 0 0
R Show__Result__Body 0 0 0 0 0 0
S Constraint Force/Moments
1.000000 0.000000 0.000000
0.000000 0.000000 0.000000

-continued

A driver__number 1 0
B Type 2
C Act__On 1
D Active 1 1 0
E Offset 0.000000000000e+00 0.000000000000e+00
0.000000000000e+00
F Diver Limits
−3.600000000000e+02 3.600000000000e+02 0.000000000000e+00
−3.600000000000e+02 3.600000000000e+02 0.000000000000e+00
−3.600000000000e+02 3.600000000000e+02 0.000000000000e+00
G Soft 0
H Soft__Val 5.000000000000e+02 1.000000000000e+01
5.000000000000e+03
I Val 3.000000000000e+01 −1.800000000000e+01 0.000000000000e+00
J Slider__Span 360.000000 −360.000000 720.000000
K Range__On 0 0 0 0 0 0
L Slider__On 1 1 0
M Force__Active 1 1 0 0 0 0
N Force__Display 0 0 0 0 0 0
O Force__Set 0 0 0 0 0 0
P Constraint Force/Moments
0.000000 0.000000 0.000000
0.000000 0.000000 0.000000
Q Show__Arrows 0 0 0 0 0 0
R Show__Result__Body 0 0 0 0 0 0
S Constraint Force/Moments
0.000000 0.000000 0.000000
0.000000 0.000000 0.000000

A driver__number 2 0
B Type 2
C Act__On 2
D Active 1 0 0
E Offset 0.000000000000e+00 0.000000000000e+00
0.000000000000e+00
F Diver Limits
−3.600000000000e+02 3.600000000000e+02 0.000000000000e+00
−3.600000000000e+02 3.600000000000e+02 0.000000000000e+00
−3.600000000000e+02 3.600000000000e+02 0.000000000000e+00
G Soft 0
H Soft__Val 5.000000000000e+02 1 .000000000000e+01
5.000000000000e+03
I Val 6.000000000000e+01 0.000000000000e+00 0.000000000000e+00
J Slider__Span 360.000000 720.000000 720.000000
K Range__On 0 0 0 0 0 0
L Slider__On 1 0 0
M Force__Active 1 0 0 0 0 0
N Force__Display 0 0 0 0 0 0
O Force__Set 0 0 0 0 0 0
P Constraint Force/Moments
0.000000 0.000000 0.000000
0.000000 0.000000 0.000000
Q Show__Arrows 0 0 0 0 0 0
R Show__Result__Body 0 0 0 0 0 0
S Constraint Force/Moments
0.000000 0.000000 0.000000
0.000000 0.000000 0.000000

A driver__number 0 1
B Type 5
C Act__On 0
D Active 0 0 0
E Offset 0.000000000000e+00 0.000000000000e+00
0.000000000000e+00
F Diver Limits
8.561354875565e−02 1.512896299362e+00 0.000000000000e+00
−3.600000000000e+02 3.600000000000e+02 0.000000000000e+00
−3.600000000000e+02 3.600000000000e+02 0.000000000000e+00
G Soft 0
H Soft__Val 5.000000000000e+02 1.000000000000e+01
5.000000000000e+03
I Val 1.777215076195e+00 0.000000000000e+00 0.000000000000e+00
J Slider__Span 1.000000 720.000000 720.000000
K Range__On 0 0 0 0 0 0
L Slider__On 1 0 0
M Force__Active 0 0 0 0 0 0
N Force__Display 0 0 0 0 0 0
O Force__Set 0 0 0 0 0 0
P Constraint Force/Moments
0.000000 0.000000 0.000000

-continued

```
0.000000 0.000000 0.000000
Q Show_Arrows 0 0 0 0 0 0
R Show_Result_Body 0 0 0 0 0 0
S Constraint Force/Moments
0.000000 0.000000 0.000000
0.000000 0.000000 0.000000
```

```
A driver_number 1 1
B Type 5
C Act_On 1
D Active 0 0 0
E Offset 0.000000000000e+00 0.000000000000e+00
0.000000000000e+00
F Diver Limits
2.464886665344e+00 3.787941455841e+00 0.000000000000e+00
-3.60000000000e+02 3.600000000000e+02 0.000000000000e+00
-3.600000000000e+02 3.600000000000e+02 0.000000000000e+00
G Soft 0
H Soft_Val 5.000000000000e+02 1.000000000000e+01
5.000000000000e+03
I Val 4.018349328082e+00 0.000000000000e+00 0.000000000000e+00
J Slider_Span 1.000000 720.000000 720.000000
K Range_On 0 0 0 0 0 0
L Slider_On 1 0 0
M Force_Active 0 0 0 0 0 0
N Force_Display 0 0 0 0 0 0
O Force_Set 0 0 0 0 0 0
P Constraint Force/Moments
0.000000 0.000000 0.000000
0.000000 0.000000 0.000000
Q Show_Arrows 0 0 0 0 0 0
R Show_Result_Body 0 0 0 0 0 0
S Constraint Force/Moments
0.000000 0.000000 0.000000
0.000000 0.000000 0.000000
```

```
*************************************
************JOINT GEOM************
=a JOINT GEOM:
A USE_JOINT_GEOM 1
B JOINT GEOM_NAME geom/jointslong.byu
C JOINT_GEOM_MATERIALS
0 0.51 0.50 0.11 1.00 22.22 0.20 0.20 0.20
0 ambient 0.40 0.40 0.00
1 0.45 0.10 0.00 1.00 22.99 0.20 0.20 0.20
1 ambient 0.40 0.00 0.00
2 0.77 0.75 0.00 1.00 32.99 0.20 0.20 0.20
2 ambient 0.30 0.30 0.30
*************************************
************FORCES************
=b Force:
A Force_number 0
B Body 3
C Active 0
D Global 1
E Force 1.000000000000e+01
F Point 0.000000000000e+00 0.000000000000e+00 0.000000000000e+00
G Point 0.000000000000e+00 0.000000000000e+00 1.000000000000e+00
H Size 1.000000
I Force_or_Moment 0
*************************************
************OPTIONS************
=c options:
A Kinematic_structure 1
B Kinematic_geom 1
C Joints on 0
D Bodies on 1
E Tendons on 1
F Joint_geom on 1
G Forces on 1
H Solution_type 0
I Pulldown_view 1
J Background 12 12 14
*************************************
************SHOW FORCES************
=d options:
A WIN_POSITION 600 800
B ARROW_SIZE_COLOR 1 1 1 0 0
```

-continued

```
C FORCE_RANGE 1.000000000000e+02 1.000000000000e+02
C SIZE_SCALE 1.000000000000e+02 1.000000000000e+02
*************************************
```

SECTION 3

It is to be understood that the above description is intended to be illustrative, and not restrictive. Many other embodiments will be apparent to those of skill in the art upon reviewing the above description.

The scope of the invention should, therefore, be determined with reference to the appended claims, along with the full scope of equivalents to which such claims are entitled.

What is claimed is:

1. A method for simulating a multibody system on a computer comprising the steps:

inputting into the computer a mathematical description of each body in the multibody system;

specifying to the computer a plurality of constraints to act on the bodies wherein each one of the plurality of constraints is mathematically represented within the computer by a constraint equation;

specifying to the computer a plurality of external forces to act on the bodies;

formulating a Jacobian matrix in the computer, wherein the Jacobian matrix comprises partial derivatives of the constraint equations;

specifying to the computer one of a plurality of solution modes to execute to generate a configuration of the multibody system resulting from the constraints and external forces acting on the bodies, wherein the plurality of solution modes comprises:

a kinematics mode using the Jacobian matrix to iteratively calculate coordinates of the bodies so that the constraint equations are solved when each one of the plurality of external forces has a zero magnitude;

a dynamic mode using the Jacobian matrix to iteratively calculate coordinates of the bodies when at least one of the plurality of external forces has a non-zero magnitude; and a static force mode using the Jacobian matrix to iteratively calculate reaction forces and reaction moments required to maintain the multibody system in a static configuration when at least one of the plurality of external forces has a non-zero magnitude;

detecting changes to the body descriptions, the plurality of constraints, and the plurality of forces, which are interactively input into the computer by a user during an iteration cycle, and reiterating the one of the plurality of solution modes using the changes until no further changes are detected; and graphically displaying the configuration resulting from the one of the plurality of solution modes on an electronic display at the end of an iteration cycle.

2. A method according to claim 1, further comprising the step of physically building a prototype which physically embodies the configuration resulting from the one of the plurality of solution modes.

3. A method according to claim 1, wherein said multibody system is an anatomical system.

4. A method according to claim 3, wherein the bodies represent bones, and the plurality of constraints represent joints, muscles and tendons in the anatomical system.

5. A method according to claim 1, wherein a force-arrow icon is graphically displayed as part of the configuration resulting from the one of the plurality of solution modes, and wherein a size of the force-arrow icon represents a magnitude of a force vector.

6. A method according to claim 1, wherein a moment-arrow icon is graphically displayed as part of the configuration resulting from the one of the plurality of solution modes, and wherein a size of the moment-arrow icon represents a magnitude of a moment vector.

7. A system for simulating a multibody system on a computer, comprising:

an input device for inputting into the computer a mathematical description of each body in the multibody system;

means for specifying to the computer a plurality of constraints to act on the bodies wherein each one of the plurality of constraints is mathematically represented within the computer by a constraint equation;

means for specifying to the computer a plurality of external forces to act on the bodies;

a computer algorithm running on the computer for formulating a Jacobian matrix, wherein the Jacobian matrix comprises partial derivatives of the constraint equations;

means for specifying to the computer one of a plurality of solution algorithms to execute to generate a configuration of the multibody system resulting from the constraints and external forces acting on the bodies, wherein the plurality of solution algorithms comprises:

a kinematics algorithm using the Jacobian matrix to iteratively calculate coordinates of the bodies so that the constraint equations are solved when each one of the plurality of external forces has a zero magnitude;

a dynamic algorithm using the Jacobian matrix to iteratively calculate coordinates of the bodies when at least one of the external forces has a non-zero magnitude; and a static force algorithm using the Jacobian matrix to iteratively calculate reaction forces and reaction moments required to maintain the multibody system in a static configuration when at least one of the external forces has a non-zero magnitude;

means for detecting changes to the body descriptions, the plurality of constraints, and the plurality of forces, which are interactively input into the computer by a user during an iteration cycle, and reiterating the one of the plurality of solution algorithms using the changes until no further changes are detected; and a graphical display coupled to the computer for graphically displaying the configuration resulting from the one of the plurality of solution algorithms at the end of an iteration cycle.

8. A system according to claim 7, further comprising means for physically building a prototype which physically embodies the configuration resulting from the one of the plurality of solution algorithms.

9. A system according to claim 7, wherein said multibody system is an anatomical system.

10. A system according to claim 9, wherein the bodies represent bones, and the plurality of constraints represent joints, muscles and tendons in the anatomical system.

11. A system according to claim 7, further comprising means for graphically displaying a force-arrow icon as part of the configuration resulting from the one of the plurality of solution algorithms, wherein a size of the force-arrow icon represents a magnitude of a force vector.

12. A system according to claim 7, further comprising means for graphically displaying a moment-arrow icon as part of the configuration resulting from the one of the plurality of solution algorithms, wherein a size of the moment-arrow icon represents a magnitude of a moment vector.

13. A system for simulating a multibody system on a computer, comprising:

means for inputting into the computer a mathematical description of each body in the multibody system;

means for specifying to the computer a plurality of constraints to act on the bodies wherein each one of the plurality of constraints is mathematically represented within the computer by a constraint equation;

means for specifying to the computer a plurality of external forces to act on the bodies;

means for formulating in the computer a Jacobian matrix, wherein the Jacobian matrix comprises partial derivatives of the constraint equations;

means for specifying to the computer one of a plurality of solution means to execute to generate a configuration of the multibody system resulting from the constraints and forces acting on the bodies wherein the plurality of solution means comprises:

a kinematics means using the Jacobian matrix to iteratively calculate coordinates of the bodies so that the constraint equations are solved when each one of the plurality of external forces has a zero magnitude;

a dynamic means using the Jacobian matrix to iteratively calculate coordinates of the bodies when at least one of the plurality of external forces has a non-zero magnitude; and a static force means using the Jacobian matrix to iteratively calculate reaction forces and moments required to maintain the multibody system in a static configuration when at least one of the plurality of external forces has a non-zero magnitude;

means for detecting changes in the body descriptions, the plurality of constraints and the plurality of forces, which are interactively input into the computer by a user during an iteration cycle, and reiterating the one of the plurality of solution means using the until no further changes are detected; and means for graphically displaying the configuration resulting from the one of the plurality of solution means at the end of an iteration cycle.

14. A system according to claim 13, further comprising means for physically building a prototype which physically embodies the configuration resulting from the one of the plurality of solution means.

15. A system according to claim 13, wherein said multibody system is an anatomical system.

16. A system according to claim 15, wherein the bodies represent bones, and the plurality of constraints represent joints, muscles and tendons in the anatomical system.

17. A system according to claim 13, further comprising means for graphically displaying a force-arrow icon as part of the configuration resulting from the one of the plurality of solution means, wherein a size of the force-arrow icon represents a magnitude of a force vector.

18. A system according to claim 13, further comprising means for graphically displaying a moment-arrow icon as part of the configuration resulting from the one of the plurality of solution means wherein a size of the moment-arrow icon represents a magnitude of a moment vector.

19. A method for simulating a multibody system on a computer comprising the steps:

inputting into the computer a mathematical description of each body in the multibody system;

specifying to the computer a plurality of constraints to act on the bodies wherein the plurality of constraints comprise joint constraints and cable/pulley constraints, and each one of the plurality of constraints is mathematically represented within the computer by a constraint equation;

specifying to the computer a plurality of external forces and a plurality of external moments to act on the bodies;

specifying to the computer one of a plurality of solution modes to execute to generate a configuration of the multibody system resulting from the constraints, the external forces and the external moments acting on the bodies, wherein the plurality of solution modes comprises:

a first Newton kinematics mode using a first Jacobian matrix to iteratively calculate coordinates of the bodies so that the constraint equations are solved when each one of the plurality of external forces and each one of the plurality of external moments has a zero magnitude, wherein the first Jacobian matrix comprises the partial derivatives of the constraint equations calculated with respect to Euler parameters;

a second Newton kinematics mode using a second Jacobian matrix to iteratively calculate the coordinates of the bodies so that the constraint equations are solved when each one of the plurality of external forces and each one of the plurality of external moments has a zero magnitude, wherein the second Jacobian matrix comprises partial derivatives of the constraint equations in terms of angular velocities;

a third Newton kinematics mode using a third Jacobian matrix to iteratively calculate the coordinates of the bodies so that the constraint equations are solved when each one of the plurality of external forces and each one of the plurality of external moments has a zero magnitude, wherein the third Jacobian matrix comprises partial derivatives of the constraint equations calculated using the Levenberg-Marquardt algorithm with Euler parameters;

an optimized kinematics mode using a fourth Jacobian matrix to iteratively calculate the coordinates of the bodies in an over-constrained multibody system so that a best solution is found for the constraint equations when each one of the plurality of external forces and each one of the plurality of external moments has a zero magnitude;

a dynamic mode using a fifth Jacobian matrix to iteratively calculate the coordinates of the bodies when at least one of the plurality of external forces or at least one of the plurality of external moments has a non-zero magnitude, wherein the fifth Jacobian matrix comprises partial derivatives of the constraint equations in terms of angular velocities; and a static force mode using a sixth Jacobian matrix to iteratively calculate reaction forces and reaction moments required to maintain the multibody system in a static configuration when at least one of the plurality of external forces or at least one of the plurality of external moments has a non-zero magnitude, wherein the sixth Jacobian matrix comprises partial derivatives of the constraint equations in terms of angular velocities;

detecting changes in the body descriptions, the plurality of constraints, and the plurality of forces, which are interactively input into the computer by a user during an iteration cycle, and reiterating the one of the plurality of solution modes using the variations until no further variations are detected; and graphically displaying the configuration resulting from the one of the plurality of solution modes on an electronic display at the end of an iteration cycle.

20. A method according to claim 19, further comprising the step of specifying one of the plurality of constraints as a soft constraint, wherein a soft constraint acts as a spring or damping force on the bodies.

21. A method according to claim 19, wherein forces and moments are represented on the electronic display as arrow icons having a size proportional to a magnitude of the force or moment vector so represented.

22. A method according to claim 19, wherein the bodies represent bones, the joint constraints represent joints, and the cable/pulley constraints represent muscles and tendons in an anatomical system.

* * * * *

UNITED STATES PATENT AND TRADEMARK OFFICE

CERTIFICATE OF CORRECTION

PATENT NO. : 5,835,693

DATED : November 10, 1998

INVENTOR(S) : James D. Lynch et al.

It is certified that error appears in the above-identified patent and that said Letters Patent is hereby corrected as shown below:

On title page,

At [73] Assignees: please insert --Iowa State University Research Foundation, Inc.--

Signed and Sealed this

Second Day of November, 1999

Attest:

Q. TODD DICKINSON

*Attesting Officer*

*Acting Commissioner of Patents and Trademarks*